US006067645A

United States Patent [19]

Yamamoto et al.

[11] Patent Number: 6,067,645

[45] Date of Patent: *May 23, 2000

[54] DISPLAY APPARATUS AND METHOD

[75] Inventors: Takashi Yamamoto, Yamato; Atsushi Mizutome, Hayamamachi; Akio Yoshida, Hiratsuka; Hideo Mori, Yokohama; Kazuhiko Murayama; Tomoyuki Ohno, both of Atsugi, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/655,146

[22] Filed: May 30, 1996

[30] Foreign Application Priority Data

Jun. 2, 1995 [JP] Japan .................................... 7-136651

[51] Int. Cl.[7] .......................... H02K 3/05; H03K 19/003

[52] U.S. Cl. .............................. 714/57; 714/24; 345/326; 345/520

[58] Field of Search ............................ 395/185.1, 183.22, 395/501, 788, 326, 185.01, 185.09; 345/97, 98, 185, 418, 326, 333, 156, 501, 520; 364/413.22, 237.2, 237.5, 146; 714/57, 24

[56] References Cited

U.S. PATENT DOCUMENTS

| | | | |
|---|---|---|---|
| 4,527,250 | 7/1985 | Galdun et al. | 395/326 |
| 4,964,699 | 10/1990 | Inoue | 350/322 |
| 5,363,122 | 11/1994 | Suenaga et al. | 345/212 |
| 5,373,307 | 12/1994 | Shiraishi | 345/2 |
| 5,434,589 | 7/1995 | Nakamura et al. | 345/98 |
| 5,434,592 | 7/1995 | Dinwiddie, Jr. et al. | 345/133 |
| 5,483,634 | 1/1996 | Hasegawa | 395/501 |
| 5,488,384 | 1/1996 | Uehara et al. | 345/1 |
| 5,606,343 | 2/1997 | Tsuboyama et al. | 345/97 |
| 5,613,103 | 3/1997 | Nobutani et al. | 395/501 |
| 5,627,569 | 5/1997 | Matsuzaki et al. | 345/214 |

FOREIGN PATENT DOCUMENTS

| | | |
|---|---|---|
| 0404182 | 12/1990 | European Pat. Off. . |
| 0487742 | 6/1992 | European Pat. Off. . |
| 0520454 | 12/1992 | European Pat. Off. . |
| 4233789 | 7/1993 | Germany . |
| 62-76357 | 4/1987 | Japan . |
| 4137944 | 5/1992 | Japan . |
| 5160839 | 6/1993 | Japan . |
| 93-20887 | 10/1993 | Rep. of Korea . |

*Primary Examiner*—Dieu-Minh T. Le
*Attorney, Agent, or Firm*—Fitzpatrick, Cella, Harper & Scinto

[57] ABSTRACT

A display apparatus includes a communication device for executing a communication with a host computer via an interface cable. The display apparatus also includes a display having a display screen for displaying image data transferred in synchronism with display timing from the host computer via the interface cable, a connector connectable to the interface cable that communicates with the host computer, and a detector for detecting whether or not the connector is connected to the host computer via the interface cable. A connection/disconnection state of the interface cable is recognized on the basis of the detection result.

23 Claims, 91 Drawing Sheets

FIG. 16

| COMMAND | | STATUS | |
|---|---|---|---|
| COMMAND NAME | CODE | NORMAL STATE | ERROR STATE |
| Request Unit ID | 00H | 00xxxxxx B | 01xxxxxx B |
| Request 1H | 01H | 00xxxxxx B | 01xxxxxx B |
| Unit Start | 02H | 00000000B | 01xxxxxx B |
| Request Attention Inf. | 03H | 00xxxxxx B | 01xxxxxx B |
| Request Attention Bit. | 04H | 00xxxxxx B | 01xxxxxx B |
| Get Mode | 05H | 00xxxxxx B | 01xxxxxx B |
| Request Status | 06H | 00xxxxxx B | 01xxxxxx B |
| Attention Clear | 0AH | 00000000B | 01xxxxxx B |
| Get Contrast Enh. | 0BH | 00xxxxxx B | 01xxxxxx B |
| Get Multi | 0CH | 00xxxxxx B | 01xxxxxx B |
| Send Diagnostic | 1xH | 00xxxxxx B | 01xxxxxx B |
| Send Host ID | 2xH | 00000000B | 01xxxxxx B |
| Set Mode | 3xH | 00000000B | 01xxxxxx B |
| Set Multi | 4xH | 00000000B | 01xxxxxx B |
| Write High Memory | 8xH | 00000000B | 01xxxxxx B |
| Write Low Memory | 9xH | 00000000B | 01xxxxxx B |
| Read High Memory | 08H | 0000xxxxB | 01xxxxxx B |
| Read Low Memory | 09H | 0000xxxxB | 01xxxxxx B |
| Set HH address | AxH | 00000000B | 01xxxxxx B |
| Set MH address | BxH | 00000000B | 01xxxxxx B |
| Set ML address | CxH | 00000000B | 01xxxxxx B |
| Set LL address | DxH | 00000000B | 01xxxxxx B |

FIG. 32

| OPERATION MODE | SCREEN DISPLAY | BACKLIGHT | LED | REMARKS |
|---|---|---|---|---|
| Normal | REWRITE | ON | ON | |
| Static | STILL STATE | ON | ON | DEPENDS ON I/F FORM |
| Sleep | ERASE ALL SEGMENTS TO BLACK | OFF | 1st ON 1st OFF | DEPENDS ON HOST S/W (COMPLIES WITH VESA) |
| UNRECOVERABLE ERROR | MAINTAIN PREVIOUS STATE | MAINTAIN PREVIOUS STATE | 0.5s ON 0.5s OFF | RESTORABLE BY TURNING ON POWER SUPPLY AGAIN |

| PARAMETER | SYMBOL | Min | Typ | Max | UNIT |
|---|---|---|---|---|---|
| BUSY PERIOD | t cbusy | 64.0 | | | µs |
| BUSY WIDTH | t wbusy | | | 10.0 | µs |
| FCLK PERIOD | t cfclk | 100 | | | ns |
| FCLK "H" WIDTH | t wfclkh | 40 | | | ns |
| FCLK "L" WIDTH | t wfclkl | 40 | | | ns |
| AHDL DELAY TIME 1 | t dahdl1 | 600 | | 1000 | ns |
| AHDL DELAY TIME 2 | t dahdl2 | 0 | | 15 | ns |
| AHDL DELAY TIME 3 | t dahdl3 | 0 | | 15 | ns |
| PD DELAY TIME | t dpd | 0 | | 15 | ns |
| PD PERIOD | t cpd | 100 | | | ns |
| PD DATA SETUP TIME | t spd | 20 | | | ns |
| PD DATA HOLD TIME | t hpd | 60 | | | ns |

FIG. 49

| | AMBIENT TEMPERATURE [C°] | 5 | 15 | 20 | 25 | 30 | 35 |
|---|---|---|---|---|---|---|---|
| FRAME FREQUENCY | UPON STARTING [Hz] | 3.0 | 6.2 | 7.7 | 8.8 | 9.9 | 13 |
| | UPON TEMPERATURE SATURATION [Hz] | 9.6 | 10.4 | 12 | 12 | 12 | 10 |

FIG. 61

8-POSITION GRAY CODE OUTPUT

| POSITION | | 0 | 1 | 2 | 3 | 4 | 5 | 6 | 7 |
|---|---|---|---|---|---|---|---|---|---|
| SIGNAL | CESW0 | | ○ | ○ | | | ○ | ○ | |
| | CESW1 | | | ○ | ○ | ○ | ○ | | |
| | CESW2 | | | | | ○ | ○ | ○ | ○ |

MARK ○ INDICATES THAT CONNECTION TO GND IS ON

FIG. 68

| W3 | | | | | | | | Level | PRIORITY ORDER | |
|---|---|---|---|---|---|---|---|---|---|---|
| b7 | b6 | b5 | b4 | b3 | b2 | b1 | b0 | | | |
| 0 | 0 | 0 | × | × | × | × | × | 0 | HIGH | POWEROFF ATTENTION |
| 0 | 0 | 1 | × | × | × | × | × | 1 | ↑ | STATUS FOR SPECIFIC COMMAND |
| 0 | 1 | 0 | × | × | × | × | × | 2 | ↑ | |
| 0 | 1 | 1 | × | × | × | × | × | 3 | ↑ | ATTENTION FOR NORMAL COMMAND |
| 1 | 0 | 0 | × | × | × | × | × | 4 | ↑ | |
| 1 | 0 | 1 | × | × | × | × | × | 5 | ↑ | ATTENTION FOR UNRECOVERABLE ERROR |
| 1 | 1 | 0 | × | × | × | × | × | 6 | ↑ | OTHER ATTENTION |
| 1 | 1 | 1 | × | × | × | × | × | 7 | LOW | |

DISPLAY APPARATUS AND METHOD

BACKGROUND OF THE INVENTION

The present invention relates to a display apparatus and method.

An information processing system (or apparatus) normally uses a display apparatus as a means for realizing a visual expression function of information. As is well known, a CRT display apparatus is popularly used as such display apparatus.

Since a CRT display apparatus itself has no display memory function, display data must be kept supplied to the display apparatus at all times, and when the supply of display data is stopped, the display operation on the display screen is immediately interrupted.

For this reason, the display control for the CRT display apparatus must constantly execute an image write operation and a display image read-out operation to and from a video memory (to be referred to as a VRAM hereinafter) arranged in the information processing apparatus.

In the case of the above-mentioned CRT display control, since the operation for writing display data in the VRAM to update display information and the operation for reading out data from the VRAM to attain a display operation are independently performed, a program on the information processing system side can write desired display data at an arbitrary timing regardless of the display timing.

However, in general, since a CRT display apparatus has a larger depth in proportion to its display area, the volume of the entire CRT display apparatus increases. That is, the CRT display apparatus suffers a limited installation space, poor portability, and the like, and cannot attain a size reduction.

In view of these problems, a liquid crystal display (to be referred to as an "LCD" hereinafter) is known. The LCD can have an extremely low profile with respect to its display area as compared to that of the CRT display apparatus. Of such LCD, a display using a ferroelectric liquid crystal cell (to be referred to as an FLCD hereinafter) is known.

As one feature of the FLCD, its liquid crystal cell has preservation characteristics of the display state with respect to the applied electric field. That is, the FLCD has a very low-profile liquid crystal cell and an FLC element in the cell can maintain an orientation state after the applied electric field is removed. As a result, such FLC element has bistability, and the FLCD that utilizes the bistability of the FLC element has characteristics of storing the displayed contents. The FLC and FLCD are described in detail in, e.g., Japanese Patent Application No. 62-76357, which is corresponding to U.S. Pat. No. 4,964,699.

Upon driving the FLCD, unlike in a CRT or other liquid crystal displays, since the FLCD can store and continuously display an image, successive refresh periods have a time margin. As a result, in addition to the successive refresh driving operations, a so-called partial rewrite driving operation for updating the display state of only a changed portion on the display screen can be realized.

Meanwhile, the FLCD keeps displaying previous information unless display data is updated. For example, when a host computer or the like hangs up, the previous display state is maintained. Therefore, the conventional display control for a display apparatus cannot solve such problems.

On the other hand, the FLCD performs binary halftone processing for artificially increasing the number of display colors. As typical binary halftone processing, an ED (error diffusion) method that can attain high quality of both natural and character images is known. The ED processing requires an image to have continuity since an error generated in a given pixel diffuses (is distributed) in turn to neighboring pixels.

When the ED method is used, an error from an original image is inevitably generated. Therefore, a change in image quality upon generation of errors caused by an increase in the number of display colors may pose a problem.

SUMMARY OF THE INVENTION

The present invention has been made in consideration of the above-mentioned problems, has as its object to prevent the display state on a screen from being disturbed by display information that remains inadvertently even in a display having storage holding characteristics of a displayed image, and has another object to provide a display apparatus and method, which can quickly recognize and take a measure against an abnormality of the apparatus such as a disconnection of a connection cable.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 16 is a table showing a list of commands to be sent from the FLCD interface to the FLCD in the embodiment shown in FIG. 1;

FIG. 32 is a table showing the screen display state, backlight state, and LED driving state in the respective operation modes of the FLCD in the embodiment shown in FIG. 1;

FIG. 49 is a table showing an example of the start frame frequencies and the frame frequencies when the internal temperature is sufficiently saturated;

FIG. 61 is a table showing the relationship between the setting state of the color adjustment switch and the gray code in the embodiment shown in FIG. 1;

FIG. 68 is a table showing a setting example of the priority order of transmission using a transmission data buffer used in the serial communication of the embodiment shown in FIG. 1;

DETAILED DESCRIPTION OF THE PREFERRED EMBODIMENTS

An embodiment according to the present invention will be described in detail hereinafter with reference to the accompanying drawings.

Figure 1:
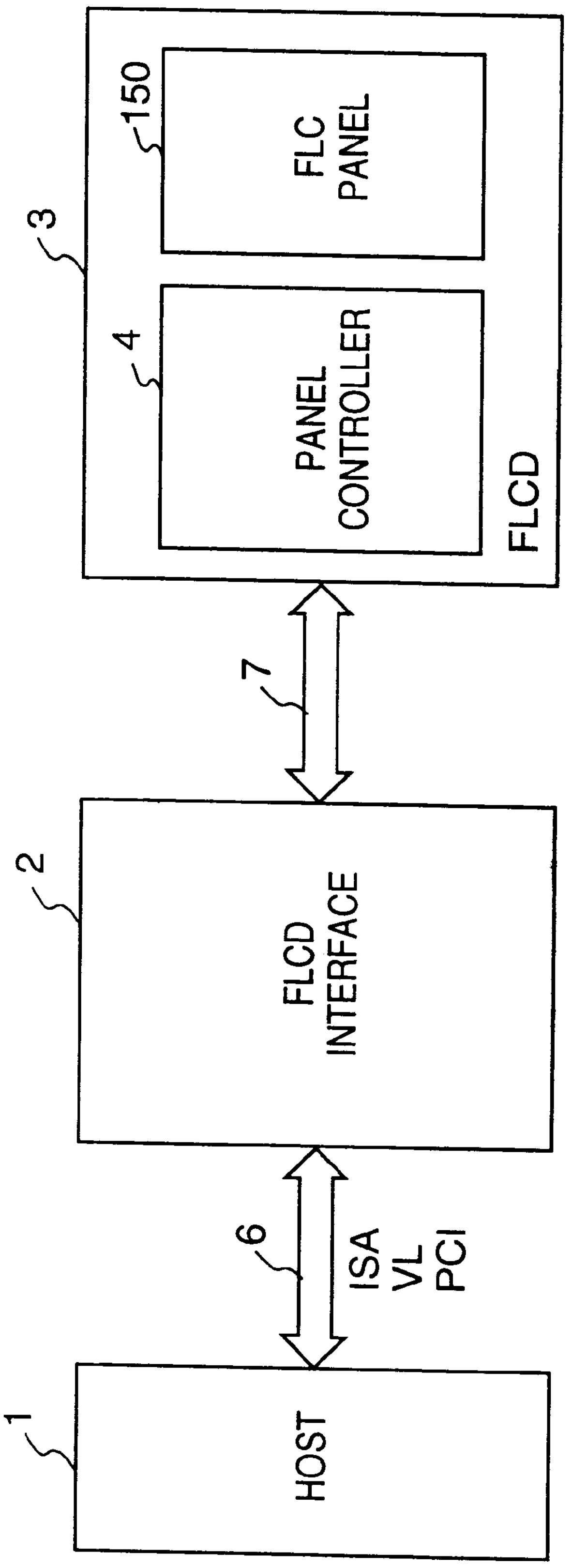
FIG. 1 is a block diagram showing an information processing system according to an embodiment of the present invention.

FIG. 1 is a block diagram showing the arrangement of a display system including an apparatus (FLCD) of this embodiment. Referring to FIG. 1, reference numeral 1 denotes a host for controlling a display apparatus (FLCD) 3 of this embodiment via an FLCD interface 2 and supplying display data to the FLCD 3; and 2, an FLCD interface for interfacing between the FLCD 3 of this embodiment and the host 1 side. In practice, the FLCD interface 2 is mounted in the host 1 as a single interface board. The FLCD 3 includes a panel controller for performing various kinds of display control of an FLC panel 150 and displaying display data on the FLC panel 150.

Note that the FLCD interface 2 may be permanently connected to the system or may be connected as a card (or board) in a portion called an extension slot arranged in an information processing apparatus represented by a workstation and a personal computer. The host 1 and the FLCD interface 2 can be connected via ISA, VL, or PCI interface specifications, and the FLCD 3 and the FLCD interface 2 are connected to each other via a cable 7.

In this system, the host 1 loads and executes an OS (operating system) and an application program. Screen information indicating the work in progress is stored in a VRAM arranged in the FLCD interface 2 and is displayed on the FLCD 3. Note that the OS and application program to be executed are not limited to specific ones. For example, MS-WINDOWS available from Microsoft Corporation may be used as the OS, and application programs that can run on this OS may be used.

Figure 2:
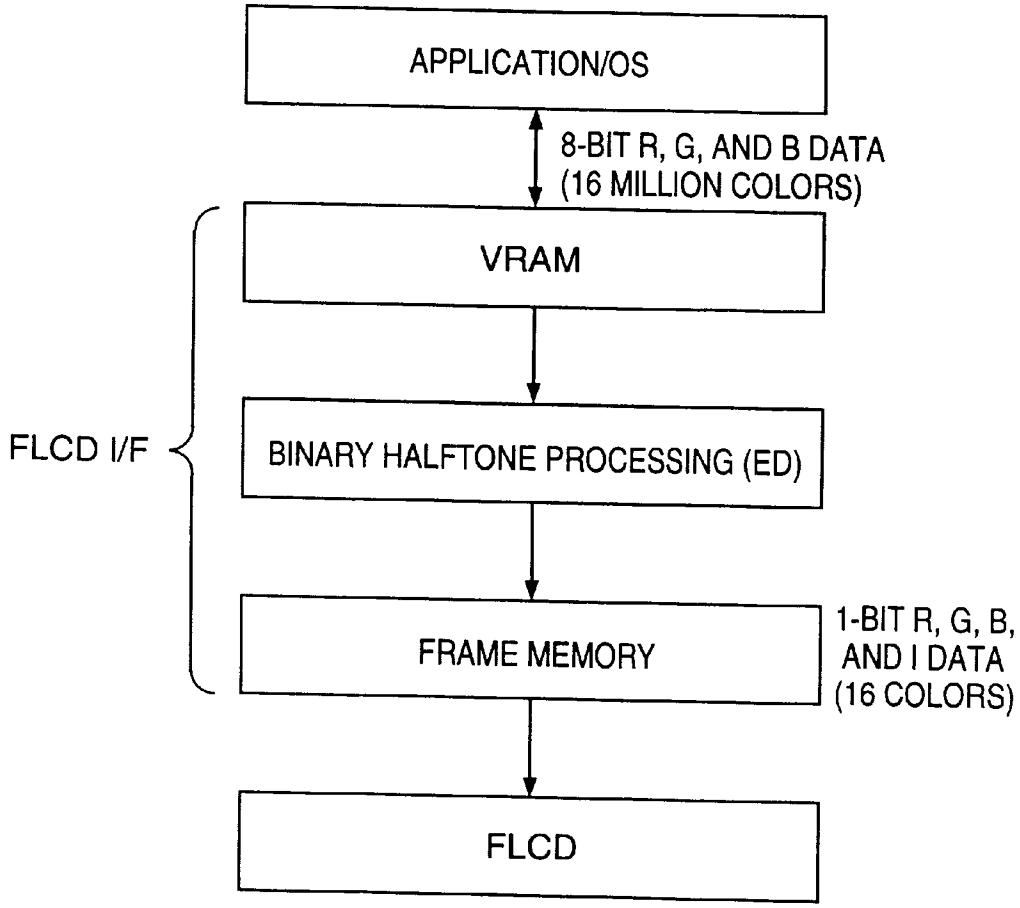
FIG. 2 is a schematic chart showing the flow of data associated with an image display operation in the system of the embodiment shown in FIG. 1.

FIG. 2 shows the schematic flow of data associated with an image display operation in the system of this embodiment shown in FIG. 1.

When the application program or OS writes data in the VRAM in the FLCD interface 2, the FLCD interface 2 performs binary halftone processing (ED (Error Distribution) processing in this embodiment) of the written data, and writes the processed data in a frame memory (4 bits per pixel=R, G, B, and I bits) having a capacity for one frame of the FLCD 3. The interface 2 transfers the contents of the frame memory to the FLCD 3 to display them.

More specifically, in a conventional display apparatus, the contents of the VRAM are directly transferred to the display apparatus, while in the FLCD interface 2 of this embodiment, a new memory, i.e., the frame memory, is inserted between the VRAM and the FLCD 3.

Figure 3:
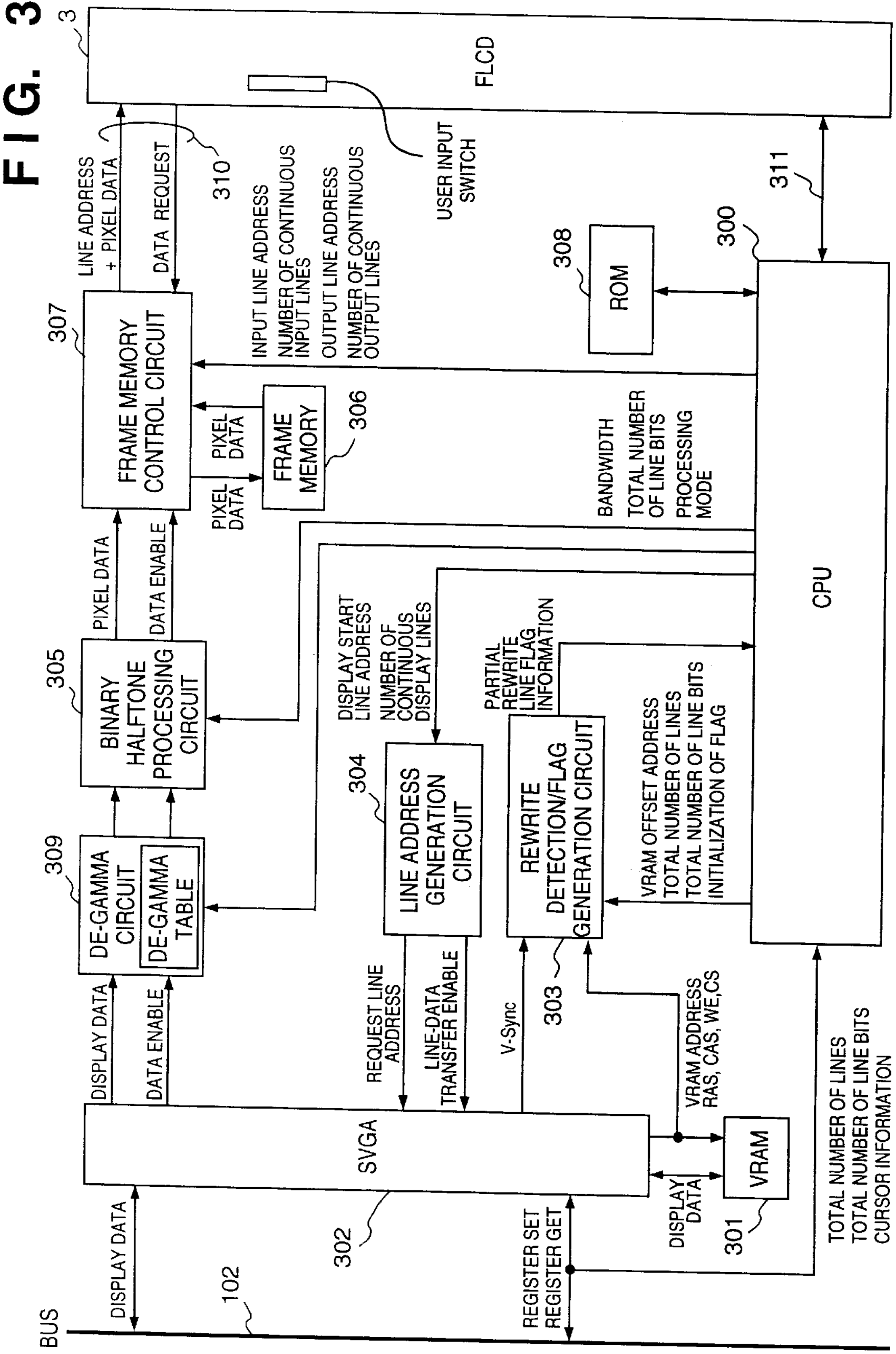
FIG. 3 is a detailed block diagram showing the arrangement of an FLCD interface in the embodiment shown in FIG. 1.

FIG. 3 is a detailed block diagram showing the arrangement of the FLCD interface 2 of this embodiment.

Referring to FIG. 3, reference numeral 300 denotes a CPU which is arranged in the FLCD interface 2 and controls the entire interface. The CPU 300 operates in accordance with programs stored in a ROM 308.

Reference numeral 301 denotes a VRAM in which 1 byte (8 bits) is assigned to each of R, G, and B data per pixel (a total of 3 bytes=24 bits=about 16 million colors) In general, when 8 bits are assigned to each of R, G, and B color elements, a color image reproduced by these data is called a full-color image. Note that the VRAM has a capacity capable of storing an image having a size of 1,280 dots×1,024 dots (1,280×1,024×3=4 Mbytes)

Reference numeral 302 denotes an SVGA chip (accelerator) for controlling accesses to the VRAM 301. The SVGA chip 302 can make data draw (write) and read accesses to the VRAM 301 on the basis of commands from the host 1. Also, the SVGA chip 302 has a function of drawing, e.g., figures and the like on the basis of commands from the CPU 300, and functions to be described later. Note that an LSI for drawing various kinds of figures on the VRAM 301 is popularly used as a display control chip, and the LSI itself is known to those who are skilled in the art.

Reference numeral 303 denotes a rewrite detection/flag generation circuit. When the SVGA chip 302 makes a write access (drawing processing) to the VRAM 301, the circuit 303 detects the write address in response to a write enable signal (also including a chip select signal in practice) as a trigger signal, so as to detect and hold updated line data.

More specifically, the rewrite detection/flag generation circuit 303 utilizes the write enable signal generated when the SVGA chip 302 makes a write access to the VRAM 301, and latches the address output at that time in a register (not shown). The circuit 303 calculates a written line (which can be calculated by a circuit for dividing the write address with the number of bytes per line) on the display screen on the basis of the latched address data, and sets "1" in an area flag corresponding to the written line.

Since the number of lines on the entire screen of the FLCD 3 in this embodiment is 1,024 (0th to 1,023rd lines), and each area is defined in units of 32 lines, the area flag requires a total of 32 (=1,024/32) bits. That is, the respective bits of the 32-bit flag hold whether or not data are written in the areas corresponding to 0th to 31st lines, 32nd to 63rd lines, . . . , 992nd to 1,023rd lines.

The reason why rewrite information is held not for each line but for a predetermined number of lines is that a displayed image is often changed not by one line but across a plurality of lines. Note that the number of lines assigned to each area is not limited to 32 but may be changed to, for example, 64 or 128. In this case, if the number of lines to be assigned to each area is too small, the area flag requires a larger number of bits. Also, the number of times of instructions in partial rewrite processing (to be described later) increases accordingly, and the overhead generation rate becomes high. On the contrary, if the number of lines to be assigned to each area is too large, an unnecessary portion in the partial rewrite processing undesirably increases.

As will be described later, the maximum display size of the FLCD 3 is 1,280 dots×1,024 dots. However, in order to allow display operations in other display dot sizes (e.g., 1,024×768, 600×480, and the like), the information amount per line used for calculating the written line is programmable. The display dot size can be changed in accordance with an instruction sent from the host to the CPU 300.

When the above-mentioned rewrite detection/flag generation circuit 303 detects that one of the 32-line areas written in the VRAM 301 is rewritten, it informs the CPU 300 of the contents of the area flag. As will be described later, the circuit 303 clears the area flag to zero in accordance with a request from the CPU 300.

Reference numeral 304 denotes a line address generation circuit which receives the address of the designated line and the number of offset lines from the designated line from the CPU 300, and outputs a data transfer address and its control signal to the SVGA chip 302. Upon reception of the address data and signal, the SVGA chip 302 outputs image data (8-bit R, G, and B data) of the designated number of lines from the corresponding line to a de-gamma circuit 309.

The de-gamma circuit 309 comprises a look-up table, and its contents are freely changed on the basis of an instruction from the CPU 300. The de-gamma circuit 309 changes the contrast of a displayed image in accordance with the contents set by a color adjustment switch 108 arranged on the FLCD 3, and its role will be described in detail later. Image data corrected by the de-gamma circuit 309 is output to a binary halftone processing circuit 305.

The binary halftone processing circuit 305 quantizes image data (8-bit R, G, and B data per pixel) supplied from the SVGA chip 302 via the de-gamma circuit 309 to R, G. and B signals and a luminance signal I (1 bit for each data; a total of 4 bits) on the basis of the error diffusion method. Note that the technique for binary-converting 8-bit R, G, and B data into 1-bit R, G, and B data, and generating a binary signal I indicating the luminance level has already proposed by the present assignee (e.g., Japanese Patent Application No. 4-126148). The binary halftone processing circuit 305 incorporates a buffer memory required in the error diffusion processing so as to attain its processing.

Note that the binary halftone processing circuit 305 outputs data on the basis of an instruction from the CPU 300, i.e., an error diffusion table (parameters) serving as parameters upon binary conversion, and the line positions and the number of lines to be output. The reason why the error diffusion table is not a permanent one but can be freely set by the CPU 300 is to change the color arrangement or the like on the basis of an instruction from a CPU 101 of the information processing apparatus side.

Reference numeral 306 denotes a frame memory for storing an image (1-bit R, G, and B data per pixel) to be displayed on the FLCD 3. As described above, since the maximum display size of the FLCD 3 of this embodiment is 1,280 dots×1,024 dots, and each dot is expressed by 4 bits, the frame memory 306 has a capacity of 1 Mbyte (640 Kbytes for calculations).

Reference numeral 307 denotes a frame memory control circuit for controlling read and write accesses to the frame memory and data transfer to the FLCD 3. More specifically, the control circuit 307 stores R, G, B, and I data output from the binary halftone processing circuit 305 in the frame memory, and outputs data of an area designated by the CPU 300 to the FLCD 3 via a data transfer bus 310 (of this bus, a data bus has a 16-bit width and can simultaneously transfer data for four pixels). Except for a case wherein image data for a relatively large number of lines are being transferred to the FLCD 3 (i.e., when transfer of image data designated by the CPU 300 is completed and the next transfer instruction is not yet input), upon reception of a data transfer request from the FLCD 3, the control circuit 307 supplies a message indicating this to the CPU 300 as an interrupt signal. Note that the data format used upon transfer of data to the FLCD is defined in units of sets of data each including a total of four bits (R, G, B, and I data), and data are stored in the frame memory 306 in this format.

Furthermore, upon completion of storage of image data from the binary halftone processing circuit 305 in the frame memory, the frame memory control circuit 307 also outputs a message indicating this to the CPU 300 as an interrupt signal. Upon completion of transfer of image data of the line designated by the CPU 300 (or upon completion of transfer of image data of the designated number of lines when transfer of data for a plurality of lines is designated), the control circuit 307 also outputs a message indicating this to the CPU 300 as an interrupt signal.

Note that an interrupt signal is also supplied to the CPU 300 in cases other than the above-mentioned cases. For example, an interrupt signal is output upon reception of data from a serial communication line (e.g., an RS-232C standard communication line) 311 arranged exclusively for communications with the FLCD 3. This operation will be described in detail later. The data transfer bus 310 and the serial communication line 311 are included in the cable 7.

In the above-mentioned arrangement, assuming that the host 1 receives a drawing request of a character, figure, or the like from an execution program of, e.g., the OS, application program, or the like, it outputs a command corresponding to the request or image data to the SVGA chip 302 in the FLCD interface 2. Upon reception of the image data, the SVGA chip 302 writes the received image data at the designated position of the VRAM 301. Upon reception of a drawing command of, e.g., figure data, the SVGA chip 302 draws a figure image at the corresponding position of the VRAM 301. That is, the SVGA chip 302 performs write processing with respect to the VRAM 301.

The rewrite detection/flag generation circuit 303 monitors a write access of the SVGA chip 302, as described above. As a result, the circuit 303 sets a flag corresponding to the written area and informs the CPU 300 of it.

The CPU 300 reads the area flag stored in the rewrite detection/flag generation circuit 303, and resets the flags in the rewrite detection/flag generation circuit 303 to prepare for the next rewrite access. Note that this reset operation may be realized using a hardware means so as to be performed simultaneously with the read operation.

The CPU 300 detects the set bit from the read area flag, i.e., a rewritten area. In order to transfer data of the detected rewritten area from the VRAM 301 to the binary halftone processing circuit 305, the CPU 300 outputs the start address (normally, the address of the left corner of the screen) of the transfer start line and data indicating the number of lines of image data to be transferred from the start address position to the line address generation circuit 304.

In this case, when the CPU 300 detects that data is written in, e.g., the 10th area of the VRAM 301, i.e., in an area corresponding to the 320th to 351st lines, it controls the line address generation circuit 304 to transfer data from the start pixel address of a line five lines before the 320th line in place of outputting the address of the start pixel of the 320th line and an instruction for transferring data for 32 lines from the output address position. That is, the CPU 300 controls the circuit 304 to issue a transfer instruction for data of 315th to 351st lines.

The reason for this processing is as follows. In general, when error diffusion processing is performed, a two-dimensional matrix having weighted element values (values each indicating the distribution ratio) is used so as to diffuse a generated error to non-processed pixels. The generated error propagates to pixels in turn. In this case, two pixels A and B are assumed, and the influence of an error generated upon execution of the binary processing at the position of the pixel A on the position of the pixel B (non-processed pixel) will be examined below.

In this case, the influence of the error generated at the pixel A on the pixel B becomes smaller as the distance between the pixels A and B is larger. In other words, if the two pixels are separated by a relatively large distance, the influence of the error generated at the pixel A on the position of the pixel B is negligibly small. The above-mentioned five lines are determined based on this reason.

The distance at which the influence of an error can be ignored is determined depending on the size and weighted element values of the error diffusion matrix. The error diffusion processing in the binary halftone processing circuit 305 is performed from the upper left corner to the lower right corner of an image in consideration of the above-mentioned fact.

The CPU 300 supplies an instruction indicating a portion to be output of line data as the binary halftone processing result to the binary halftone processing circuit 305.

More specifically, as described above, when data is written in the area corresponding to the 320th to 351st lines of the VRAM 301, data of the 315th to 351th lines are transferred to the binary halftone processing circuit 305. In this case, the CPU 300 instructs the binary halftone processing circuit 305 to output data of the 320th to 351th lines.

As a result, the binary halftone processing circuit 305 outputs data of the 320th to 351st lines, which are influenced by an image of a non-changed portion before the 319th line, to the frame memory control circuit 307.

The frame memory control circuit 307 writes the data in units of lines (4 bits per pixel), which are output from the binary halftone processing circuit 305, in the corresponding area of the frame memory 306 on the basis of an instruction from the CPU 300. More specifically, since the CPU 300 recognizes the number of lines output from the binary halftone processing circuit and which line of an image the first line corresponds to, and sets the address of input lines (i.e., the write start address for the frame memory 306) and the number of lines of data to be continuously written in the frame memory control circuit 307.

In this manner, an image of only a rewritten portion (updated image), which has a natural boundary portion with a non-rewritten image, is written in the frame memory 306. Note that the frame memory control circuit 307 generates the above-mentioned interrupt signal upon completion of storage of data transferred from the binary halftone processing circuit 305 in the frame memory 306 for an area designated by the CPU 300.

The processing speed of the binary halftone processing circuit 305 of this embodiment is about 1/30 sec per frame at present. This speed is about half of the vertical synchronization signal (about 60 Hz) of a CRT. However, it is rare to rewrite data on the entire frame as long as a normal application program is used. In other words, the number of lines to be processed by the binary halftone processing circuit 305 is not so large in practice, and since the amount of data to be processed is small, the period required until the processing is completed on the entire frame is roughly equal to the display updating period of the CRT or may even be shorter than that of the CRT if an area to be processed is half the frame or less.

The frame memory control circuit 307 also receives an output instruction to the FLCD 3 from the CPU 300 (to be described in detail later). The output instruction instructs a line from which the transfer is to be started (the start address of lines) and the number of lines to be transferred (the number of continuous lines). Upon completion of this transfer, the frame memory control circuit 307 outputs an interrupt signal informing the CPU 300 of it, as was mentioned earlier.

The format of data to be transferred from the frame memory control circuit 307 to the FLCD 3 is:

write line address+RGBI+RGBI+ . . . RGBI

Upon reception of the data, the FLCD 3 uses the subsequent data for driving the FLCD 3 in accordance with the start address.

On the other hand, the binary halftone processing circuit 305 often outputs the processing results of a plurality of discontinuous areas, and a transfer instruction to the FLCD 3 is issued to the frame memory control circuit 307 after a completion message of previous data transfer to the FLCD is received. For this reason, image data written in the frame memory 306 are not always those to be output to the FLCD 3. That is, as described above, since image data are processed via the frame memory 306, the write operation to the VRAM 301 and the output operation to the FLCD 3 are asynchronously processed.

Figure 4:
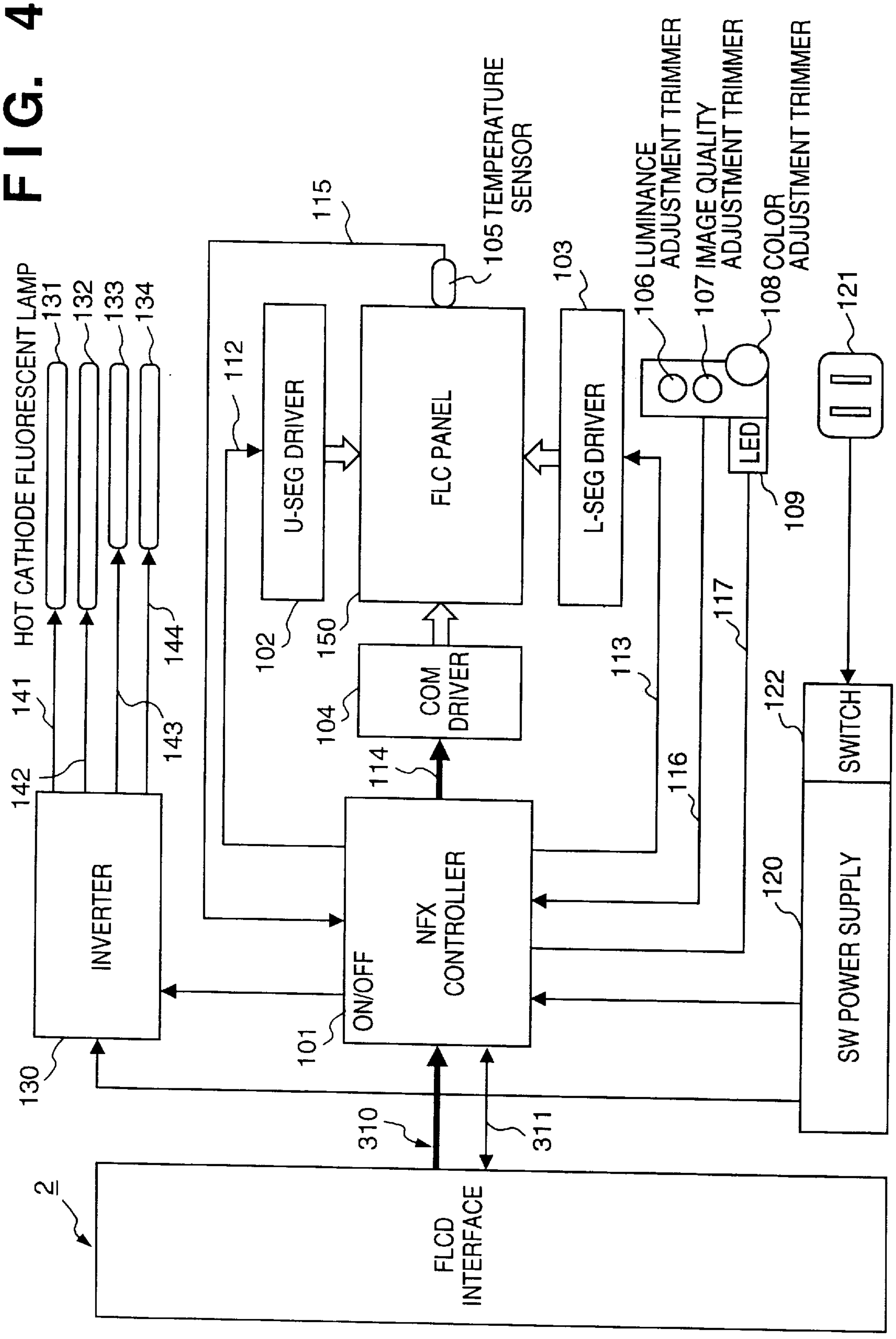
FIG. 4 is a block diagram showing the arrangement of an FLCD in the embodiment shown in FIG. 1.
Figure 5:
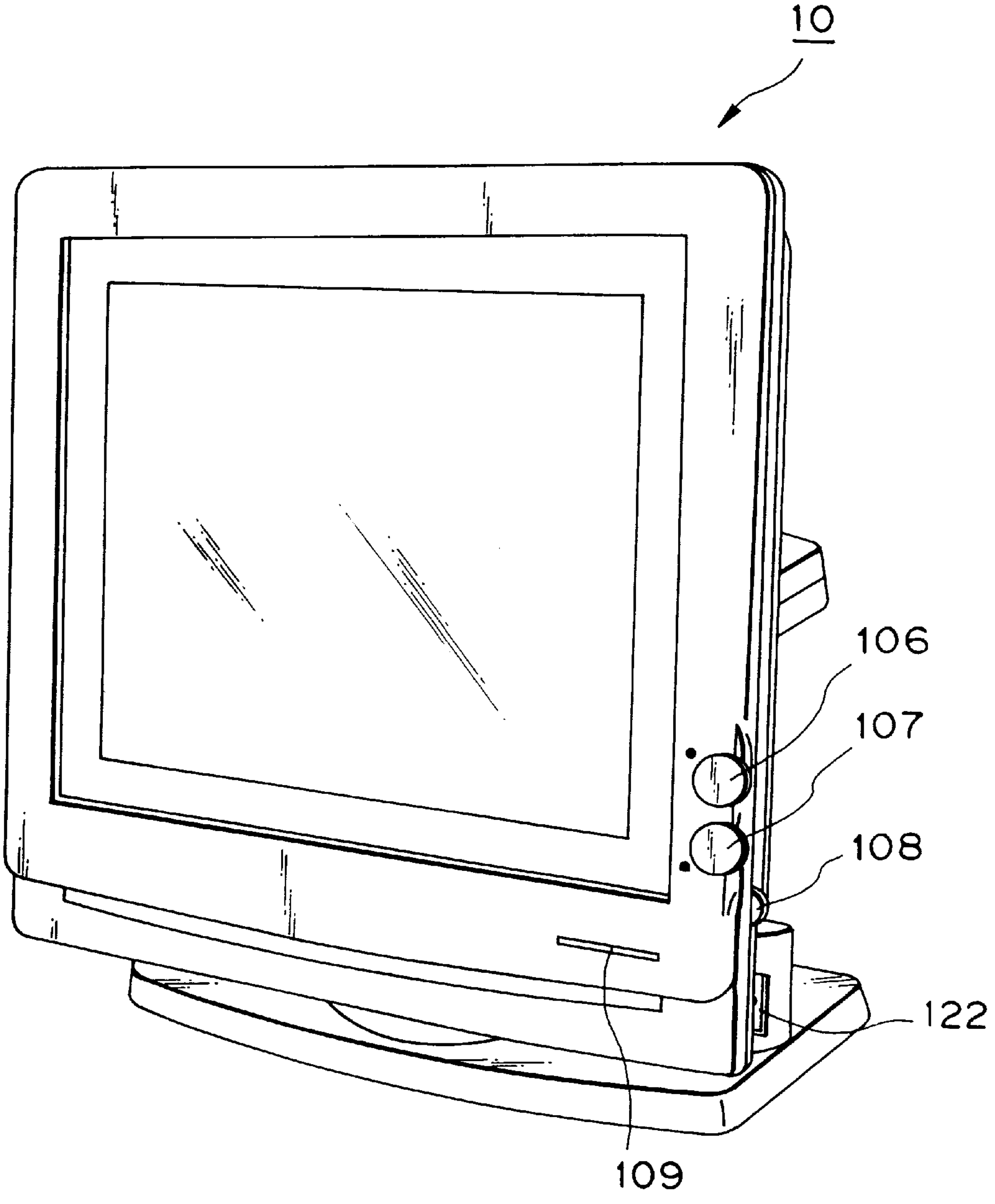
FIG. 5 is a perspective view showing the outer appearance of a display apparatus of the embodiment shown in FIG. 1.
Figures 6A, 6B:
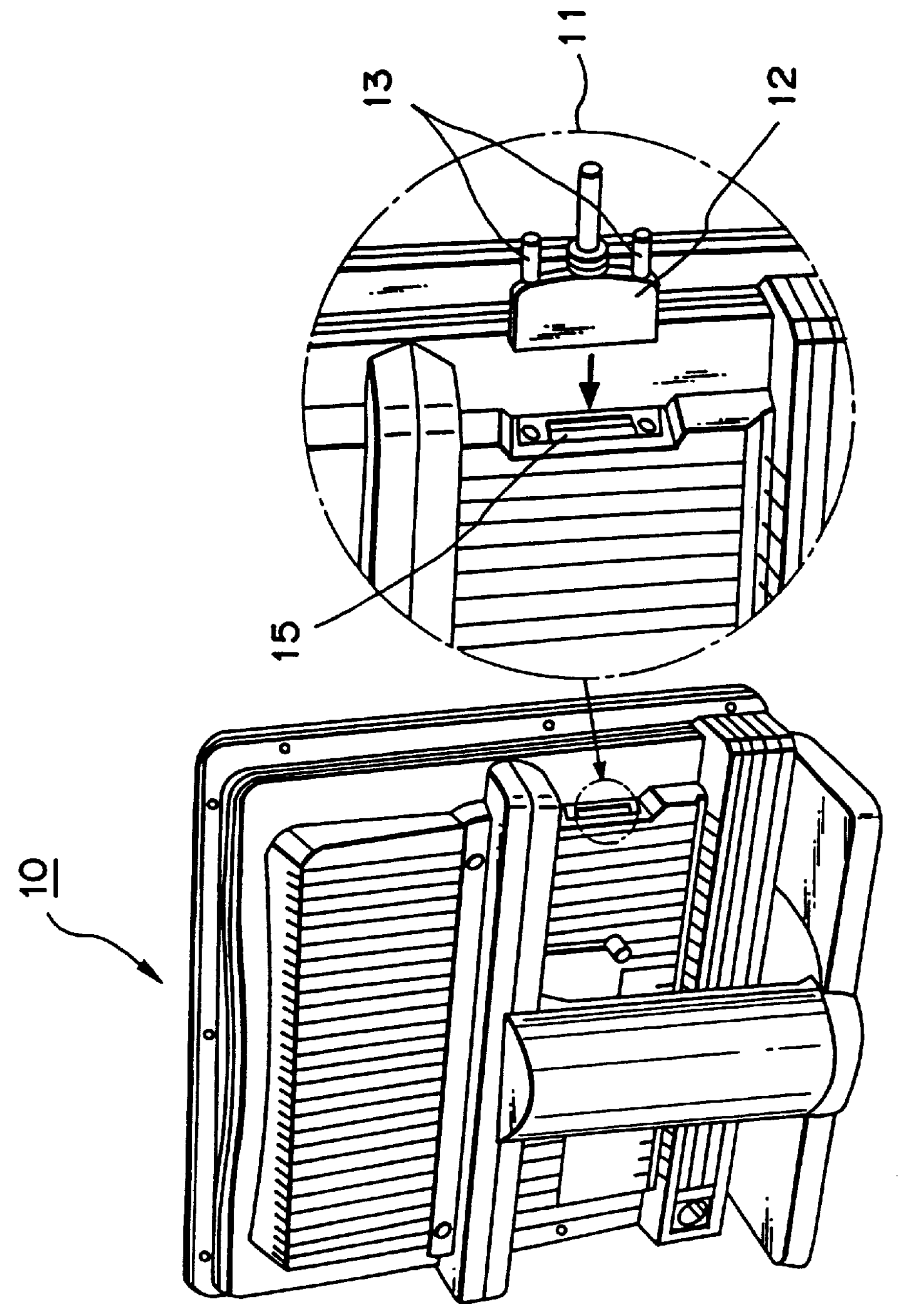
FIGS. 6A and 6B are perspective views showing the connection portion of the display apparatus of the embodiment shown in FIG. 1 with respect to the host side.

The detailed arrangement of the FLCD 3 shown in FIG. 1 will be described below with reference to FIGS. 4 to 6. FIG. 4 is a schematic block diagram showing the arrangement of the FLCD 3 of this embodiment, FIG. 5 is a perspective view showing the outer appearance of the FLCD 3 of this embodiment, and FIG. 6 is a perspective view showing the connection portion of the FLCD 3 with the host side (the FLCD interface side).

Referring to FIG. 4, reference numeral 101 denotes an NFX controller for performing various kinds of principal control; 102, a U-SEG driver for driving signal lines of U-segment display elements on the FLC panel 150; and 103, an L-SEG driver for driving signal lines of L-segment display elements. These two drivers 102 and 103 alternately drive every other segments of the display elements. Reference numeral 104 denotes a COM driver serving as a driver of common signal lines of the display elements on the FLC panel 150.

Each display pixel on the FLC panel 150 of this embodiment is activated when a segment driving signal as a driving signal line, in the column direction, of a display element matrix, and a common driving signal as a driving signal line, in the row direction, of the matrix are simultaneously driven. As described above, the segment driving signal is driven by the two drivers 102 and 103. That is, the U-SEG and L-SEG drivers 102 and 103 alternately drive every other segment signal lines of the FLC panel 150 to attain dispersed mounting of circuits, thereby averaging the heat generation amount, and the like.

Reference numeral 105 denotes a temperature sensor which is arranged to be in direct contact with the FLC panel surface, and measures the temperature of the FLC panel 150; 106, a luminance adjustment trimmer used for adjusting the luminance; 107, an image quality adjustment trimmer used for adjusting image quality; 108, a color adjustment switch used for adjusting colors; and 109, an LED serving as a state information means for informing the state (to be described in detail later) of the FLC panel 150. In this embodiment, the LED 109 is arranged on the lower right portion of the FLCD 3, as shown in FIG. 5.

Reference numeral 120 denotes a switching power supply for generating various driving power supply voltages for the FLCD 3 of this embodiment. The switching power supply 120 can receive electric power from a commercial power supply 121 via a power switch 122 that controls power supply. Note that this power switch 122 is also arranged on the lower right portion of the FLCD 3, as shown in FIG. 5. In this embodiment, the FLCD 3 can operate using AC power supplies of various voltages ranging from 85 V to 264 V (48 Hz to 62 Hz), so that it can be used in various countries.

Reference numeral 130 denotes an inverter for driving fluorescent lamps (hot cathode fluorescent lamps) 131 to 133 for illuminating the FLC panel 150 of this embodiment with light.

The FLCD 3 of this embodiment with the above arrangement can realize a very low-profile display apparatus since it uses the FLC panel 150. In this embodiment, connection to (the host 1 and) the FLCD interface 2 is attained via the interface cable 7, and connection to the FLCD 3 is attained by fixing a connector 12 of the cable to a receiving connector 15 arranged on the back surface of the display apparatus using fixing screws 13, as indicated by reference numeral 11 in FIG. 6B. That is, in this embodiment, the display apparatus and the interface unit can be connected by connecting only the single cable 7.

Figure 7:
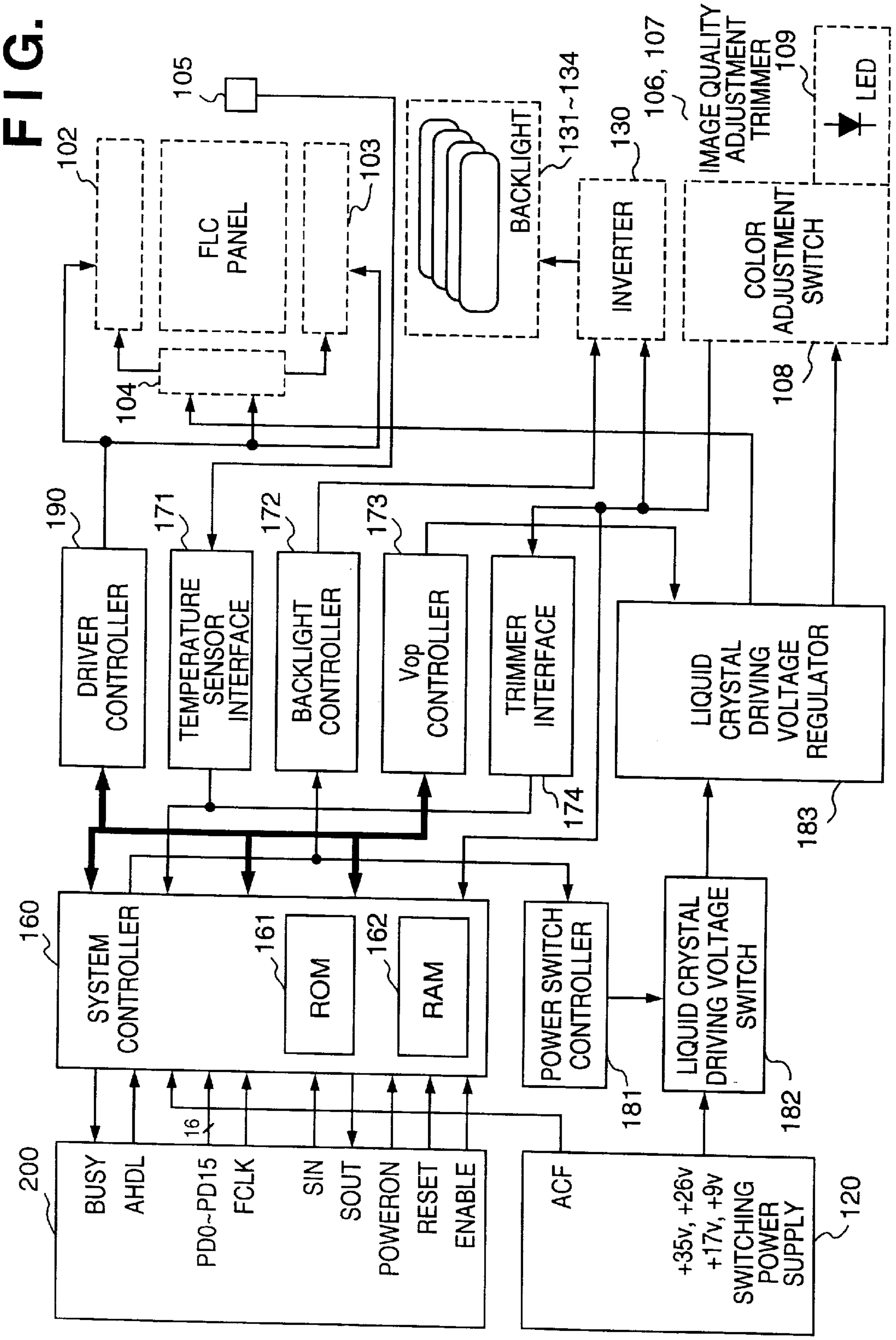
FIG. 7 is a detailed block diagram showing the arrangement of an NFX controller shown in FIG. 4.

FIG. 7 shows the detailed arrangement of the NFX controller 101 shown in FIG. 4.

Referring to FIG. 7, reference numeral 160 denotes a system controller, which may be constituted by a microcomputer or the like. The system controller 160 performs various kinds of display control (to be described later) of the FLCD 3 of this embodiment, and displays display data received from the FLCD interface 2 on the FLC panel 150 via a driver controller 190. Note that the system controller 160 incorporates a ROM 161 and a RAM 162, and performs various kinds of control in accordance with control sequences (to be described later) stored in the ROM 161.

Various status data of the system controller 160 and the storage contents of the RAM 162 of this embodiment can be read out by the host side via the FLCD interface 2, and some of them can be directly written. This data will be described in detail later.

Reference numeral 171 denotes a temperature interface for converting the temperature detected by the temperature sensor 105 into an analog signal, and supplying the analog signal to the system controller; 172, a backlight controller for controlling the inverter 130 to control the light amounts of the hot cathode fluorescent lamps 131 to 134 (backlights); 173, a Vop controller for controlling a liquid crystal driving voltage regulator 183 to control the image quality of the FLC panel 150; and 174, a trimmer interface for supplying the setting values of the luminance adjustment trimmer 106 and the image quality adjustment trimmer 107 to the system controller 160, and supplying the setting state of the color adjustment switch (SESW) 108 to the system controller.

Reference numeral 181 denotes a power switch controller for controlling the driving power supply voltage of a liquid crystal driving power switch 182; 182, a liquid crystal driving power switch for controlling supply of the driving power supply voltage to the FLC panel 150; and 183, a liquid crystal driving voltage regulator.

Input/output signals to/from the FLCD interface 2 will be explained below.

Reference numeral 200 denotes an interface chip for making information communications with the FLCD interface 2. The interface chip 200 is connected to the connector 15. That is, the interface chip 200 inputs/outputs data to/from the data transfer bus 310 and the serial communication line 311.

Reference symbol BUSY denotes an image data request signal to the host side; and AHDL, a scan address/image data identification signal supplied from the host side (in practice, the FLCD interface 2). When the signal AHDL is "H", it indicates a scan address; when the signal AHDL is "L", it indicates image data. Reference symbols PD0 to PD15 denote 16-bit image data with an address; FCLK, an image data transfer clock supplied from the host side; SIN, serial communication data supplied from the host side; SOUT, serial communication data supplied from the FLCD 3 to the host side; POWERON, a power-ON signal indicating that a power supply voltage is supplied to the FLCD Interface 2; RESET, an FLCD reset signal supplied from the host side; and ENABLE, a signal unique to this embodiment, i.e., a connector connection signal indicating connection with the FLCD interface 2 and having a negative logic format. When the cable 7 shown in FIG. 6 is disconnected, the signal ENABLE does not change to low level, and the disconnection of the cable can be easily recognized at the FLCD 3 side. When the disconnection of the cable is recognized, the subsequent display data is not received, and the display screen is not updated. In such a case, when the display mode of the display apparatus merely changes to a sleep mode as a power saving operation mode (to be described later) which is set when no new display data is input, the user cannot accurately recognize the disconnection, and may not take any countermeasure against it for a long period of time.

However, in this embodiment, since the user can accurately and quickly recognize the disconnection of the cable, and the display mode of the above-mentioned LED 109 is set to be different from the power saving operation mode, the user can easily recognize the current state such as the disconnection of the cable, and can quickly take a countermeasure against it.

Figure 8:
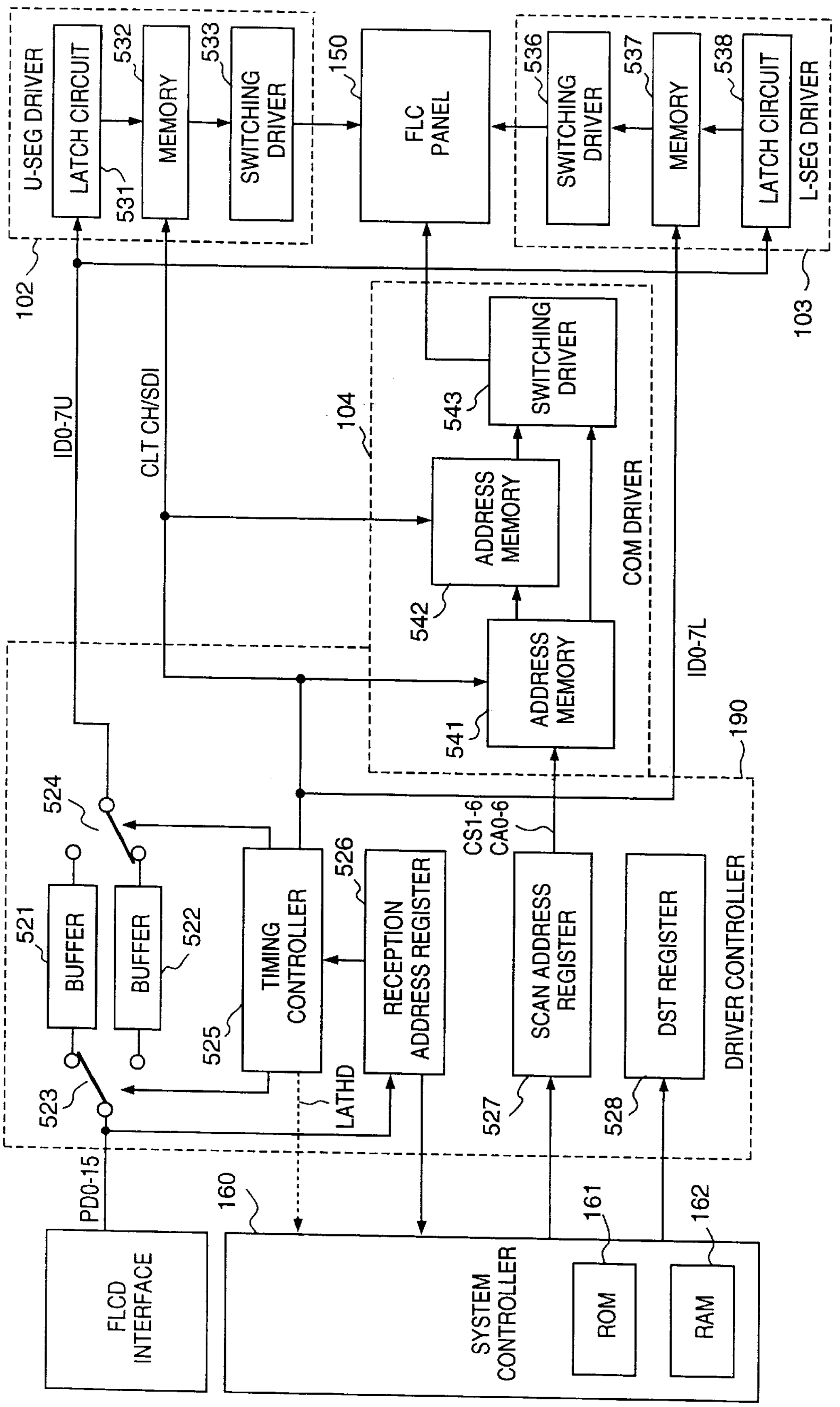
FIG. 8 is a detailed block diagram showing the arrangement of a portion associated with input/output operations of image data in FIG. 7.

FIG. 8 shows the detailed arrangement of the portion associated with the input/output operations of image data in FIG. 7.

Image data are supplied to and displayed on the FLC panel mainly by the driver controller 190 and the drivers 102 to 104 for the FLC panel 150.

The driver controller 190 comprises at least the following arrangement: two buffers 521 and 522 each of which can store image data (PD0 to PD15) for at least one line supplied from the system controller 160, and input- and output-side switches 523 and 524 for controlling the switching operation of these buffers 521 and 522. The controller 190 switches these switches 523 and 524 to output display image data ID0U/L to ID7U/L to the segment drivers 102 to 103 to display data.

Also, the controller 190 comprises a timing controller 525 for generating various driving timing signals of the FLC panel 150, including control signals for these switches, and a reception address register 526 for holding the line address which is supplied from the FLCD interface 2 and at which display data is to be displayed, and allowing the system controller 160 to read out its contents.

Furthermore, the controller 190 comprises a scan address register 527 whose contents can be written by the system controller 160 and which holds address data corresponding to display data, and a DST register 528 in which display start (DST) data for instructing start of execution of the display control is written by the system controller 160. When the DST data is written in the DST register 528, a write operation of one scan line of the FLC panel is started.

The U-SEG driver 102 comprises a U-SEG latch circuit 531 for latching every other data corresponding to U-SEG of display data supplied from the buffer (521 or 522), a U-SEG memory 532 for storing display data latched by the U-SEG latch circuit 531 in accordance with a driving timing signal supplied from the timing controller 525, and a driver circuit 533 for driving a U-SEG signal in accordance with the display data stored in the memory 532.

The L-SEG driver 103 comprises an L-SEG latch circuit 538 for latching every other data corresponding to L-SEG of display data supplied from the buffer (521 or 522), an L-SEG memory 537 for storing display data latched by the L-SEG latch circuit 538 in accordance with a driving timing signal supplied from the timing controller 525, and a driver circuit 536 for driving an L-SEG signal in accordance with the display data stored in the memory 537.

The COM driver 104 comprises an address memory 541 for storing address information supplied from the scan address register 527 in accordance with a timing signal supplied from the timing controller 525, an address memory 542 for storing the contents of the address memory 541 in accordance with a timing signal from the timing controller 525, and a switching driver 543 for outputting the former half of scan selection signals to selected common signal lines in accordance with the address information stored in the address memory 541, and outputting the latter half of scan selection signals to the selected common signal lines in accordance with the address information stored in the address memory 542.

More specifically, in order to drive the FLC panel 150 to display an image for one line, the data of the line is temporarily cleared, and thereafter, the line is driven in accordance with the received data. Therefore, the address memories 541 and 542 store the address of the line to be cleared and the address of the cleared line to be driven to display data.

Figure 9:
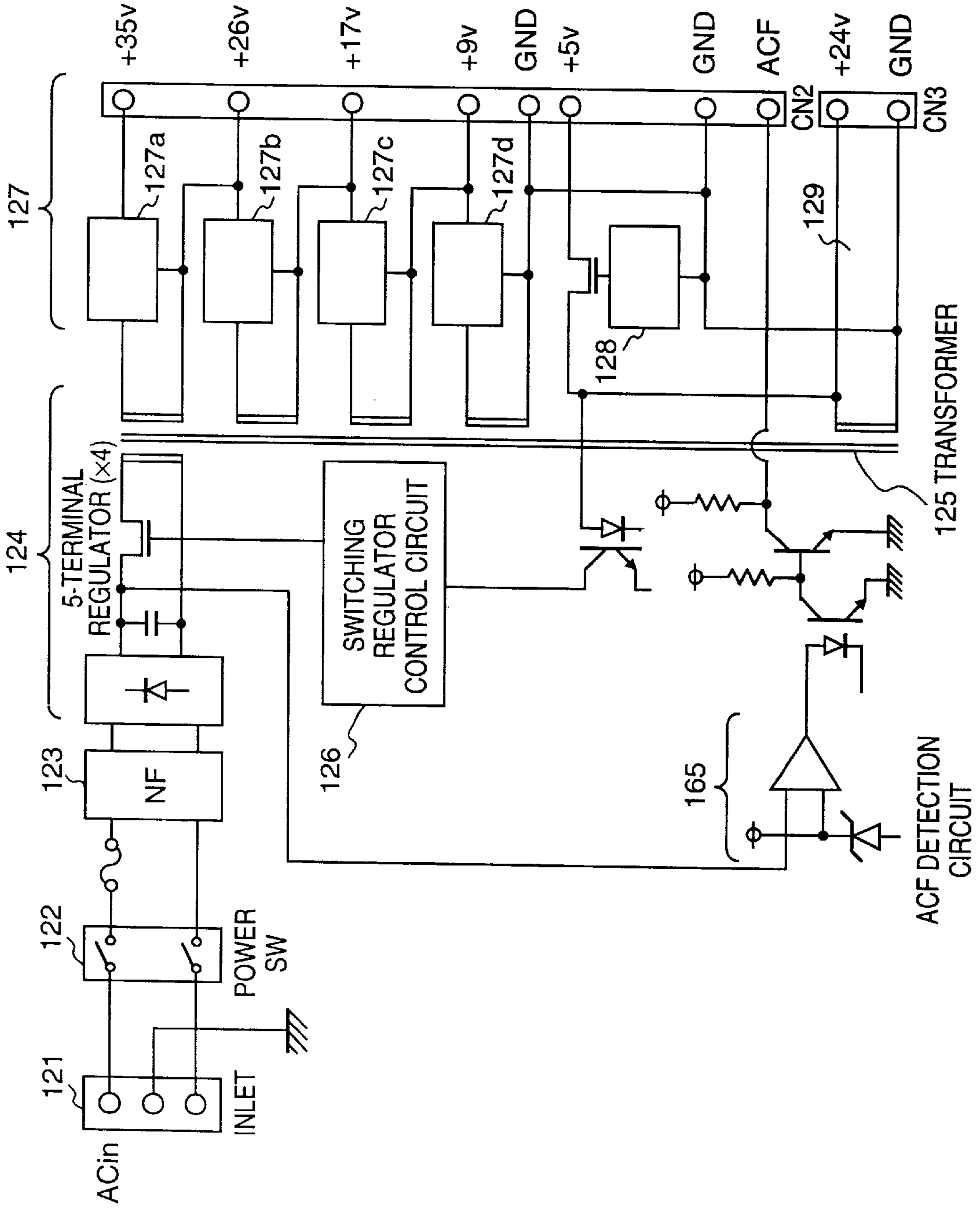
FIG. 9 is a detailed block diagram showing the arrangement of a switching power supply 120 shown in FIG. 2.

FIG. 9 shows the detailed arrangement of the detailed arrangement of the switching power supply 120 shown in FIG. 4.

The switching power supply 120 removes noise components mixed in electric power received via the power switch 122 using a noise filter 123, then generates a predetermined high-frequency signal using a switching circuit 124 including a switching regulator control circuit 126 and a transformer 125, and supplies the generated signal to a +5-V power supply circuit 128 for a 5-terminal regulator 127 and logic circuits, and a backlight driving power supply circuit 129 constituted by the hot cathode fluorescent lamps 131 to 134. Note that the 5-terminal regulator 127 is constituted by four circuits 127*a* to 127*d* for generating DC power supply voltages of +35 V, +26 V, +17 V and +9 V with reference to the potential at the GND terminal. Reference numeral 165 in FIG. 9 denotes an ACF detection circuit, which detects stop of electric power supplied to the switching power supply 120. The output signal (ACF signal) from the ACF detection circuit 165 serves as an emergency interrupt signal to the system controller 160.

Figure 10:
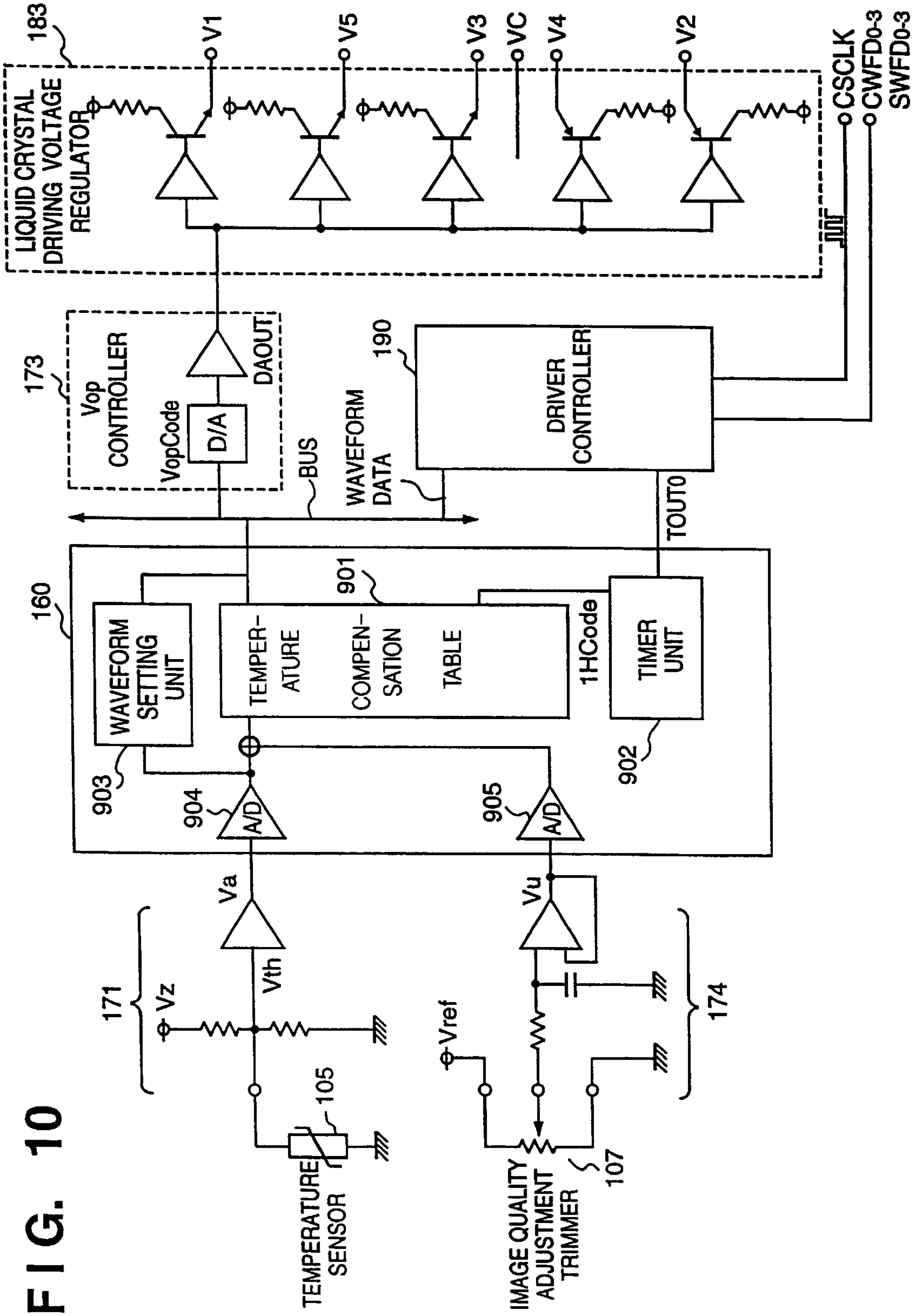
FIG. 10 is a block diagram showing the arrangement of a portion associated with temperature compensation in the display apparatus of the embodiment shown in FIG. 1.

In the display apparatus of this embodiment, the temperature sensor 105 is provided to the FLC panel 150 so as to obtain good display quality irrespective of variations in ambient temperature, and the driving voltage, the one-scan line driving time (1H), and the driving waveforms are selected to be optimal values on the basis of the detected temperature, thus performing the driving control of the FLC panel. FIG. 10 shows the arrangement of the portion associated with the temperature compensation.

In this embodiment, an analog signal corresponding to the temperature detected by the temperature sensor 105 and input via the temperature sensor interface 171 is converted into digital temperature information by an analog-to-digital (A/D) converter 904. An analog signal input from the image quality adjustment trimmer via the trimmer interface 174 is converted into a digital signal by an A/D converter 905, and the digital signal is added to the digital temperature information to finely adjust the temperature information. A temperature compensation table 901 is searched using the adjusted temperature information to obtain a Vop code for determining the driving voltage and a 1H code for determining the 1H time.

The Vop code is supplied to a digital-to-analog (D/A) converter constituting the Vop controller 173 and is converted into an analog signal DAOUT. The liquid crystal driving voltage regulator 183 generates liquid crystal driving voltages V1, V5, V3, V4, and V2 on the basis of the analog signal DAOUT.

The 1H code is set in a timer unit in the system controller to generate fundamental clocks for the liquid crystal driving operation. The fundamental clocks are supplied to the driver controller 190, and are also supplied to the U-SEG, L-SEG, and COM drivers as clocks CSCLK.

The driving waveform is determined by a waveform setting unit 903 on the basis of the temperature information output from the A/D converter 904 before being adjusted by the image quality trimmer. That is, the driving waveform does not depend on the operation of the image quality adjustment trimmer by the user. The waveform setting unit 903 selects an optimal waveform from predetermined waveforms on the basis of the temperature information, and sets the selected waveform in the driver controller 190 as waveform data. In synchronism with the clocks CSCLK, the waveform data is supplied to the U-SEG and L-SEG drivers as data SWFD0 to SWFD3, and is also supplied to the COM driver as data CWFD0 to CWFD3. As will be described later, the driving waveform of this embodiment defines the 1H time by five clocks CSCLK, and the 1H time is adjusted to an optimal value for the temperature of the FLC panel by varying the pulse width of the clocks CSCLK.

Note that the operation of the driver controller 190 will be described later.

Exchange of display data, various control commands, and the like between the FLCD interface 2 and the FLCD 3 in this embodiment with the above arrangement will be explained in detail below.

Data (the write line address+RGBI+RGBI ) from the above-mentioned FLCD interface 2 are transferred via the data transfer bus 310, the write start address at the beginning of the data is stored in the reception address register 526, and the subsequent pixel data RGBI, RGBI, . . . are stored in one of the buffers 521 and 522. The system controller 160 reads the address stored in the reception address register 526, and writes it in the scan address register 527. Thereafter, the system controller 160 instructs the DST register 528 to start a driving operation of one scan line. The system controller 160 generates data transfer request signals to the FLCD interface 2 at time intervals depending on the temperature detected by the temperature sensor 105.

On the other hand, upon reception of, e.g., a transfer request for 32 lines from the CPU 300, the frame memory control circuit 307 of the FLCD interface 2 outputs data in units of lines in accordance with the above-mentioned format every time it receives a data transfer request from the FLCD 3. In this manner, when the frame memory control circuit 307 has completed transfer of all the designated lines, does not receive the next transfer request instruction, and receives another data transfer request from the FLCD 3, it supplies a message indicating it to the CPU 300 as an interrupt signal.

Upon reception of the message, the CPU 300 checks if non-transferred data of the partially rewritten image still remain. If no data remains, the CPU 300 instructs to transfer image data for the entire frame stored in the frame memory 306 to the FLCD 3 in an interlace mode. More specifically, every time the CPU 300 receives this interrupt signal, it supplies an instruction to the frame memory control circuit 307 to transfer data in units of lines in the order of, e.g., the first line, the third line, . . . , the 1,023rd line, the second line, . . . , the 1,024th line. In practice, upon reception of a transfer request signal from the FLCD 3, the CPU 300 designates a line to be transferred upon reception of the next transfer request signal. The control on the side of the FLCD 3 will be described later.

The reason why data is transferred in the interlace mode when the image does not change is as follows.

Since the FLCD 3 used in this embodiment has a function of storing and holding a displayed image, an image corresponding to only a changed portion need only be transferred in principle. However, the present inventors found that an image portion which does not change and is not refreshed, and an image portion which has changed and is newly driven and displayed (partially rewritten) have a slight luminance difference therebetween.

More specifically, when an image displayed on the FLCD 3 of this embodiment is to be partially updated, only the updated portion of the image displayed on the FLCD is updated, but when the displayed image does not change, processing for transferring the entire image in the frame memory 306 to the FLCD 3 in an interlace manner is performed. The reason why the image is transferred in the interlace manner in place of sequentially transferring the respective lines is to apparently accelerate the updating operation of the displayed image since a liquid crystal display normally has a low response speed.

Figure 11:
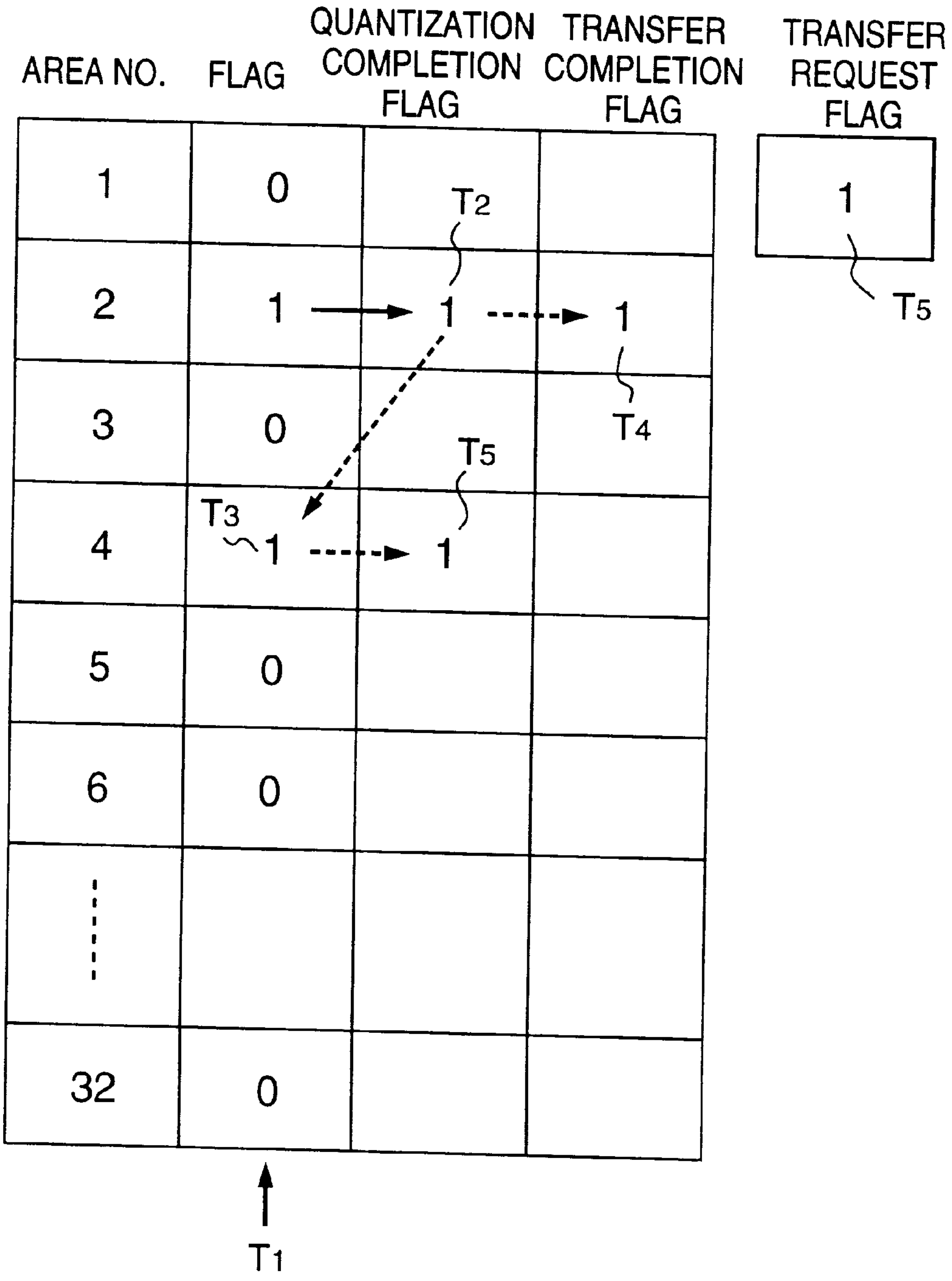
FIG. 11 is a table showing the flag transition state during the operation of a CPU in the FLCD interface of the embodiment shown in FIG. 1.

The operation processing sequence of the CPU 300 in the FLCD interface 2 will be described below with reference to FIG. 11 in accordance with the above-mentioned processing contents. In FIG. 11, "flag" is flag information obtained from the rewrite detection/flag generation circuit 303 (see FIG. 3).

The respective flags used in the following description have the following meanings.

A) Quantization Completion Flag:

This flag holds information indicating whether or not the frame memory control circuit 307 has completed the storage operation of image data output from the binary halftone processing circuit 305 in the frame memory 306.

B) Transfer Completion Flag:

This flag holds information indicating whether or not the frame memory control circuit 307 has completed the transfer operation of an image at the position designated by the CPU 300 to the FLCD 3.

C) Transfer Request Flag:

This flag holds information indicating whether or not the FLCD 3 has issued the next data transfer request. Note that this transfer request flag is not set unless the frame memory control circuit 307 has completed the transfer operation of data for lines designated by the CPU 300 (because the transfer request signal during this interval is used for determining the transfer timing of the frame memory control circuit 307, and an interrupt signal for this transfer request signal is not generated).

Assume that the area flag (32 bits) read from the rewrite detection/flag generation circuit 303 is as shown in FIG. 11 (timing T1).

In this case, the CPU 300 can detect the area position (to be referred to as an "area No." hereafter) "2" where "1" is set first by checking the area flag from the beginning. Then, the CPU 300 calculates the address and the number of lines to be respectively set in the frame memory control circuit 307, the binary halftone processing circuit 305, and the line address generation circuit 304, and sets the calculated data in the respective circuits in the above-mentioned order.

The reason why the data are set in the frame memory control circuit 307 first is that the respective circuits perform their operations when their enable signals (see FIG. 3) are enabled, and a problem occurs when a circuit may output data although a subsequent circuit is not ready, if the data are set in the opposite order.

When the address and the number of lines are set in the last line address generation circuit 304, the SVGA chip 302 sets the enable signal of the lower-level binary halftone processing circuit 305 in response to the setting data as a trigger signal, and begins to transfer data.

The binary halftone processing circuit 305 generates 4-bit R, G, B, and I image data by the error diffusion processing on the basis of 8-bit R, G, and B data. In this case, when the processing of the circuit 305 has reached the line (fifth line) set by the CPU 300, the circuit 305 sets the enable signal to the subsequent frame memory control circuit 307 and outputs the processing result.

The frame memory control circuit 307 sequentially stores the processed image data received from the binary halftone processing circuit 305 from the address position, designated by the CPU 300, of the frame memory 306. Upon completion of the storage processing, the frame memory control circuit 307 outputs an interrupt signal indicating completion of storage to the CPU 300. Upon reception of this interrupt signal, the CPU 300 sets the quantization completion flag (timing T2), and issues a transfer instruction (sets the address and the number of lines) to the FLCD 3 with respect to the frame memory 307.

The CPU 300 searches the area flag for a set area No. in addition to area No. "2". If the CPU 300 finds the set area No. in addition to area No. "2", it performs the same processing described above for the found area. In FIG. 11, since the CPU 300 recognizes that data were written in the area corresponding to area No. "4", it performs the processing up to the storage operation in the frame memory 306 in association with area No. "4". Upon completion of this storage processing (timing T3), the CPU 300 repeats the same processing as described above for the set area Nos. in the area flag.

In this state, when the CPU 300 receives, from the frame memory control circuit 307, an interrupt signal indicating that the transfer operation associated with the previously transfer-instructed area No. "2" is completed, it sets "1" in the transfer completion flag for area No. "2" (timing T4), and checks if there is another area No. with a quantization completion flag="1". If the CPU 300 finds another area No. with a quantization completion flag="1", it instructs a transfer operation to the FLCD 3.

Note that the timings T4 and T3 are determined depending on the data amount to be processed and are indefinite.

When the CPU 300 receives a transfer completion message, and there is no data to be transferred at that timing, the frame memory control circuit 307 outputs an interrupt signal based on the data transfer request signal from the FLCD 3 (timing T5). Upon reception of this interrupt signal, the CPU 300 reads the area flag of the rewrite detection/flag generation circuit 303.

If the read area flag includes no "1" bits, the CPU 300 sets the address of one line to be transferred so as to perform an interlace transfer operation of the frame memory 306 (interlaced transfer of every other lines), as described above. Upon completion of this transfer operation, the frame memory control circuit 307 receives a data transfer request signal from the FLCD 3. At that time, since the data transfer operation for one line has been completed, the circuit 307 outputs an interrupt signal to the CPU 300.

Every time the CPU 300 receives this interrupt signal, it reads the area flag from the rewrite detection/flag generation circuit 303. While all the bits are "0", the CPU 300 continues the above-mentioned interlace-transfer operation.

As described above, according to this embodiment, when the CPU 300 reads the area flag shown in FIG. 11 and finds at least one area No. set with "1" from the read flag, it performs the processing as if the area flag shifted to the right along the flag table shown in FIG. 11.

An example of the processing of the CPU 300 for realizing the processing of the FLCD interface 2 in this embodiment will be described below with reference to the flow charts of FIGS. 12 to 15. The following control sequences are stored in, e.g., the ROM 308.

Figure 12:
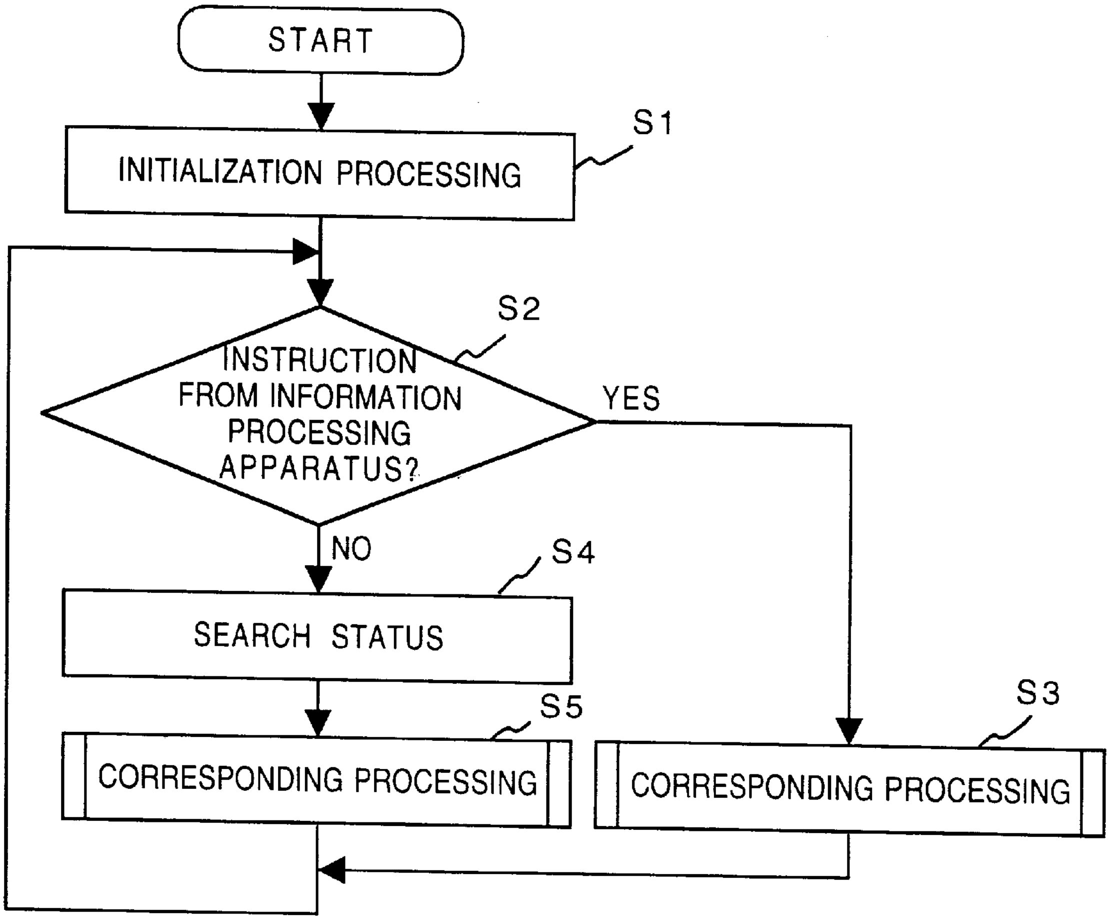
FIG. 12 is a flow chart showing the main processing routine of the CPU in the FLCD interface of the embodiment shown in FIG. 1.

FIG. 12 is a flow chart showing the main processing routine of the CPU 300 in the FLCD interface 2 of this embodiment.

When the FLCD interface 2 is powered, the processing shown in FIG. 12 is started. In step S1, a series of initialization processing operations such as initialization of the respective circuits in the FLCD interface 2 are executed. In this case, commands such as Unit Start, and the like are issued to the FLCD 3, and corresponding status data are received from the FLCD 3.

It is checked in step S2 via a bus 102 (reference numeral 6 in FIG. 1) of the host 1 if a state instruction associated with the display operation such as a change in the number of display dots, or the like is received. If YES in step S2, the flow advances to step S3, and environment information is set in the respective circuits 305 to 307 (e.g., the rewrite detection/flag generation circuit 303) so as to realize the instructed processing, e.g., to attain the instructed number of display dots.

On the other hand, if NO in step S2, the flow advances to step S4 to find the current condition. Subsequently, in step S5, processing example, the display performance of the FLCD according to the current condition is performed. For 3 may be changed.

The FLCD 3 of this embodiment has display performance of 1,280×1,024 dots. For example, upon reception of an instruction for changing the number of display dots to 1,024×768 dots from the host 1, an image is preferably displayed at the center of the display screen so an operator can naturally observe it. In this embodiment, in the processing in step S3, display screen change processing, or the like for realizing it is performed. For example, the rewrite detection/flag generation circuit 303 performs the above-mentioned processing by dividing the rewritten address by the number of bytes for one line so as to specify the rewritten line position. In this case, the number of bytes for one line is determined by the number of display dots.

At the same time, the FLCD 3 side must perform the corresponding processing. For this purpose, a command for realizing the processing is issued from the FLCD interface 2 to the FLCD 3 via the serial communication line 311 to attain a match between the operations.

In the following description, the processing executed upon reception of a display instruction of 1,280×1,024 dots will be exemplified.

When the frame memory control circuit 307 receives a transfer instruction of an image for the number of lines designated by the CPU 300 to the FLCD 3, as described above, it performs a transfer operation in synchronism with a data transfer request signal supplied from the FLCD 3. If the circuit 307 receives a data transfer request signal from the FLCD 3 when it does not receive, from the CPU 300, any transfer instruction to the FLCD 3 or when it has completed the instructed transfer operation, the circuit 307 outputs the data transfer request signal as an interrupt signal to the CPU 300. On the other hand, when the frame memory control circuit 307 receives a series of transfer requests and receives a data transfer request signal from the FLCD 3 during the transfer operation, it does not output the interrupt signal to the CPU 300.

Figure 13:
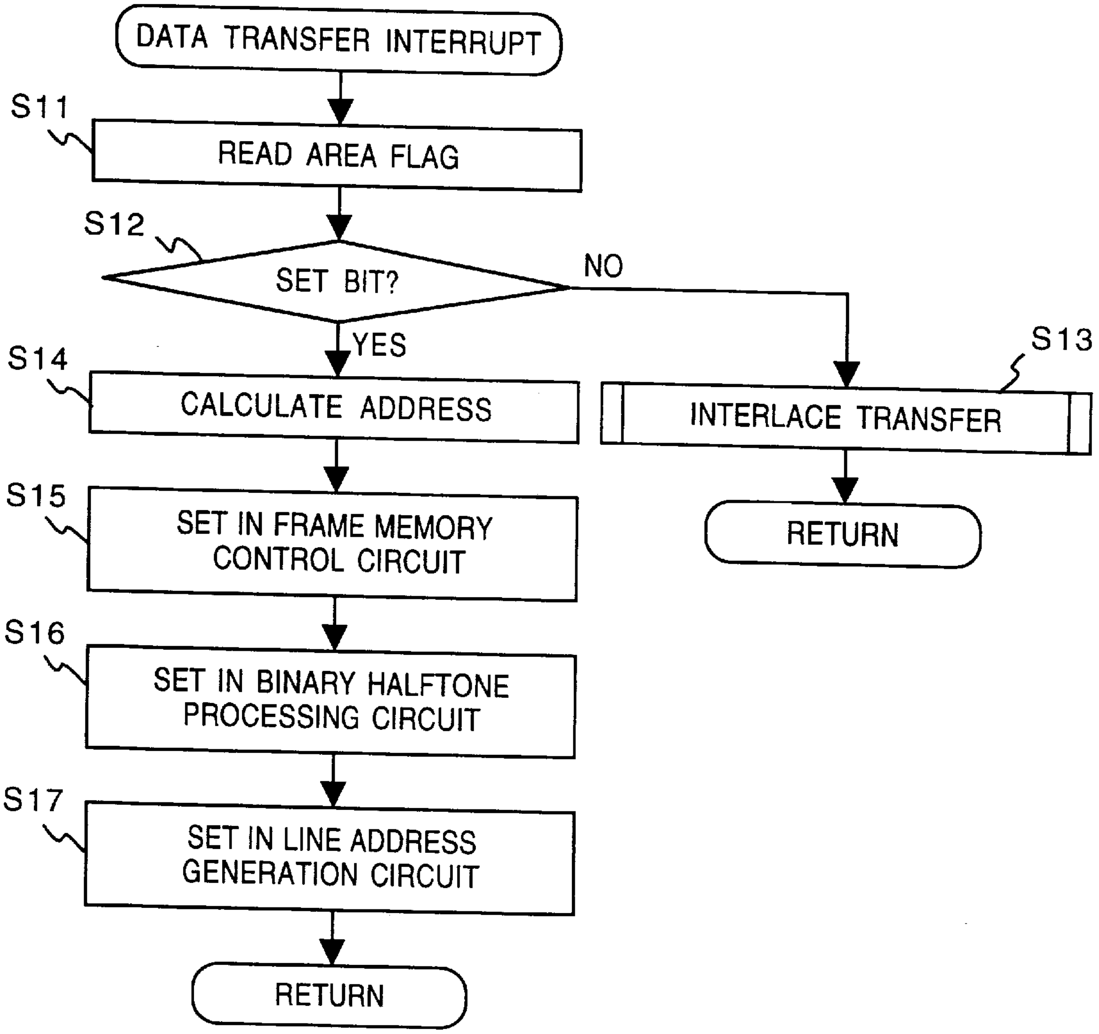
FIG. 13 is a flow chart showing the interrupt routine activated upon reception of a data transfer request signal from a frame memory control circuit in the FLCD interface of the embodiment shown in FIG. 1.

The processing of the CPU 300 upon reception of the interrupt signal, i.e., the interrupt processing upon completion of the transfer operation of data to be sent will be described below with reference to FIG. 13. FIG. 13 is a flow chart showing the interrupt routine of the CPU 300, which is started upon reception of the data transfer request signal from the frame memory control circuit 307.

Upon reception of the data transfer request signal from the frame memory control circuit 307, the CPU 300 reads the area flag (32 bits) from the rewrite detection/flag generation circuit 303 in step S11, and clears the internal area flag to be reset in the rewrite detection/flag generation circuit 303 to zero.

In step S12, the CPU 300 checks if the read area flag includes set bits, i.e., there are rewritten portions. If the CPU 300 determines in step S12 that the flag includes no set bits, i.e., all the bits are "0", the flow advances to step S13 to perform the interlace-transfer processing. More specifically, if no write access to the VRAM 301 is detected, the interlace-transfer operation (for instructing to interlaced-transfer I-line data from the frame memory 306) is performed every time a data transfer request signal is received from the FLCD 3. Upon completion of this processing, the flow returns to the main routine.

On the other hand, if the CPU 300 determines in step S12 that the read area flag includes set bits, the flow advances to step S14 and the CPU 300 calculates the address and the number of lines to be set in the respective circuits. In this case, when bits corresponding to continuous area Nos. "10" to "12" (areas of the 289th to 284th lines) are set, the CPU 300 calculates the address and the number of lines while assuming these areas as one area.

Upon completion of the calculation in step S14, the flow advances to steps S15 to S17, and the CPU 300 sets the corresponding information in the frame memory control circuit 307, the binary halftone processing circuit 305, and the line address generation circuit 304 to start the binary halftone processing (quantization processing). As described above, an address five lines before the start line of the rewritten area is set in the line address generation circuit 304. If the area corresponding to area No. "1" is rewritten, an address five lines before the start line of this area is not present. In this case, the address determined based on the area No. is directly used. Upon completion of this processing, the flow returns to the main routine.

As a result of the above-mentioned processing, the first quantization processing when the read area flag includes set bits is started.

Figure 14:
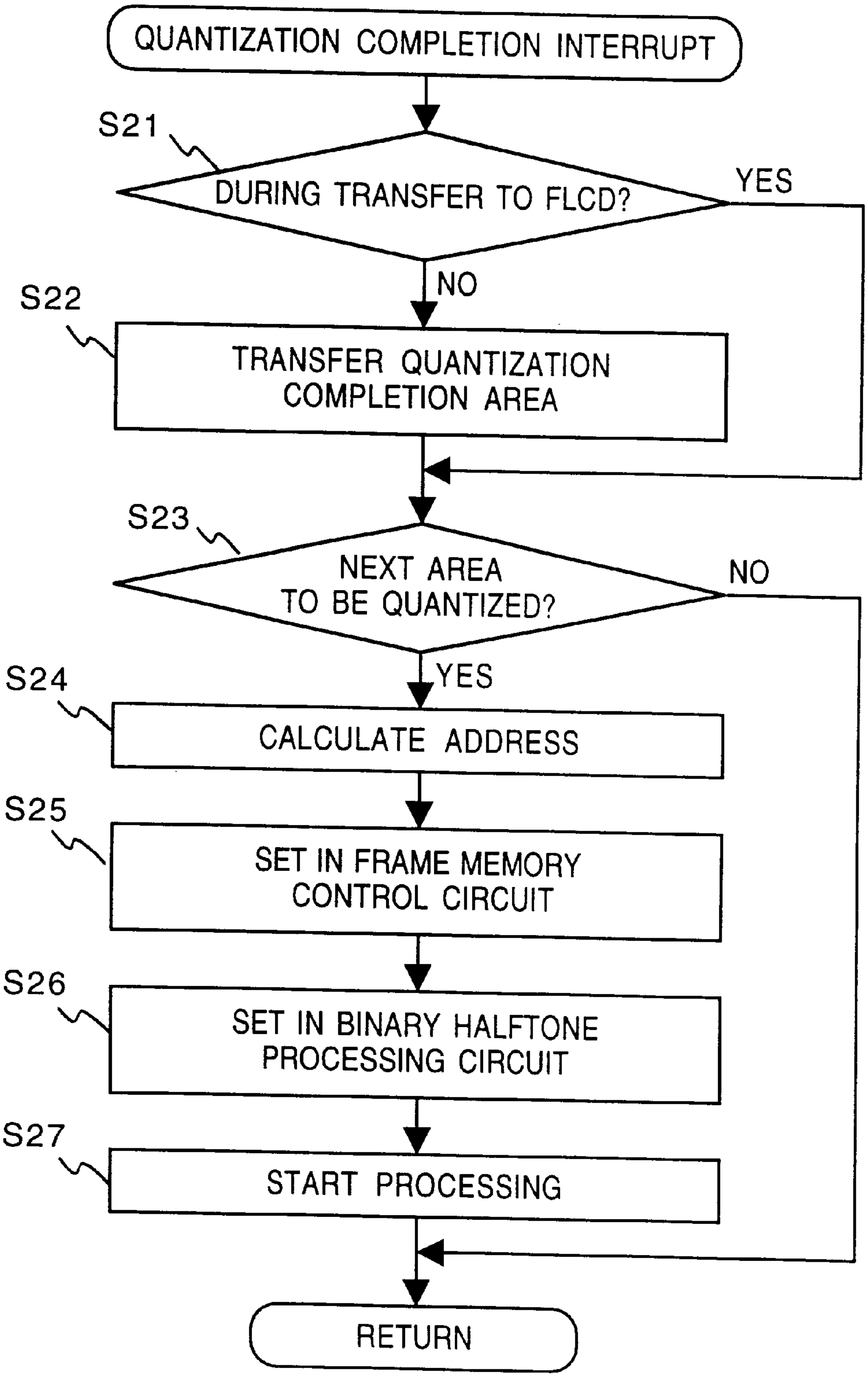
FIG. 14 is a flow chart showing the processing activated upon reception of a quantization completion message from the frame memory control circuit in the embodiment shown in FIG. 1.

FIG. 14 is a flow chart showing the processing for the interrupt signal output from the frame memory control circuit 307 when the circuit 307 has completed the storage operation of quantized image data received from the binary halftone processing circuit 305 in the frame memory 306.

It is checked in step S21 if the frame memory control circuit 307 is performing the transfer processing of a partially rewritten image to the FLCD 3. If YES in step S21, the flow advances to step S23.

On the other hand, if NO in step S21, i.e., if the interlace-transfer operation is being performed at that time, and the storage operation of the first partially rewritten image in the frame memory 306 has been completed, the flow advances to step S22, and the CPU 300 sets the address and the number of lines in the frame memory control circuit 307 so as to transfer the quantized and stored image data, thereby transferring the partially rewritten image. Thereafter, the flow advances to step S23.

In step S23, the CPU 300 checks the already read area flag to determine if there is the next area to be quantized. If NO in step S23, this processing ends.

On the other hand, if the CPU 300 determines in step S23 that there is a non-quantized area, the flow advances to step S24, and the CPU 300 calculates the address and the number of lines of the non-quantized area. Then, the CPU 300 sets the calculated information in the respective circuits in steps S25 to S27 to start the next quantization processing. Since the processing operations in steps S24 to S27 are the same as those in steps S14 to S17 described above, a detailed description thereof will be omitted. Thereafter, this processing ends.

Figure 15:
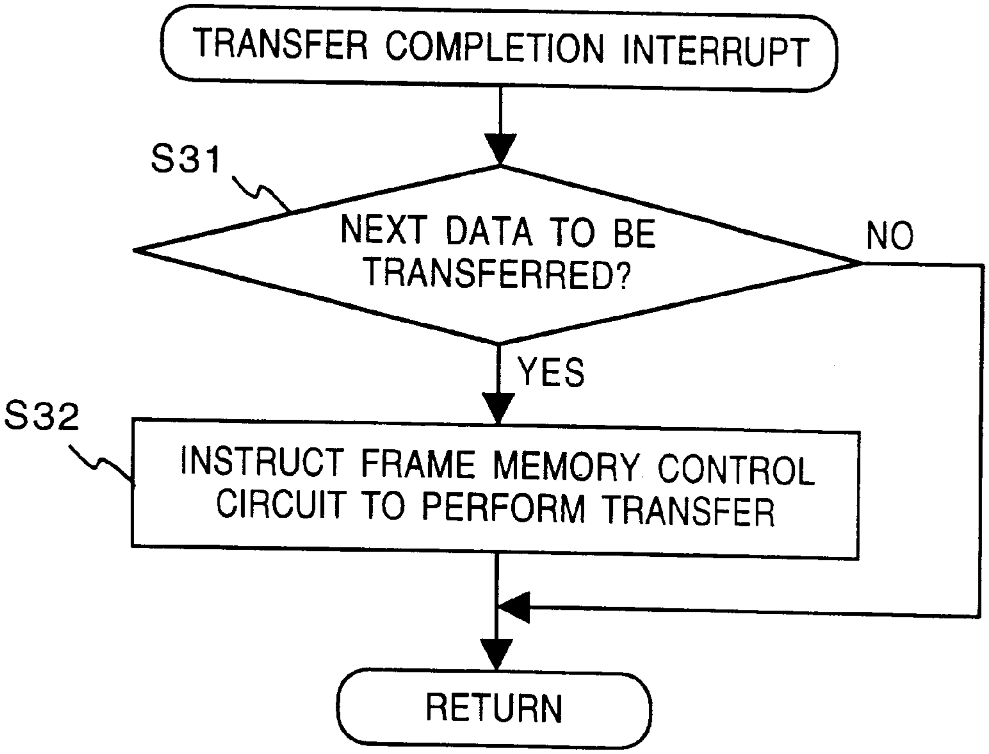
FIG. 15 is a flow chart showing the processing activated upon reception of an FLCD transfer completion message from the frame memory control circuit in the embodiment shown in FIG. 1.

The interrupt processing informed from the frame memory control circuit 307 upon completion of the transfer operation, instructed by the CPU 300, of the partially rewritten image to the FLCD 3 will be described below with reference to the flow chart of FIG. 15.

It is checked in step S31 if the next data to be transferred are present. There is no data to be transferred in two cases, i.e., a case wherein images of all the partially rewritten areas have been transferred to the FLCD 3, and a case wherein the above-mentioned quantization processing has not been completed yet, and the CPU 300 is waiting for the end of the processing. In either case, after NO is determined in step S31, this processing ends.

If it is determined in step S31 that data to be transferred are present, the flow advances to step S32, and the CPU 300 sets the transfer start line address and the number of lines in the frame memory control circuit 307 so as to transfer the data of the area to the FLCD 3, thus starting the transfer processing. Thereafter, this processing ends.

As described above, with the above-mentioned processing, the CPU 300 updates the display state of the partially rewritten portion and the interlace display operation when the image does not change. These processing operations are mainly attained by the CPU 300, as a matter of course, and they can be realized since a portion depending on the frame memory control circuit 307, i.e., the frame memory 306, is arranged.

As described above, according to this embodiment, since the write operation of the VRAM 301 and the display updating operation of the FLCD 3 can be asynchronously performed, the display operation can fully utilize the features of the FLCD 3.

In the above embodiment, when the frame memory control circuit 307 receives a transfer instruction of a partially rewritten image from the CPU 300 and is transferring the partially rewritten image, it does not output an interrupt signal based on the data transfer request signal from the FLCD 3 to the CPU 300. However, the circuit 307 may output an interrupt signal independently of its operation state.

In this case, since the CPU 300 has already recognized the number of lines to be transferred when it issued a partial rewrite instruction, the CPU 300 may decrement the number of lines and check the value every time it receives an interrupt signal. In this manner, the CPU 300 can determine if the interrupt signal is output upon completion of a transfer operation or during an interlace transfer operation.

The processing sequences of the CPU 300 in the above embodiment are merely examples, and the present invention is not limited to these sequences. As described above, a partially rewritten image is transferred to the FLCD 3 via the frame memory 306 to attain an asynchronous transfer operation.

Communications between the FLCD interface 2 and the FLCD 3 via the serial communication line 311 in this embodiment will be described below.

In FIG. 3, the serial communication line 311 is illustrated as a single line. However, in practice, an RS-232C standard line capable of performing full-duplex communications is used, and the number of lines complies with the serial interface standard (cross interface). The data transfer bus 310 includes the above-mentioned data bus and a data transfer request line. In addition to these lines, the bus 310 includes a signal line for outputting a logic-level signal for informing the FLCD 3 that the power supply of the FLCD interface 2 (the power supply of the information processing apparatus side) is turned on. Of course, in addition to these lines, predetermined signal lines such as those for transfer clocks are included.

The communication conditions of the serial communication line 311 include a start-stop synchronization method, 9,600 bps, a data bit length=8 bits, and even parity. Such conditions are ordinary ones in serial communications, and are not unique to the present invention. Therefore, a detailed description thereof will be omitted.

With the communications to be described below, the system including the FLCD 3 can be used in an optimal state. For example, even when the power switch of the FLCD 3 is turned on after the power switch of the host 1 side is turned on, for example, a trouble that only a partially rewritten image is transferred and the full-screen display operation is disturbed can be prevented.

The communications of this embodiment are performed using data in units of bytes in principle. This is because both the control units (the CPU 300 and the system controller 160) can reduce their data transfer and reception amounts and can facilitate their control operations.

Serial communication protocols include codes to be supplied from the FLCD interface 2 side (CPU 300) to the FLCD 3 and codes to be supplied from the FLCD 3 (system controller 160) to the FLCD interface 2. To avoid confusion, the former codes (FLCD interface 2_FLCD 3) will be referred to as "commands" or "command codes" hereinafter, and the latter codes (FLCD 3_FLCD interface 2) will be referred to as "attentions", "statuses", or "attention codes" hereinafter.

Note that some specific commands/statuses are transmitted in response to a status returned from the FLCD 3 in correspondence with a command supplied from the FLCD interface 2 to the FLCD 3 and an attention issued from the FLCD 3 to the FLCD interface as a trigger signal.

FIG. 16 shows in detail the commands of this embodiment, and status data returned from the FLCD 3 in response to these commands. In FIG. 16, "H" in the code column in the main item "command" indicates a hexadecimal value, and "x" indicates variable 4 bits. Also, "B" in the main item "status" indicates a binary value, and "x" indicates variable 1 bit (different from "x" in "command").

The respective commands and corresponding status data will be explained below in turn.

Request Unit ID: 00H

This command inquires the type of connected FLCD 3.

Status:

Upon reception of this command, the FLCD 3 adds ID information stored in an internal ROM (not shown) of the system controller 160 to status data, and outputs, to the FLCD interface 2, the status data in the format of 00xxxxxxB for a normal state or 01xxxxxxB for an abnormal state.

The most significant bit of the lower 6 bits indicates if the FLCD 3 is a color display (:0) or monochrome display (:1), and the next upper 2 bits indicate if the screen size (the maximum number of display dots) corresponds to, e.g., 15 inch (:00) or 21 inch (:01). That is, the FLCD interface 2 can detect the type of FLCD 3 by issuing this command "00H". In this embodiment, the FLCD 3 is a color display. However, since a monochrome display apparatus can also be connected to the FLCD interface 2, such command is prepared.

The reason why bits for specifying an abnormal state (error state) are included is to cope with a case wherein a command issued from the FLCD interface 2 to the FLCD 3 cannot be normally received by the FLCD 3 under the influence of, e.g., noise. In such case, the FLCD 3 returns 8-bit status data whose upper 2 bits start from "01". Note that status data upon occurrence of an error is common to the respective commands, and attention data upon occurrence of an error for the received command will be explained below.

The lower 6 bits of status data upon occurrence of an error include a combination of 4-bit type data indicating the error type, and 2-bit content data indicating the contents of the error. The type data and content data are as follows.

Type Data: Send Diagnostic Error

Content Data:

This error corresponds to "Send Diagnostic (self diagnosis result)", and includes a check sum error of the ROM 161 in the system controller 160, an error (verify error between read and write accesses) of the RAM 162 used as the work memory, an AC fail error, and other errors during the display operation. Note that the FLCD 3 may also suffer a cable disconnection error. However, in this state, communications cannot be performed.

Type Data: Reception Timing Error

This error occurs at the time of reception, and includes a parity error, overrun, undefined command, and the like.

Type Data: Send Host ID Error

Content Data:

This error indicates an undefined ID of the host (FLCD interface 2) upon reception of a "Send Host ID" command.

Type Data: Set Mode Error

Content Data:

This error corresponds to a "Set Mode" command, and indicates an impossible transition (cannot transit to the designated mode) or that an undefined operation mode is designated.

Type Data: Read/Write Error

Content Data:

This error corresponds to a "Read/Write" command, and indicates a write access to a Read Only area, an access to a Hidden area, or an undefined address.

Type Data: Set Address Error

Content Data:

This error corresponds to a "Set Address" command, and indicates that an address falling outside the range is set.

Type Data: Unit Start Error

Content Data:

This error corresponds to a "Unit Start" command, and indicates a not-ready-to-start state, an Error state, or an already started state.

Type Data: Request Attention Error

Content Data:

This error corresponds to a "Request Attention" error, and indicates that there is no attention to be transmitted.

Type Data: Request Status Error

Content Data:

This error corresponds to a "Request Status" command, and indicates that there is no status to be transmitted.

Note that the above-mentioned errors are examples, and since the type data consists of 4 bits, it can define 16 different type data in principle. As described above, since status data output from the FLCD 3 upon occurrence of an error for the received command is common to the respective commands, a description of attention data in the error state of the commands to be described below will be omitted.

Request 1H: 01H

As will be described in detail later, the FLCD 3 changes its operation speed (image display period for one scan) depending on the FLC panel temperature detected by the temperature sensor 105. With this command, the FLCD interface 2 inquires the FLCD 3 as to the current driving speed for one scan (1H information of the FLC panel). Status data as a response from the FLCD 3 returns 1H information indicating the current 1-scan driving period using its lower 6 bits, as shown in FIG. 16.

Upon reception of the response status obtained by issuing the command, the FLCD interface 2 changes the interlace interval or changes the ratio between the partial write operation and the full-screen updating operation.

As described above, the FLCD interface 2 performs an interlace display operation when there is no data to be transferred to the FLCD 3. For example, when a dynamic image or the like is being displayed on the predetermined region on the FLCD 3, an image corresponding to the display updated portion is being updated. Therefore, if the display time of this dynamic image is long, a luminance difference is generated between images of a non-changed portion and a changed portion, and the difference gradually becomes emphasized.

Therefore, even when the partial rewrite operation is continued, the full-screen image must be displayed at given intervals. In consideration of the above situation, in this embodiment, an image on the entire screen is updated (all the image data in the frame memory 306 are transferred) at least at substantially 1-Hz periods. Since the number of frames that can be displayed during the 1-Hz period (i.e., for 1 sec), that is, the driving period for one scan line of the FLCD 3, changes depending on the temperature, such command must be used.

This command has an influence on the jump interval of the interlace display operation when an image on the screen does not change. That is, when the temperature is not so high, since the display speed of the FLCD 3 lowers, a relatively large jump interval is set in the interlace display operation in such case to apparently accelerate the updating timing of the entire image. Conversely, if the temperature is high enough to assure a sufficiently high display speed, the jump interval can be reduced.

Unit Start: 02H

This command is used for activating the drawing operation (instructing to start the driving operation) of the connected FLCD 3. Upon reception of this command, the FLCD 3 can start an image display operation. In this case, since the FLCD 3 need only output a Busy signal to return only a response indicating if the operation is normally started, status data in a normal state includes no operand, as shown in FIG. 16.

Request Attention Inf.: 03H

This command requests transmission of the detailed contents of attention data received from the FLCD 3. Upon reception of this command, the FLCD 3 adds a code indicating the contents of the attention to the lower 6 bits of the status data, and outputs the status data.

Request Attention Bit: 04H

This command requests transmission of attention status bits of the FLCD 3. The attention status bits of the FLCD indicate, e.g., if the FLCD is ready, 1H information is changed, the contrast is changed, an error has occurred, and so on, and the FLCD 3 outputs status data in which data indicating these contents are set in the lower 6 bits.

Get Mode: 05H

This command requests transmission of the current display mode of the FLCD 3. The display modes of the FLCD 3 include a normal operation mode (a normal drawing state display mode in which the LED and the backlights are turned on and the scan operation is performed) corresponding to operation mode number 0, a static mode (a mode in which reception of image data is stopped, the LED and the backlights are turned on, and the displayed image in a scan stop state is frozen: suitable for observing a still image) corresponding to operation mode number 1, and a sleep mode (a mode in which neither an image display operation nor a backlight driving operation are performed: a power saving effect, and an effect of prolonging the service life of the backlights and the FLCD) corresponding to operation mode number 2, as will be described in detail later. The FLCD 3 returns the operation mode number indicating one of these display modes as the current display mode as status data.

Request Status: 06H

This command requests resending of status data when a parity error or the like has occurred in attention data sent from the FLCD 3. Upon reception of this command, the FLCD 3 outputs attention data indicating the same contents as those of previously output one.

Attention Clear: 0AH

This command clears attention data of the FLCD 3. Since the FLCD 3 need only inform whether or not the attention is normally cleared, it outputs status data with all bits="0" in a normal state.

Get Contrast Enh.: 0BH

This command acquires a contrast enhancement value determined by the setting values of the luminance and image quality adjustment trimmers 106 and 107, and the contents of the de-gamma table of the above-mentioned de-gamma circuit 309 are updated in accordance with a response (6 bits in status data) to this command. When the de-gamma table is updated, the contrast of only a partially rewritten image is changed. For this reason, assuming that all the image data in the VRAM 301 are rewritten, the binary conversion processing of the entire image is performed, and the entire image is transferred to the FLCD 3.

Get Multi: 03H

The FLCD 3 of this embodiment has three scan modes, and can operate based on scan mode information set in the header portion of image data by the FLCD interface 2, and in three scan modes designated by a "Set Multi" command (to be described later). In this case, designation of the "Set Multi" command has priority over designation in the former multi-scan mode.

These three scan modes are those for displaying input 1-line image data as an n-line image (n=1, 2, or 4 at present), and include a 1-line concurrent selection mode (01H), a 2-line concurrent selection mode (02H), and a 4-line concurrent selection mode (03H). In recent multimedia trends, the default size of a dynamic image to be displayed is as small as about 300×200 dots, and some application programs are fixed to this size. In this state, since the displayed image becomes too small, the same image is displayed for two or four lines with respect to the received original image for each line.

In this manner, even when the original image is small, a visually naturally enlarged image can be displayed. Since the FLCD interface 2 need not transfer the same line data a plurality of number of times, the load on the interface 2 is reduced. In this case, the FLCD interface 2 instructs the frame memory control circuit 307 to successively transfer the same pixel n times in the main scan direction. Note that the number of times of repetition in the main scan direction may also be independently instructed, as a matter of course.

The "Get Multi" command requests transmission of information indicating the current state of the FLCD (the current state is returned in 6 bits of status data). The reason why this command is assigned is to prevent a mismatch between the transmitter and receiver image data when the power switch of the information processing system (e.g., a personal computer) is turned off and on after n is set to be "2" in the FLCD 3 using a "Set Multi" command (to be described later)

Send Diagnostic: 1xH

This command requests the FLCD 3 to perform self diagnosis and to return the diagnosis result. Four bits indicated by "x" designate a diagnosis mode. There are some diagnosis modes, and the FLCD 3 returns the diagnosis result corresponding to the designated mode as status information.

Send Host ID: 2xH

This command informs the FLCD 3 of the ID (type) of the FLCD interface 2. Two out of four bits indicated by "x" represent the version of the FLCD interface 2, and the remaining two bits represent the ID of the card of the FLCD interface 2 (also, the type of the information processing apparatus). When the FLCD 3 determines that the received ID is permitted, it returns status data with all the bits="0".

Set Mode: 3xH

This command corresponds to the "Get Mode" command, and four bits indicated by "x" send the above-mentioned operation mode number for instructing setting of one of the normal mode, static mode, and sleep mode. When the FLCD 3 can normally shift its operation mode to the designated mode, it returns status data with all the bits="0". This command is issued, e.g., when a user inputs an instruction for setting the mode and the, instruction is input to the FLCD interface 2. On the other hand, when the image has not changed after an elapse of a predetermined period of time (this period is programmable by the user), the operation mode may shift to the static mode.

Set Multi: 4xH

This command corresponds to the above-mentioned "Get Multi" command, and instructs the FLCD 3 to display a 1-line image as a 1-, 2-, or 4-line image. When four bits indicated by "x" are set to be "0", the command instructs that the scan mode is determined depending on the scan mode information set in the header portion of image data supplied from the FLCD interface 2. When the four bits are set to be "01H", the command instructs the 1-line concurrent selection mode; when the four bits are set to be "02H", the 2-line concurrent selection mode; and when the four bits are set to be "03H", the 4-line concurrent selection mode.

In the normal state, status data with all the bits "0" is returned. In this embodiment, for example, when a so-called VGA mode (640 dots in the horizontal direction×480 dots in the vertical direction) is selected and detected, a 2-line concurrent driving operation is performed in correspondence with the display size of 1,280×960 dots of the FLCD 3. In this case, since some users may want to change such display size according to their favors, an environment setting utility program of the FLCD interface in the information processing apparatus may be used to allow the users to perform various setting operations. "Write High/Low Memory" commands (8xH, 9xH) and "Read High/Low Memory" (08H, 09H) commands are used for writing data at an arbitrary address of the system controller 160 (address space=64 Kbytes) in the FLCD 3 and supplying a read instruction thereto. Two sets of the lower 4 bits of the "Write High/Low Memory" commands indicate one byte of data to be written. As for the "Read High/Low Memory", commands have no operands (variable 4 bits), as a matter of course.

In any case, a write or read address must be designated. The address is set by four sets of the lower 4 bits (a total of 16 bits) of "Set HH/MH/ML/LL Address" commands (Ax, Bx, Cx, DxH) shown in FIG. 16. The address indicates a read or write address. After the address is determined, a read or write access is made using the "Read" or "Write" commands.

As for the "Read" commands, the upper or lower 4 bits of the contents of the byte at the designated address are returned as status data. As for other commands, attention data with all the bits="0" is returned in the normal state.

These read/write commands for the internal memory of the FLCD 3 are mainly used for debugging. Of course, the present invention is not limited to this specific purpose, and these commands may have another purpose by changing the work area in the FLCD 3. The operation processing program of the system controller 160 in the FLCD 3 may be loaded and executed on a RAM as a resident program, so that the host 1 may store programs with improved functions on the RAM.

The commands (command codes) output from the FLCD interface 2 to the FLCD 3 and the corresponding response status data have been described.

A case will be described below wherein the FLCD 3 spontaneously outputs attention data to the FLCD interface 2.

Attention data output from the FLCD 3 has the format: 10xxxxxxB. That is, the most significant bit (MSB) is set to be "1".

This is because when the FLCD interface 2 outputs a certain command to the FLCD 3 and at the same time, the FLCD 3 spontaneously outputs attention data to the FLCD interface 2, the FLCD interface 2 must be able to determine whether the received attention data is not a response with respect to the output command but to a spontaneous one. That is, as described above, since all the response attention data for the issued commands have MSBs="0", the FLCD interface 2 can easily discriminate the spontaneous attention data.

The lower 6 bits of attention data from the FLCD 3 are as follows:

bit 0: set when the FLCD is ready bit 1: set when 1H information has been changed bit 2: set when the contrast enhancement value has been changed bit 3: not defined bit 4: set when a recoverable error has occurred in the FLCD bit 5: set when an unrecoverable error has occurred in the FLCD The recoverable error includes a case wherein the attention state is not set, a case wherein image data is not input after an elapse of a predetermined period of time, a case wherein an undefined display mode is set, and the like. The unrecoverable error includes a detection error due to disconnection of the temperature sensor 105, a detection error due to short-circuiting of the sensor 105, a sampling time-out error caused by an A/D converter, a conversion end time-out error, a data set time-out error, ROM and RAM check errors as a result of self diagnosis, and the like.

Note that the ROM check operation and the like are also performed in the self diagnosis mode executed in accordance with an instruction from the FLCD interface. However, the errors herein mean those which have occurred in an initial check operation when the FLCD 3 is powered, as will be described below.

When the FLCD interface 2 issues a command and the FLCD 3 issues spontaneous attention data, i.e., when they output the first codes, the attention data from the FLCD 3 is preferentially processed. This is because the request from the FLCD is the one issued from an image display interface closest to the user.

Examples of the communication protocols based on the above-mentioned commands and attentions when viewed from the FLCD interface 2 side will be described below with reference to FIGS. 17 to 19. As for the FLCD 3, an explanation will be given later.

Figure 17:
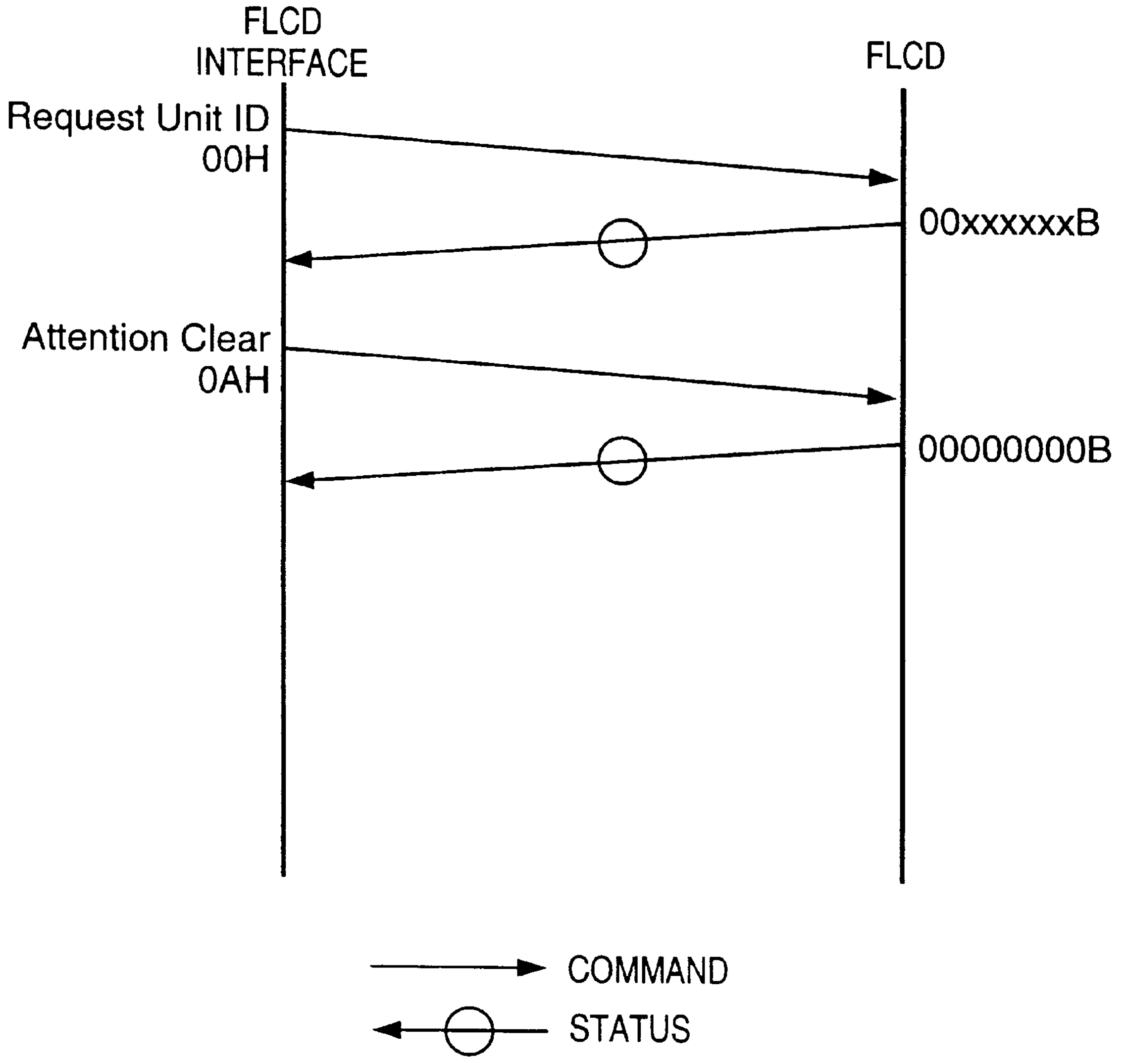
FIG. 17 is a chart showing an example of the communication sequence between the FLCD interface and the FLCD in the embodiment shown in FIG. 1.

FIG. 17 shows the sequence when the FLCD interface 2 acquires the ID of the FLCD 3.

The FLCD interface 2 (CPU 300) issues a "Request Unit ID (00H)" command to the FLCD 3 via the serial communication line 311. Upon reception of this command, the FLCD 3 (system controller 160) reads FLCD inherent information written in its own ROM 161 or the like, and returns the read information to the FLCD interface 2 as status data.

In the above-mentioned sequence, when a communication error (e.g., a parity error) has occurred in the command issued from the FLCD interface 2, the FLCD 3 returns error status data to indicate that it cannot normally receive the command. Upon reception of this status, the FLCD interface 2 generates the same command again. On the contrary, when a communication error has occurred in attention data supplied from the FLCD 3, the FLCD 2 outputs a "Request Status" command to prompt re-sending of status data.

Figure 18:
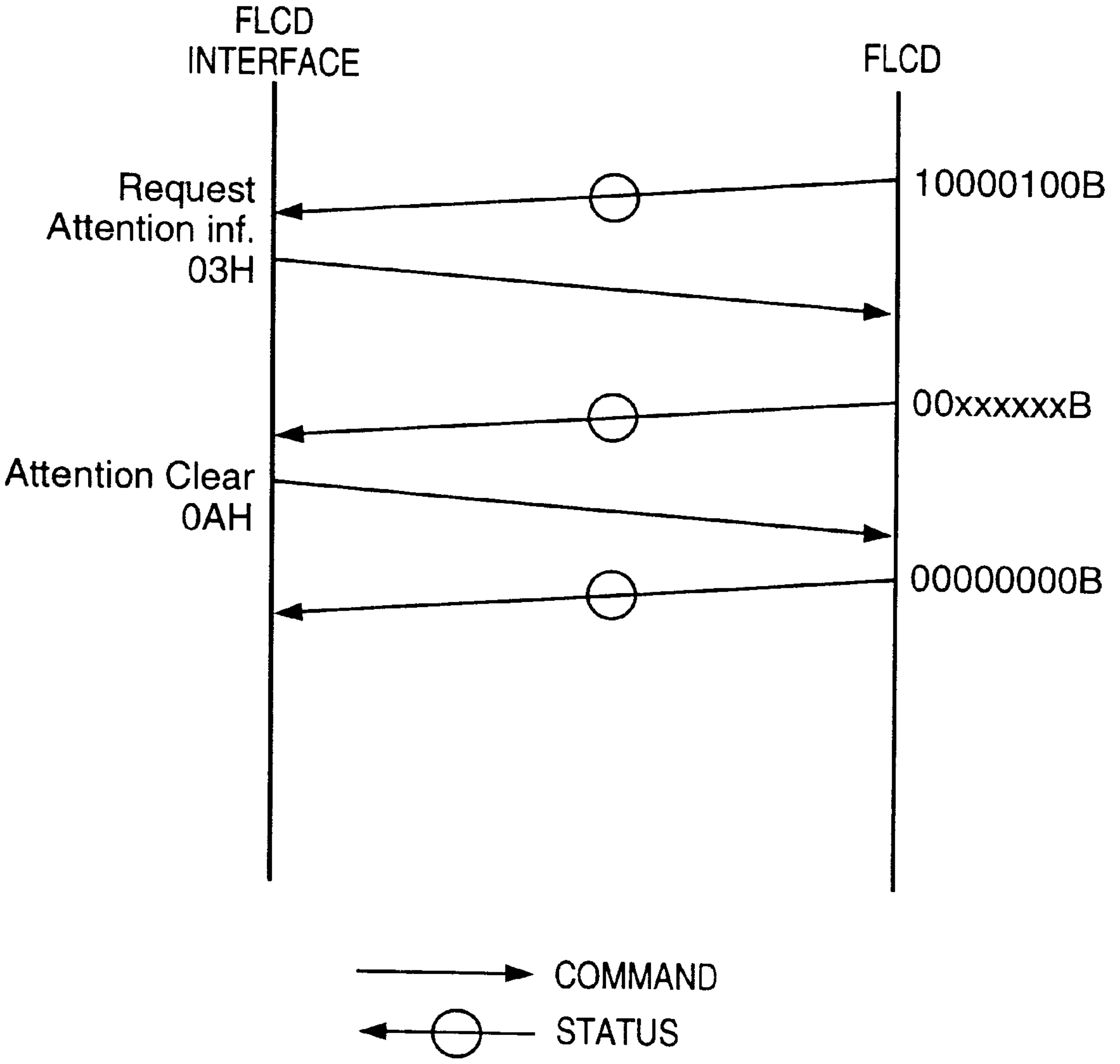
FIG. 18 is a chart showing an example of the communication sequence between the FLCD interface and the FLCD in the embodiment shown in FIG. 1.

FIG. 18 shows the sequence when the FLCD 3 generates spontaneous attention data (in this case, attention data generated when the contrast enhancement value is changed).

Figure 59:
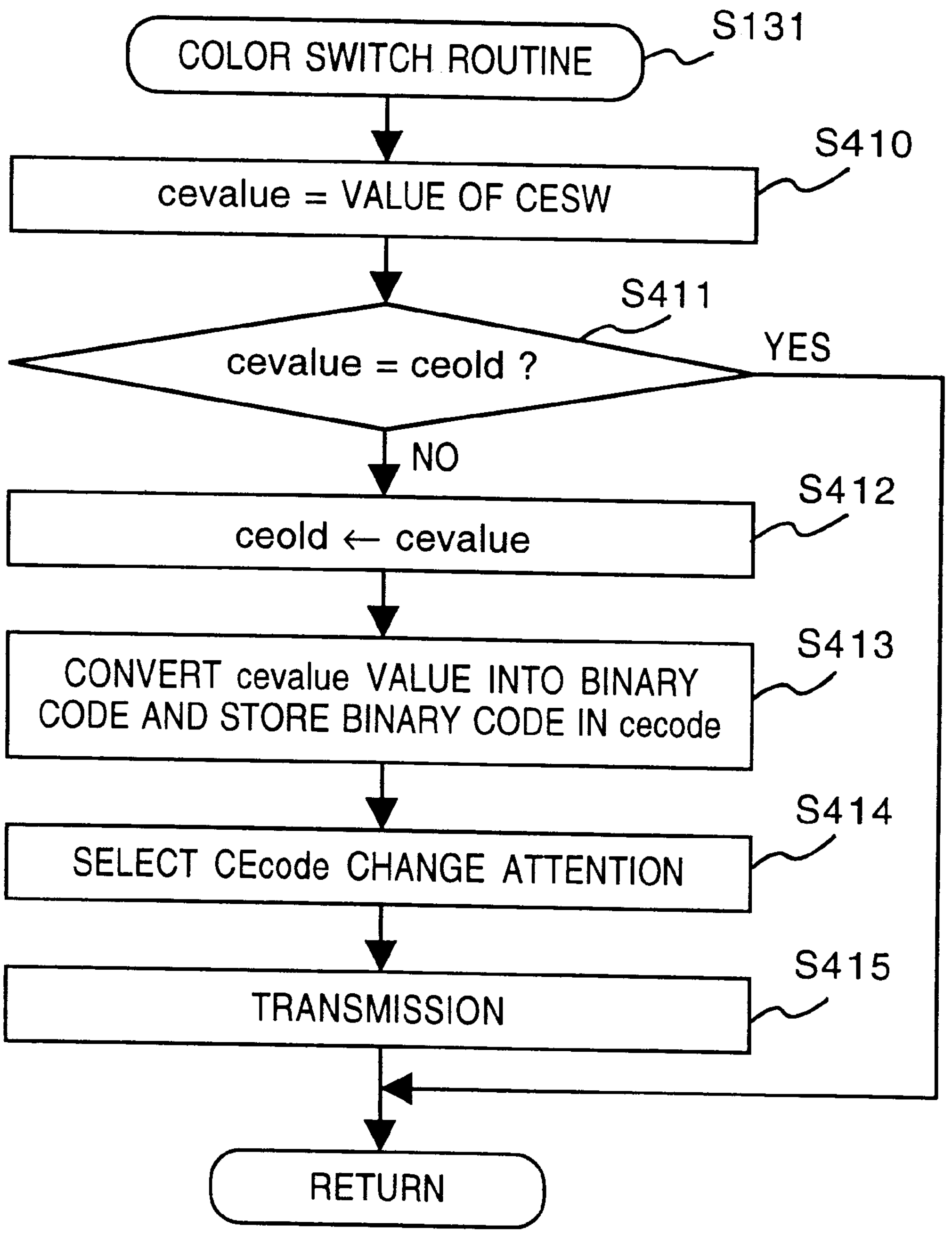
FIG. 59 is a flow chart showing the color switch routine in the embodiment shown in FIG. 1.

The FLCD 3 transmits spontaneous attention data "10000100B" indicating that the contrast enhancement value has been changed to the FLCD interface 2 via the serial communication line 311 in the processing in step S415 shown in FIG. 59 (to be described later).

Upon reception of this attention data, since the FLCD interface 2 can recognize that the contrast enhancement value has been changed, it outputs a "Request Attention Inf." command (03H) to inquire as to the change in contrast enhancement value. Upon reception of this command, the FLCD 3 outputs binary data indicating the contrast enhancement value held in step S413 to the FLCD interface 2.

Upon reception of the contrast enhancement value, the FLCD interface 2 looks up the contents of the ROM 308 to rewrite the contents of the de-gamma table in the de-gamma circuit 309. In order to complete the processing for the attention data, the FLCD interface 2 issues an "Attention Clear" command. Since the FLCD 3 can recognize based on this command that de-gamma conversion using the new contrast value has been finished or the contrast is scheduled to change, it returns acknowledgement attention data "00000000B", thus ending this processing. In this case, since the contrast is changed, the image of the entire frame is transferred to the FLCD 3 even in the case of a partial rewrite operation.

Figure 19:
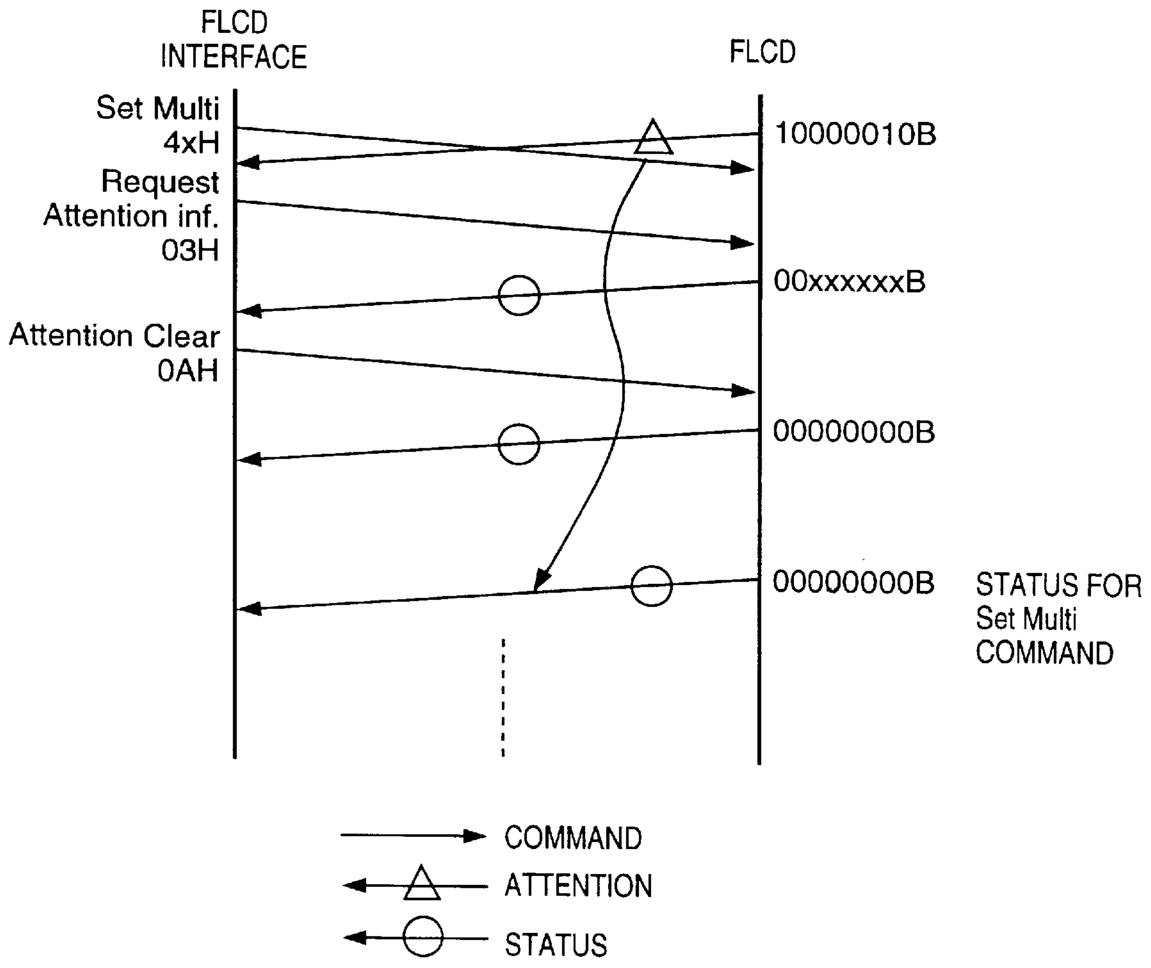
FIG. 19 is a chart showing an example of the communication sequence between the FLCD interface and the FLCD in the embodiment shown in FIG. 1.

FIG. 19 shows the sequence when a command (in this case, the "Set Multi" command) issued by the FLCD interface 2 and spontaneous attention data (in this case, attention data indicating that 1H information is changed based on the detection result of the temperature sensor 105) pass each other.

When the FLCD interface 2 detects that the MSB of the received 8-bit data is "1", it determines that the received data is spontaneous attention data issued by the FLCD 3, and postpones processing for the previously issued "Set Multi" command. Then, the FLCD interface 2 issues a "Request Attention Inf." command to instruct the FLCD 3 to transmit a one-scan driving period value. Upon reception of this command, the FLCD 3 sets 1H data based on the current temperature value detected by the temperature sensor 105 in the lower 6 bits of status data by looking up a temperature compensation table 901 shown in FIG. 10, and transmits the status data to the FLCD interface 2.

Upon reception of the status, the FLCD interface 2 changes its own operation contents, as described above, and issues an "Attention Clear" command to the FLCD 3. Upon reception of data "00000000B" from the FLCD 3, the FLCD interface 2 ends the processing for the attention data from the FLCD 3.

Thereafter, the FLCD 3 performs processing for the previously received "Set Multi" command and returns status data. If the received status data is "00000000B" indicating normal end, the FLCD interface 2 ends the processing for the "Set Multi" command.

In the above description, the protocols for some commands and attentions have been explained. As can be easily understood from the above description, substantially the same sequences apply to protocols of other commands or attentions. Therefore, a description of other protocols will be omitted.

The operations upon power-ON of the FLCD 3 and the FLCD interface 2 (also, power-ON of the information processing apparatus) of this embodiment will be explained below.

In general, whether a host side apparatus such as a personal computer and a display apparatus are constituted separately or independently does not pose any serious problem. This is because a normal display apparatus merely displays image data pouring out from a host apparatus, and its display operation stops when information from the host apparatus stops, that is, the display apparatus and the host apparatus cannot communicate with each other.

However, since the FLC panel 150 of the FLCD 3 of this embodiment has a self storage function and the display apparatus has intelligence to some extent, processing must be performed while both the host apparatus and the display apparatus recognize each other's conditions. In this embodiment, this problem is solved as follows.

The data transfer bus 310 includes a single signal line indicating whether or not the power supply of the FLCD interface 2 is turned on. Using this signal line, the following control operations can be attained.

Case 1. When the power supply of the FLCD interface 2 is turned on first, and thereafter, the power supply of the FLCD 3 is turned on:

In this case, the FLCD 3 can detect in its power-ON initialization processing that the power supply of the FLCD interface 2 has already been turned on since the POWERON signal in the data transfer bus 310 is "L". Thus, when the FLCD 3 detects this information and its own initialization processing has been completed, it outputs attention data (1000001B: indicates that the FLCD 3 is ready) to the FLCD interface 2.

Upon reception of this attention, the FLCD interface 2 recognizes that the FLCD 3 is ready, and issues an "Attention Clear" command. Then, the FLCD interface 2 waits for reception of attention data "00000000B" from the FLCD 3. Thereafter, the FLCD interface 2 outputs a "Unit Start" command to prompt the FLCD 3 to output a NOT BUSY (=READY) signal, thereby starting an image display operation.

In practice, when the power supply of the FLCD 3 is turned on, the FLCD interface 2 issues output request commands of the contrast value and 1H so as to obtain the contrast value and 1H value (to be described later) upon power-ON, and acquires the requested information.

Case 2. When the power supply of the FLCD 3 is turned on first, and thereafter, the power supply of the FLCD interface 2 is turned on (for example, when the user forgets to turn off power supply of the FLCD 3 although he or she turns off the host 1):

In this case, upon completion of the initialization processing, the FLCD interface 2 waits for an "L" POWERON signal set by the FLCD interface, and then issues a "Unit Start" command. Upon reception of this command, the FLCD 3 can restart its operation.

Next, the operation processing of the system controller 160 in the FLCD 3 will be explained below. The following description will explain a case wherein a chip computer (MPU) is used as the main device of the system controller 160.

Figure 20:
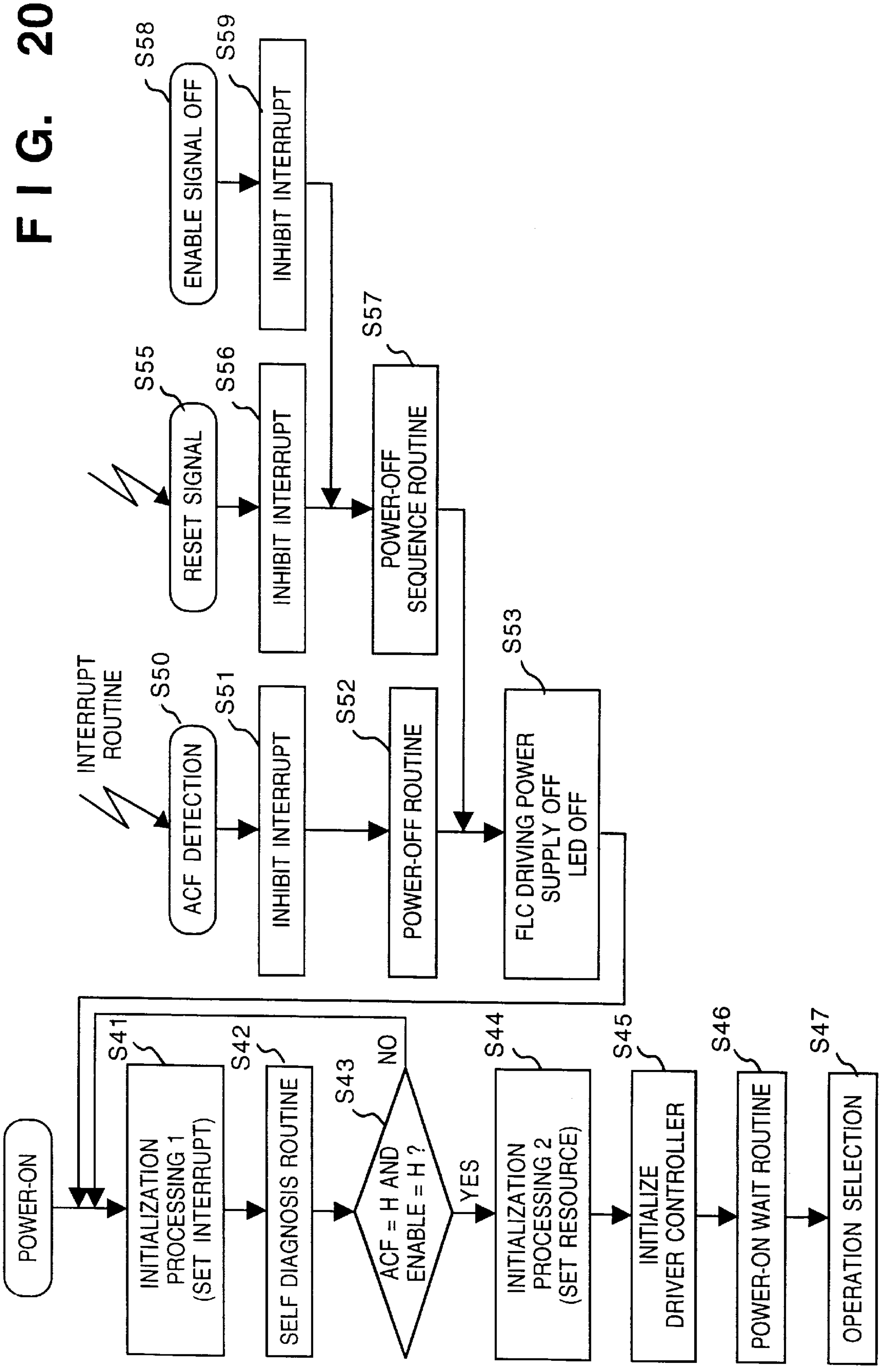
FIG. 20 is a flow chart showing the basic processing at the beginning of operation immediately after the power switch of the FLCD is turned on or when the FLCD is reset in the embodiment shown in FIG. 1.

FIG. 20 is a flow chart showing the basic processing at the beginning of the operation after power-ON or in the reset state of the FLCD 3 in this case.

When the power switch 122 is turned on, and the apparatus is powered, the processing shown in FIG. 20 is started. In step S41, the first initialization processing of the system controller 160 is executed and an interrupt setting operation is performed. Subsequently, in step S42, the system controller 160 executes a self diagnosis routine to check if its own operation is normal. In step S43, it is checked based on the diagnosis results of the ACF and ENABLE signals in the self diagnosis routine in step S42 if the ACF detection circuit 165 has not output any ACF signal, and if the cable 11 is disconnected and the ENABLE signal is not at low ("L") level. If the cable is not normally connected, or if the input from the switching power supply 120 lowers again due to some cause, the flow returns to step S41 to inhibit the subsequent display control of the FLC panel 150. In this manner, inadvertent display control, i.e., a display operation of an undesired image can be effectively prevented.

On the other hand, if it is determined in step S43 that the cable 11 is normally connected, i.e., the ENABLE signal is at low level, and the switching power supply 120 is normally operating, i.e., an ACF signal is output, the flow advances to step S44 to execute initialization processing 2 of the system controller 160 so as to perform a resource setting operation and the like. Subsequently, initialization processing of the driver controller 190 is performed in step S45. In step S46, power-ON wait processing is executed, and the flow then advances to step S47 to execute operation selection processing.

In the apparatus of this embodiment, the processing shown in FIG. 20 is executed not only upon power-ON but also when an interrupt is generated after an interrupt setting operation is performed.

More specifically, the initialization processing is also executed when the ACF detection circuit 165 detects that power supply to the switching power supply has stopped due to some cause, and outputs an ACF signal, when a reset signal is received from the FLCD interface 2, and when the ENABLE signal is set in the OFF state.

When the ACF detection circuit 165 detects a power supply failure and outputs an ACF signal, ACF detection interrupt processing indicated by "ACF detection" in step S50 is executed. When this interrupt processing is started, all other interrupts are inhibited in step S51. In step S52, a power-OFF routine is executed. Thereafter, a 15VSW is turned off to deenergize the LED 109 in step S53. Then, the initialization processing starting from step S41 is executed.

On the other hand, when the apparatus of this embodiment is reset, reset interrupt processing is executed in step S55. When this interrupt processing is started, all other interrupts are inhibited in step S56. Subsequently, a power-OFF routine is executed in step S57. Thereafter, the 15VSW is turned off to deenergize the LED 109. Then, the initialization processing starting from step S41 is executed.

Furthermore, when the cable 7 between the FLCD 3 and the FLCD interface 2 of this embodiment shown in FIG. 6 is disconnected from the connector 15 for some reason, or when the cable 7 is disconnected midway, the ENABLE signal is reset and does not change to low level. In this case, cable disconnection interrupt processing indicated by "ENABLE signal OFF" in step S58 is executed. When this interrupt processing is started, all other interrupts are inhibited in step S59. The flow then advances to step S57 to execute the power-OFF routine. Thereafter, the 15VSW is turned off to deenergize the LED 109 in step S53. Then, the initialization processing starting from step S41 is executed.

The self diagnosis routine in step S42 shown in FIG. 20 will be described in detail below with reference to FIG. 21.

In step S61, signal check processing for checking the ENABLE signal and the ACF signal from the ACF detection circuit 165 is executed. Subsequently, in step S62, check processing of the ROM 161 is performed. Thereafter, check processing of the RAM 162 is executed in step S63. The flow then returns to the previous routine.

Figure 22:
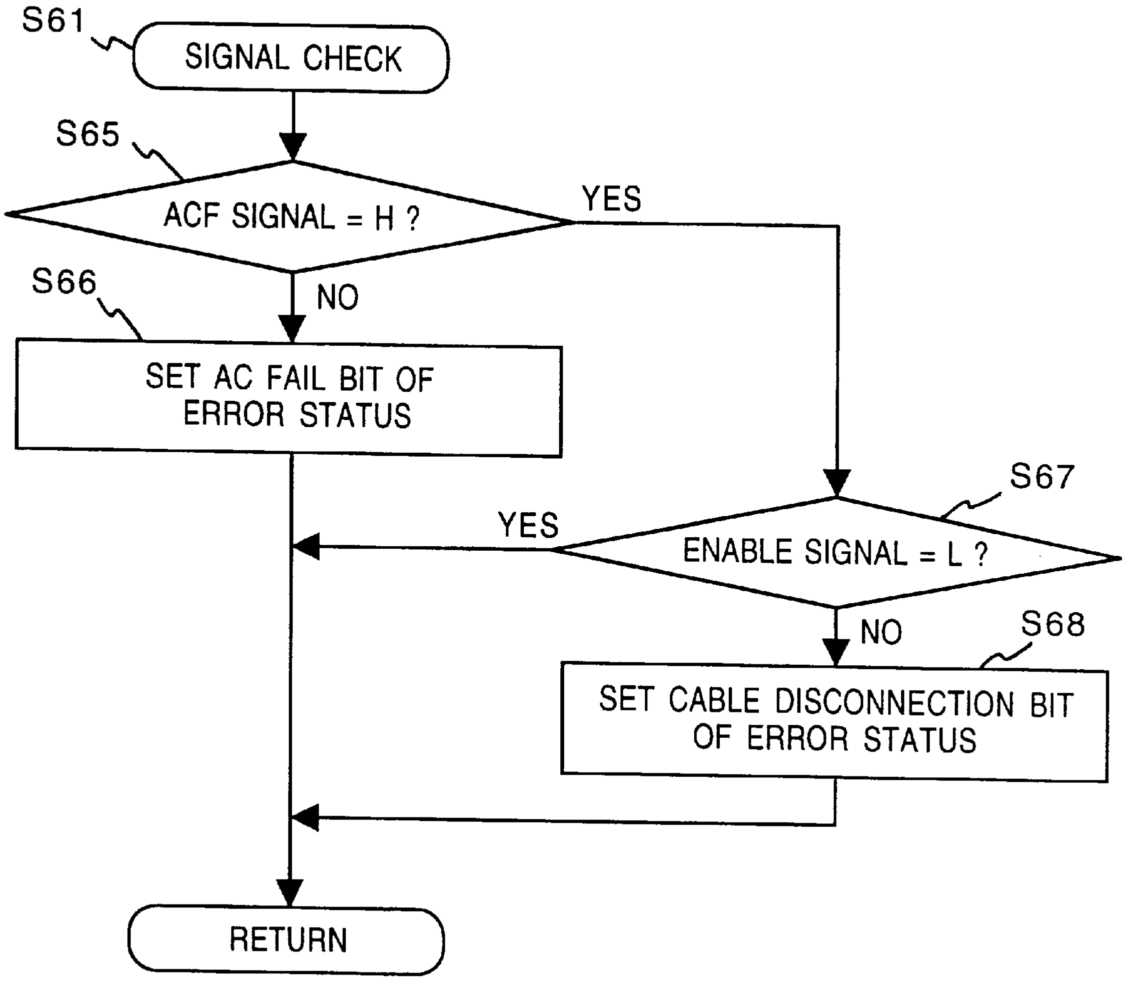
FIG. 22 is a flow chart showing in detail the ACF signal check routine in the embodiment shown in FIG. 1.

FIG. 22 shows in detail the signal check processing in step S61.

It is checked in step S65 if the ACF signal is at the high level, i.e., an ACF signal is not output (the power supply is normal). If an ACF signal is not output, the flow advances to step S66, and an AC fail bit of an error status that can be read out by the FLCD interface 2 is set. Thereafter, the flow returns to the previous routine.

On the other hand, if an ACF signal is output, the flow advances from step S65 to step S67 to check if the ENABLE signal is at the low level, i.e., the cable is normally connected. If the ENABLE signal is at the low level, i.e., the cable is normally connected, this processing ends, and the flow returns to the previous routine.

On the other hand, if the ENABLE signal is not at the low level, i.e., the cable is not normally connected, the flow advances from step S67 to step S68, and a cable disconnection bit in an error status that can be read out by the FLCD interface 2 is set. Thereafter, the flow returns to the previous routine.

Figure 21:
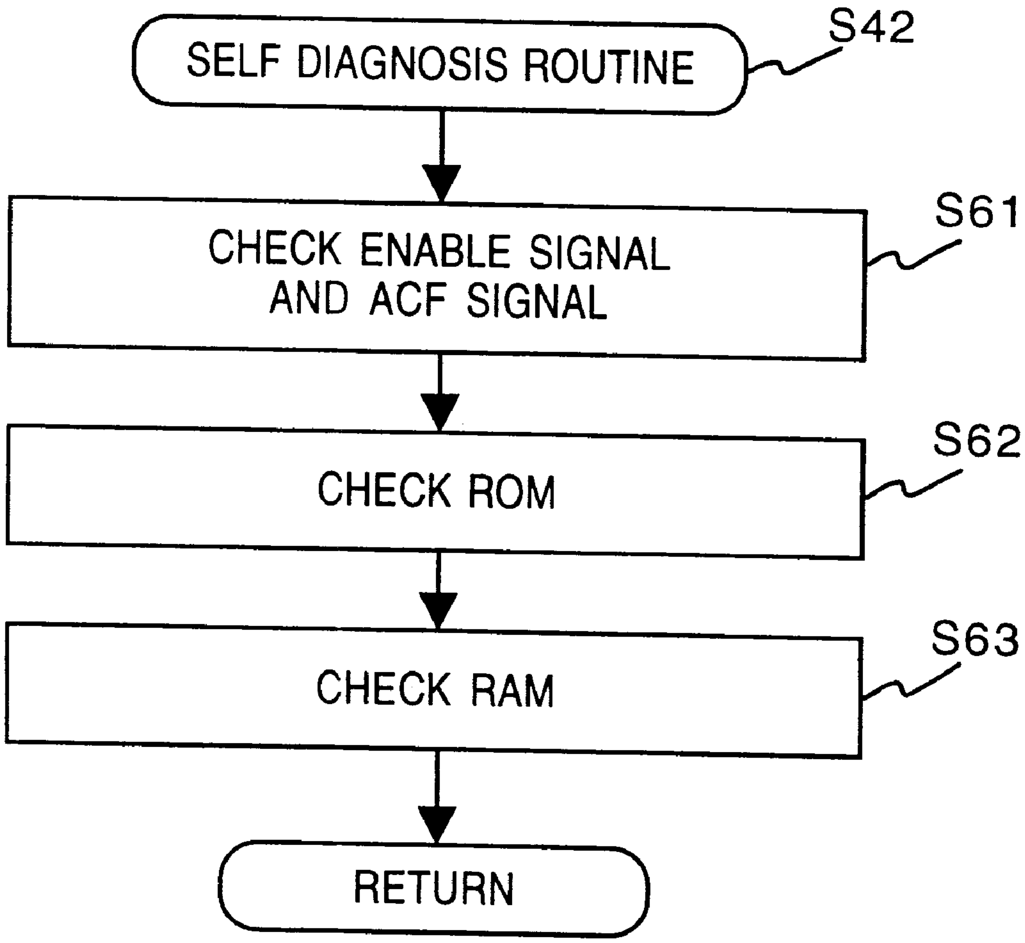
FIG. 21 is a flow chart showing in detail the self diagnosis routine in the embodiment shown in FIG. 1.
Figure 23:
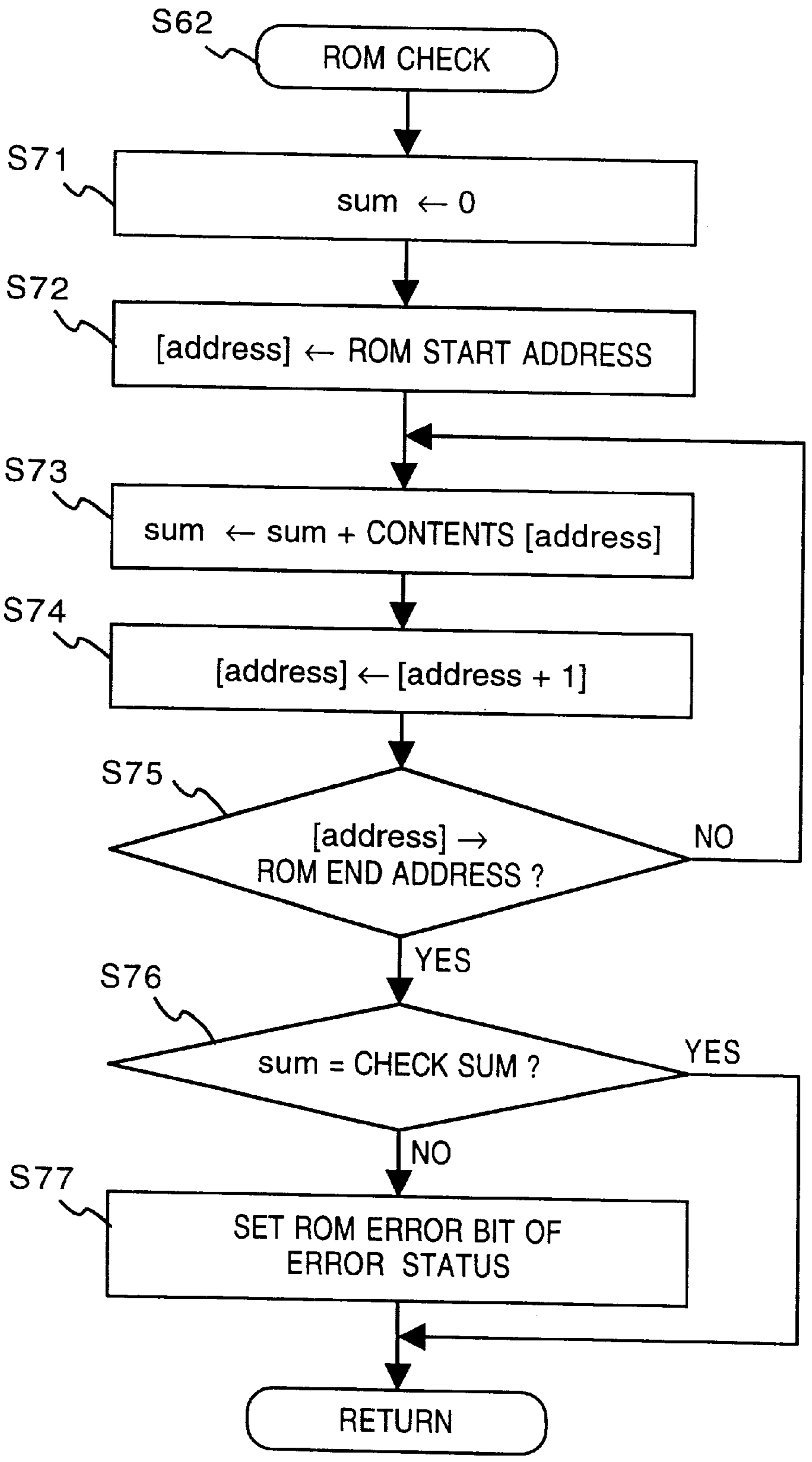
FIG. 23 is a flow chart showing in detail the ROM check processing shown in FIG. 21.

FIG. 23 shows in detail the check processing of the ROM 161 in step S62 in FIG. 21. In the ROM check processing, all the data in the ROM area are added in units of words to obtain a 16-bit unsigned integer value while ignoring overflow, and the obtained value is compared with a pre-calculated value (check sum=xxxxh) to confirm if the two values match each other.

In step S71, a register sum for storing the addition result is cleared. Subsequently, in step S72, the start address of the ROM is stored in an address register for holding the address value to be subjected to the ROM check processing. In step S73, the written contents are read out from the address, specified by the address register, of the ROM, and are added to the contents of the register sum. At this time, the addition result is a 16-bit unsigned integer value obtained by ignoring overflow.

The value of the address register is updated to designate the next address of the ROM in step S74. It is checked in step S75 if the updated address value has exceeded the end address of the ROM, i.e., the processing is completed for the entire area of the ROM. If NO in step S75, the flow returns to step S73, and the read-out processing of the contents of the next word updated in step S74 and the addition processing to the contents of the register sum are performed.

On the other hand, if YES in step S75, the flow advances from step S75 to step S76, and the addition result in the register sum is compared with a pre-calculated value (check sum=xxxxh). If the addition result in the register sum matches the pre-calculated value (check sum=xxxxh), it is determined that the ROM is normal, and the flow returns to the previous routine.

On the other hand, if the addition result in the register sum does not match the pre-calculated value (check sum=xxxxh), since a ROM error has occurred, an error bit indicating an unrecoverable error is set in step S77. The flow returns to the previous routine. Thereafter, unrecoverable error attention data is issued to the FLCD interface 2, and processing for shifting to a scan stop mode as one operation mode is performed.

Figure 24:
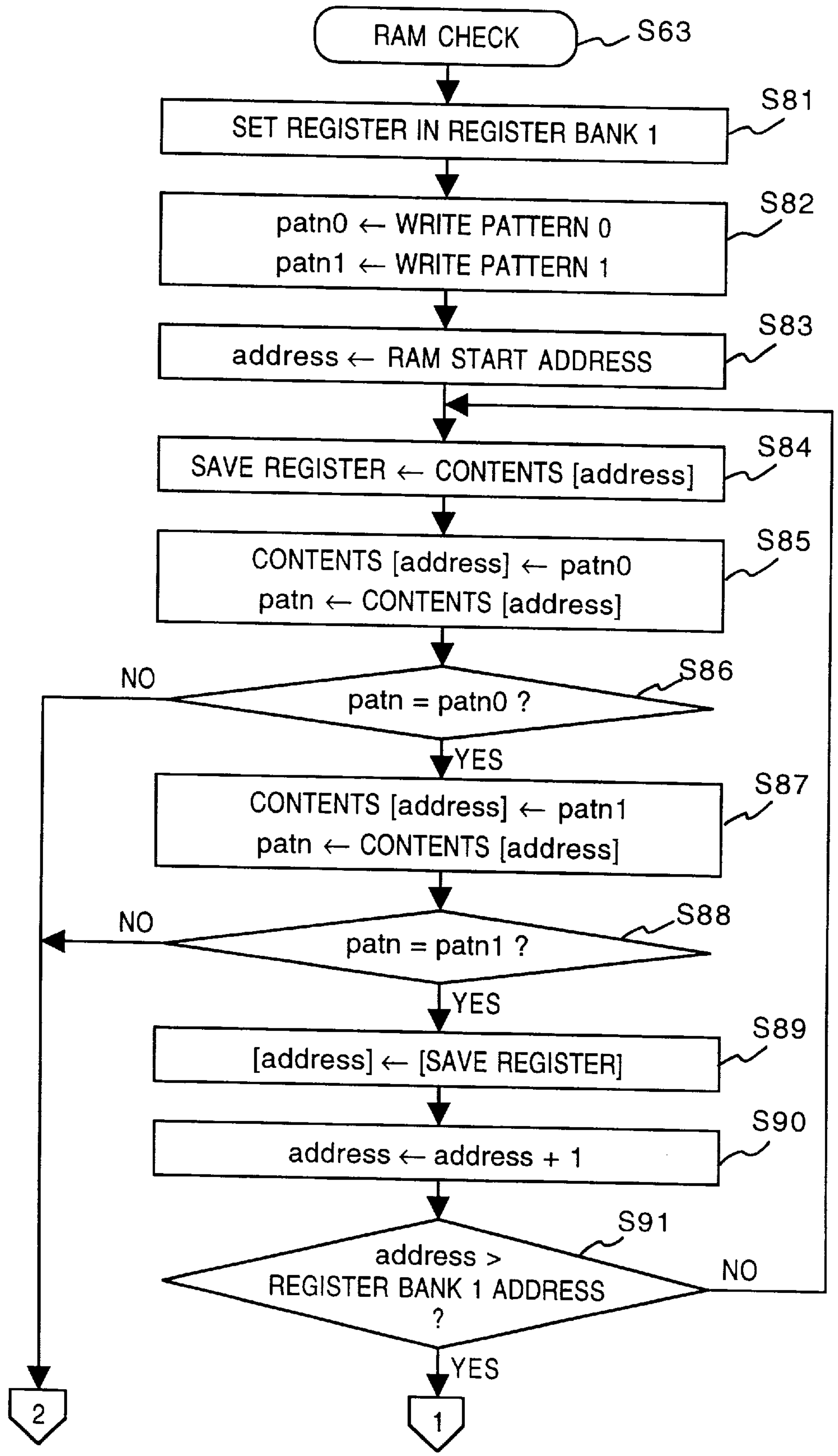
FIG. 24 is a flow chart showing in detail the RAM check processing shown in FIG. 21.
Figure 25:
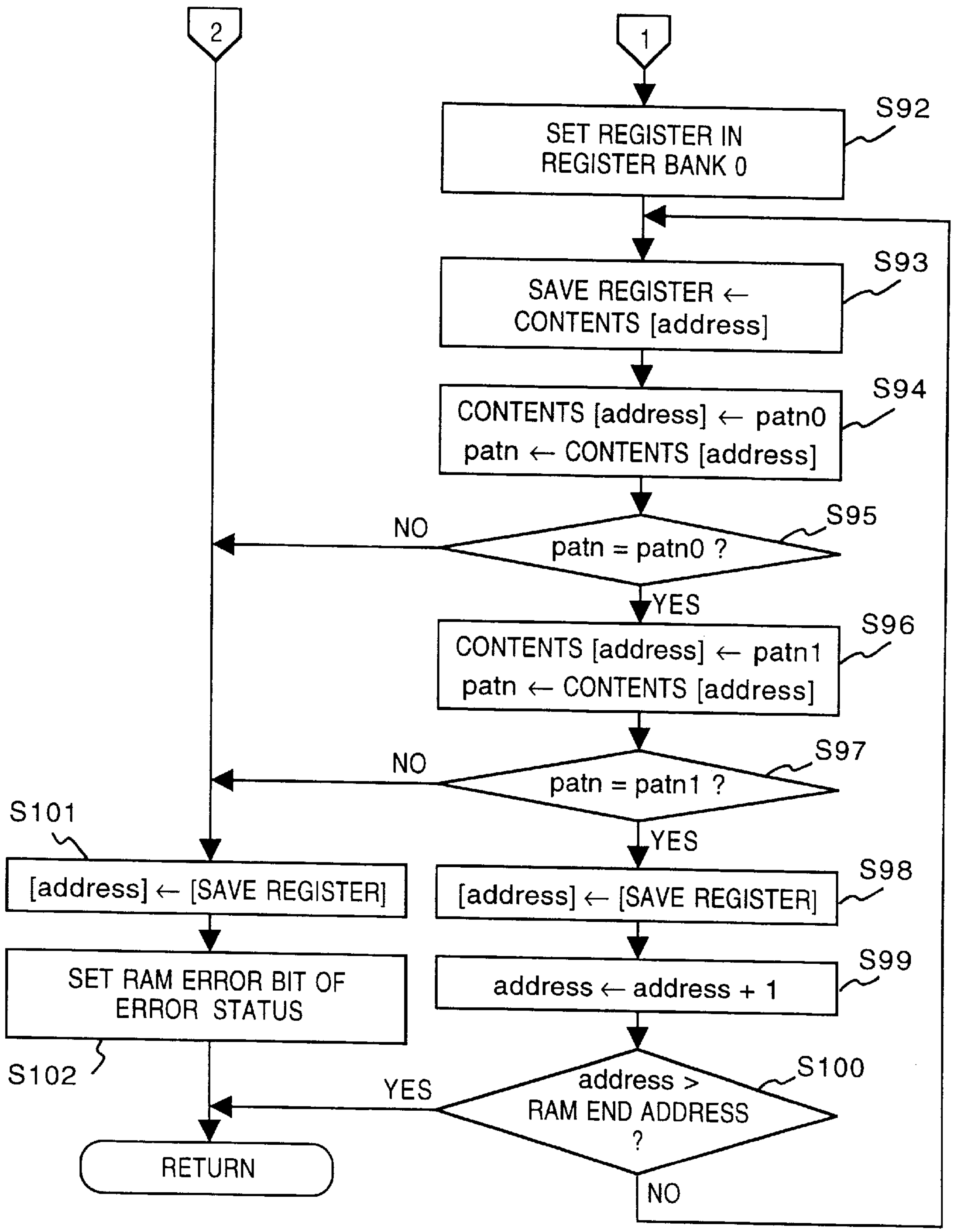
FIG. 25 is a flow chart showing in detail the RAM check processing shown in FIG. 21.

FIGS. 24 and 25 show in detail the check processing of the RAM 162 in step S63 in FIG. 21. In the RAM check processing, after data are written in the RAM area in units of words, the written data are read out to check if the readout data match the written data. In this case, data to be written are, for example, (00h) and (FFh). Upon writing, data already stored at a given write address is temporarily saved in a register, and is restored to the RAM upon completion of the check processing at that address.

In this embodiment, a plurality of register groups are allocated in the RAM. These register groups are called register bank 0, register bank 1, . . . . Initially, in order to check an area from the start address of the RAM to register bank 1, registers are set to be register bank 1 in step S81. Subsequently, in step S82, (00h) as pattern data to be written is registered in a patn0 register as pattern 0, and (FFh) as another pattern to be written is registered in a patn1 register as pattern 1. In step S83, the RAM start address as the first address of the RAM is set in an address register.

In this manner, since preparation for the RAM check processing is completed, the contents at the RAM address designated by the address register are read out, and are stored in a save register in step S84. Subsequently, in step S85, the contents of the patn0 register are written at the RAM address designated by the address register, the written contents are read out, and the readout contents are stored in a patn register. In step S86, the readout contents of the patn register are compared with the written contents of the patn0 register.

In this case, if a RAM error has occurred, i.e., the contents of the two registers are different from each other, the flow jumps to step S101 in FIG. 25, and the contents saved in the save register are written at the RAM address designated by the address register. In step S102, a RAM error bit in error status data is set, and the flow returns to the previous routine. Thereafter, unrecoverable error attention data is issued to the FLCD interface 2, and processing for shifting to the scan stop mode as one operation mode is performed.

On the other hand, if it is determined in step S86 that the readout contents of the patn register match the written contents of the patn0 register, the flow advances to step S87. In step S87, the contents of the patn1 register are written at the RAM address designated by the address register, the written contents are read out, and the readout contents are stored in the patn register. Subsequently, in step S88, the readout contents in the patn register are compared with the written contents of the patn1 register. If a RAM error has occurred, i.e., the contents of the two registers are different from each other, the flow jumps to step S101.

On the other hand, if it is determined in step S88 that the readout contents of the patn register match the written contents of the patn1 register, the flow advances to step S89, and the contents at the RAM address designated by the address register, which were saved in the save register in step S84, are restored. In step S90, the contents of the address register are incremented to set the next RAM address to be checked. It is then checked in step S91 if the check processing of the area up to register bank 1 is completed, and the contents of the address register have exceeded the address of register bank 1. If NO in step S91, the flow returns to step S84 to continue the check processing for the next address.

On the other hand, if YES in step S91, the flow advances to step S92 shown in FIG. 25.

In step S92, registers are set to be register bank 0 so as to perform the RAM check processing from the start address of the area of register bank 1 to the end address of the RAM, and write patterns 0 and 1 are set in the registers again. In step S93, the contents at the RAM address designated by the address register are read out, and are stored in the save register. Subsequently, in step S94, the contents of the patn0 register are written at the RAM address designated by the address register, the written contents are read out, and the readout contents are stored in the patn register. In step S95, the readout contents of the patn register are compared with the written contents of the patn0 register. In this case, if a RAM error has occurred, i.e., the contents of the two registers are different from each other, the flow jumps to step S101.

On the other hand, if it is determined in step S95 that the readout contents of the patn register match the written contents of the patn0 register, the flow advances to step S96. In step S96, the contents of the patn1 register are written at the RAM address designated by the address register, the written contents are read out, and the readout contents are stored in the patn register. Subsequently, in step S97, the readout contents in the patn register are compared with the written contents of the patn1 register. If a RAM error has occurred, i.e., the contents of the two registers are different from each other, the flow jumps to step S101.

On the other hand, if it is determined in step S97 that the readout contents of the patn register match the written contents of the patn1 register, the flow advances to step S98, and the contents at the RAM address designated by the address register, which were saved in the save register in step S93, are restored. In step S99, the contents of the address register are incremented to set the next RAM address to be checked. It is then checked in step S100 if the check processing of the entire RAM area is completed, and the contents of the address register have exceeded the end address of the RAM. If NO in step S100, the flow returns to step S93 to continue the check processing for the next address.

On the other hand, if YES in step S100, the processing ends, and the flow returns to the previous routine.

Figure 26:
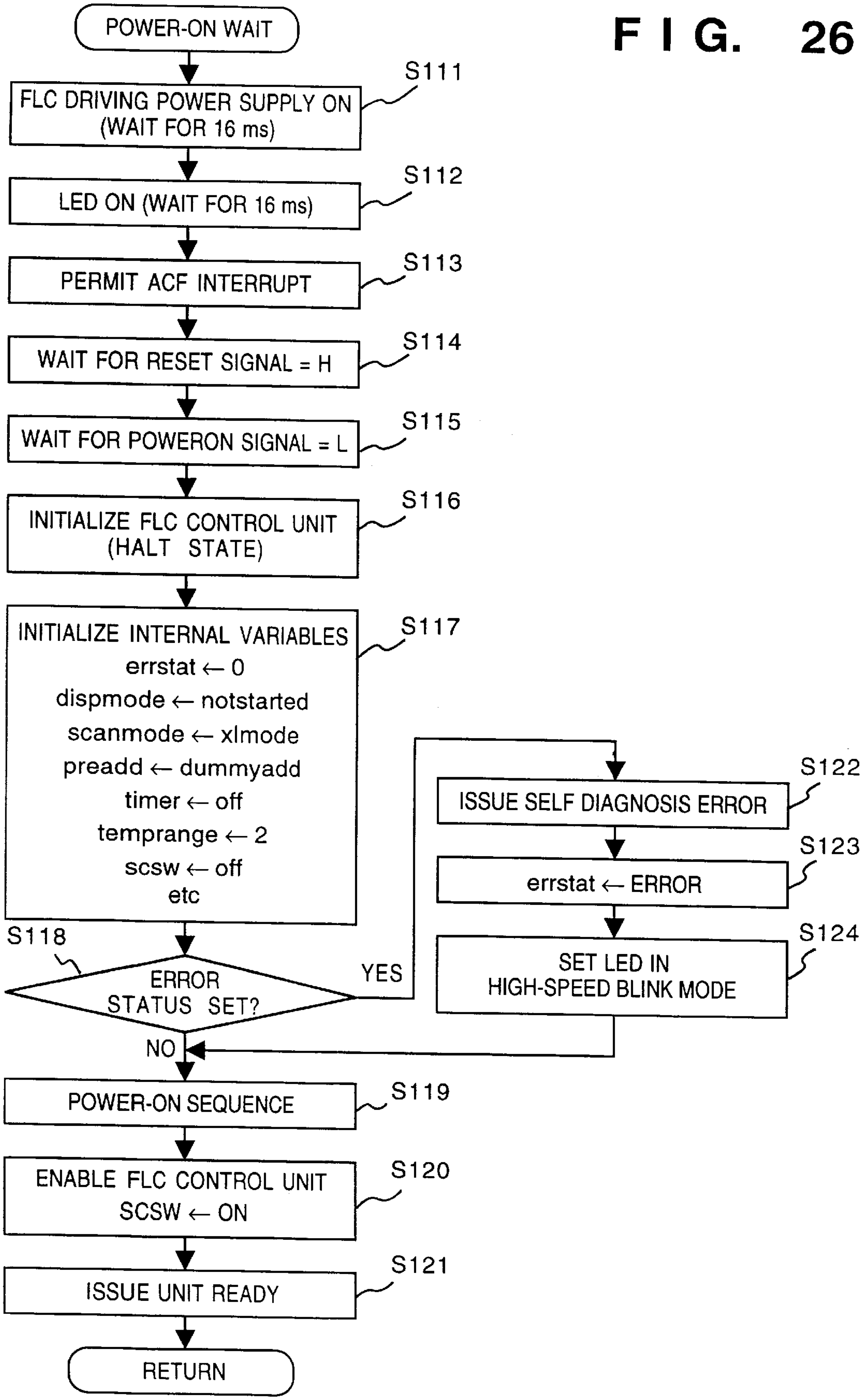
FIG. 26 is a flow chart showing in detail the power-ON wait processing shown in FIG. 20.

The power-ON wait processing in step S46 in FIG. 20 will be described below with reference to FIG. 26.

In step S111, the power switch controller 181 is controlled to turn on a 15-V power supply serving as a power supply for the LED. After the control waits for an elapse of 16 ms, the LED 109 is turned on in step S112. After the control waits for an elapse of another 16 ms, an ACF interrupt for the system controller 160 is permitted in step S113. In step S114, if the RESET signal from the FLCD interface 2 side is in the reset state at that time, i.e., is not at H (high) level, the control waits until the RESET signal changes to H level.

Subsequently, in step S115, it is also confirmed if the POWERON signal indicating that the power supply of the FLCD interface 2 side is turned on is set. In this case, if the POWERON signal is not set, the control waits until the power supply of the FLCD interface side is turned on. If the power supply of the host side is turned on, i.e., the POWERON signal is set, the flow advances to step S116 to initialize (set in the halt state) the FLC control portion, shown in FIG. 9, of the system controller 160.

Furthermore, internal variables are initialized in step S117. More specifically, the following initialization processing is performed. That is, status data (errstat) indicating an error state is cleared to 0, and subsequently, display mode control data (dispmode) is set to be nonstarted as a mode in which no display operation is performed. Also, the scan mode (scanmode) is set to be a x1 scan mode (x1mode), a dummy address is set in a previous scan address (preadd), the ON/OFF flag (timer) of a timer unit 902 is set to be OFF, and the FLC control portion is set in the OFF state not to perform the display operation of the FLC panel 150.

It is then checked in step S118 if an error status as a result of, e.g., the above-mentioned self diagnosis routine is set. If NO in step S118, the flow advances to step S119 to execute a power-ON sequence. Subsequently, in step S120, the operation of the FLC control portion set in the halt state in step S116 is enabled, and the SCSW is turned on to activate the trimmer interface 174, thereby controlling the driving signal based on the setting value of the image quality adjustment trimmer 107 and the detection value of the temperature sensor 105. In step S121, a "Unit Ready" attention is issued to the FLCD interface 2 side via the serial interface 311, and the flow then returns to the previous routine.

On the other hand, if it is determined in step S118 that the error status is set, the flow advances to step S122, and a self diagnosis error attention is issued to the FLCD interface 2 side via the serial interface 311. Subsequently, in step S123, the status errstat indicating the error state is set to be "error". In step S124, the LED 109 is set in a blink mode in which the LED 109 is turned on/off at short periods in the case of an unrecoverable mode (to be described later), thus blinking the LED 109 at short periods. With this control, the user can easily and visually confirm that an error has occurred in the FLCD 3. The flow then advances to step S119 to execute the power-ON sequence.

Figure 27:
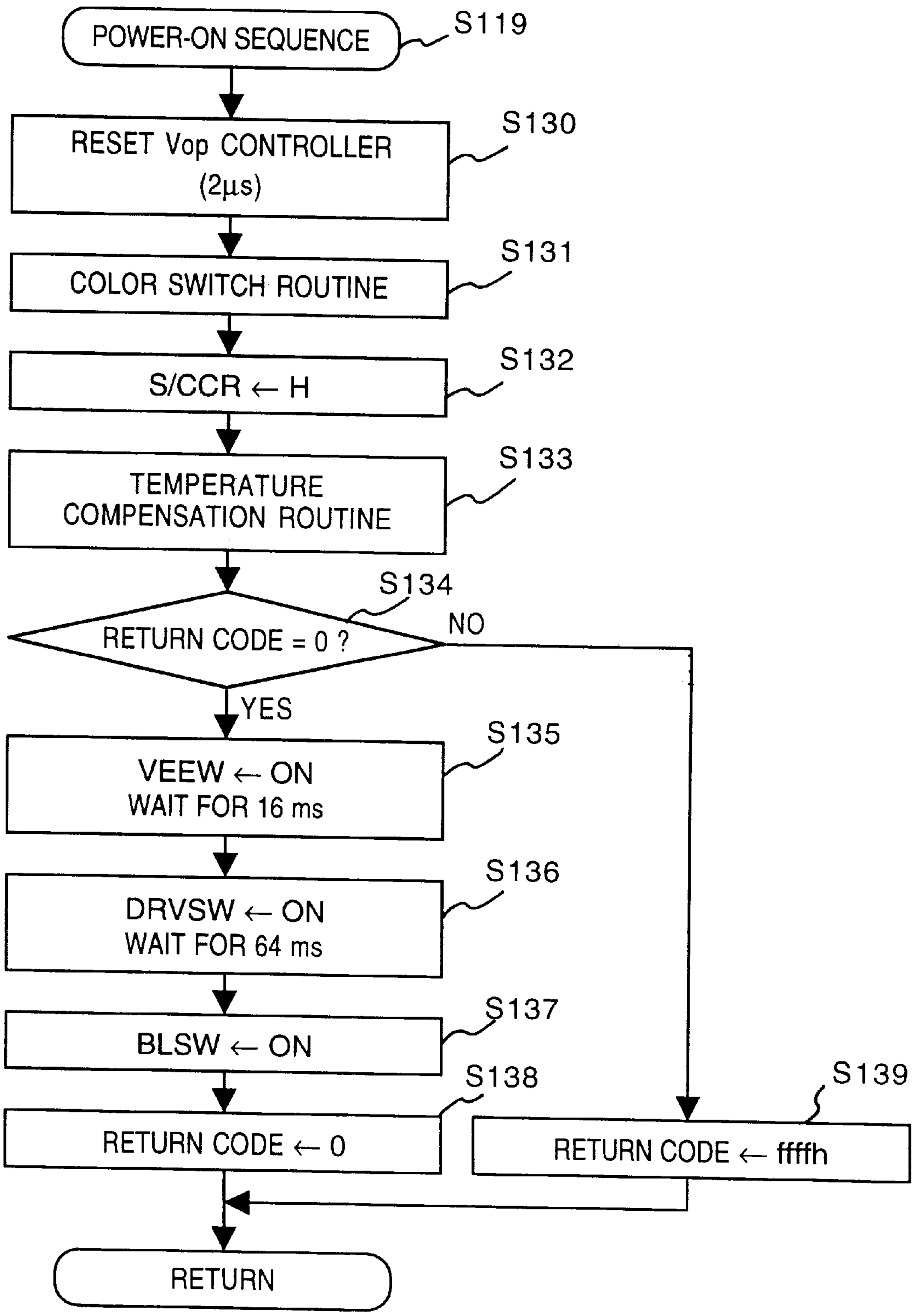
FIG. 27 is a flow chart showing in detail the power-ON sequence processing shown in FIG. 26.

The power-ON sequence routine in step S119 in FIG. 26 will be described below with reference to FIG. 27.

In step S130, the Vop controller 173 is reset. Subsequently, a color switch routine is executed in step S131, and (S/CCR) is set at H level in step S132. In step S133, a temperature compensation routine is executed. It is then checked in step S134 if a return code (end code) as a result of the processing of the temperature compensation routine is 0. If NO in step S134, the flow advances to step S139, and (ffff)H is set as the return code. Thereafter, the flow returns to the previous routine.

On the other hand, if YES in step S134, the flow advances to step S135, and a VEESW signal is set in the ON state to energize an output channel power supply (VEE) of the respective driver circuits. The Vop controller 173 is controlled to turn on the output channel power supply of the respective driver circuits. The control waits for an elapse of 16 ms, and a DRVSW signal is set in the ON state in step S136 to input the output from the liquid crystal driving voltage regulator. Subsequently, after waiting for an elapse 64 ms, in step S137, a BLSW signal is set in the ON state to instruct the backlight controller 172 to turn on the backlight power supply. Then, 0 is set in a return code, and the flow returns to the previous routine.

Figure 28:
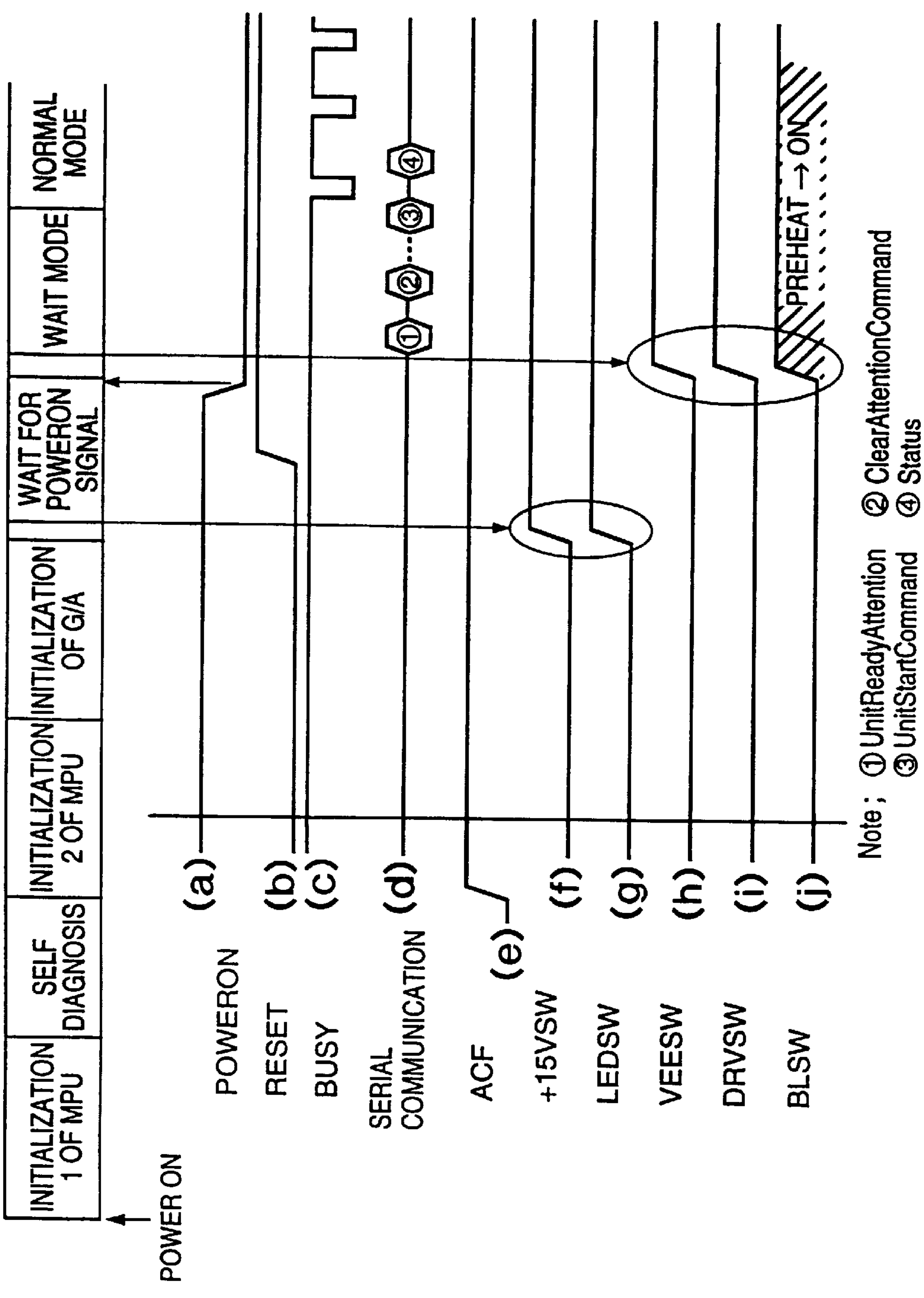
FIG. 28 is a timing chart of signals in a series of operations of power-ON processing of an FLCD 3 in the embodiment shown in FIG. 1.

FIG. 28 is a timing chart of the signals as a result of a series of operations upon power-ON of the FLCD 3. In serial communications shown in FIG. 28, the FLCD issues a "Unit Ready" attention shown in FIG. 26 at timing ①, and a "Clear Attention" command is returned at timing ②. Thereafter, at timing ③, the backlights are turned on, the operation mode shifts to the normal display mode, and the FLCD interface 2 transmits a "Unit Start" command. Then, at timing ④, status data for this command is transmitted.

The operation selection processing in step S47 and the subsequent steps in FIG. 20 after the power-ON processing will be described below with reference to FIGS. 29 to 31.

In the following description, a user trimmer monitoring timing drawing line number counter value "linc" means the time interval for monitoring the user trimmer state. That is, in this embodiment, the user trimmer is checked every time a predetermined number of lines are display-driven, and the predetermined number of lines corresponds to "linc".

The FLCD 3 has the normal display mode, the static mode (suitable for observing a still image) in which the display driving operation is stopped unless it is not cancelled, and the sleep mode in which the backlights are turned off to stop the display operation so as to suppress consumption power. The data dispmode holds one of these modes. Also, this data is used for storing an error status.

In the operation selection processing, initialization processing of work registers is executed in step S140. Work register 0 (rw0) is set with the user trimmer monitoring timing drawing line number counter value (linc), work register 1 (rw1) is set with the display operation mode set by dispmode, and an error state is set to be errstat. Also, work register 2 (rw2) is set with a scan mode (scanmode) added in the header portion of image data, work register 3 (rw3) is set with a previous scan address (preadd), and work register 4 (rw4) is set with a buffer pointer (buffpointer) of a transmission data buffer for buffering a transmission image and the like, since the transmission priority order and holding operation information after transmission, and the transmission image including attention information in the case of attention must be set in addition to transmission data upon transmission of status and attention. Furthermore, work register 5 is set with an ON/OFF flag (timer) of the timer unit 902. In this manner, these work registers are initialized.

In the above description, the previous scan address is written in work register rw3 for the following reason.

Upon display-driving one line of the FLC panel 150, data of a line to be written is temporarily cleared, and thereafter, the data is written in the line in principle. Data must be continuously written in the same line after the immediately preceding write access is completed. Thus, it must be checked if the address of the current line to be written is the same as the previous address. For this reason, work register rw3 holds the previous address.

Since information is exchanged with the FLCD interface 2 via the serial communication line 311 with a relatively low speed, as described above, an attention or status cannot be immediately transmitted. Thus, the attention and status data are temporarily stocked in a buffer memory, and are sequentially transmitted from the buffer memory. Work register rw4 stores the addresses of data to be transmitted.

The ON/OFF flag of the timer unit 902 to be set in work register rw5 has the following meaning.

When the FLC panel 150 of this embodiment is driven, the display driving operation of the next line is performed after an elapse of the display driving period 1H of the current one scan line. The period 1H is measured by the timer unit 902. Thus, if the period 1H is measured during processing for performing the display driving operations for the number of lines indicated by the user timer monitoring timing drawing line number counter value (linc), and checking the user trimmer state, the display driving operation of the next line cannot be performed in time. That is, during this interval, the timer unit 902 must be stopped. However, it is inconvenient if it cannot be discriminated whether or not the timer unit 902 is in operation. Therefore, since information indicating whether or not the timer unit 902 is in operation must be held, work register rw5 is allocated.

Subsequently, it is checked in step S141 if the power supply of the FLCD interface 2 is turned on, i.e., the POWERON signal from the FLCD interface 2 is at high level. If YES in step S141, the flow advances to step S142 to check the contents of register rw1, i.e., if the operation mode is the normal operation mode (NORMAL). If NO in step S142, the flow advances to step S176.

On the other hand, if the contents of register rw1 are NORMAL, i.e., the operation mode is the normal operation mode, the flow advances to step S143 to check the contents of register rw5. Since register rw5 holds information indicating whether or not the timer unit 902 is in operation, if rw5=ON, it indicates that the timer unit 902 is in operation. If the timer unit 902 is not in operation, the flow advances to step S144. In step S144, the timer unit is restarted, and rw5=ON is set. Thereafter, the flow advances to step S145 in FIG. 30.

Figure 30:
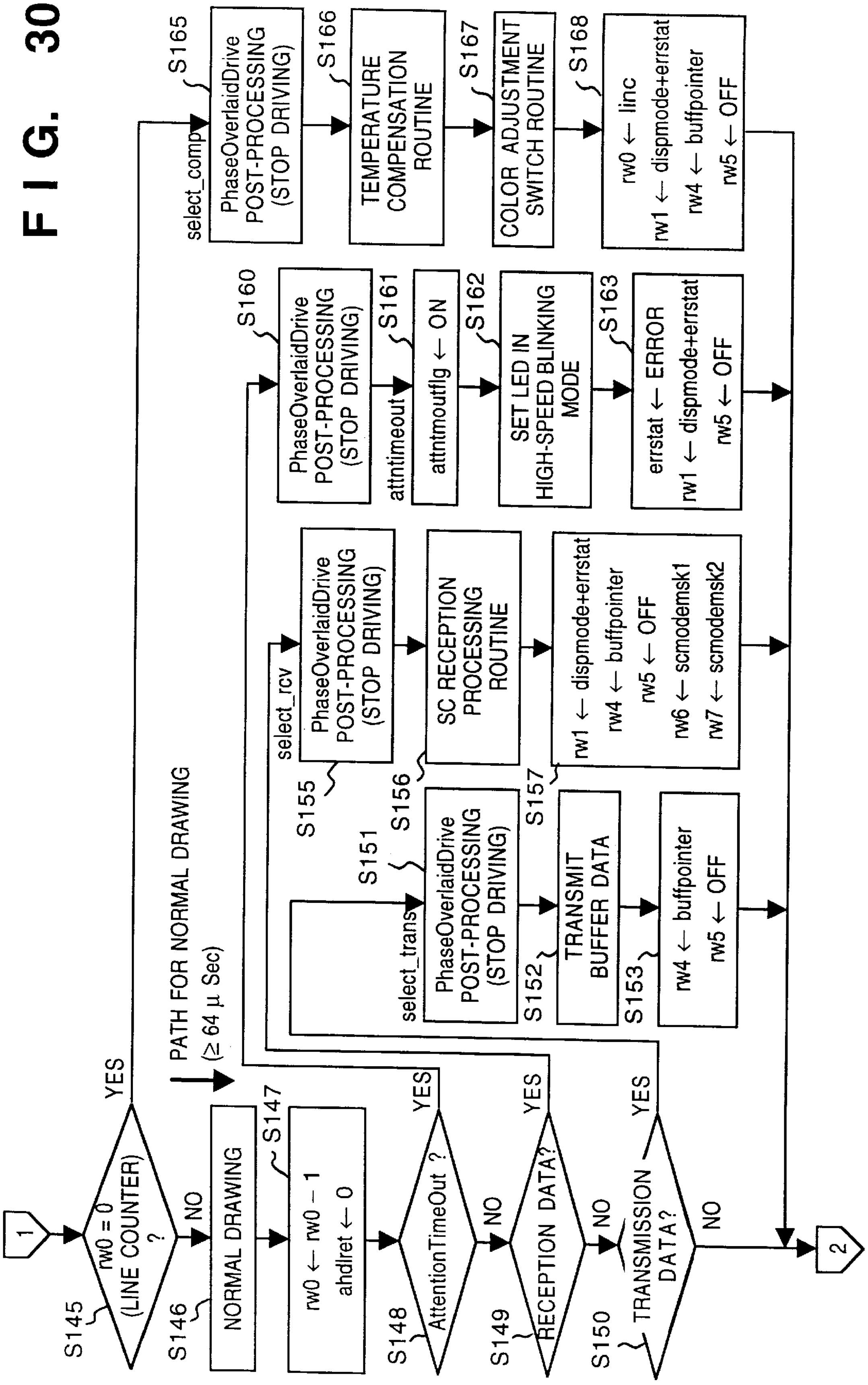
FIG. 30 is a flow chart showing in detail the operation selection processing shown in FIG. 20 in the embodiment shown in FIG. 1.
Figure 31:
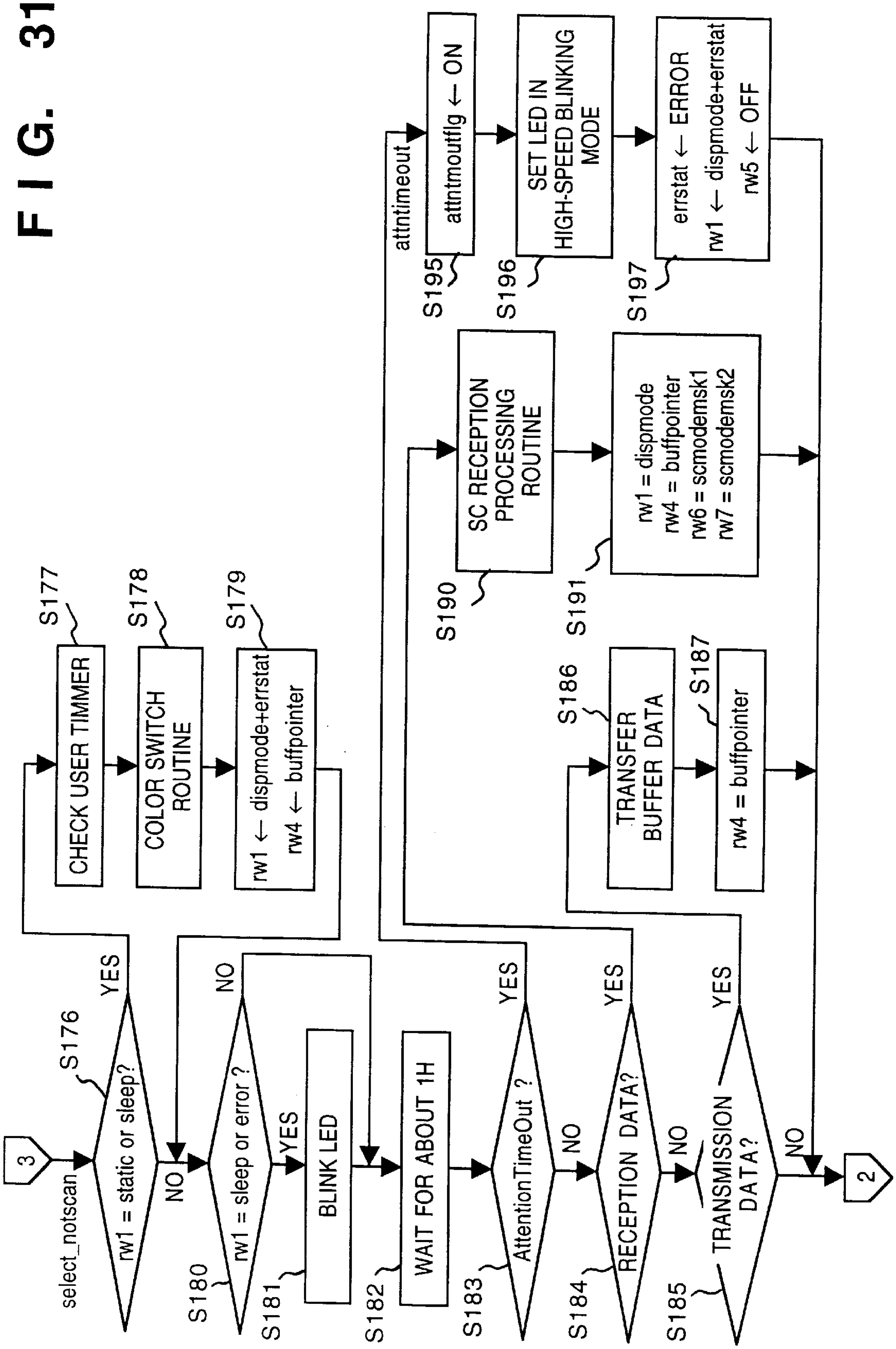
FIG. 31 is a flow chart showing in detail the operation selection processing shown in FIG. 20 in the embodiment shown in FIG. 1.

If it is determined in step S143 that rw5=ON, i.e., the timer unit 902 is in operation, the flow directly advances to step S145 in FIG. 30. It is checked in step S145 if rw0 (the user trimmer monitoring timing drawing line number counter value (linc))=0. If NO in step S145, normal drawing processing is executed in step S146. Subsequently, in step S147, rw0 (the user trimmer monitoring timing drawing line number counter value (linc)) is decremented by 1, and 0 is stored in a time-out retry counter (ahdlretry). It is then checked in step S148 if an "Attention Time Out" state has occurred. If NO in step S148, the flow advances to step S149 to check if there are data to be received from the FLCD interface 2. If NO in step S149, the flow advances to step S150 to check if there are data to be transmitted to the FLCD interface 2. If NO in step S150, the flow returns to step S141, and the normal drawing processing is performed.

In the above-mentioned state, if transmission data is generated in step S150, the flow advances from step S150 to the processing in step S151 and the subsequent steps, thus executing transmission mode processing. In step S151, "Phase Overlaid Drive" post-processing is performed to stop the driving operation of the FLC panel 150. Subsequently, in step S152, transmission processing of data in the transmission buffer is performed. Thereafter, in step S153, the value of this buffer address pointer is set in rw4 so that the contents of the buffer can be read out again, and rw5 is set to be OFF to reset the ON/OFF flag of the timer unit 902. Thereafter, the flow returns to step S141.

On the other hand, if reception data is detected in step S149, the flow advances from step S149 to step S155, and "Phase Overlaid Drive" post-processing is performed to stop the driving operation of the FLC panel 150. Subsequently, in step S156, an SC reception processing routine is executed to receive data from the FLCD interface 2.

Thereafter, in step S157, data added to the header portion of image data received in the SC reception processing routine are set in the work register area of the RAM 162. That is, the display operation mode (dispmode) and error state (errstat) are set in rw1, the buffer pointer (buffpointer) of the transmission data buffer in rw4 is updated, the ON/OFF flag of the timer unit 902 in rw5 is set to be OFF, and mask 1 (scmodemsk1) for extracting the designated scan mode from the header portion of image data is set in rw6. If the mask data is 0000H, the scan mode is set in accordance with data in the header portion of image data; if the mask data is 0000H, the scan mode is designated via a communication. In addition, mask 2 (scmodemsk2) for extracting the designated scan mode from the header portion of image data is set. If mask data is 00000H, the scan mode is set in accordance with the data in the header portion of image data or is set to be the x1 mode; if mask data is 40000H, the scan mode is set to be the x2 mode; and if mask data is 80000H, the scan mode is set to be the x4 mode. Thereafter, the flow returns to step S141.

Furthermore, if it is determined in step S148 that an "Attention Time Out" state has occurred, the flow advances from step S148 to step S160, and "Phase Overlaid Drive" post-processing is performed to stop the driving operation of the FLC panel 150. Subsequently, in step S161, a flag (attntmoutflg) indicating the attention time out state is set (ON). In step S162, the LED 109 is set in the blinking mode in which the LED 109 is turned on/off at short periods to indicate the unrecoverable mode. The operator can easily and visually confirm at a glance of the LED indication that an error has occurred in the apparatus.

Thereafter, in step S163, "error" is set in errstat indicating the error state, the display operation mode (dispmode) and the error state (errstat) are set in rw1, and the ON/OFF flag (timer) of the timer unit 902 in rw5 is set to be OFF. The flow then returns to step S141.

On the other hand, if it is determined in step S145 that rw0 (the user trimmer monitoring timing drawing line number counter value (linc))=0, the flow advances to step S165, and "Phase Overlaid Drive" post-processing is performed to stop the driving operation of the FLC panel 150. Subsequently, a temperature compensation routine is executed in step S166, and a color adjustment switch routine is executed in step S167.

Thereafter, in step S168, the user trimmer monitoring timing drawing line number counter value (linc) is set in work register 0 (rw0), the display operation mode set by dispmode and the error state indicated by errstat are set in work register 1 (rw1), the buffer pointer (buffpointer) of the transmission data buffer is set in work register 4 (rw4), and "OFF" is set as the ON/OFF flag (timer) of the timer unit 902 in work register 5 (rw5). Then, the flow returns to step S141.

Figure 29:
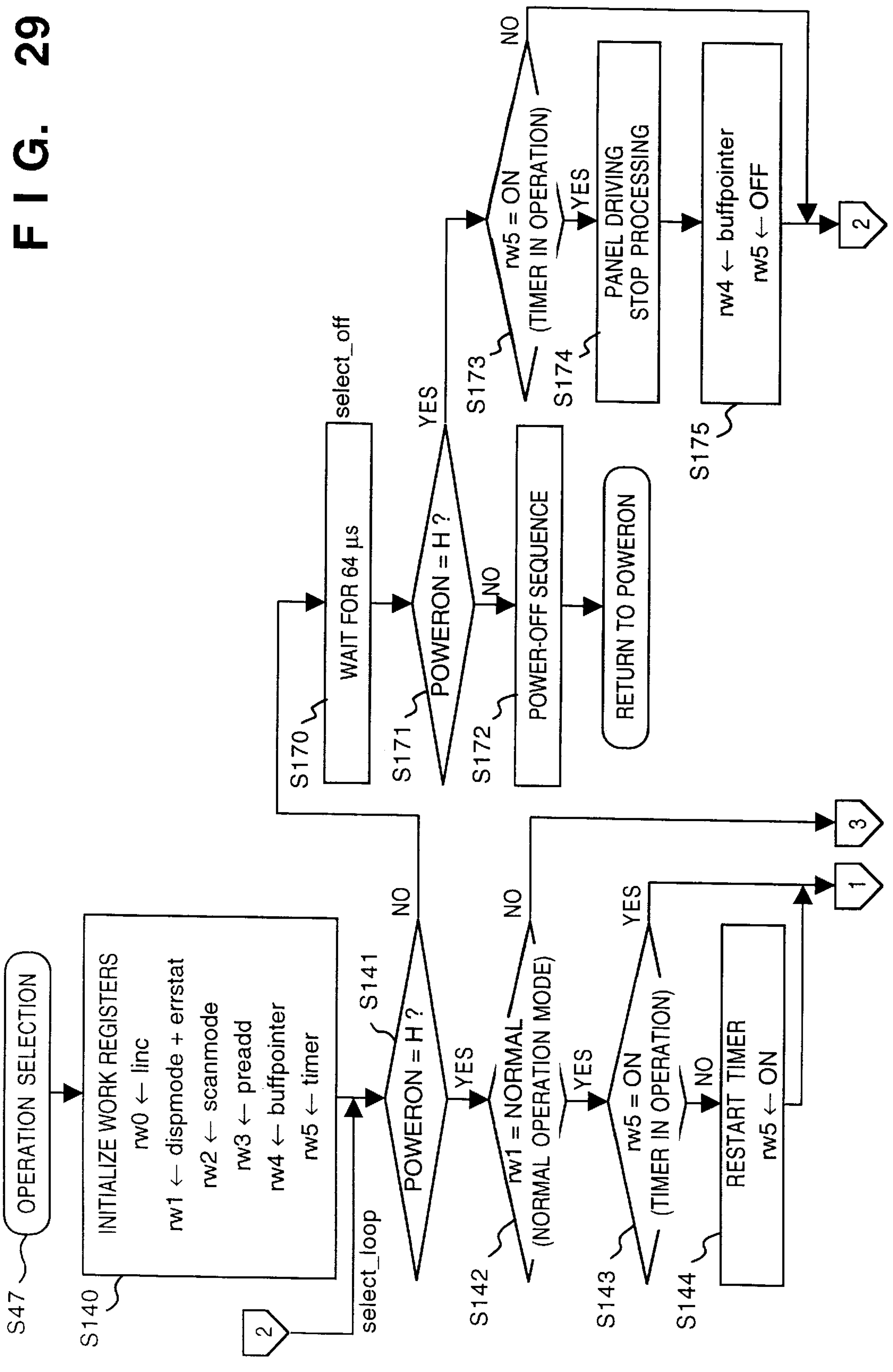
FIG. 29 is a flow chart showing in detail the operation selection processing shown in FIG. 20 in the embodiment shown in FIG. 1.

If it is determined in step S141 in FIG. 29 that the POWERON signal is not at high level, since the power supply of the FLCD interface 2 is not turned on, the flow advances to step S170, and the control waits for 64 μs. Thereafter, it is checked again in step S171 if the POWERON signal is at high level. If NO in step S171, a power-OFF sequence is executed in step S172, and the flow then returns to the power-ON processing starting from step S41 in FIG. 20.

On the other hand, if YES in step S171, the flow advances from step S171 to step S173 to check if rw5=ON (the timer unit 902 is in operation). If NO in step S173, the flow returns to step S141.

On the other hand, if YES in step S173, the flow advances to step S174 to perform panel driving stop processing, thereby stopping the driving operation of the FLC panel 150. In step S175, the buffer pointer (buffpointer) of the transmission data buffer is set in work register 4 (rw4), and "OFF" is set in the ON/OFF flag (timer) of the timer unit 902 in work register 5 (rw5). Thereafter, the flow returns to step S141.

Furthermore, if it is determined in step S142 that the display operation mode is not the normal operation mode, the flow advances from step S142 to step S176 to check if the setting contents of work register 1 (rw1) indicate one of the two display operation modes selectable as the normal operation modes of the display apparatus of this embodiment, i.e., the static operation mode (static) or the sleep operation mode (sleep) as the power saving mode. If NO in step S176, the flow advances to step S180.

On the other hand, if YES in step S176, the flow advances from step S176 to step S177 to check the luminance adjustment trimmer 106 and the image quality adjustment trimmer 107 as the user trimmers. Then, the color switch routine according to the setting state of the color adjustment switch 108 is executed in step S178.

Thereafter, in step S179, the display operation mode set by dispmode and the error state indicated by errstat are set in rw1, and the buffer pointer (buffpointer) of the transmission data buffer is set in work register 4 (rw4). The flow then advances to step S180.

It is checked in step S180 as in step S176 if the setting contents of work register 1 (rw1) indicate one of the two display operation modes selectable as the normal operation modes of the display apparatus of this embodiment, i.e., the static operation mode (static) or the sleep operation mode (sleep) as the power saving mode. If NO in step S180, the flow jumps to step S182.

On the other hand, if YES in step S180, the flow advances from step S180 to step S181, and the LED 109 is set in the blinking mode in which the LED 190 is turned on/off at short periods. The flow then advances to step S182.

In step S182, the control waits for about a 1H period, and then, the flow advances to step S183. It is checked in step S183 if an "Attention Time Out" state has occurred. If NO in step S183, the flow advances to step S184 to check if there are data to be received from the FLCD interface 2. If NO in step S184, the flow advances to step S185 to check if there are data to be transmitted to the FLCD interface 2. If NO in step S185, the flow returns to step S141 to perform the above-mentioned normal drawing processing.

In the above-mentioned state, if it is determined in step S185 that data to be transmitted is generated, the flow advances from step S185 to step S186, and data in the transmission buffer is transmitted to the FLCD interface 2 via the serial communication line. Thereafter, the value of the buffer address pointer is set in rw4 in step S187, so that the next buffer stored data can be read out. Then, the flow returns to step S141.

On the other hand, if it is determined in step S184 that there is data to be received, the flow advances from step S184 to step S190 to execute the SC reception processing routine, thus receiving data from the FLCD interface 2. Thereafter, in step S191, data added to the header portion of image data received in the SC reception processing routine are set in the work register area of the RAM 162. That is, the display operation mode (dispmode) and error state (errstat) are set in rw1, the buffer pointer (buffpointer) of the transmission data buffer in rw4 is updated, and mask 1 (scmodemsk1) for extracting the designated scan mode from the header portion of image data is set in rw6. If the mask data is c0000H, the scan mode is set in accordance with data in the header portion of image data; if the mask data is 00000H, the scan mode is designated via a communication. In addition, mask 2 (scmodemsk2) for extracting the designated scan mode from the header portion of image data is set. If mask data is 00000H, the scan mode is set in accordance with the data in the header portion of image data or is set to be the x1 mode; if mask data is 40000H, the scan mode is set to be the x2 mode; and if mask data is 80000H, the scan mode is set to be the x4 mode. Thereafter, the flow returns to step S141.

Furthermore, if it is determined in step S183 that an "Attention Time Out" state has occurred, the flow advances from step S183 to step S195, and a flag (attntmoutflg) indicating the attention time out state is set (ON). In step S196, the LED 109 is set in the blinking mode in which the LED 109 is turned on/off at short periods to indicate the unrecoverable mode. The operator can easily and visually confirm at a glance of the LED indication that an error has occurred in the apparatus.

Thereafter, in step S197, "error" is set in errstat indicating the error state, the display operation mode (dispmode) and the error state (errstat) are set in rw1, and the ON/OFF flag (timer) of the timer unit 902 in rw5 is set to be OFF. The flow then returns to step S141.

The display mode in the above description will be explained below. The FLCD 3 of this embodiment has three display modes in a normal operation state, i.e., the normal operation display mode (Normal), the static display mode (Static) suitable for displaying a still image, and the sleep mode (Sleep) in which the entire display screen of the FLCD 3 is painted in black and the backlights are turned off to attain a power saving state, as shown in FIG. 32. In addition, the FLCD 3 has a display mode upon occurrence of an unrecoverable error. In this case, the screen display operation maintains a state immediately before an unrecoverable error has occurred. In order to discriminate the respective operation mode states, the ON/OFF control of the LED 109 is performed together. As described above, in the sleep mode, the LED is turned on/off at 1-sec intervals, and in an unrecoverable error, the LED is turned on/off at 0.5-sec intervals as shorter blinking intervals than in the sleep mode.

In this embodiment, since the LED is set in different ON states in correspondence with the respective operation states, even when the operator leaves the display apparatus for a while, he or she can recognize the current state of the display apparatus by observing the LED ON state. As a result, the operator can be prevented from erroneously judging the operation state in the sleep mode as the power-OFF state, and can easily recognize whether or not an unrecoverable error has occurred. Therefore, an operation error can be prevented, and an appropriate measure can be taken.

Figure 33:
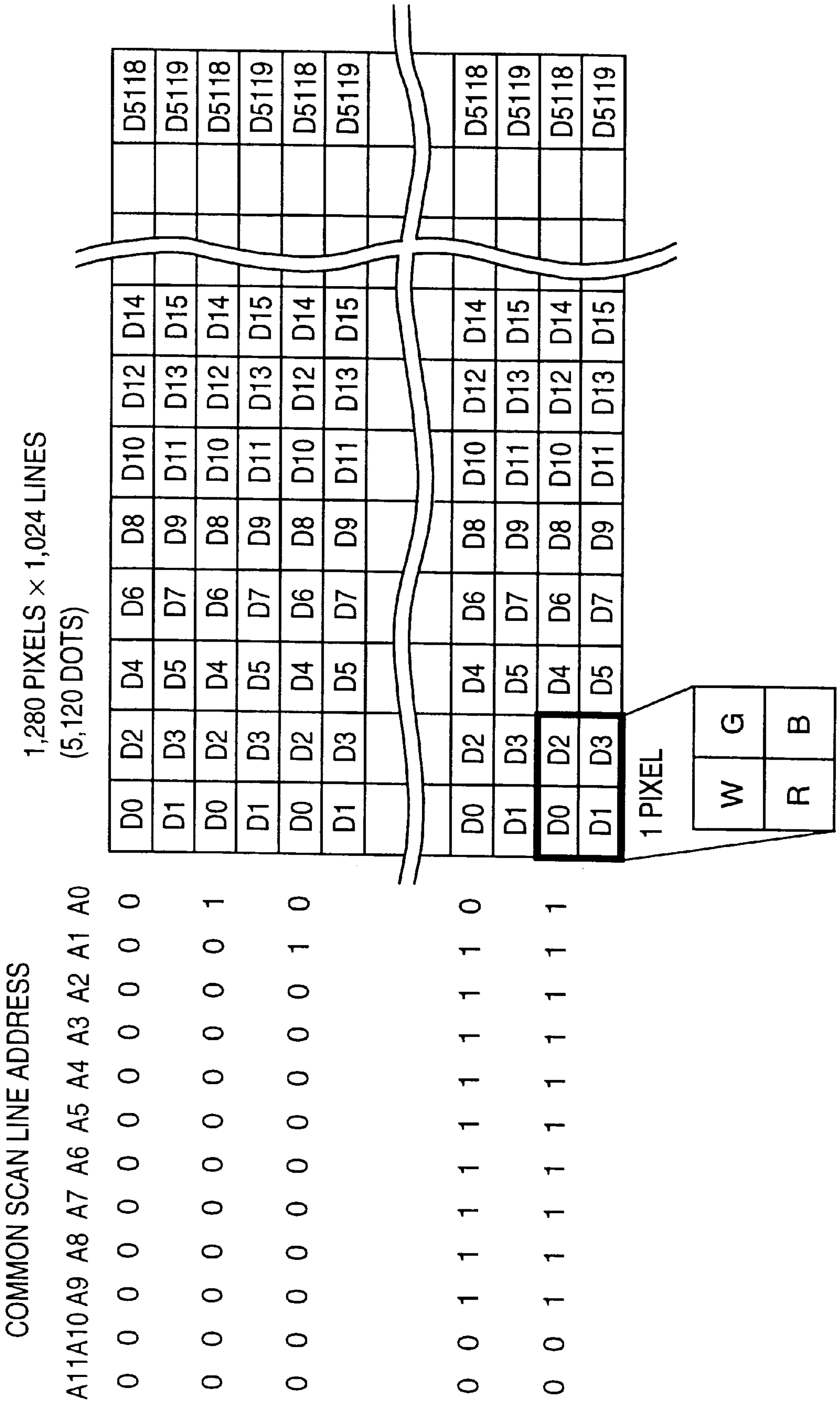
FIG. 33 is a view for explaining the image data display position on an FLC panel in the embodiment shown in FIG. 1.

The normal drawing processing shown in FIG. 30 will be described in detail below. Prior to the description of this processing, the image data display position of the FLC panel 150 of this embodiment will be described below. The image data display position of the FLC panel 150 forms one pixel using four, R, G, B, and W colors, and pixel data is expressed by four color data D0 to D3. For example, as shown in FIG. 33, when the display panel of this embodiment can display 1,280 pixels×1,024 lines, segment data for one common scan line address (A0 to A11) consist of a total of 5,120 (=1,280×4) data (D0 to D5119).

The FLCD 3 sets the BUSY signal at low level to indicate "not busy". Upon reception of this signal, the FLCD interface 2 sets an AHDL signal at high level, and outputs a 12-bit scan address for one clock onto image data buses PD0 to PD15 in synchronism with FCLK. Thus, the NFX controller 101 of the FLCD 3 receives the address in correspondence with a 1-line write period (1H) of the FLCD 3, and sets the BUSY signal at high level.

Figure 34:
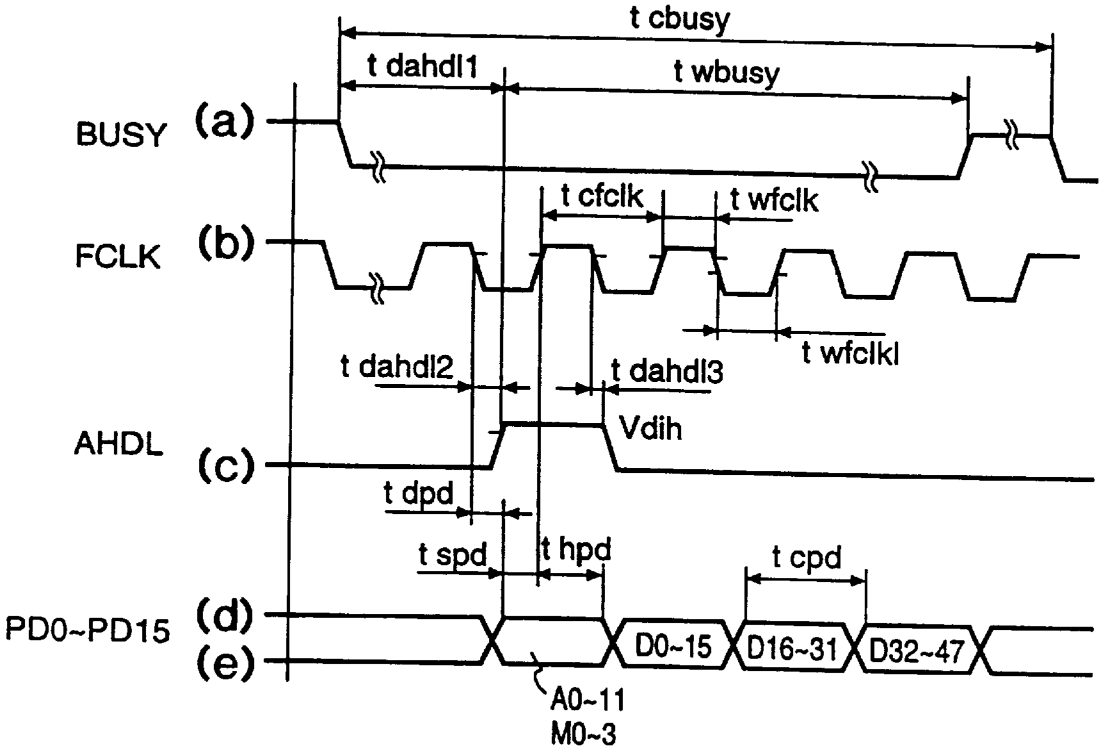
FIG. 34 is a timing chart and a table for explaining the transfer timing of display state in the embodiment shown in FIG. 1.

FIG. 34 is a timing chart showing the signals during this interval.

Figure 35:
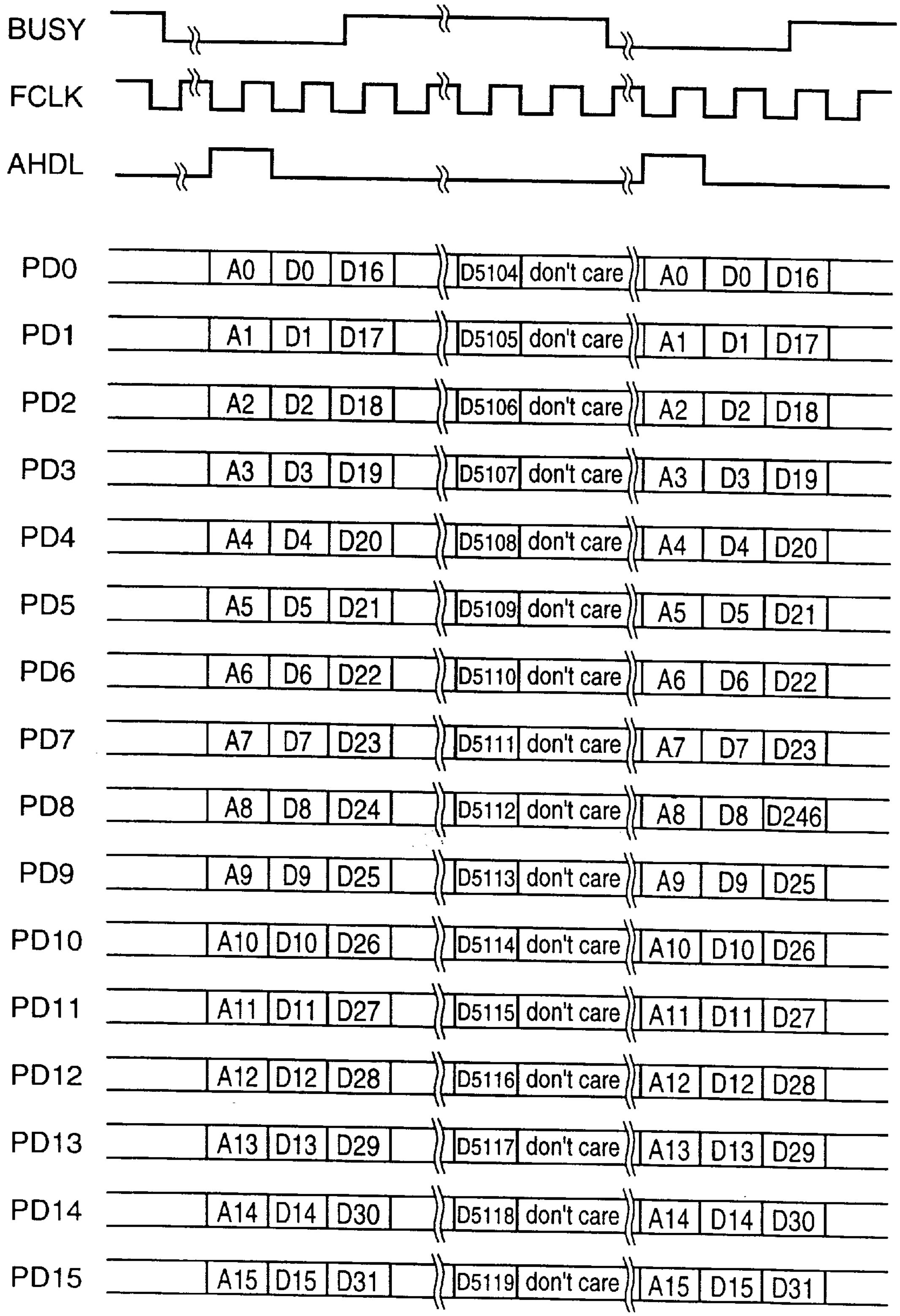
FIG. 35 is a view showing the formats of actual data sent from the FLCD interface in accordance with the timing chart shown in FIG. 34.

Furthermore, FIG. 35 shows the actual formats of data to be supplied from the FLCD interface 2 in accordance with the timing chart shown in FIG. 34. As shown in FIG. 35, display data from D0 to D15 to D5104 to D5119 are sequentially supplied using PD0 to PD15 in synchronism with the signal FCLK.

Figure 36:
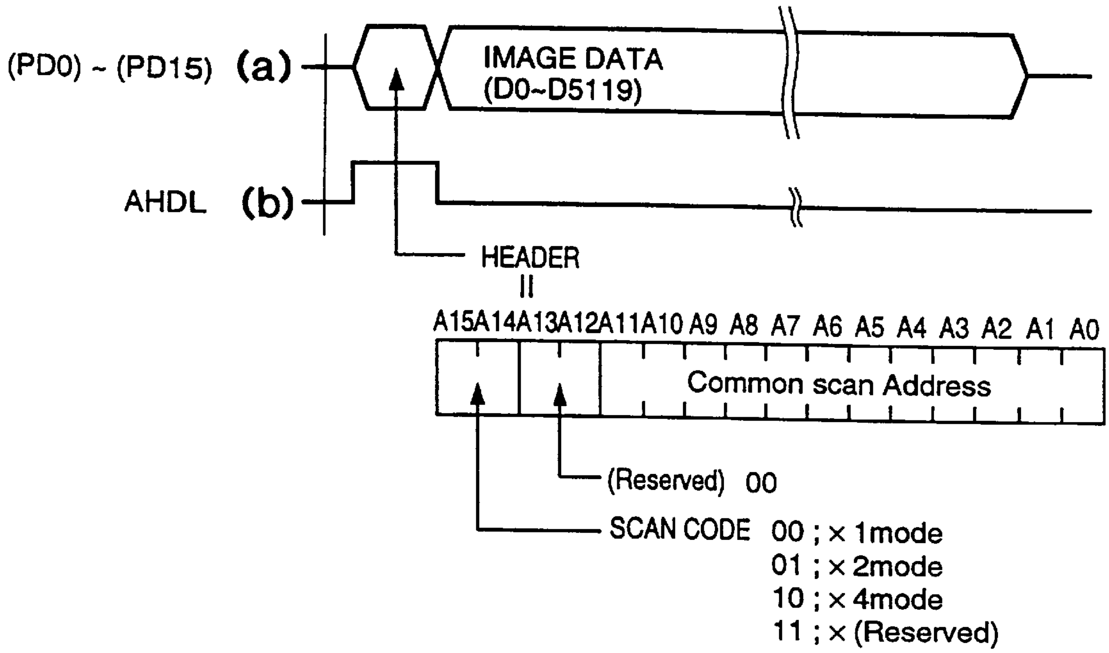
FIG. 36 is a view for explaining the scan address and scan code transfer timing in the embodiment shown in FIG. 1.
Figure 37:
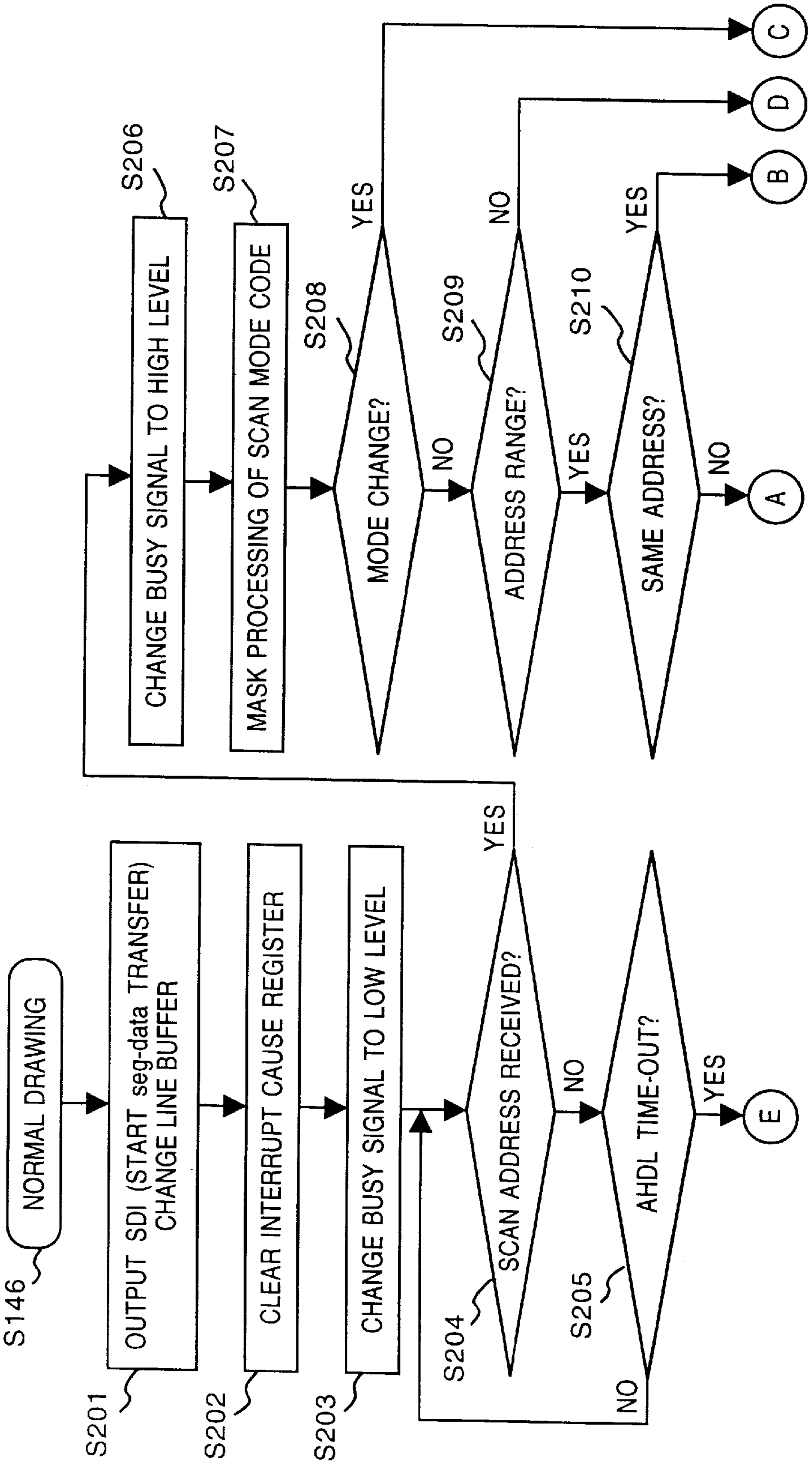
FIG. 37 is a flow chart showing in detail the normal drawing processing shown in FIG. 30 in the embodiment shown in FIG. 1.
Figure 38:
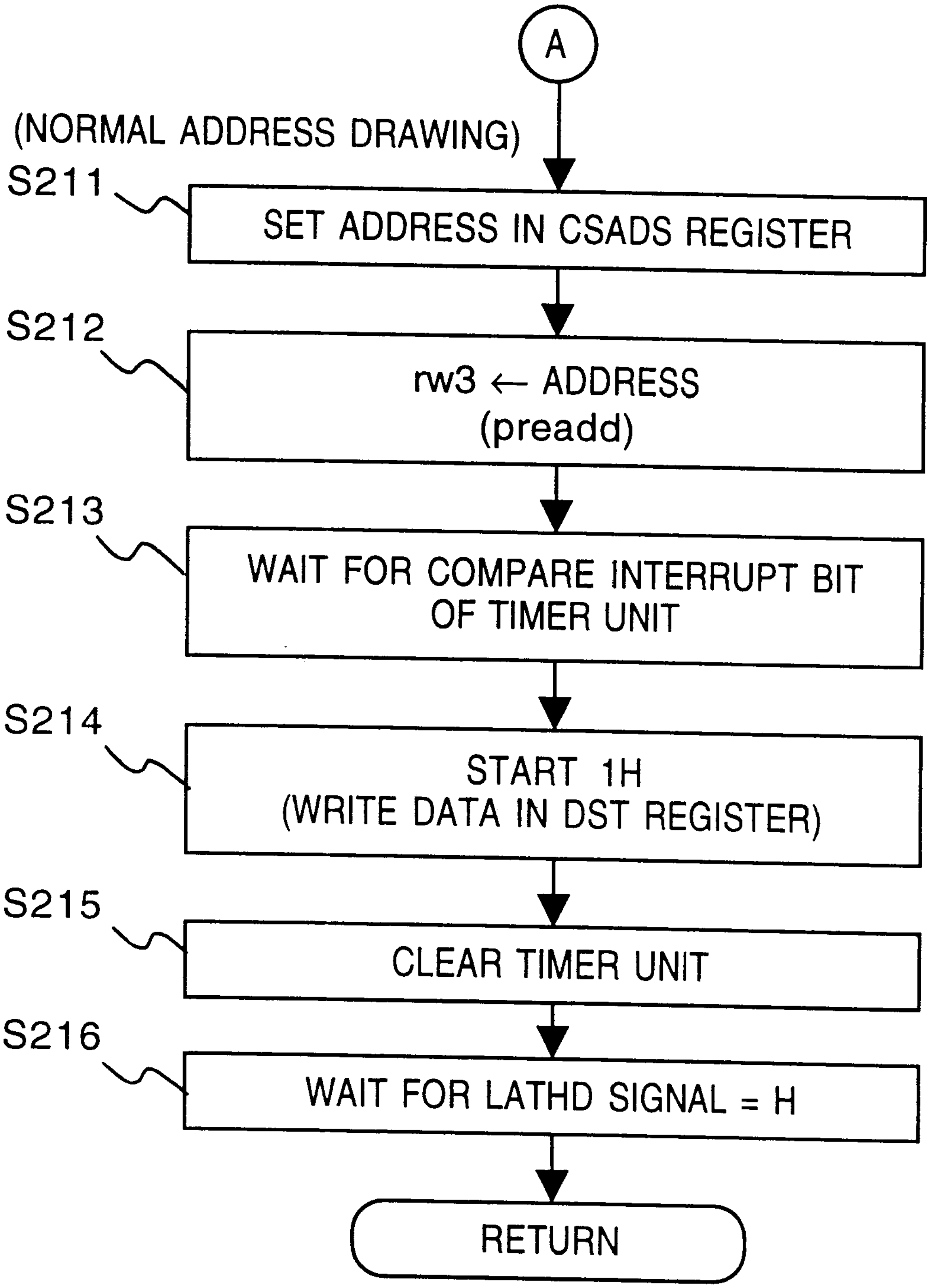
FIG. 38 is a flow chart showing in detail the normal drawing processing shown in FIG. 30 in the embodiment shown in FIG. 1.
Figure 39:
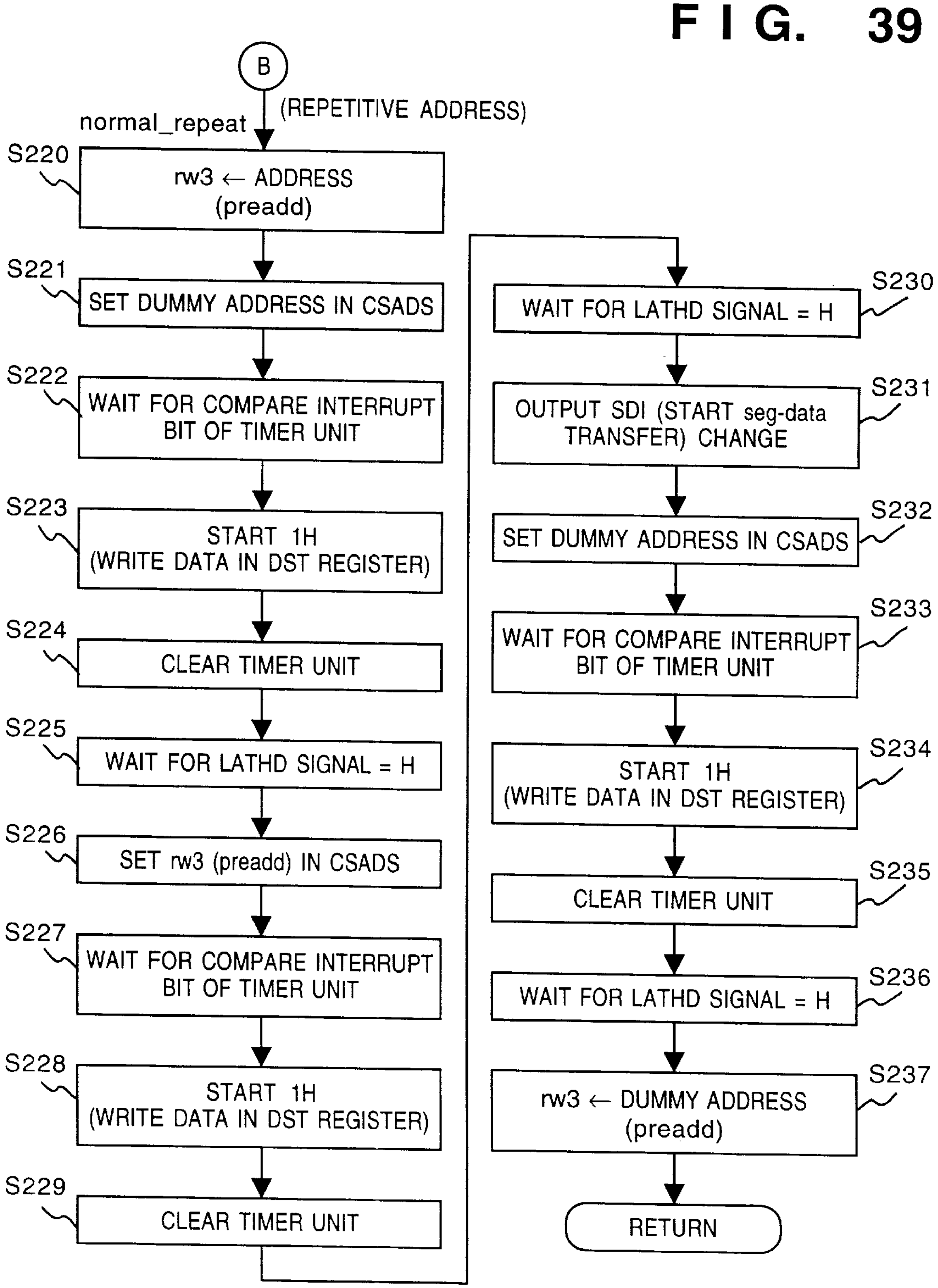
FIG. 39 is a flow chart showing in detail the normal drawing processing shown in FIG. 30 in the embodiment shown in FIG. 1.
Figure 40:
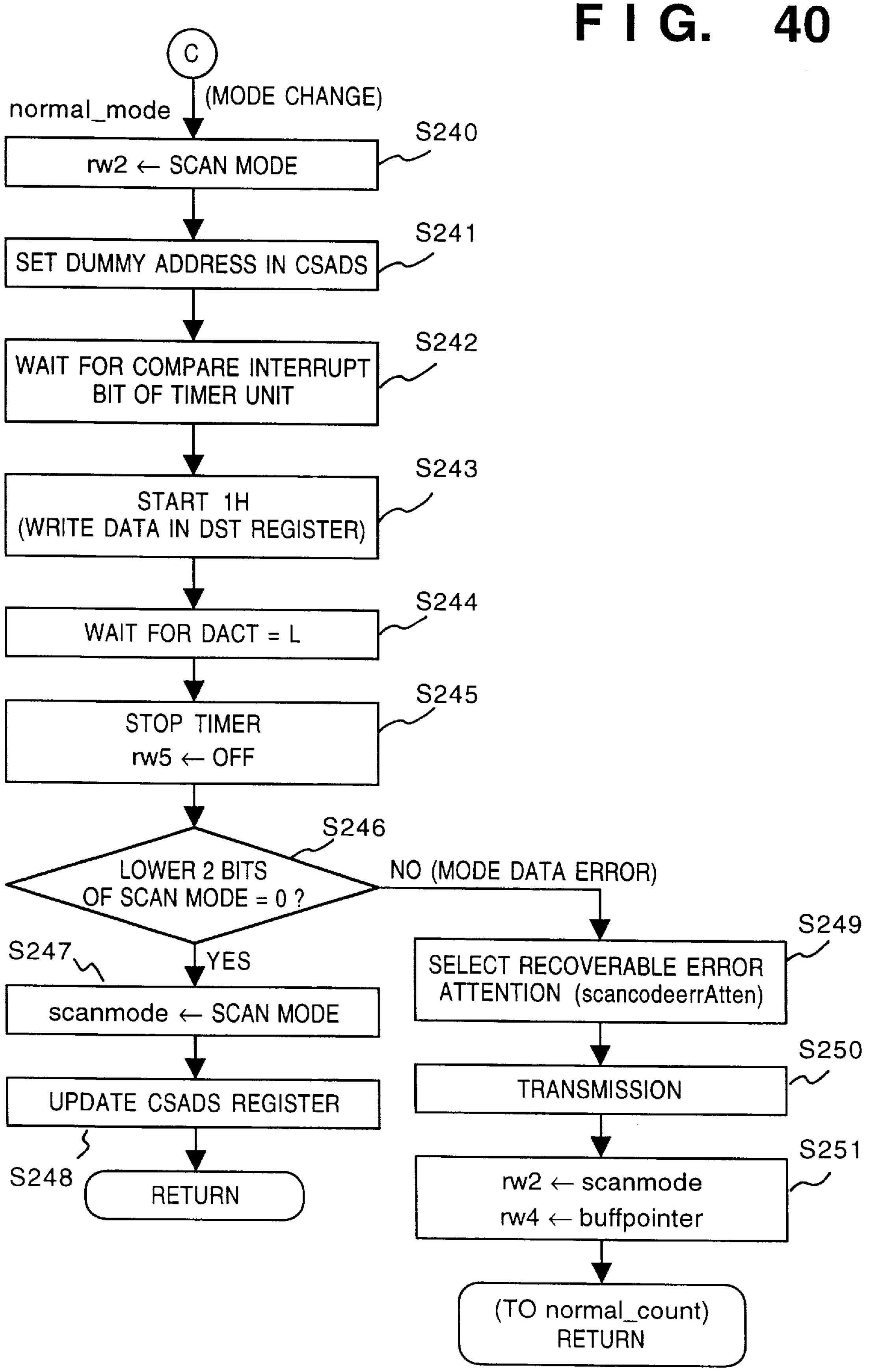
FIG. 40 is a flow chart showing in detail the normal drawing processing shown in FIG. 30 in the embodiment shown in FIG. 1.
Figure 41:
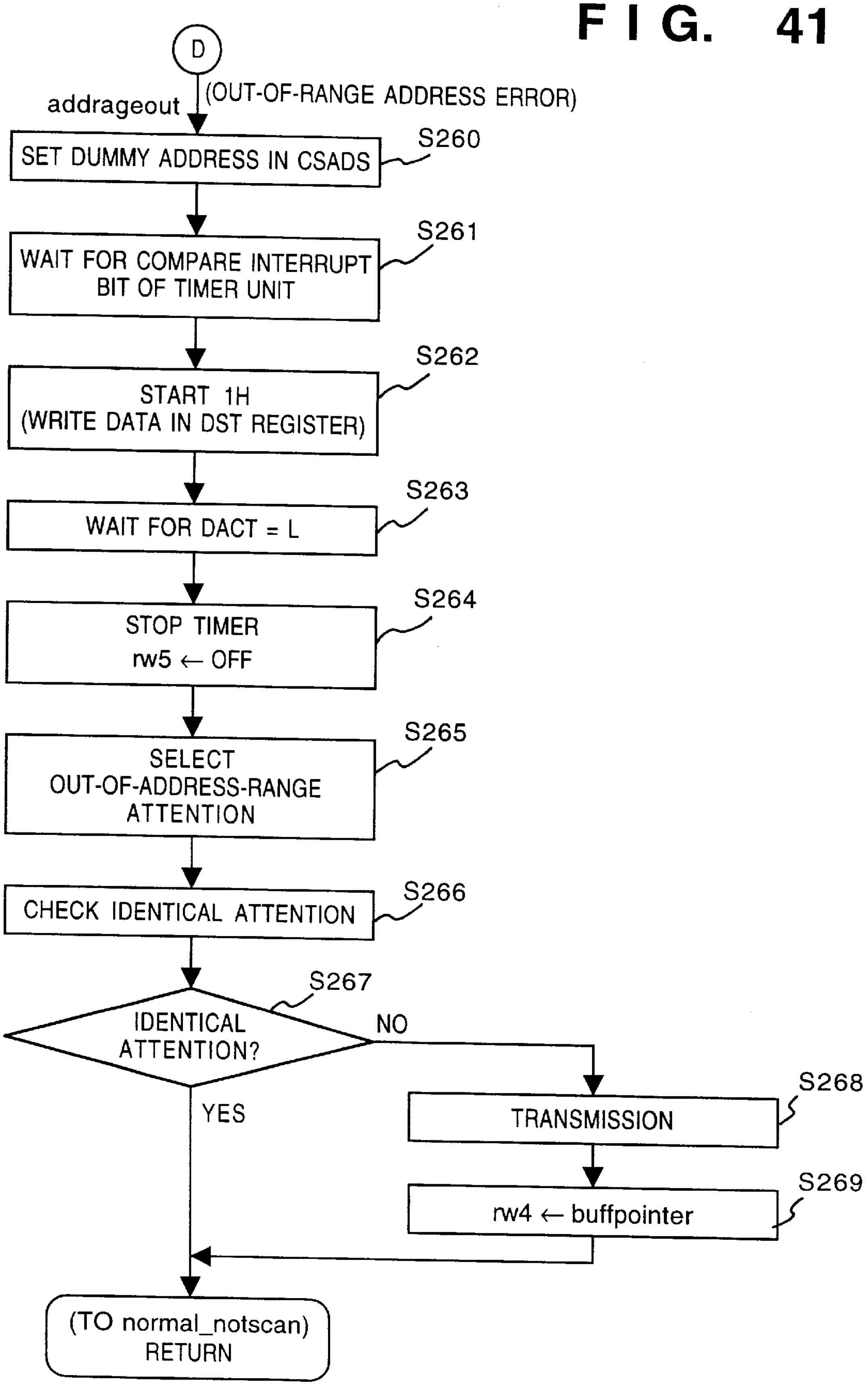
FIG. 41 is a flow chart showing in detail the normal drawing processing shown in FIG. 30 in the embodiment shown in FIG. 1.

As described above, the display mode is also supplied simultaneously with the scan address when the AHDL signal is at high level. FIG. 36 shows the transfer sequence in this case. As shown in FIG. 36, the scan address is 12-bit data, and has a margin in upper 4 bits. Thus, by utilizing this margin, the scan mode can be designated using the uppermost 2 bits. That is, if the uppermost 2 bits are (00), a x1 scan mode is designated; if they are (01), a x2 scan mode; and if they are (10), a x4 scan mode. In the "x1" scan mode, 1-line data is displayed as 1-line display data. In the "x2" scan mode, 1-line reception data is displayed for two lines. In the "x4" scan mode, 1-line reception data is displayed for four lines.

The scan mode is always set in the header portion sent prior to image data. When a scan mode different from the previously output scan mode data is received, the scan mode set so far is replaced by the received scan mode. When the scan mode is designated by the "Set Multi" command in the serial communication, the scan mode designated by the command is set prior to the scan mode designated by data in the header portion.

The reception processing of display data sent from the FLCD interface 2, as described above, and the drawing processing of the display data on the FLC panel 150 (the normal drawing processing shown in FIG. 30) will be described in detail below with reference to FIGS. 37 to 43.

In the normal drawing processing in step S146 in FIG. 30, SDI is output in step S201 to change the buffers 521 and 522 (FIG. 8) of the driver controller 190 so that data is written in one buffer, and data is read out from the other buffer. In step S202, an interrupt cause register is cleared. Thereafter, in step S203, the BUSY signal as an image data request signal to the FLCD interface 2 is set at low level to indicate "not busy".

When the FLCD 3 sets the BUSY signal at low level to indicate "not busy", the FLCD interface 2 sets the AHDL signal at high level, as described above, and at the same time, sequentially sends image data with the scan address onto the image data buses PD0 to PD15 in synchronism with FCLK. When the driver controller 190 of the system controller 160 receives the scan address included in the image data, it stores the address in the CSLA (reception address) register 526 and outputs an IREQ signal. Therefore, it is checked in step S204 if this signal is received, thereby determining if scan address reception is completed. If an IREQ signal is not received yet, it is checked in step S205 if the time-out state of the AHDL signal has occurred since no AHDL signal is received. If NO in step S205, the flow returns to steps S204 and S205 described above.

If the driver controller 190 receives the scan address, the flow advances from step S204 to step S206, and the BUSY signal is set at high level in correspondence with a 1-line write period (1H) of the FLCD 3. Subsequently, in step S207, mask processing of a scan code is performed so as to extract only the scan code in the upper 2 bits of the received scan address, and the scan mode code is discriminated in the subsequent steps.

It is checked in step S208 if a MODE change instruction that designates a mode different from the previous mode is input. If NO in step S208, the flow advances to step S209 to check if the scan address falls within a selected address range. If YES in step S209, the flow advances to step S210 to check if the same address as the previous address is designated. If NO in step S210, the flow advances to step S211 shown in FIG. 38.

In step S211 and the subsequent steps, normal address drawing processing is performed. In step S211, the received scan address is read out from the CSLA register 526 of the driver controller 190, and is stored in the CSADS (scan address) register 527. Subsequently, in step S212, the read-out address value is stored in rw3 as the previous scan address value (preadd). In step S213, the control waits for a compare interrupt bit (the driving start timing of the new scan address) of the timer unit 902. The transferred image data are stored in one of the two buffers 521 and 522.

Thereafter, in step S214, a 1H timer is started, and the driving control and display data rewrite control of the FLC panel 150 are performed by the COM driver 104 and the U- and L-SEG (segment) drivers 102 and 103 in the arrangement shown in FIG. 10. In step S215, the timer unit 902 is cleared. Subsequently, in step S216, the control waits until an LATHD signal, supplied from the driver controller 190 after the 1H operation of the driver controller 190 side is performed, changes to high level. Thereafter, the flow returns to the previous routine.

Control signals are supplied from the driver controller 190 to the respective drivers on the basis of information set in the CSADS register 527, and this supply operation is started in response to a write access to the DST register 528 by the system controller 160. When a write access to the DST register 528 is made, the driver controller 190 begins to output driver control signals while starting a new 1H period in synchronism with a signal TOUT0 output from the timer unit 902, and at the same time, image data stored in the buffer 521 or 522 serving as a 1H delay buffer are divisionally transferred to the U- and L-SEG drivers 102 and 103. Note that the 1H control will be described in detail later.

With this control, the normal address drawing processing is performed, and the display updating control of the input line is performed on the FLCD side.

On the other hand, if it is determined in step S210 that the address range designates as the same address as the previous address, the flow advances from step S210 to S220, and the received address value is stored in rw3 as a previous scan address value (preadd). In step S221, a dummy address is set in the CSADS register 527. Subsequently, in step S222, the control waits for the compare interrupt bit of the timer unit 902 (i.e., until the driving start timing of the dummy address).

Thereafter, data is written in the DST register 528 to start the 1H timer in step S223, thereby executing the driving control and display data rewrite control of the FLC panel 150 by the COM driver 104 and the U- and L-SEG drivers 102 and 103 in the arrangement shown in FIG. 10. In step S224, the timer unit 902 is cleared. Subsequently, in step S225, the control waits until the LATHD signal changes to high level after the lH operation of the driver controller 190 side is performed.

When the LATHD signal changes to high level, the previous scan address value (preadd) set in rw3 is set in the CSADS register 527 in step S226. In step S227, the control waits for the compare interrupt bit of the timer unit 902 (i.e., until the driving start timing of the next scan address). Thereafter, the 1H timer is started in step S228. The timer unit 901 is cleared in step S229, and the control waits until the LATHD signal changes to high level after the 1H operation of the driver controller 190 side is performed, in step S230.

When the LATHD signal changes to high level, SDI is output to start transfer of segment data and the FLC panel 150 starts the scan operation of the next line in step S231. In subsequent steps S232 to S236, the same processing as in steps S221 to S225 described above is performed. Thereafter, in step S237, a dummy address is set in rw3 as the previous scan address value (preadd). The flow then returns to the previous routine.

With this control, the repetitive display control of the same address can be realized.

Furthermore, if it is determined in step S208 that a scan mode change instruction is received, the flow advances from step S208 to step S240, and the received scan mode value is stored in rw2. In step S241, a dummy address is set in the CSADS register 527. Subsequently, in step S242, the control waits for the compare interrupt bit (the driving start timing of the dummy address) of the timer unit 902.

Thereafter, in step S243, data is written in the DST register 528 and the 1H timer is started, thereby executing the driving control and display data rewrite control of the FLC panel 150 by the COM driver 104 and the U- and L-SEG drivers 102 and 103 in the arrangement shown in FIG. 10. In step S244, the control waits until a DACT signal changes to low level. Thereafter, the flow advances to step S245, and "OFF" is set in rw5 to stop the timer.

Subsequently, in step S246, four bits of the masked received data except for the common scan address shown in FIG. 36 are checked to discriminate if the lower 2 bits of the scan code portion are "0". If YES in step S246, the flow advances to step S247, and the designated scan code is set in scanmode to change the scan mode to the designated scan mode. Thereafter, in step S248, the CSADS register 527 or the like of the driver controller 190 is updated, and the flow returns to the previous routine.

On the other hand, if it is determined in step S246 that the lower 2 bits of the scan code portion (upper 4 bits of the 16-bit header portion for one scan) are not "0", the flow advances to step S249. In this case, since the scan mode may be designated erroneously, a recoverable error attention (scan error attention) is selected, and is transmitted to the FLCD interface 2 in step S250. Subsequently, the current scan mode is set in rw2, and the updated buffer pointer is stored in rw4 in step S251. Then, the flow returns to the previous routine. Thereafter, the control shifts to the normal drawing processing in the normal display mode.

Furthermore, if it is determined in step S209 that the scan address falls outside the address range, the flow advances to step S260, and a dummy address is set in the CSADS register 527. Subsequently, in step S261, the control waits for the compare interrupt bit of the timer unit 902 (i.e., until the driving start timing of the dummy address). Thereafter, in step S262, data is written in the DST register 528 to start the 1H timer, thereby executing the driving control and display data rewrite control of the FLC panel 150 by the COM driver 104 and the U- and L-SEG drivers 102 and 103 in the arrangement shown in FIG. 10. In step S263, the control waits until the DACT signal changes to low level. Thereafter, the flow advances to step S264, and "OFF" is set in rw5 to stop the timer.

In step S265, an out-of-address-range attention is selected. In step S266, the presence/absence of an identical attention is checked. It is then checked in step S257 if the identical attention is present. If YES in step S267, the flow directly returns to the previous routine to start a normal scan stop mode.

On the other hand, if NO In step S267, the flow advances to step S268, and the attention falling outside the selected address range is transmitted. In step S269, the buffer pointer in rw4 is updated. Thereafter, the flow returns to the previous routine as in the above case.

Figure 42:
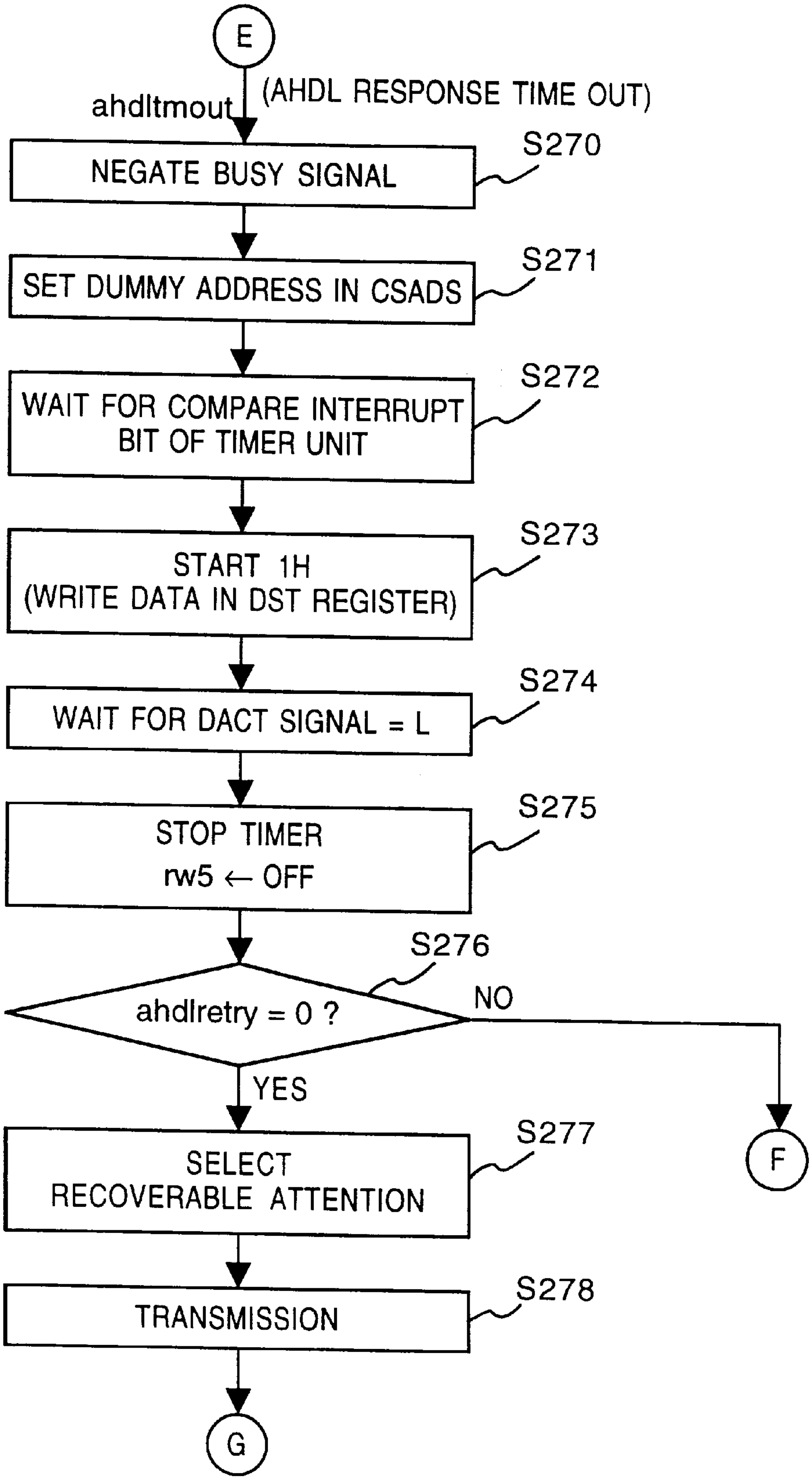
FIG. 42 is a flow chart showing in detail the normal drawing processing shown in FIG. 30 in the embodiment shown in FIG. 1.
Figure 43:
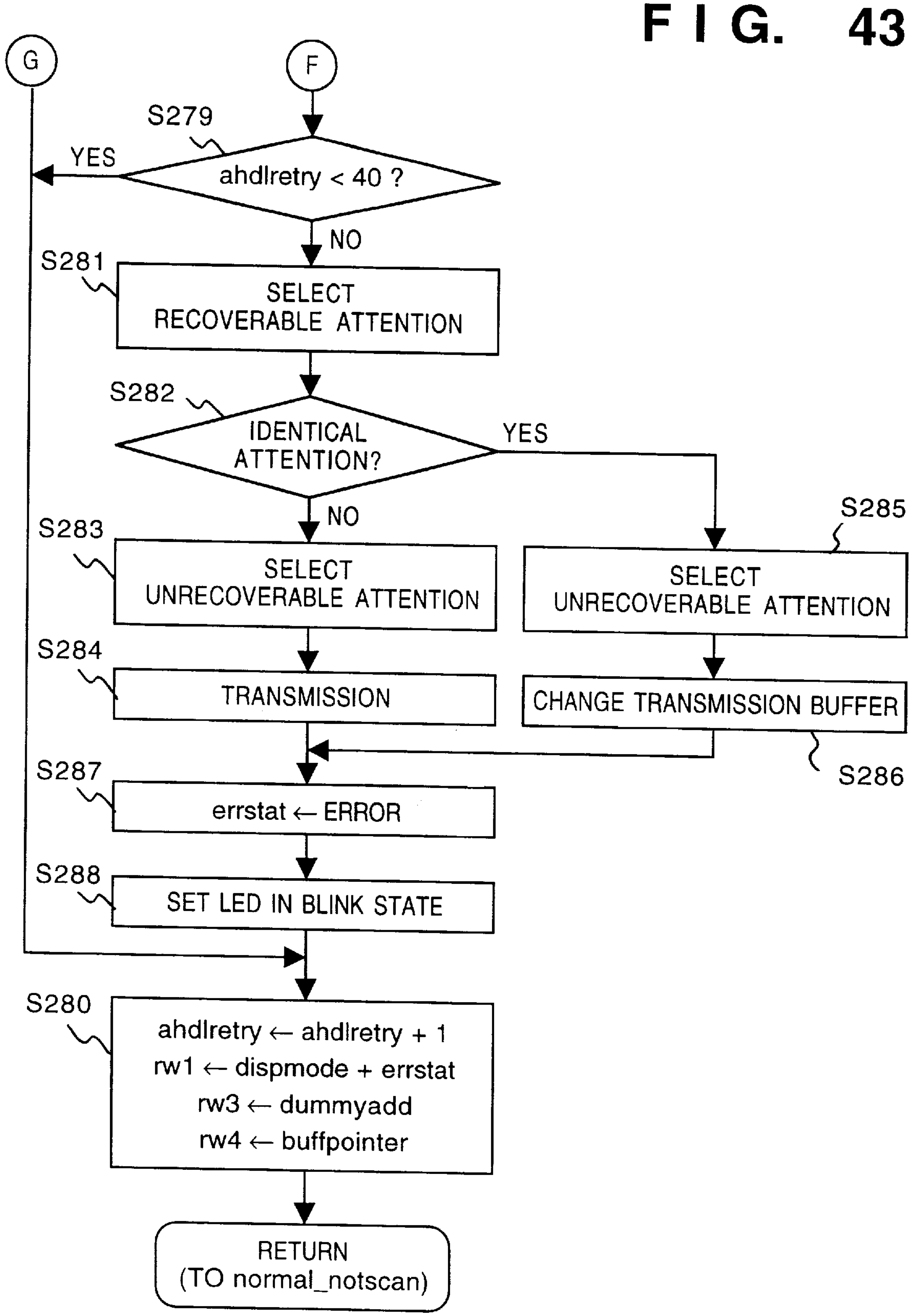
FIG. 43 is a flow chart showing in detail the normal drawing processing shown in FIG. 30 in the embodiment shown in FIG. 1.

If a time-out state is reached without the AHDL signal from the FLCD interface 2 changing to high level in the above-mentioned loop processing in steps S204 and S205, the flow advances from step S205 to step S270 in FIG. 42, and the BUSY signal is set at low level. Subsequently, in step S271, a dummy address is set in the CSADS register 527. In step S272, the control waits for the compare interrupt bit of the timer unit 902 (i.e., until the driving start timing of the dummy address).

Thereafter, in step S273, data is written in the DST register 528 to start the 1H timer, thereby executing the driving control and display data rewrite control of the FLC panel 150 by the COM driver 104 and the U- and L-SEG drivers 102 and 103 in the arrangement shown in FIG. 10. In step S274, the control waits until the DACT signal changes to low level. Thereafter, the flow advances to step S275, and "OFF" is set in rw5 to stop the timer.

Subsequently, it is checked in step S276 if the AHDL time-out retry counter (ahdlretry) is 0. If YES in step S276, the flow advances to step S277, and a recoverable error attention (AHDL time-out attention) is selected. In step S278, the selected attention is transmitted to the FLCD interface 2. The flow then jumps to step S280.

In step S280, the contents of the AHDL time-out retry counter (ahdlretry) are incremented by 1, the display operation mode set by dispmode and the error state indicated by errstat are stored in work register 1 (rw1), a dummy address is stored in work register 3 (rw3), and the updated buffer pointer is stored in work register 4 (rw4). The flow then returns to the normal scan stop mode.

On the other hand, if it is determined in step S276 that the AHDL time-out retry counter (ahdlretry) is not 0, the flow advances to step S279 to check if the AHDL time-out retry counter (ahdlretry) is equal to or smaller than 40. If YES in step S279, the flow advances to step S280.

On the other hand, if NO in step S279, the flow advances to step S281 to select a recoverable attention. It is checked in step S282 if an identical attention is present. If NO in step S282, the flow advances to step S283, and an unrecoverable attention is selected. In step S284, the selected attention is transmitted.

In step S287, an AHDL error is set in errstat. After the LED 109 is caused to blink at short intervals (0.5 sec intervals) in step S288, the flow advances to step S280.

On the other hand, if YES in step S282, the flow advances to step S285 to select an unrecoverable attention. In step S286, the transmission buffers are switched without transmitting the selected attention. The flow then advances to step S287.

Figure 44:
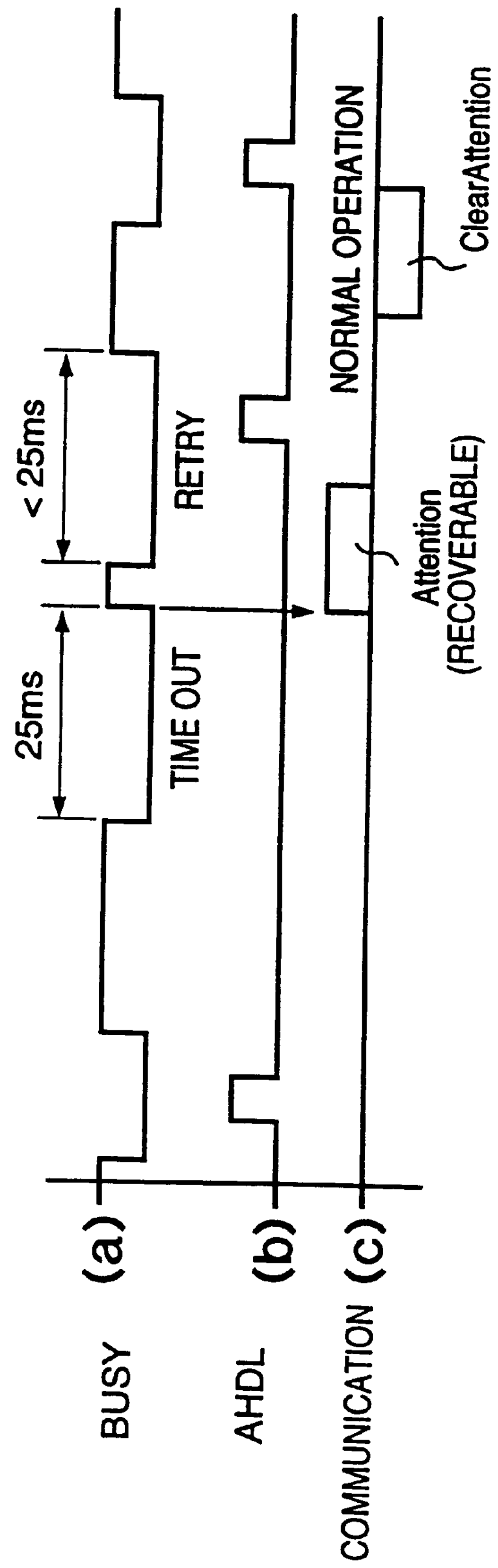
FIG. 44 is a chart showing the state transition when the operation is recovered to normal by a retry upon generation of an AHDL time-out in the embodiment shown in FIG. 1.

In the above description, the AHDL time-out time is 25 ms after the BUSY signal changes to low level. After an elapse of this time, a BUSY signal is output, and a recoverable error attention is issued. Thereafter, the BUSY signal is reset to high level, and reception of an AHDL signal is monitored again. Upon reception of an AHDL signal, a "Clear Attention" command is issued to start the normal operation. FIG. 44 shows this state transition.

Figure 45:
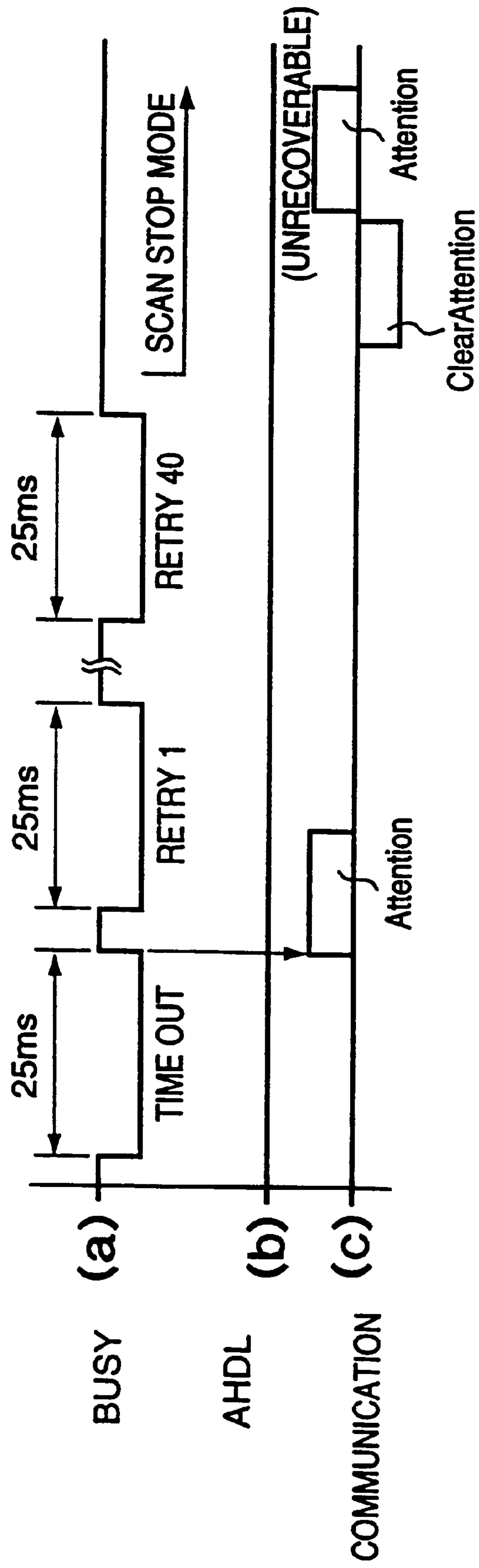
FIG. 45 is a chart showing the state transition when the number of retries has reached a prescribed value (40) after a recoverable error attention is issued upon generation of an AHDL time-out in the embodiment shown in FIG. 1.

On the other hand, after an AHDL time-out error has occurred and a recoverable attention is issued, if the number of retries has reached a prescribed value (40), the control shifts to the static mode in which the FLC panel 150 is not scanned. Then, a "Clear Attention" command is issued, and then, an unrecoverable attention is issued. FIG. 45 shows this state transition.

Figure 46:
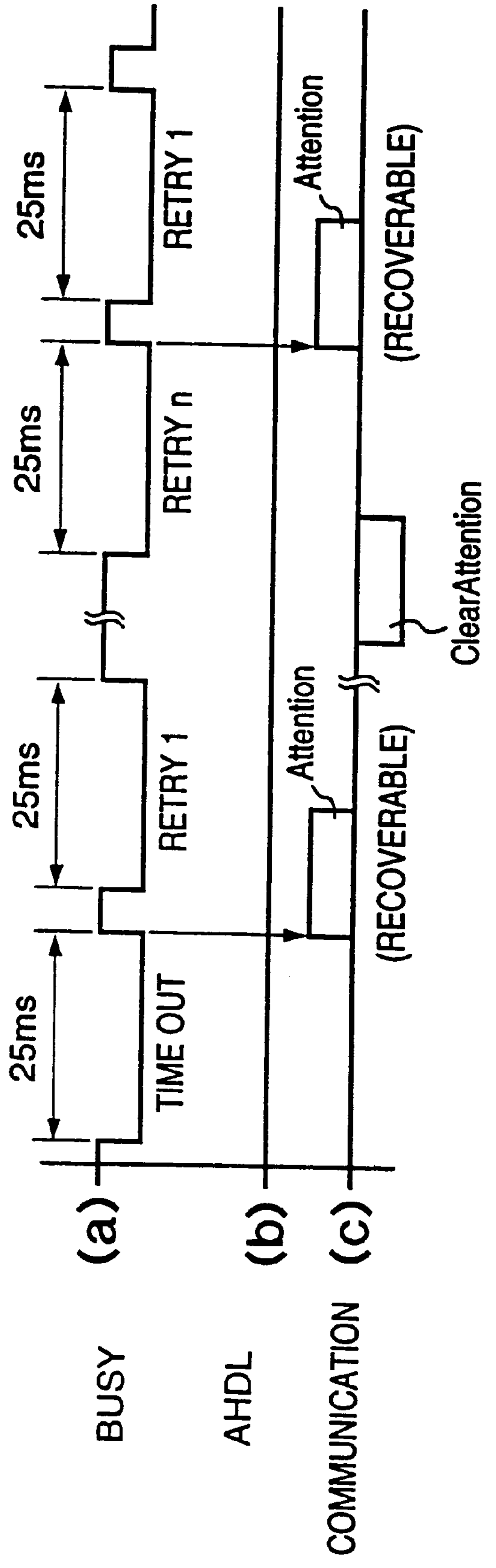
FIG. 46 is a chart showing the state transition when an AHDL signal cannot be received even after the attention is cleared upon generation of an AHDL time-out in the embodiment shown in FIG. 1.

Furthermore, even when the attention is cleared, the BUSY signal is kept at low level until an AHDL signal is received, and it is determined after an elapse of 25 ms that a new AHDL time-out error has occurred. FIG. 46 shows the state transition in this case.

As described above, the FLCD 3 side has control over exchange of display data, and the scan timing is corrected depending on the temperature of the FLC panel, thus attaining high quality of a displayed image, as will be described below.

Figure 47:
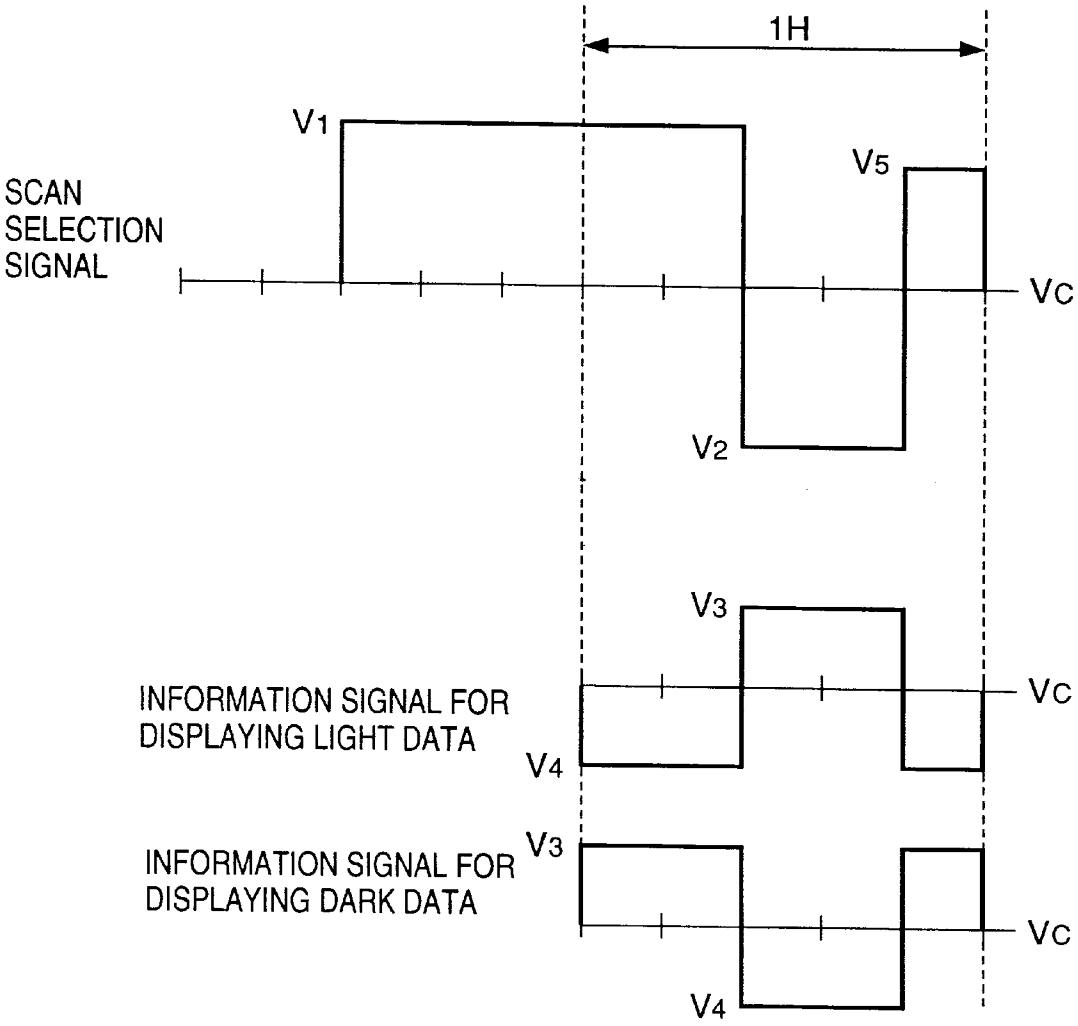
FIG. 47 is a chart showing an example of the FLC panel driving waveforms in the embodiment shown in FIG. 1.

The correction control of the scan timing in accordance with the detection temperature of the FLC panel 150 in this embodiment will be described below. FIG. 47 shows the driving waveforms defined by the U- and L-SEG drivers 102 and 103, and the COM driver 104 of this embodiment. These waveforms are defined by the data CWFD0 to CWFD3 and SWFD0 to SWFD3 output from the driver controller 190 shown in FIG. 10, one period of each waveform is determined by the 1H code output from the temperature compensation table and the clock timing generated by the timer unit 902, and the peak values of the waveforms are determined by the output voltages V1, V5, V2, V3, V4, and VC of the liquid crystal driving voltage regulator 183.

FIG. 47 shows an example of the FLC panel driving waveforms of this embodiment. A scan selection signal in FIG. 47 represents the driving signal waveform of the COM driver 104, and an information signal represents the driving waveform of the SEG drivers 102 and 103. The relationship between Vopcode and the FLC panel driving voltages is as follows.

$$DAOUT = VopCode \times 5.0/256$$

$$V1 - VC = VC - V2 = 3.49 \times DAOUT = 0.0681 \times VopCode \text{ [V]}$$

$$V5 - VC = 1.58 \times DAOUT = 0.0309 \times VopCode \text{ [V]}$$

$$V3 - VC = VC - V4 = 1.44 \times DAOUT = 0.0282 \times VopCode \text{ [V]}$$

The relationship between 1HCode and 1H is:

$$1H = (\text{CSCLK period}) \times 5 \times (1HCode + 1) \times 0.4 \times 5 [\mu sec]$$

The temperature characteristics with respect to the driving conditions of the FLC panel that generates the above-mentioned driving waveforms are corrected using the driving voltage (Vop) applied to the panel and the driving period (1H) on the basis of a signal indicating the temperature in the vicinity of the FLC panel 150 and detected by the temperature sensor 105. In order to absorb all the variations of the electrical system and the FLC panel characteristics, the temperature signal is finely adjusted by the image quality adjustment trimmer 107.

Note that the driving waveform voltage is defined so that the voltage changes to be vertically symmetrical with respect to VC in accordance with a change in temperature. This compensation is attained by the arrangement shown in FIG. 10.

Figure 48:
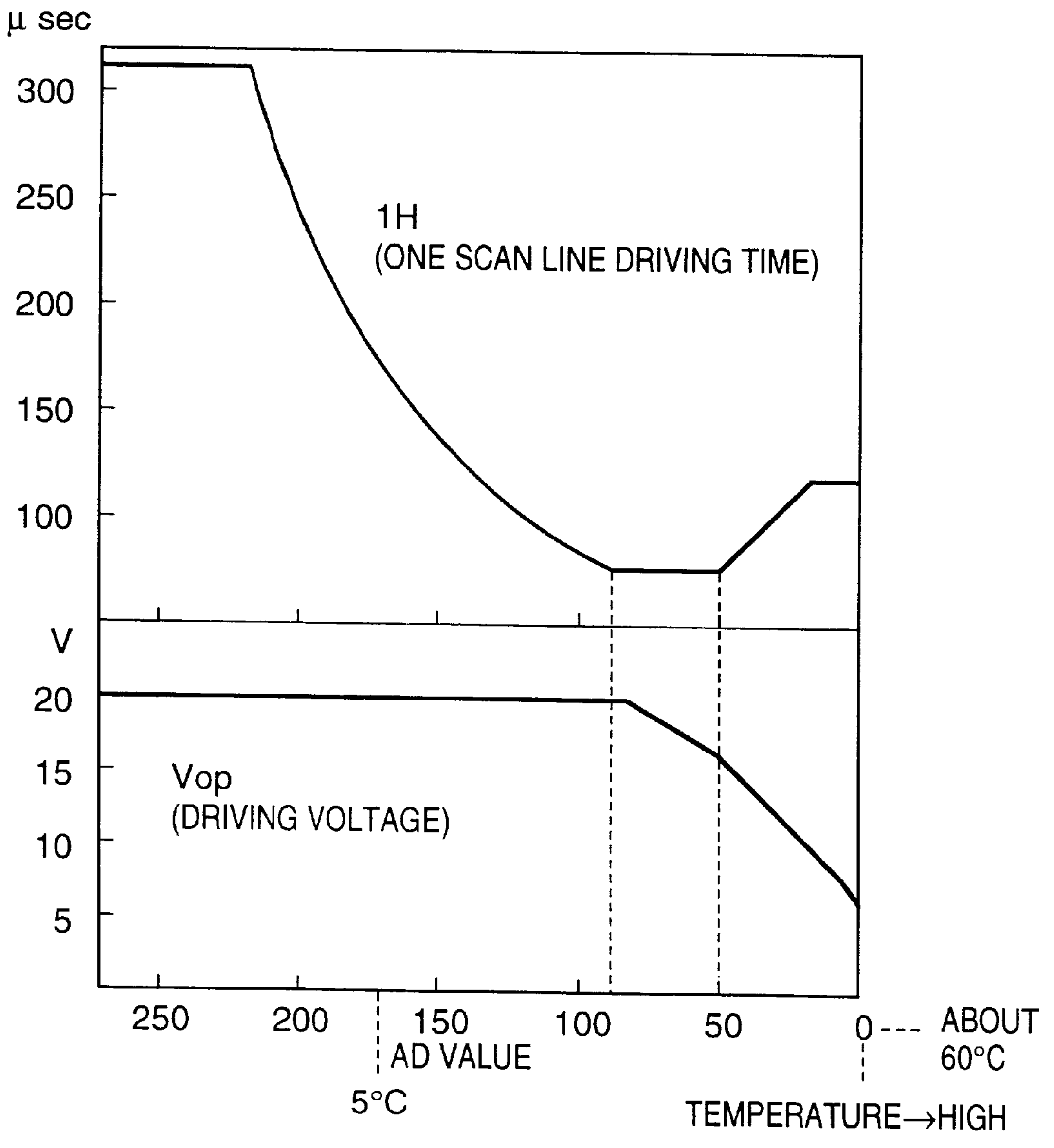
FIG. 48 is a graph showing an example of a temperature compensation table in the embodiment shown in FIG. 1.
Figure 50:
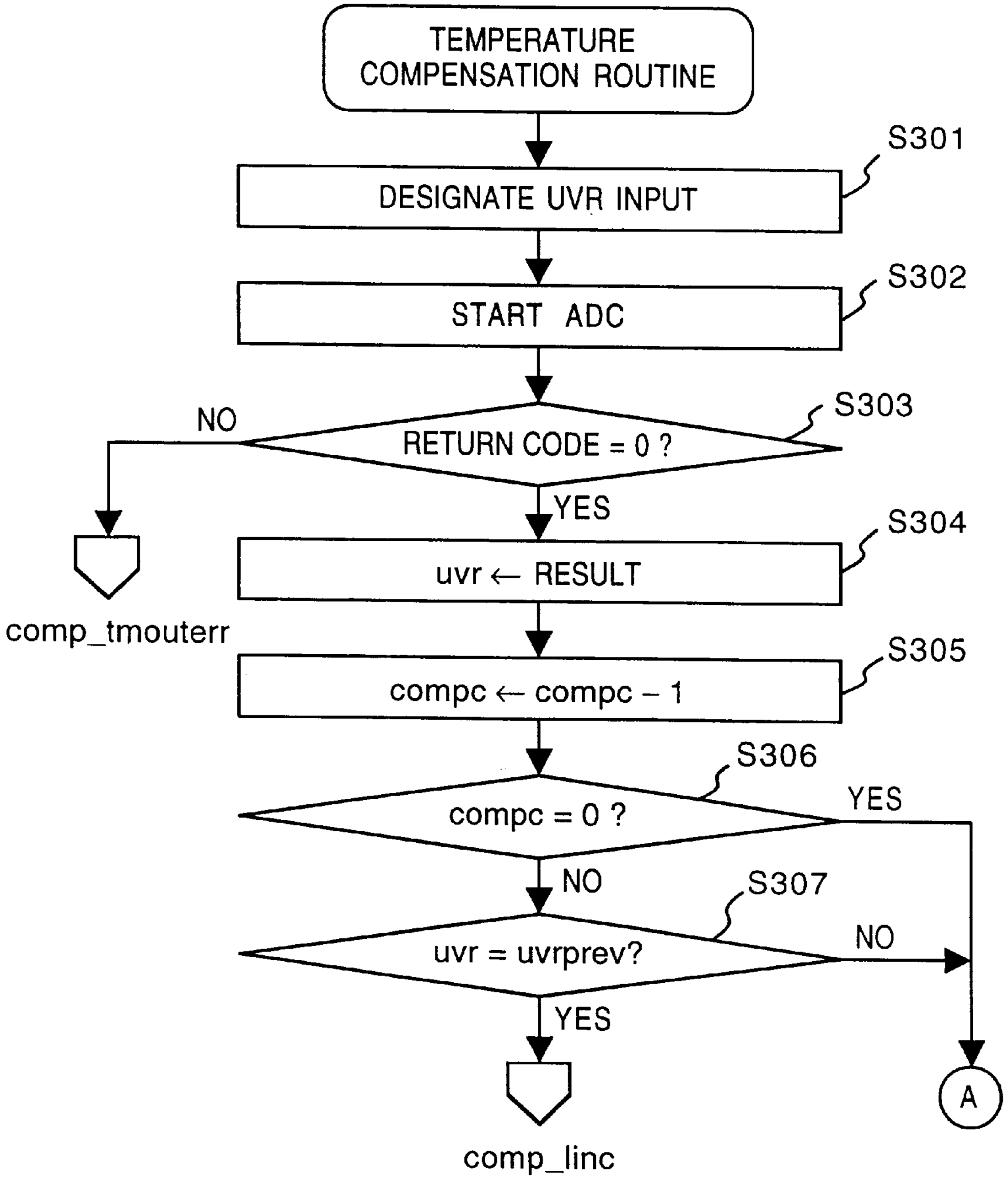
FIG. 50 is a flow chart showing in detail the temperature compensation routine in the embodiment shown in FIG. 1.
Figure 51:
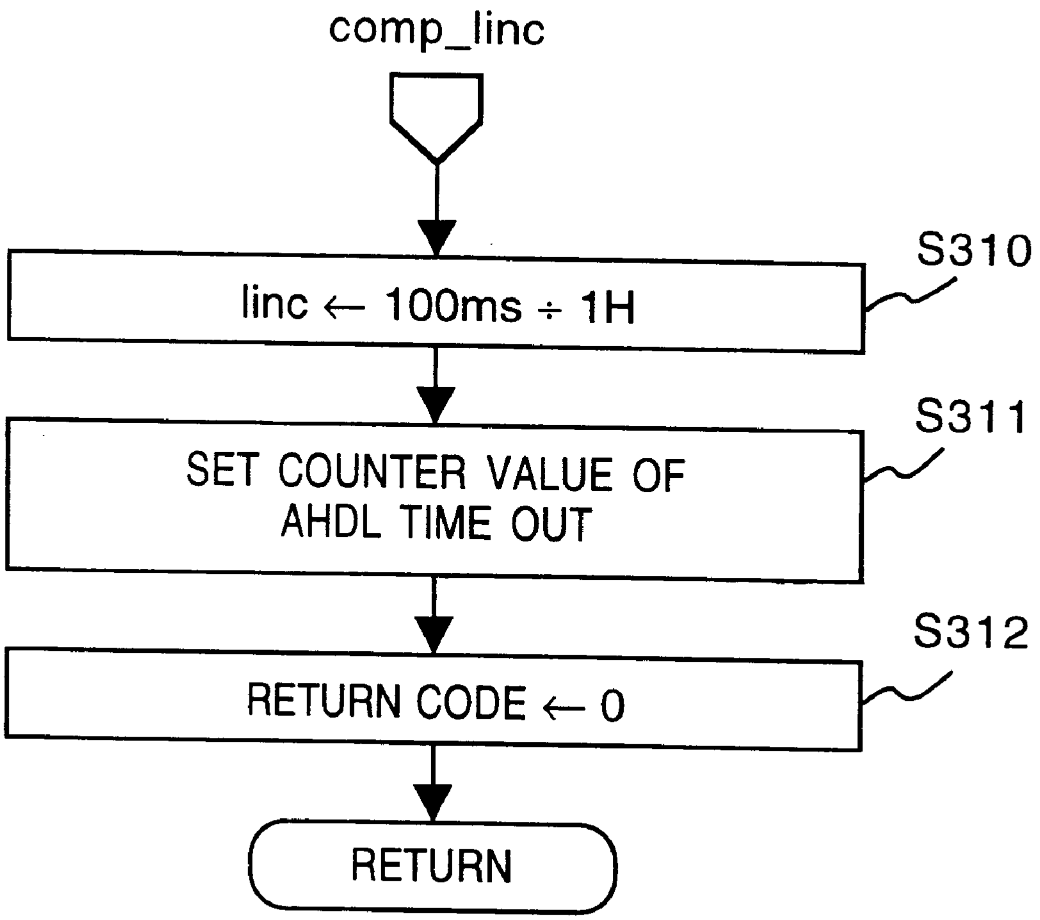
FIG. 51 is a flow chart showing in detail the temperature compensation routine in the embodiment shown in FIG. 1.

FIGS. 48 and 49 show examples of a temperature compensation table 901 shown in FIG. 10. FIG. 48 shows the output 1H time and the Vop driving voltage output value as a function of the input AD value from the A/D converters 904 and 905 to the temperature compensation table 901. As the AD value becomes smaller, the temperature becomes higher. For example, when the AD value is 0, the temperature is about 60° C. , and when the AD value is about 175, the temperature is about 5° C. In this embodiment, the apparatus is designed to prevent the temperature from exceeding 60° C. , and the table stores compensation data up to 60° C.

FIG. 49 shows examples of the frame frequency at the respective ambient temperatures at the start timing and at a timing after a sufficient time elapses from the start timing and the internal temperature is saturated.

Note that the frame frequency is the reciprocal of the rewrite time of 1,024 scan lines in this embodiment. That is, in this embodiment, the entire frame can be updated three times in one second at a temperature of 5° C. , and can be updated 13 times in one second at a temperature of 35° C.

The concrete control of the temperature compensation, whose outline has been described above, will be described below with reference to FIGS. 50 to 57. In this embodiment, the user trimmer monitoring interval is 100 ms independently of 1H, and when the user trimmer value remains the same as the previous value, the processing ends without temperature compensation; when the user trimmer value changes, the temperature compensation is performed. Even when the user trimmer value remains the same, the temperature control is performed at 30-sec intervals.

In the above description, "linc" is set in work register rw0 and the user trimmer value is monitored depending on the number of drawing lines. In this case, since the value "linc" changes depending on the temperature, the 100-ms user trimmer monitoring interval is constant, as described above.

This temperature compensation routine is the processing in step S133 or S166 described above. In this embodiment, an analog adjustment signal Vu, which is to be input from the image quality adjustment trimmer 107 to the system controller via the trimmer interface 174, must be converted into a corresponding digital signal (UVR) by the A/D converter 905, and then input to the system controller. For this reason, in step S301, the A/D converter 905 is designated as an input target.

In step S302, the A/D converter 905 is activated. Subsequently, it is checked in step S303 if the return code is 0. When the A/D converter 905 is activated in step S302, A/D conversion is performed within a predetermined period of time, an interrupt signal indicating completion of conversion is issued, and the return code is set to be 0 when the A/D conversion has been completed at that time. If the return code is not 0, an A/D-conversion time-out error has occurred. For this reason, if it is determined in step S303 that the return code is not 0, the control advances to A/D-conversion time-out processing (to be described later) in step S345 and the subsequent steps shown in FIG. 55.

On the other hand, if it is determined in step S303 that the return code is 0, the flow advances to step S304, and the conversion result of the A/D converter 905 is set in a uvr register for holding the user trimmer AD value. Subsequently, in step S305, the value of a temperature compensation timing counter (compc) is decremented by 1. It is then checked in step S306 if the value of the temperature compensation timing counter (compc) is 0. If NO in step S306, the flow advances to step S307, and the read user trimmer AD value set in step S304 is compared with a previous user trimmer value stored in a uvrprev register to check if the two values are equal to each other. If YES in step S307, since it is determined that the user has not performed any adjustment, the flow advances to step S310 shown in FIG. 51.

In step S310, 100 ms as the user trimmer monitoring interval is divided by 1H, and the quotient is stored in the user trimmer monitoring timing drawing line number counter (linc). Then, the flow advances to step S311. With this control, the user trimmer value can be monitored at 100-ms periods. The AHDL time-out counter value is set in step S311, and 0 is set in the return code in step S312, thus ending this processing.

On the other hand, if it is determined in step S306 that the value of the temperature compensation timing counter (compc) is 0, or if it is determined in step S307 that the read user trimmer AD value is different from the previous user trimmer AD value, the flow advances to step S315. In step S315, the uvr register value that holds the user trimmer AD value is stored in uvrprev. Subsequently, in step S316, the A/D converter 904 is designated as an input target so as to read the temperature detected by the temperature sensor 105.

In step S317, the A/D converter 904 is activated. It is then checked in step S320 if the return code is 0. If NO in step S320, the control advances to the A/D-conversion time-out processing (to be described later) in step S345 and the subsequent steps shown in FIG. 55.

On the other hand, if YES in step S320, the flow advances to step S322 via step S321 to check if the detected temperature in the vicinity of the panel is higher than a predetermined upper-limit temperature. If YES in step S322, the control advances to a temperature upper-limit routine (comp htmperr) shown in FIG. 56.

On the other hand, if NO in step S322, the flow advances to step S323 to check if the detected temperature in the vicinity of the panel is lower than a predetermined lower-limit temperature. If YES in step S323, the control advances to a temperature lower-limit routine (comp ltmperr) shown in FIG. 57.

Figure 53:
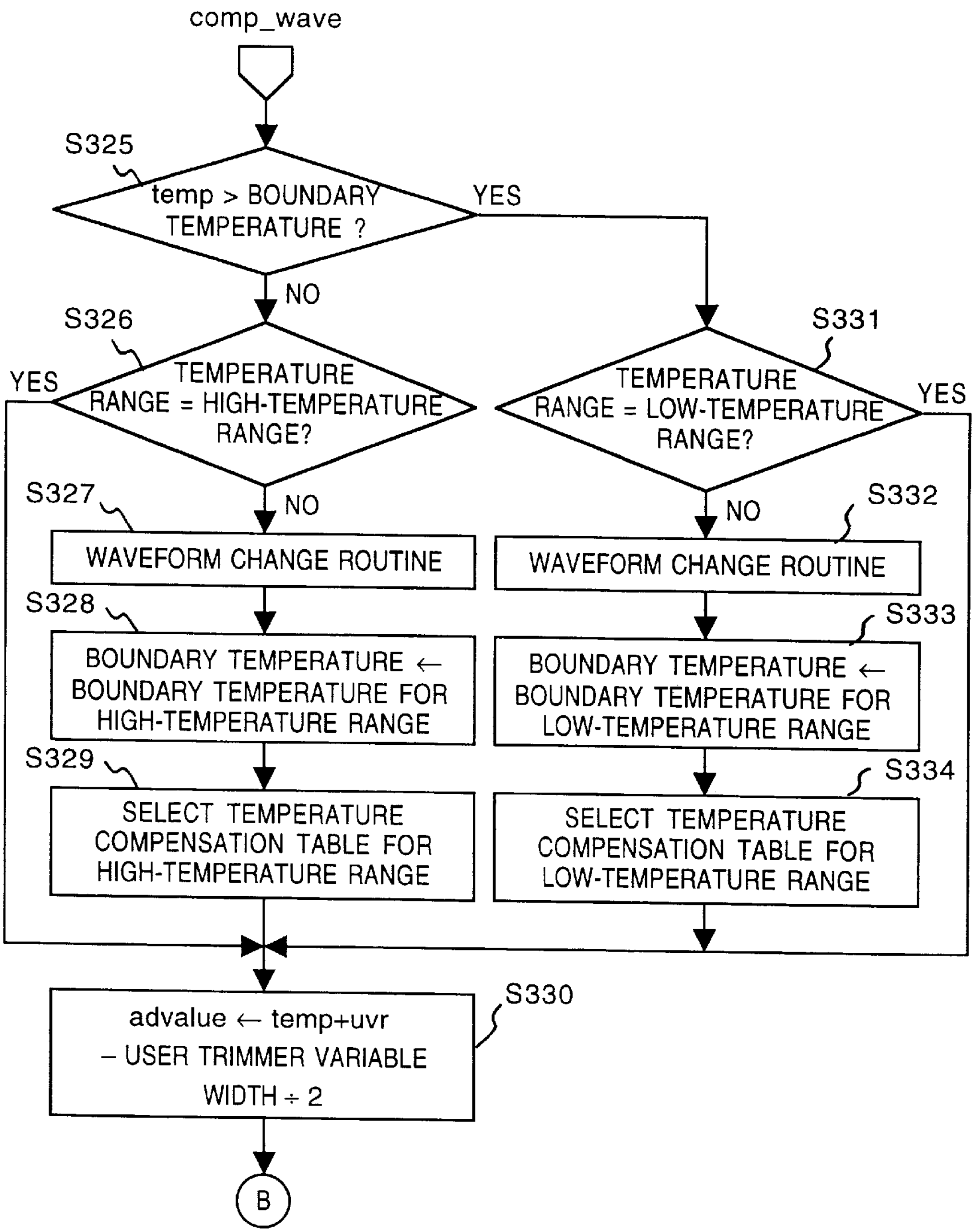
FIG. 53 is a flow chart showing in detail the temperature compensation routine in the embodiment shown in FIG. 1.
Figure 54:
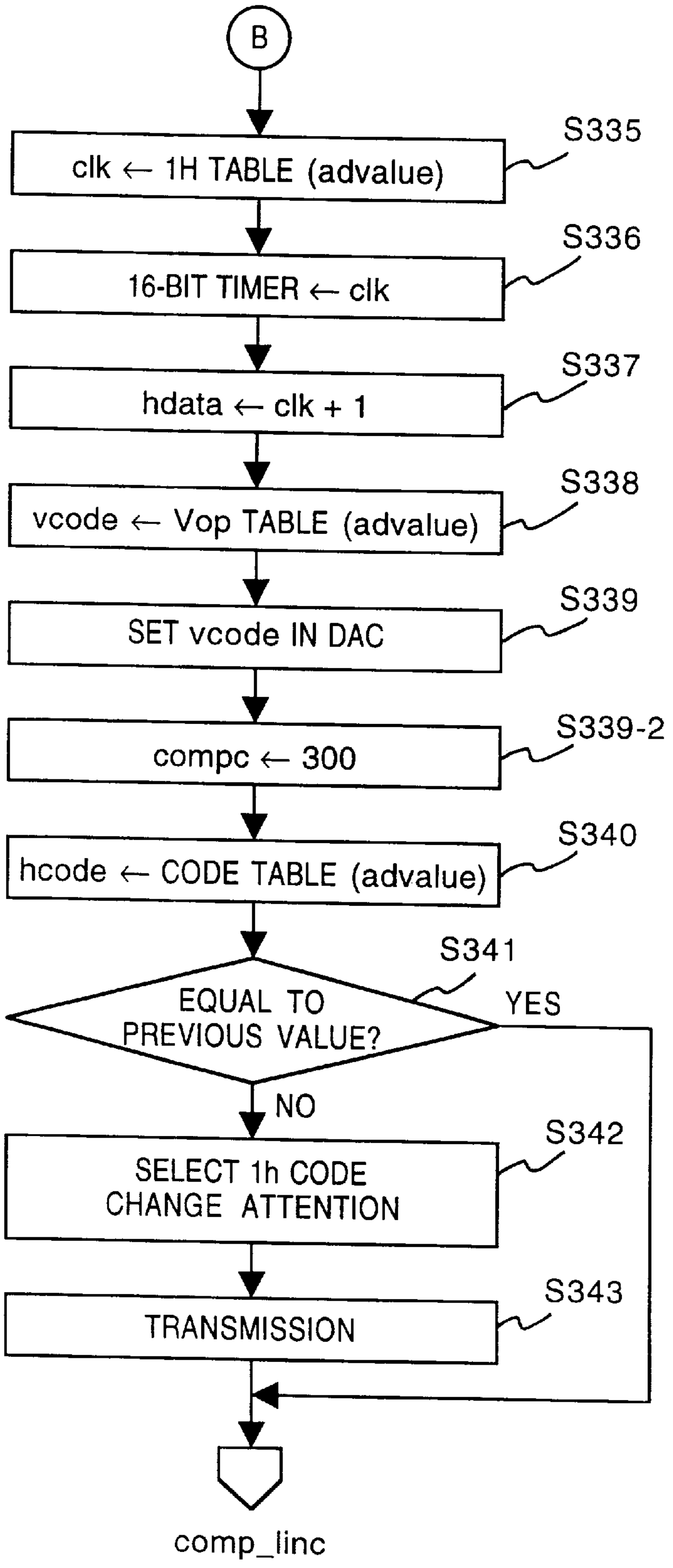
FIG. 54 is a flow chart showing in detail the temperature compensation routine in the embodiment shown in FIG. 1.

Furthermore, if NO in step S323, the flow advances to step S325 shown in FIG. 53. It is checked in step S325 if the detected temperature in the vicinity of the panel is higher than a predetermined boundary temperature. If NO in step S325, the flow advances to step S326 to check if the detected temperature range corresponds to a high-temperature range. If YES in step S326, the flow jumps to step S330.

On the other hand, if NO in step S326, the flow advances from step S326 to step S327 to execute a waveform change routine. Subsequently, in step S328, a boundary temperature for the high-temperature range is set as a new boundary temperature. In step S329, a temperature compensation table for the high-temperature range is selected. The flow then advances to step S330. In step S330, the uvr register value that holds the user trimmer AD value is registered as a new measured temperature, and the sum of the AD value of the temperature sensor 105 and the image quality adjustment trimmer value is stored in advalue. Then, the flow advances to step S335 in FIG. 54.

On the other hand, if it is determined in step S325 that the detected temperature in the vicinity of the panel is higher than the boundary temperature, the flow advances to step S331 to check if the detected temperature range corresponds to a low-temperature range. If YES in step S331, the flow jumps to step S330.

On the other hand, if NO in step S331, the flow advances from step S331 to step S332 to execute the waveform change routine. In this routine, the driving conditions are set by looking up a waveform data table in the temperature compensation table corresponding to the detected temperature so as to determine a waveform, so that the waveform can be changed in correspondence with the temperature, and the return code is set to be 0. Subsequently, in step S333, a boundary temperature for the low-temperature range is set as a new boundary temperature. In step S334, a temperature compensation table for the low-temperature range is selected. The flow then advances to step S330.

When the flow advances from step S330 to step S335, a 1HCode table for the timer unit 902 in the temperature compensation table is read out in accordance with the value of the advalue register that stores the sum of the AD value of the temperature sensor 105 and the image quality adjustment trimmer value, and the readout table is set in a clk register in the system controller 160. Subsequently, in step S336, the value of the clk register is set in a 16-bit timer (not shown). In step S337, the value of the clk register is incremented, and the incremented value is output as 1HCode (hcode) to be set in the timer unit 902.

In step S338, a VopCode table for the driver controller 190 in the temperature compensation table is read out in accordance with the value of the advalue register that stores the sum of the AD value of the temperature sensor 105 and the image quality adjustment trimmer value. Subsequently, in step S339, the readout VopCode is set in the D/A converter of the Vop controller 173.

In step S339-2, a value "300" is set in the temperature compensation timing counter (compc). The flow advances to step S340.

In step S340, the value of the advalue register that stores the sum of the AD value of the temperature sensor 105 and the image quality adjustment trimmer value is set as a code table in hcode (a code for informing the host of elapse of 1H). Subsequently, it is checked in step S341 if the set data is equal to the previous value. If YES in step S341, the flow advances to step S310.

On the other hand, if hcode is not equal to the previous value, the flow advances to step S342, and a 1H code change attention is selected. In step S343, the selected attention is transmitted to the FLCD interface 2. The flow then advances to step S310.

Figure 52:
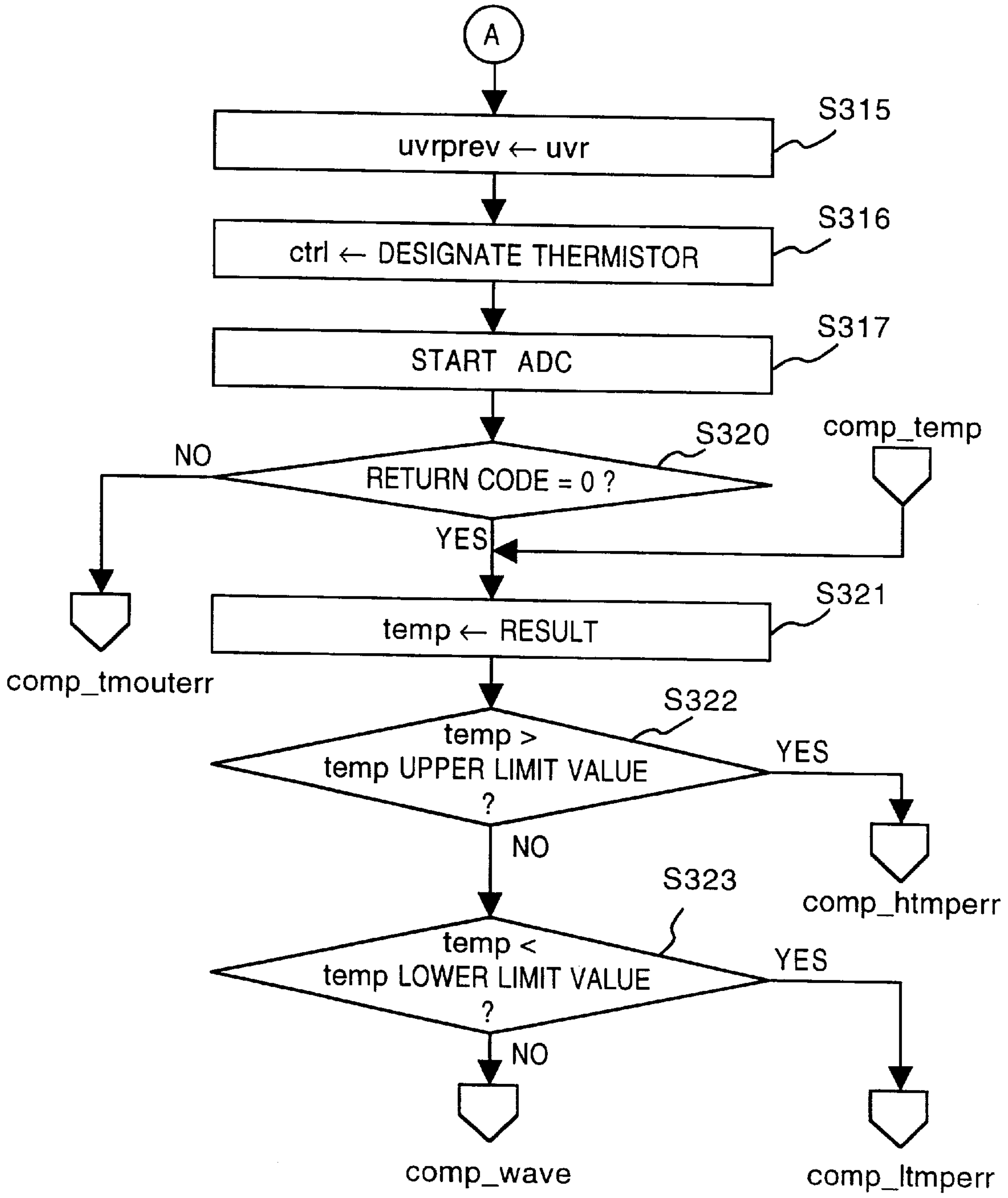
FIG. 52 is a flow chart showing in detail the temperature compensation routine in the embodiment shown in FIG. 1.
Figure 56:
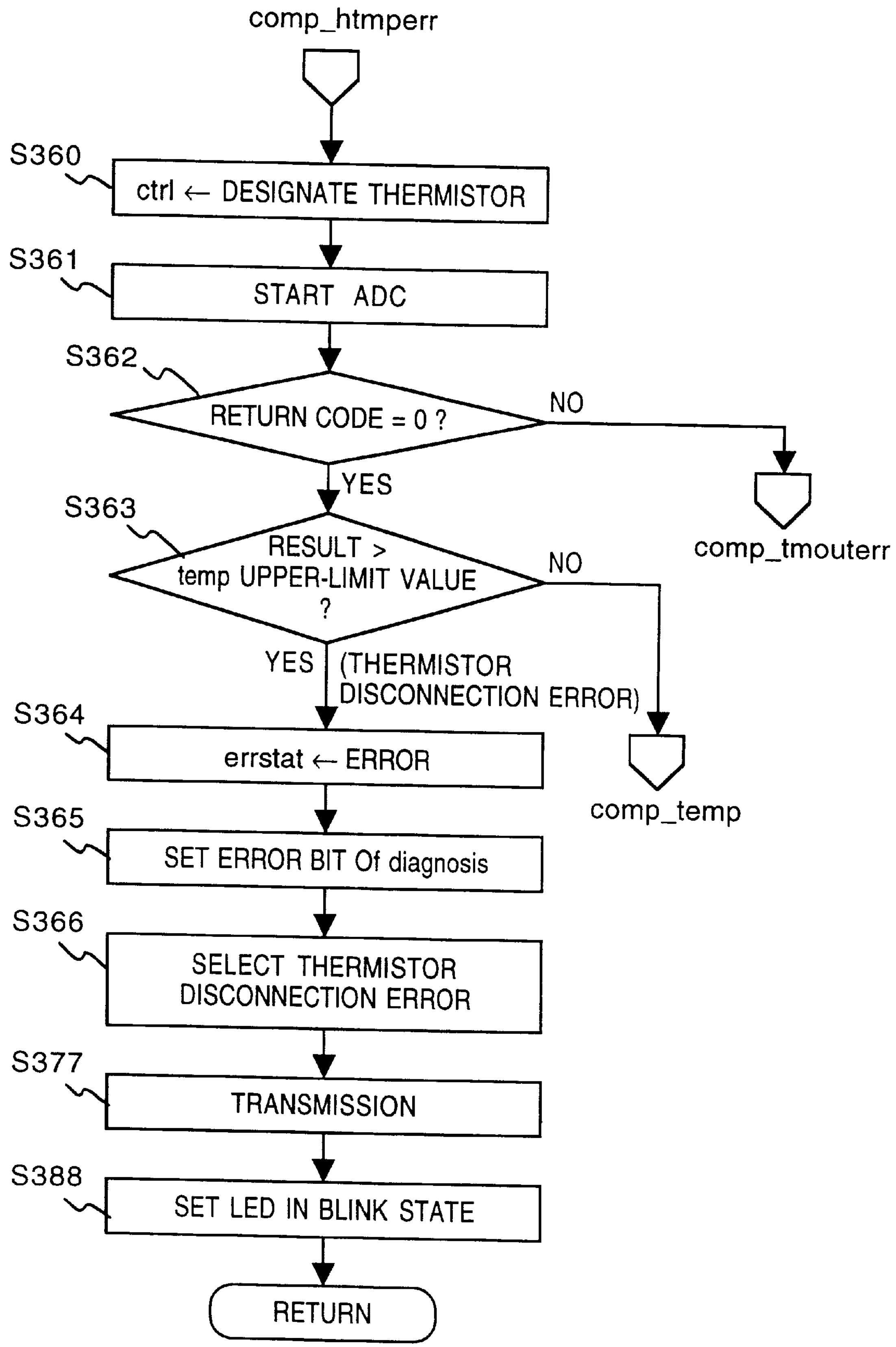
FIG. 56 is a flow chart showing in detail the temperature compensation routine in the embodiment shown in FIG. 1.

If it is determined in step S322 in FIG. 52 that the temperature detected by the temperature sensor 105 is higher than the predetermined upper-limit temperature, the flow advances to step S360 shown in FIG. 56, and the A/D converter 904 is designated as an input target so as to read the temperature detected by the temperature sensor 105. In step S361, the A/D converter 904 is activated. Subsequently, it is checked in step S362 if the return code is 0. If NO in step S362, the control advances to the A/D-conversion time-out processing (to be described later) in step S345 and the subsequent steps.

On the other hand, if YES in step S362, the flow advances to step S363 to check if the re-read temperature detected by the temperature sensor 105 is higher than the predetermined upper-limit temperature. If NO in step S363, the flow advances to step S321 in FIG. 52.

On the other hand, if YES in step S363, it is determined that a thermistor serving as the temperature sensor suffers disconnection, and the flow advances to step S364. In step S364, the error state is set in errstat indicating the error state. Subsequently, in step S365, a thermistor disconnection error bit in a self diagnosis result code "diagnosis" is set. In step S366, a thermistor disconnection attention is selected. In step S377, the selected attention is transmitted to the FLCD interface 2. In step S388, the LED 109 is set in the blinking state in which the LED 109 is turned on/off at short intervals so as to indicate the error state. Then, the processing ends, and the flow returns to the previous routine.

Figure 57:
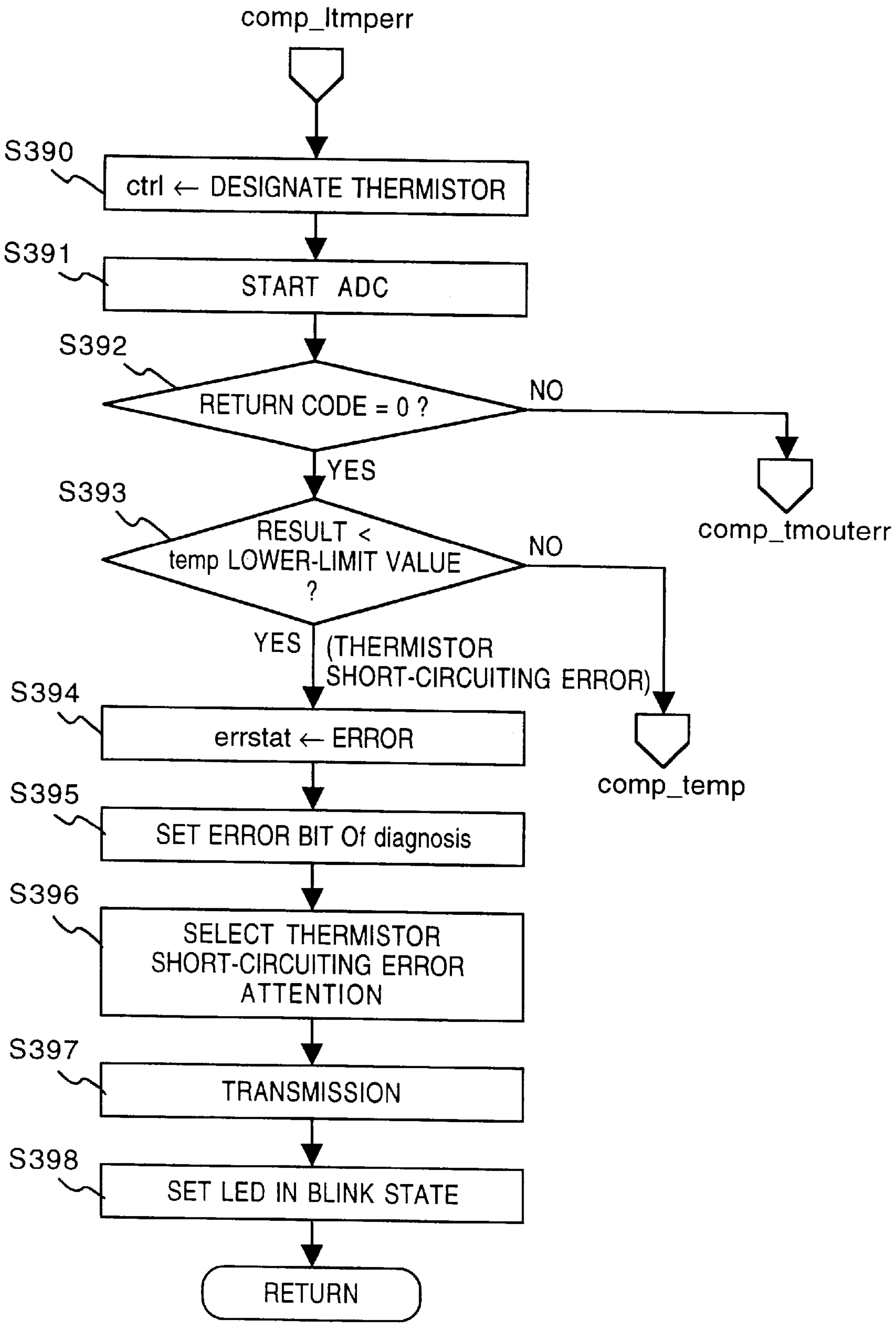
FIG. 57 is a flow chart showing in detail the temperature compensation routine in the embodiment shown in FIG. 1.

If it is determined in step S323 in FIG. 52 that the temperature detected by the temperature sensor 105 is lower than the predetermined lower-limit temperature, the flow advances to step S390 shown in FIG. 57, and the A/D converter 904 is designated as an input target so as to read the temperature detected by the temperature sensor 105. In step S391, the A/D converter 904 is activated. Subsequently, it is checked in step S392 if the return code is 0. If NO in step S392, the control advances to the A/D-conversion time-out processing (to be described later) in step S345 and the subsequent steps.

On the other hand, if YES in step S392, the flow advances to step S393 to check if the re-read temperature detected by the temperature sensor 105 is lower than the predetermined lower-limit temperature. If NO in step S393, the flow advances to step S321 in FIG. 52.

On the other hand, if YES in step S393, it is determined that the thermistor serving as the temperature sensor is short-circuited, and the flow advances to step S394. In step S394, the error state is set in errstat indicating the error state. Subsequently, in step S395, a thermistor short-circuiting error bit in the self diagnosis result code "diagnosis" is set. In step S396, a thermistor short-circuiting attention is selected. In step S397, the selected attention is transmitted to the FLCD interface 2. In step S398, the LED 109 is set in the blinking state in which the LED 109 is turned on/off at short intervals so as to indicate the error state. Then, the processing ends, and the flow returns to the previous routine.

Figure 55:
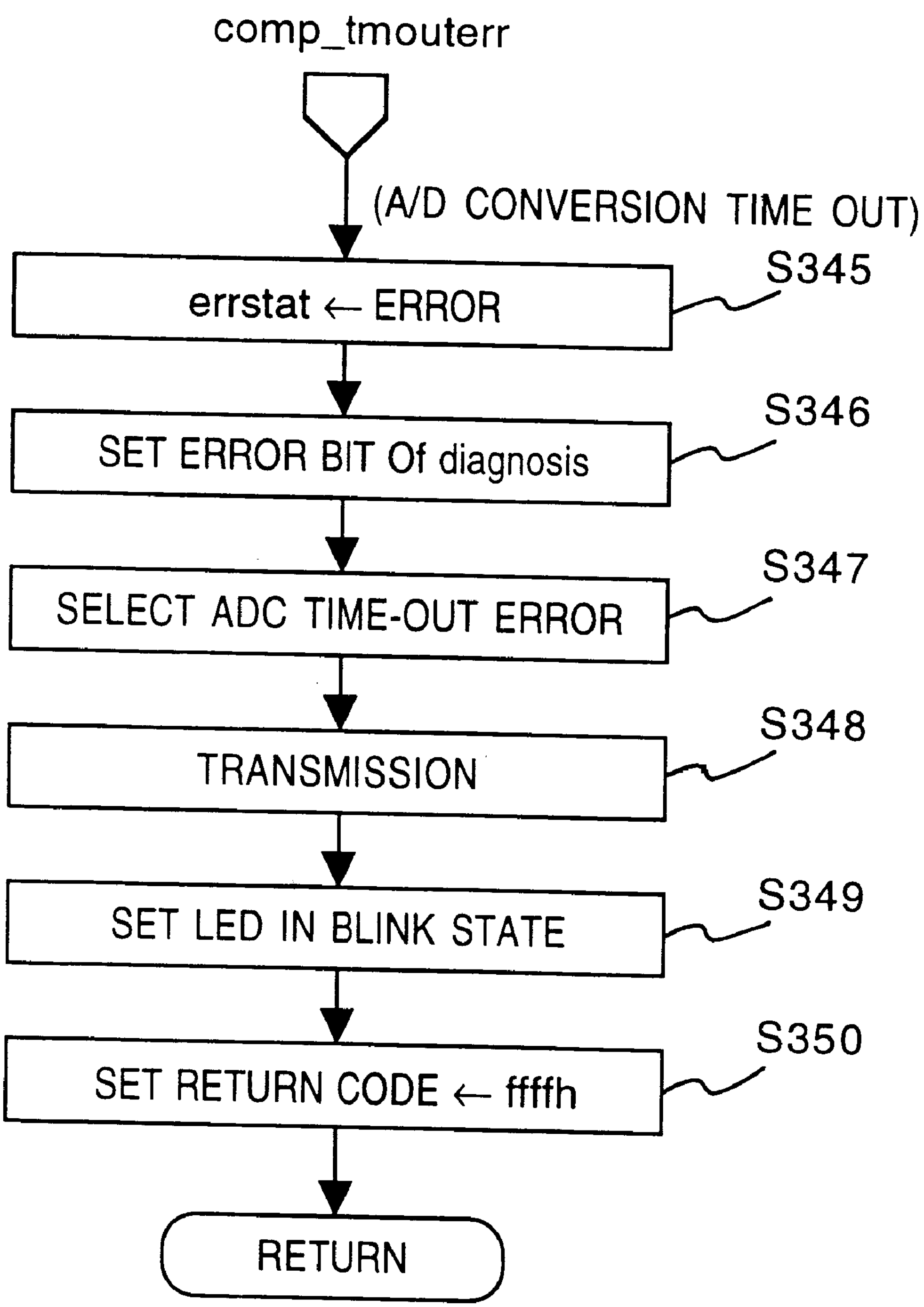
FIG. 55 is a flow chart showing in detail the temperature compensation routine in the embodiment shown in FIG. 1.

Furthermore, if it is determined in the corresponding step described above that the return code is not 0, it is determined that an A/D-conversion time-out error has occurred, and the flow advances to step S345 in FIG. 55. In step S345, the error state is set in errstat indicating the error state. Subsequently, in step S346, an A/D-conversion error bit in the self diagnosis result code "diagnosis" is set. In step S347, an A/D-conversion error attention is selected.

Subsequently, in step S348, the selected attention is transmitted to the FLCD interface 2. In step S349, the LED 109 is set in the blinking state in which the LED 109 is turned on/off at short intervals so as to indicate the error state. In step S350, "ffH" is set in the return code, thus ending this processing. The flow then returns to the previous routine.

As described above, in this embodiment, the user trimmer monitoring interval is 100 ms independently of 1H, and when the user trimmer value remains the same as the previous value, the processing ends without temperature compensation; when the user trimmer value changes, the temperature compensation is performed. Even when the user trimmer value remains the same, the temperature control is performed at 30-sec intervals.

Figure 58:
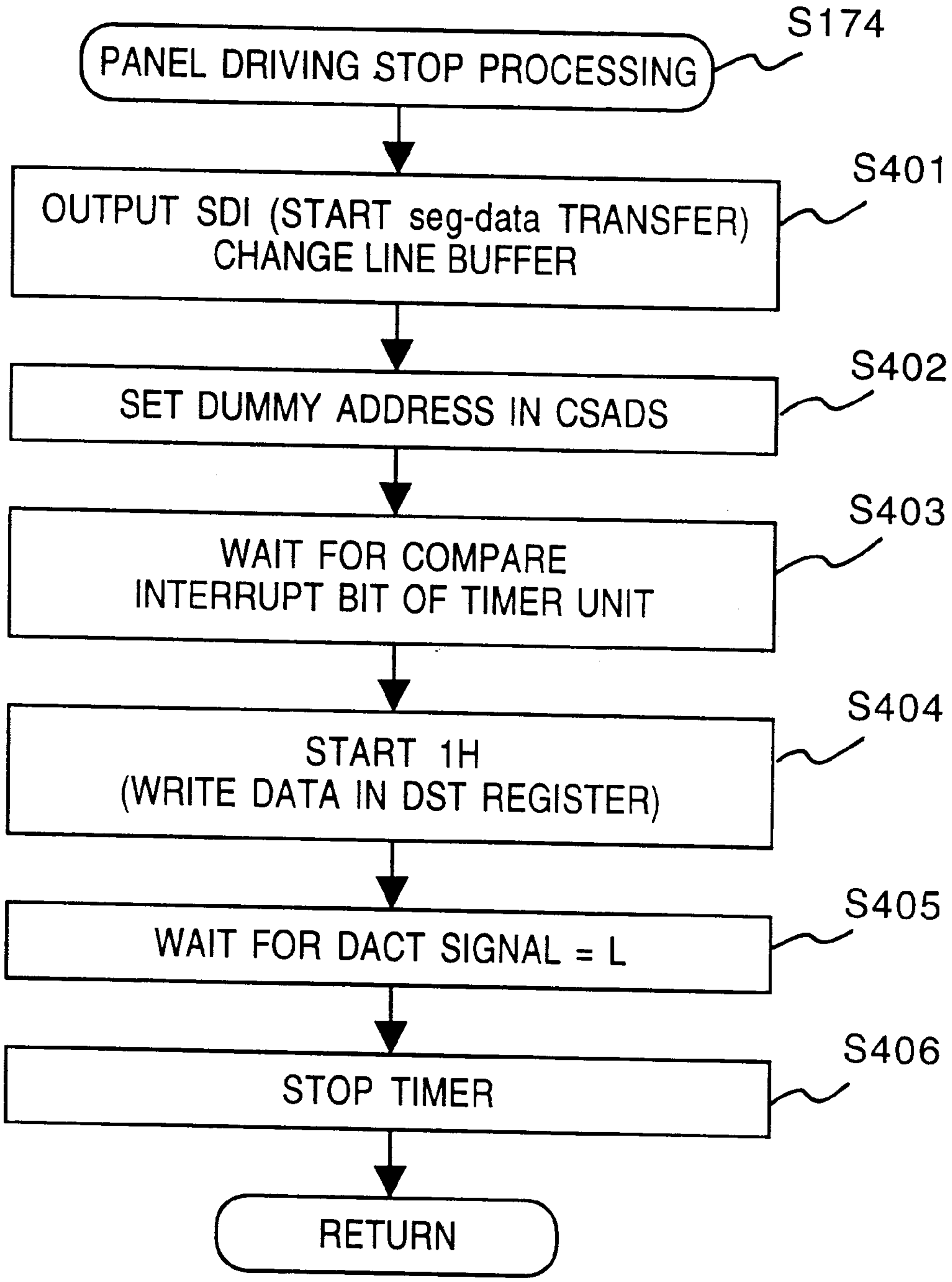
FIG. 58 is a flow chart showing in detail the panel stop processing in the embodiment shown in FIG. 1.

The panel stop processing shown in FIG. 29 will be described below with reference to FIG. 58. In this processing, the post-processing of the driver controller 190 and the COM driver 104 is performed to stop the driving operation of the FLC panel 150.

In step S401, SDI is output to start transfer of segment data, and the FLC panel 150 starts the scan operation of the next line. Then, the line buffers are changed. In step S402, a dummy address is set in the CSADS register 527. In step S403, the control waits for the compare interrupt bit of the timer unit 902 (i.e., until the driving start timing of the scan address).

Thereafter, in step S404, data is written in the DST register 528 to start the 1H timer, thereby executing the driving control and display data rewrite control of the FLC panel 150 by the COM driver 104 and the U- and L-SEG drivers 102 and 103 in the arrangement shown in FIG. 10. In step S405, the control waits until the DACT signal changes to low level. When the DACT signal changes to low level, the timer unit 902 is cleared in step S406, and the flow then returns to the previous routine.

The color switch routine in step S131 in FIG. 27 and the like will be described in detail below with reference to FIG. 59.

In step S410, the trimmer interface 174 is activated to read a gray code (GrayCode) as the setting value of the color adjustment switch (contrast enhancement switch) 108, which is used for color adjustment), i.e., the value (cevalue) of the contrast enhancement switch. It is checked in step S411 if the read value is equal to the previous value (ceold) of the contrast enhancement switch. If YES in step S411, the processing ends, and the flow returns to the previous routine.

On the other hand, if NO in step S411, the flow advances from step S411 to step S413 via step S412. In step S413, gray-binary conversion processing is performed for the read value to convert the gray code into a corresponding binary code, and the converted code is set in a new contrast enhancement value (cecode). A CEcode change attention is selected in step S414, and is transmitted to the FLCD interface 2 in step S415. Then, the flow returns to the previous routine.

Figure 60:
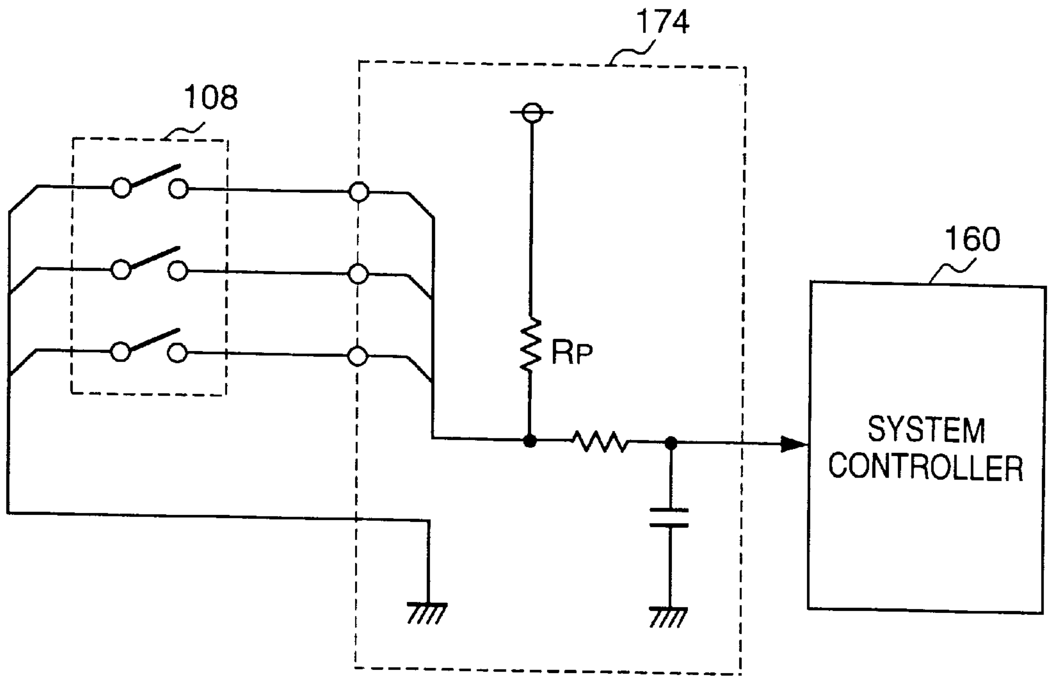
FIG. 60 is a detailed block diagram showing a color adjustment switch (FIG. 7) and a portion, corresponding to the color adjustment switch, of a trimmer interface in the embodiment shown in FIG. 1.

As described above, the FLCD 3 can supply the setting value of the color adjustment switch 108 (the value of the contrast enhancement switch) to the FLCD interface 2. FIG. 60 shows the detailed arrangement of the color adjustment switch 108 of the FLCD 3, and FIG. 61 shows the relationship with the value of the contrast enhancement switch.

As shown in FIG. 60, in this embodiment, the color adjustment switch 108 is a 3-switch circuit, and generates an 8-position gray code in correspondence with the ON/OFF states of the switches, so as to obtain a high-level output corresponding to a switch circuit OFF state and a low-level output corresponding to a switch circuit ON state due to the presence of a pull-up resistor Rp of the trimmer interface 174. The states of the respective signals are as shown in FIG. 61. In FIG. 61, position 0 instructs 16 gradation levels, i.e., the smallest number of gradation levels, as the basic specification of the FLC panel 150, and position 7 instructs about 32K gradation levels.

Upon reception of the gray code defined by signals CESW, the system controller 160 converts the gray code shown in FIG. 61 into a binary code in the processing in step S413, and sends the converted binary code to the FLCD interface 2 in step S415. The transmission processing has been described in detail above with reference to FIG. 18.

Upon reception of the switch value, the FLCD interface 2 rewrites the de-gamma table in the de-gamma circuit 309 by looking up the ROM 308. As a result, the contrast of an image displayed on the FLC panel 150 is changed. Image data corrected by the de-gamma circuit 309 and output from the host 1 are output to the binary halftone processing circuit 305. The binary halftone processing circuit 305 binary-converts 8-bit R, G, and B data into 1-bit R. G, and B data, and also outputs a binary signal indicating the luminance level.

Figure 62:
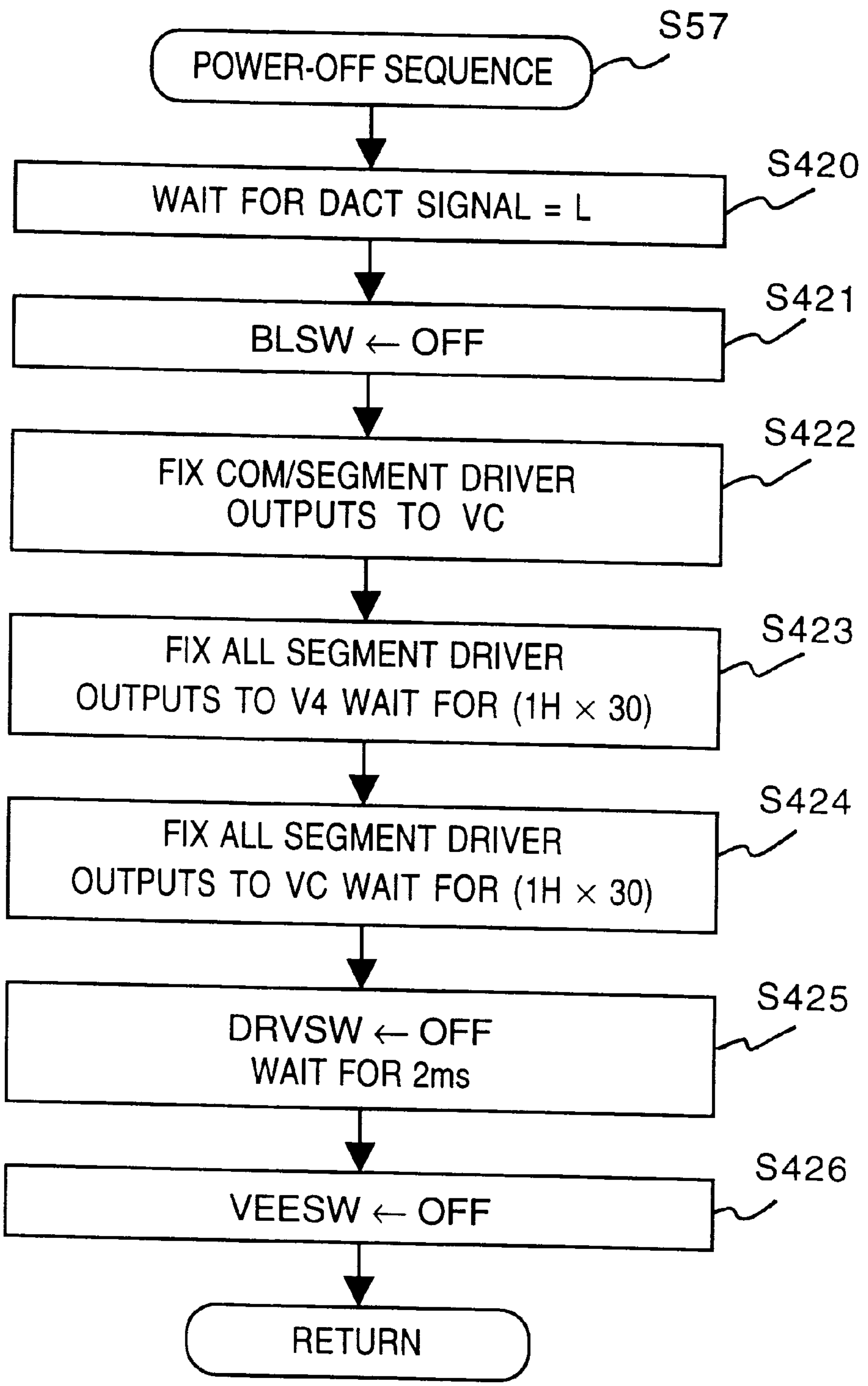
FIG. 62 is a flow chart showing in detail the power-OFF sequence of the embodiment shown in FIG. 1.

The power-OFF sequence in step S57 in FIG. 20 will be described in detail below with reference to FIG. 62. In this embodiment, the power-OFF sequence is executed in the following three cases:

1. when the SW power supply 120 is turned off, and the ACF signal from the SW power supply 120 is enabled (after the end of the processing in FIG. 62, the control returns to the entry point of hardware reset processing);
2. when the RESET signal from the FLCD interface 2 is disabled (the control waits until the RESET signal is disabled after the end of the processing in FIG. 62, and then returns to the entry point of hardware reset processing); and
3. when the POWERON signal from the FLCD interface 2 is disabled (in this case, the controls waits until the POWERON signal is enabled after the end of the processing in FIG. 62, and returns to the entry point of hardware reset processing after the POWERON signal is enabled).

In the power-OFF sequence, the control waits for the end of the 1H period as the scan time of the driver controller 190, i.e., waits for the DACT signal indicating the end of 1H, in step S420. Subsequently, in step S421, the backlight controller 172 is instructed to turn off the BLSW, thus tuning off the backlights. In steps S422 to S424, black erase processing for writing black data in all the segments of the FLC panel 150 is executed. Since the FLC panel 150 can store display data, the previous display data remains displayed on the display screen unless this processing is executed.

More specifically, in step S422, the COM driver 104 and the two segment drivers 102 and 103 are energized so that all the outputs select VC. In step S423, the information signals to the segment drivers 102 and 103 are fixed to V4 as an information signal level for displaying dark data for (1H×30). In step S424, VC is fixed for (1H×30). With the above-mentioned control, all the display segments of the FLC panel 150 are erased by black.

Subsequently, in step S425, a DRVSW signal is set in the OFF state to disable the liquid crystal driving voltage output. After an elapse of 2 ms, the flow advances to step S426, and the VEESW signal for energizing the output channel power supply (VEE) of the respective driver circuit is set in the OFF state. Thereafter, this processing ends, and the flow returns to the previous routine.

Figure 63:
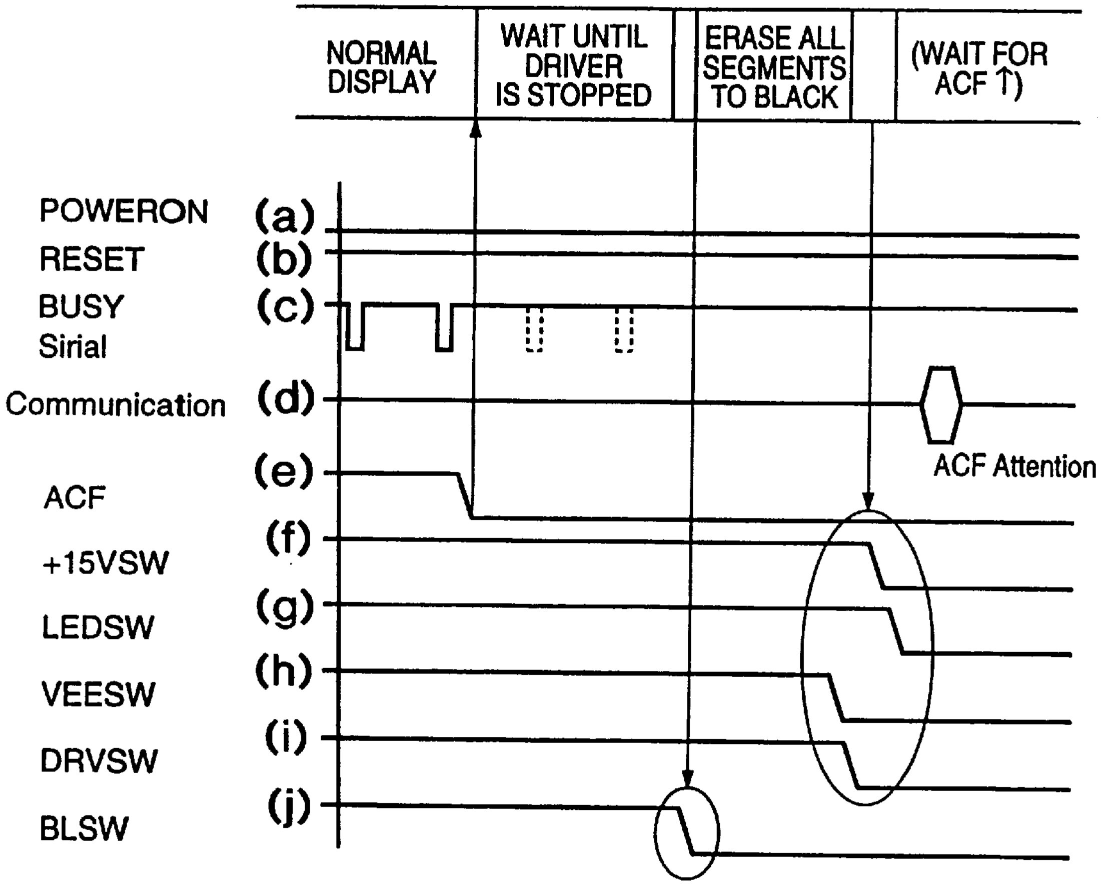
FIG. 63 is a timing chart of the power-OFF sequence of the embodiment shown in FIG. 1.

FIG. 63 is a timing chart showing the power-OFF sequence of the display apparatus of this embodiment. In an example shown in FIG. 63, the power-OFF sequence is called from the interrupt routine due to ACF detection when the ACF signal is disabled.

In this embodiment, the FLCD interface 2 and the FLCD 3 exchange various kinds of control data via serial communications, and for this purpose, the system controller 160 of the FLCD 3 performs the following communication control.

In the Normal mode in which the normal drawing processing is being performed, polling of the reception and transmission buffers of the internal RAM 162 is performed at 1H intervals. In the Static mode as the static state, the Sleep mode in which all the segments are erased by black, and the Wait mode such as an unrecoverable error state, polling of the reception and transmission buffers is performed every time the serial communication transmission/reception processing and transmission from the buffer are completed.

First, the reception buffer is checked, and if new reception data is detected, reception processing to be described below is performed. When transmission data is stored in the transmission data buffer, transmission processing is performed.

In the above-mentioned processing, in the case of the normal drawing processing, the processing up to polling is performed simultaneously with the driving operation of the FLC panel 150. However, when the reception processing or the transmission processing from the transmission buffer is performed, the corresponding processing is performed after the driving operation is stopped. Note that processing for the transmission/reception command and the received command is not performed during an interval from power-ON to issuance of a "Unit Ready" attention, and during execution of the self diagnosis, but is performed after the end of such processing.

Since the communication control sequence is as described above, a repetitive description thereof will be avoided. In the internal processing of the FLCD 3, the following operation is performed.

Figure 64:
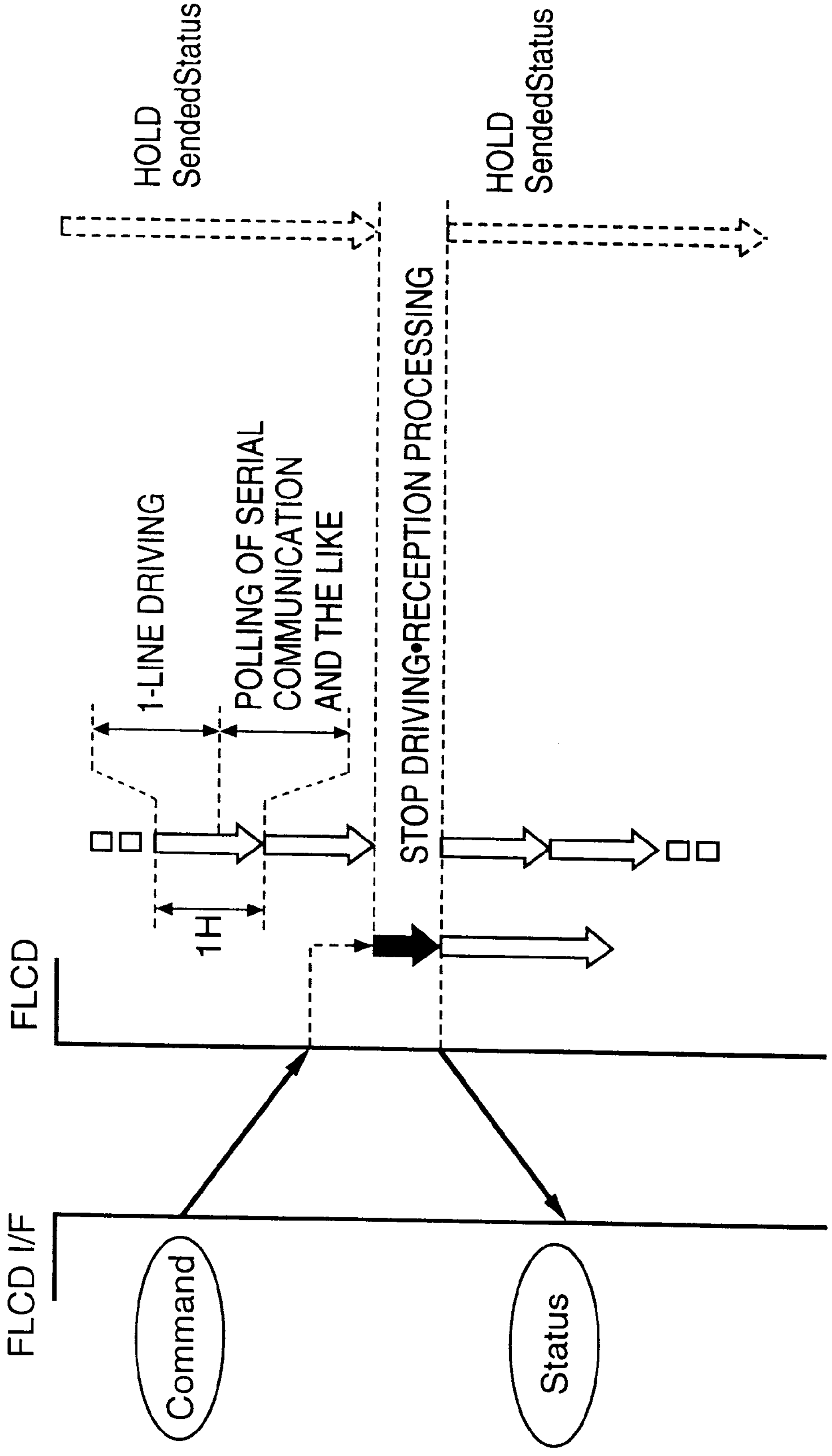
FIG. 64 is a view showing the internal processing state when the FLCD of the embodiment shown in FIG. 1 receives a command via a serial communication.

That is, upon reception of a command, the driving operation of the FLC panel 150 is stopped, and processing of the received command and transmission of a status are performed. In this case, the transmitted status is held until the next command is received since a pointer is not operated until the next command is received, as described in the above flow charts. Therefore, the status can be re-sent quickly without requiring any special operation, if necessary. FIG. 64 shows the internal processing state of the FLCD 3 during this interval.

Figure 65:
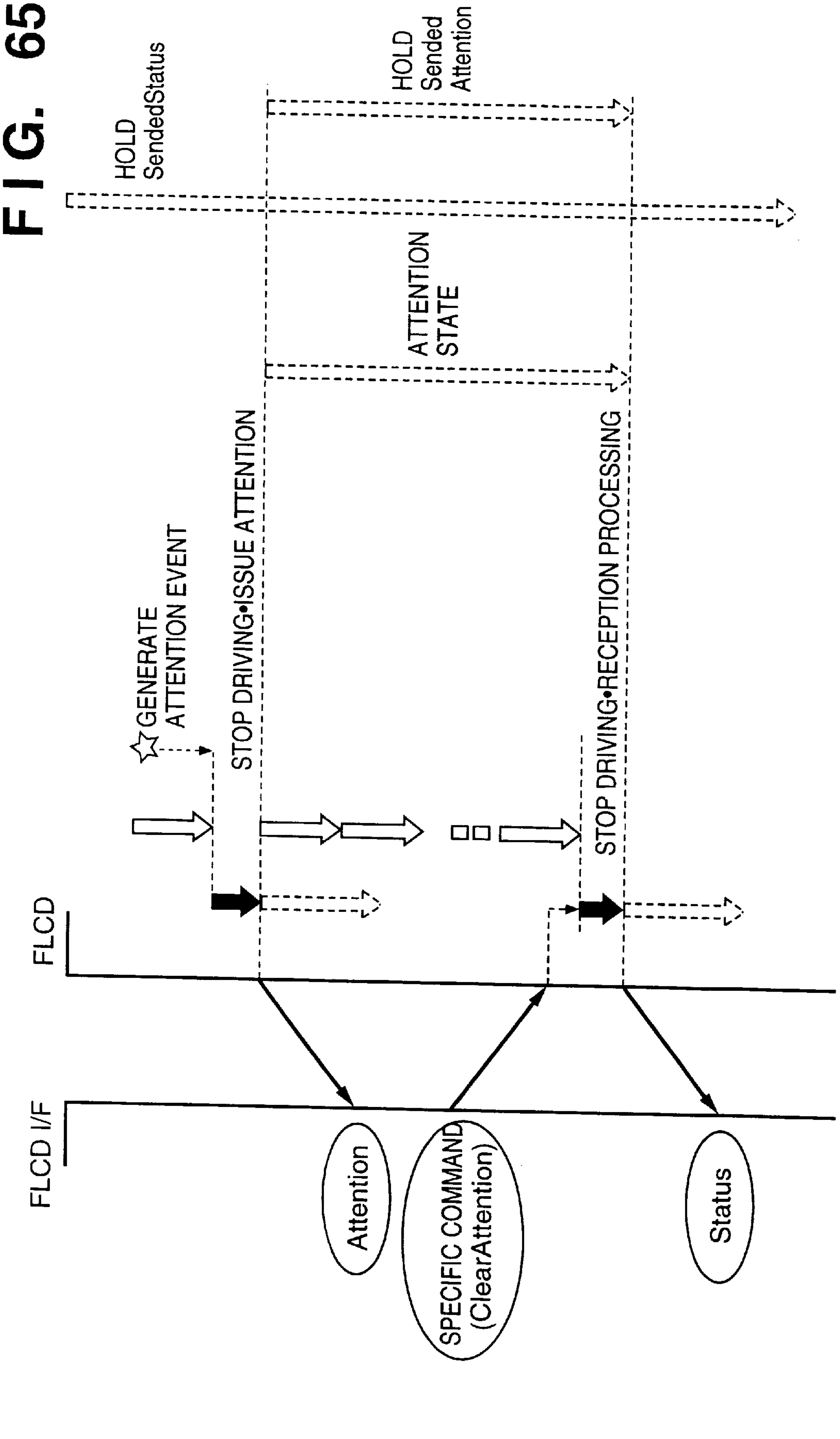
FIG. 65 is a view showing the internal processing state when the FLCD of the embodiment shown in FIG. 1 performs a serial communication in response to issuance of an attention.

Also, when a serial communication is performed in response to issuance of an attention, the attention state is set from when the attention is issued until a command (Clear Attention) for clearing the attention state is received, and the control responds only to a specific command during this interval. Detailed information (AttentionInformation) of an attention event is held during the attention state. FIG. 65 shows the internal processing state of the FLCD 3 during this interval.

Figure 66:
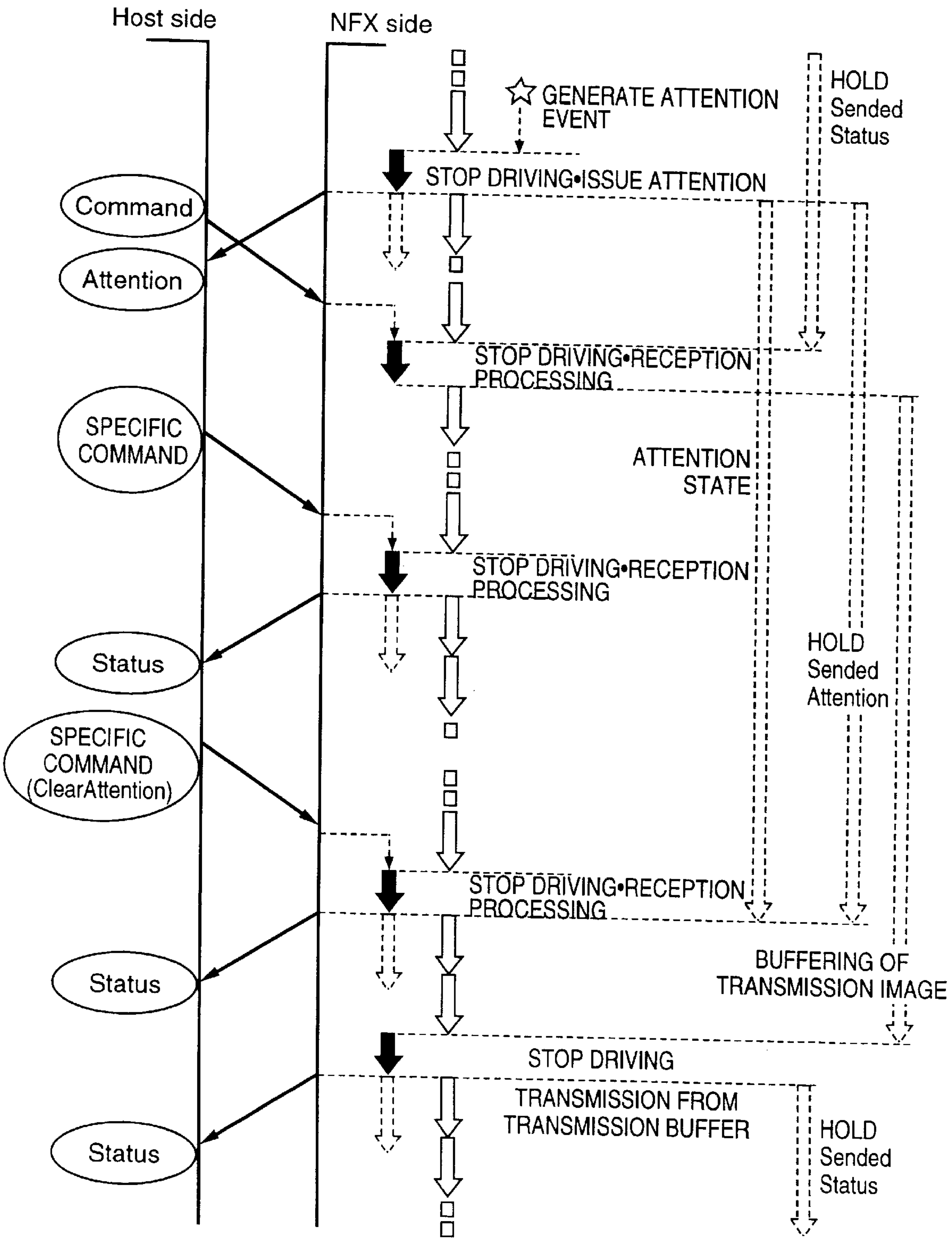
FIG. 66 is a view showing the internal processing state when the FLCD of the embodiment shown in FIG. 1 receives a command during an attention state upon execution of a serial communication in response to issuance of an attention.

When a command is received in the attention state, a status for the received command is transmitted after the attention state is cleared. On the other hand, SendedStatus for a specific command is not held, and a previous status is held without being updated. FIG. 66 shows the internal processing state of the FLCD 3 during this interval.

The buffering control of a transmission image, status, and the like in the transmission data buffer will be explained below. The FLCD 3 of this embodiment sets a transmission image including the transmission priority order, holding operation information after transmission, and the detailed information (AttentionInformation) of an attention event in addition to transmission data upon transmission of a status and an attention. When the previous transmission is not completed or an attention is not cleared, buffering is performed in accordance with the priority order, and the transmission and holding operations are performed when transmission is ready.

Figure 67:
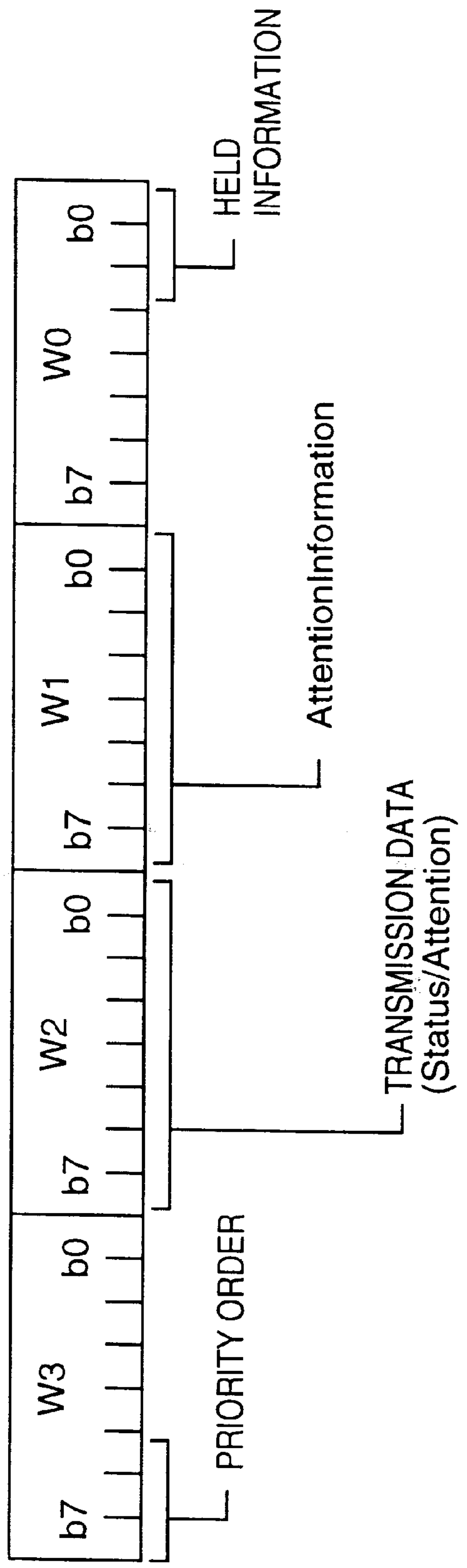
FIG. 67 is a view showing an example of a transmission image used in the serial communication of the embodiment shown in FIG. 1.

FIG. 67 shows an example of the transmission image in the above-mentioned processing, and FIG. 68 shows a setting example of the priority order in the transmission image.

In this embodiment, using commands via serial communications, an access to the memory space of the FLCD 3 can be made, and a read access to the memory space of the ROM 161/a write access to the memory space of the RAM 162 can be made. In this case, if the memory space that can be accessed via a communication is defined as an access space, and the actual address spaces in the ROM 161 and the RAM 162 are defined as a real address space, memory accesses are mapped to reduce the transmission amount in serial communications in this embodiment, and hence, the real address space cannot be recognized by accesses via serial communications. The 64-Kbyte access space is mapped to arbitrary addresses in the 16-Mbyte address space in units of 4 Kbytes.

Mapping of memory accesses of the FLCD 3 in this embodiment will be described below with reference to FIG. 69.

Figure 69:
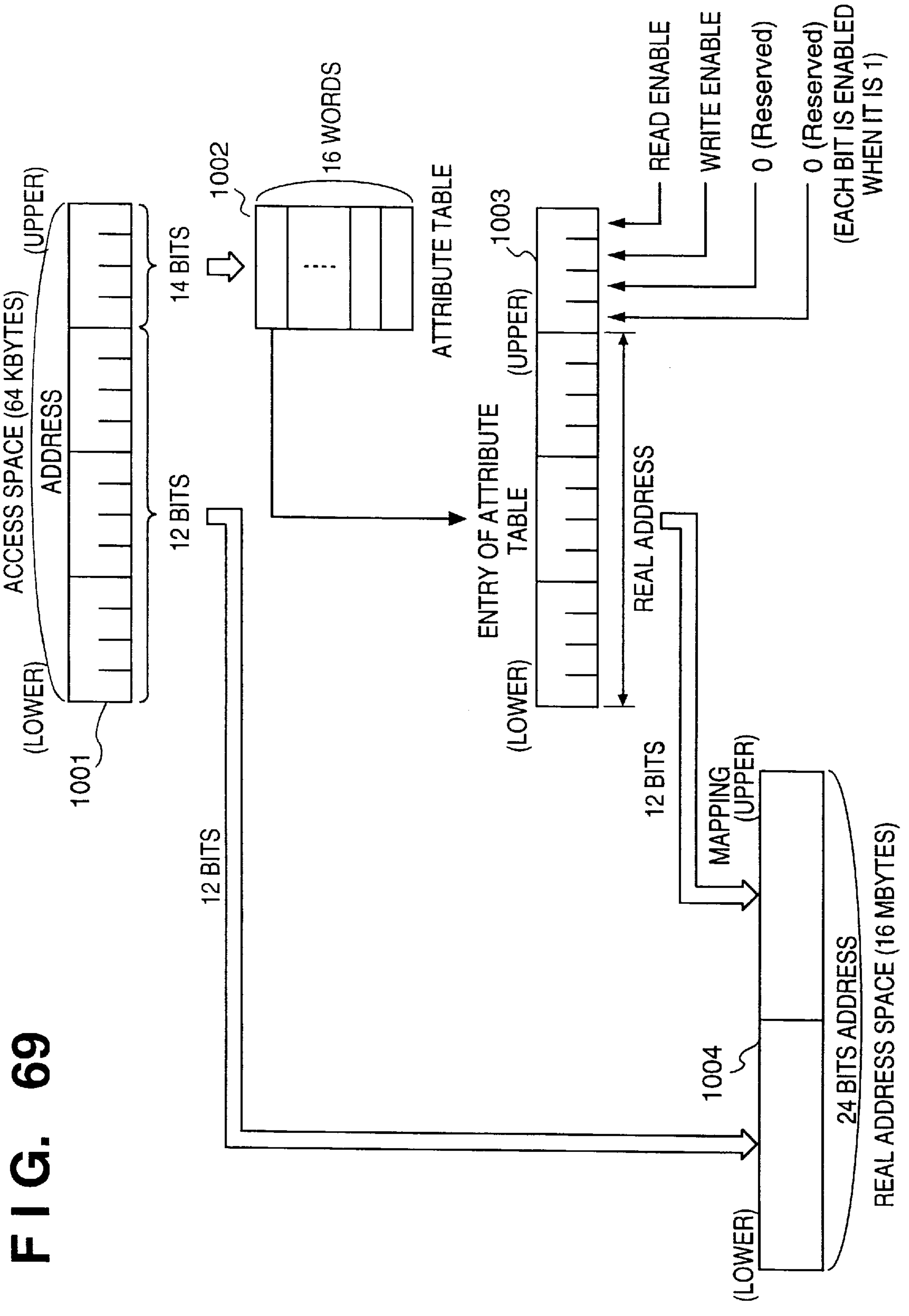
FIG. 69 is a view for explaining the address space when the FLCD of the embodiment shown in FIG. 1 makes a memory access.

An address space designated by a command via a serial communication consists of 16 bits, as indicated by 1001 in FIG. 69. The lower 12 bits of this space are used as lower 12 bits of the real address space, and the remaining upper 4 bits are used as a pointer to an attribute table 1002. In this embodiment, the attribute table 1002 consists of a total of 16 words, and can be designated by 4 bits.

The attribute table 1002 is constituted by a 12-bit real address portion for designating each of blocks, divided in units of 4 Kbytes, in the real address space, and a 4-bit portion for designating a read/write attribute of each block.

As described above, since mapping is performed using the attribute table, the real address space with a larger capacity can be accessed by a smaller communication amount, thus improving the communication efficiency.

The above-mentioned serial communication processing of this embodiment with the above-mentioned control will be described below with reference to FIGS. 70 to 97. First, the SC reception routine in step S190 in FIG. 31 will be described below with reference to FIGS. 70 to 95.

Figure 70:
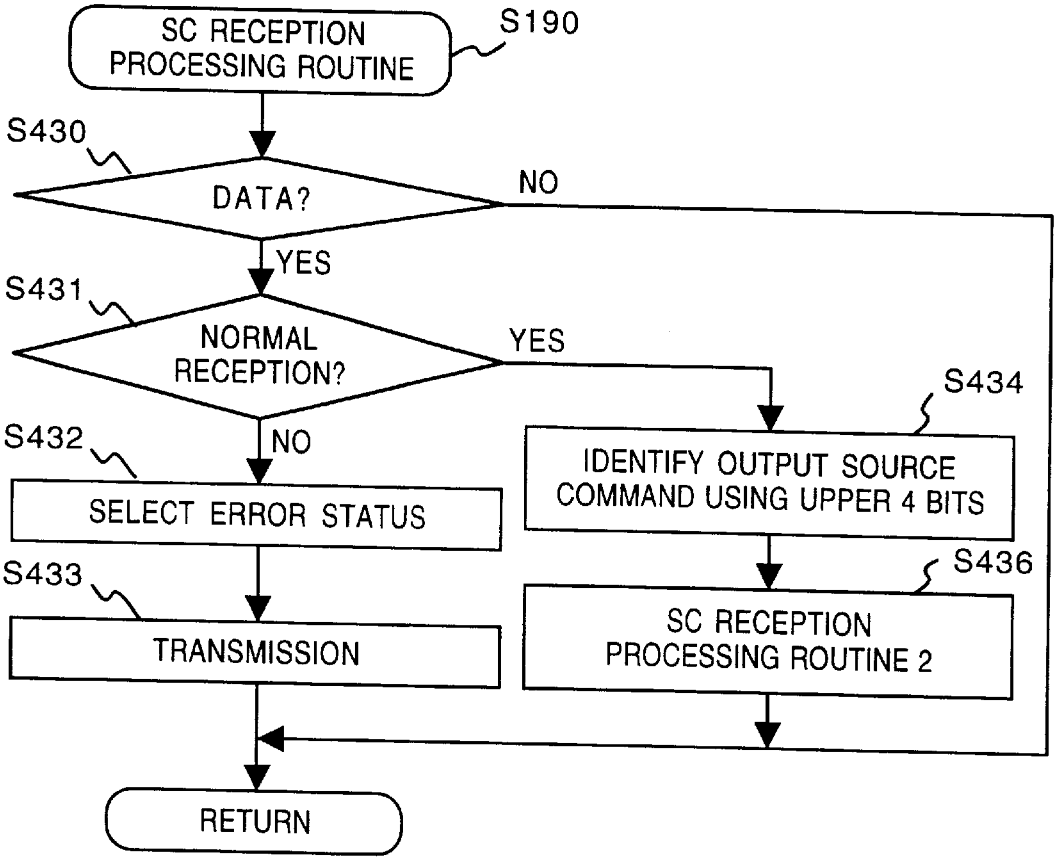
FIG. 70 is a flow chart showing the SC reception processing in the serial communication processing of the embodiment shown in FIG. 1.

In the SC reception processing, it is checked in step S430 in FIG. 70 if reception data is present. If NO in step S430, the flow directly returns. On the other hand, if YES in step S430, the flow advances from step S430 to step S431 to check if reception was normally performed. If NO in step S431, the flow advances to step S432, and an error status is selected in accordance with the error contents. Subsequently, in step S433, the transmission processing of the selected error status to the FLCD interface 2 is executed.

On the other hand, if it is determined in step S431 that reception was normally performed, the flow advances to step S434, and the upper 4 bits of a received command are checked to discriminate the command type. In step S436, one of the processing operations shown in FIGS. 71 to 82 is executed in accordance with the request of the command. Thereafter, the processing ends, and the flow returns to the previous routine.

The processing operations corresponding to the received commands in step S435 will be explained below.

Figure 71:
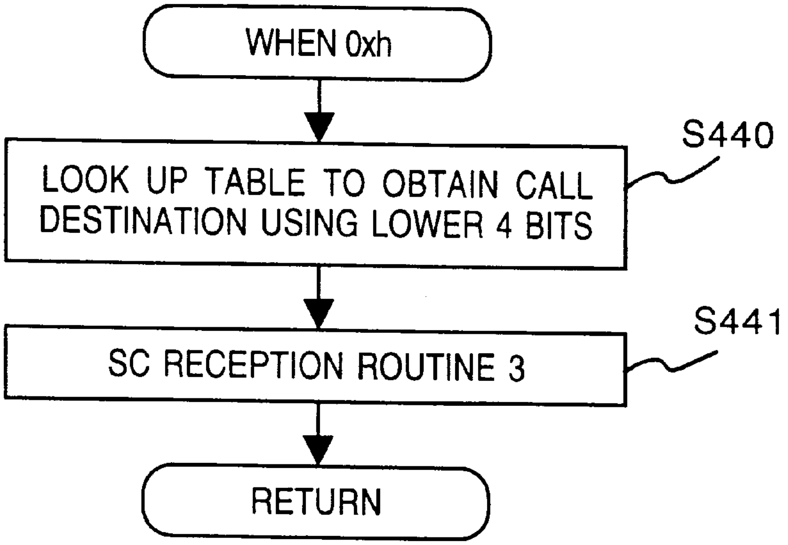
FIG. 71 is a flow chart showing the SC reception processing in the serial communication processing of the embodiment shown in FIG. 1.

If it is determined in step S434 that the upper 4 bits are (0x)h, the processing shown in FIG. 71 is executed. In step S440, the remaining lower 4 bits are checked to discriminate the command type, and processing corresponding to the request of the command is executed in SC reception processing routine 3. Then, the flow returns to the previous routine. SC reception processing routine 3 will be described later.

Figure 72:
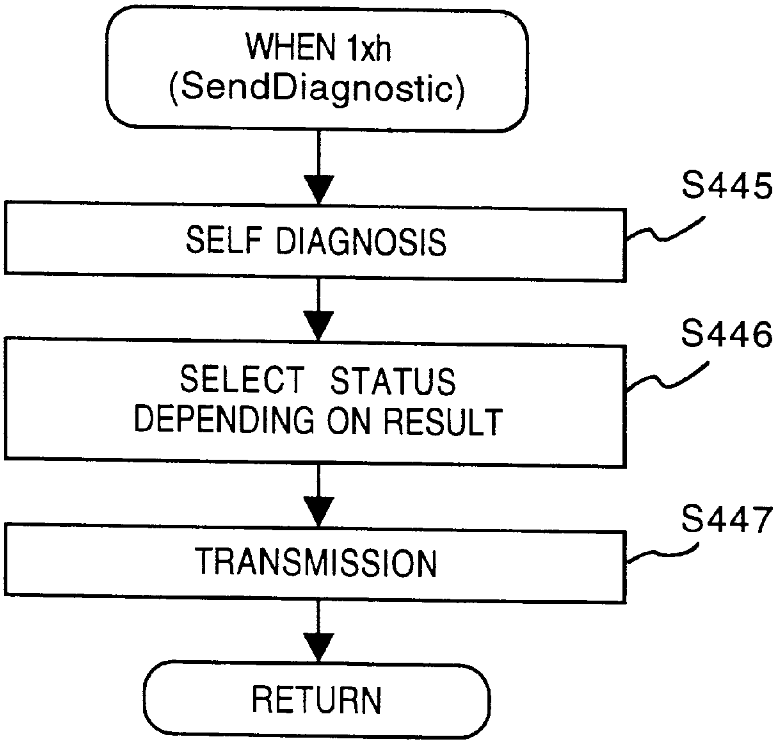
FIG. 72 is a flow chart showing the SC reception processing in the serial communication processing of the embodiment shown in FIG. 1.

If it is determined in step S434 that the upper 4 bits are (1x)h, the processing shown in FIG. 72 is executed. In this case, since the command corresponds to the self diagnosis instruction of the FLCD 3, the above-mentioned self diagnosis routine shown in FIG. 21 is executed in step S445. Subsequently, a status is selected in correspondence with the self diagnosis result in step S446, and the selected status is transmitted to the FLCD interface 2 in step S447. Then, the processing ends, and the flow returns to the previous routine.

Figure 73:
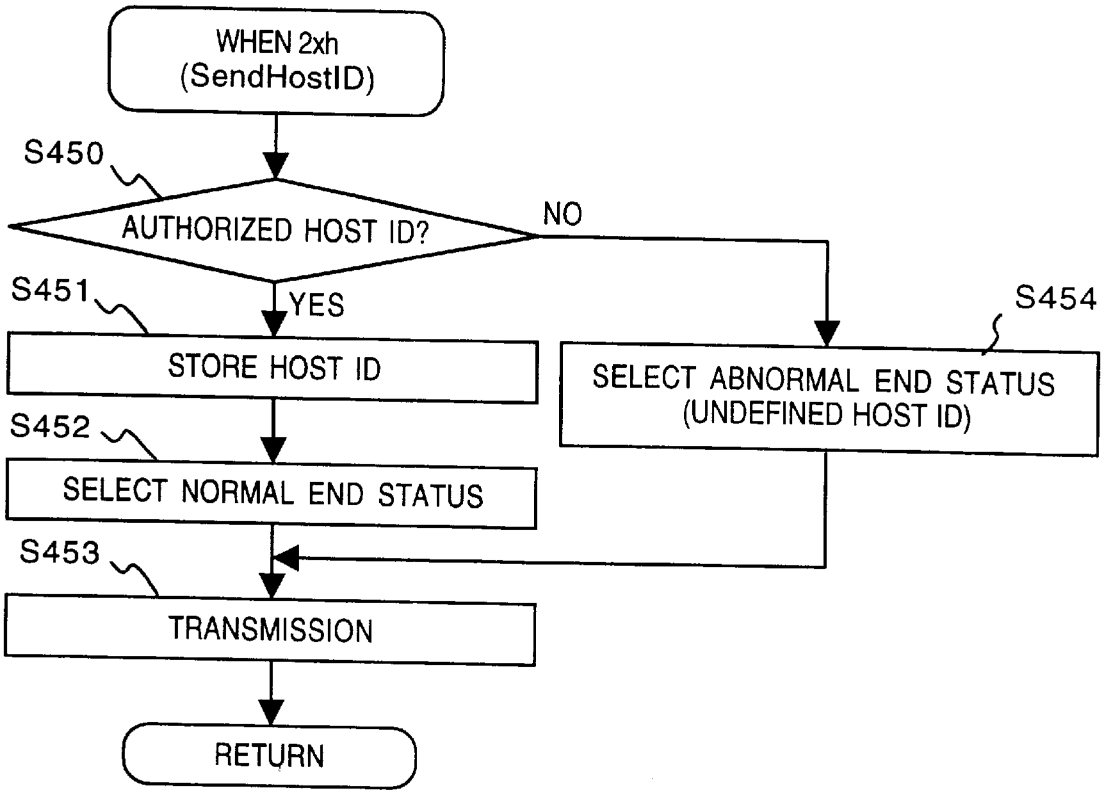
FIG. 73 is a flow chart showing the SC reception processing in the serial communication processing of the embodiment shown in FIG. 1.

If it is determined in step S434 that the upper 4 bits are (2x)h, the processing shown in FIG. 73 is executed. In this case, since the command informs the host ID, it is checked in step S450 if the received host ID is an authorized one. If the host ID sent from the host side (FLCD interface 2 side) is an authorized one, i.e., the host is the one for which connection is permitted, the flow advances to step S451, and the received host ID is stored in a predetermined storage area. A normal end status is selected and generated in step S452, and is transmitted in step S453. Thereafter, the processing ends.

On the other hand, if it is determined in step S450 that the host ID is not an authorized one, the flow advances from step S450 to step S454, and an abnormal end status (undefined host ID) is selected and generated. The flow then advances to step S453 to transmit the status to the FLCD interface 2.

Figure 74:
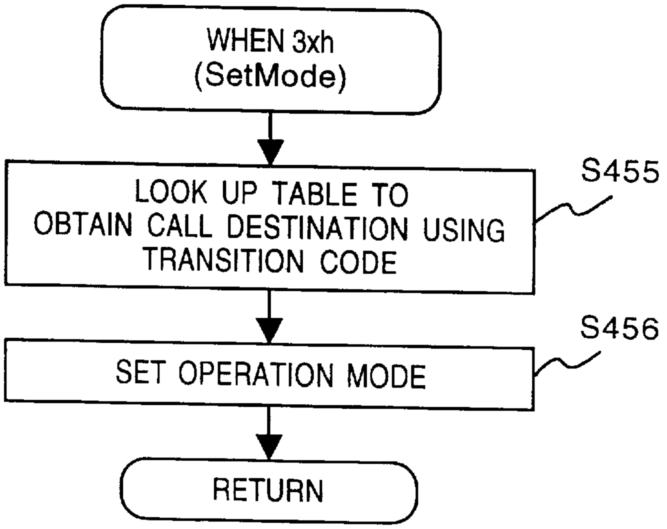
FIG. 74 is a flow chart showing the SC reception processing in the serial communication processing of the embodiment shown in FIG. 1.

If it is determined in step S434 that the upper 4 bits are (3x)h, the processing shown in FIG. 74 is executed. In this case, since the command corresponds to a display mode switch instruction of the FLCD 3, a call destination is discriminated based on a transition code in step S455, and the above-mentioned operation mode routine is executed in step S456. Then, the display mode is set to be one discriminated from the three modes, i.e., the normal display, static, and sleep modes. The processing ends, and the flow returns to the previous routine.

Figure 75:
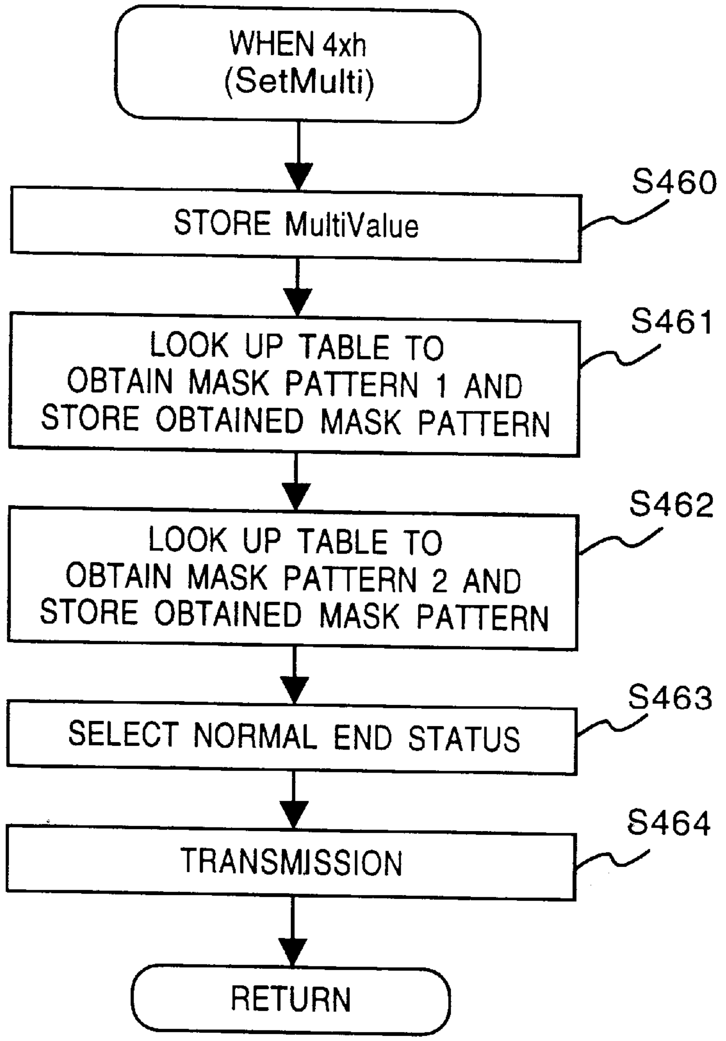
FIG. 75 is a flow chart showing the SC reception processing in the serial communication processing of the embodiment shown in FIG. 1.

If it is determined in step S434 that the upper 4 bits are (4x)h, the processing shown in FIG. 75 is executed. In this case, since the command sets the FLCD 3 in a multi-driving mode, MultiValue sent together with the command is read and stored in step S460. In step S461, mask pattern 1 is obtained by looking up a table, and the obtained mask pattern is stored. Subsequently, in step S462, mask pattern 2 is obtained by looking up a table, and the obtained mask pattern is stored. A normal end status is selected and generated in step S463, and is transmitted in step S464. Then, the processing ends.

Figure 76:
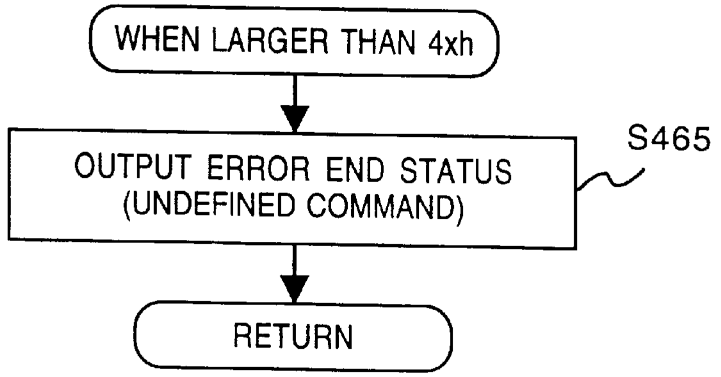
FIG. 76 is a flow chart showing the SC reception processing in the serial communication processing of the embodiment shown in FIG. 1.

On the other hand, in a normal user use state, if it is determined in step S434 that the upper 4 bits are larger than (4x)h, the processing shown in FIG. 76 is performed. In step S465, an error end status indicating an undefined command is output, and the flow then returns to the previous routine. Commands larger than (8x)h are those for debugging, and are not used in a use state based on an application program for a normal user.

However, upon setting of a maintenance mode (debugging mode) (not shown), commands larger than (8x)h must be used for debugging, and in this case, the processing shown in FIG. 76 is not performed, but the processing operations shown in FIGS. 77 to 82 can be executed. The SC reception processing in the maintenance mode will be described below. In this case, in addition to the processing operations shown in FIGS. 71 to 75, the following command reception and corresponding processing operations are executed.

Figure 77:
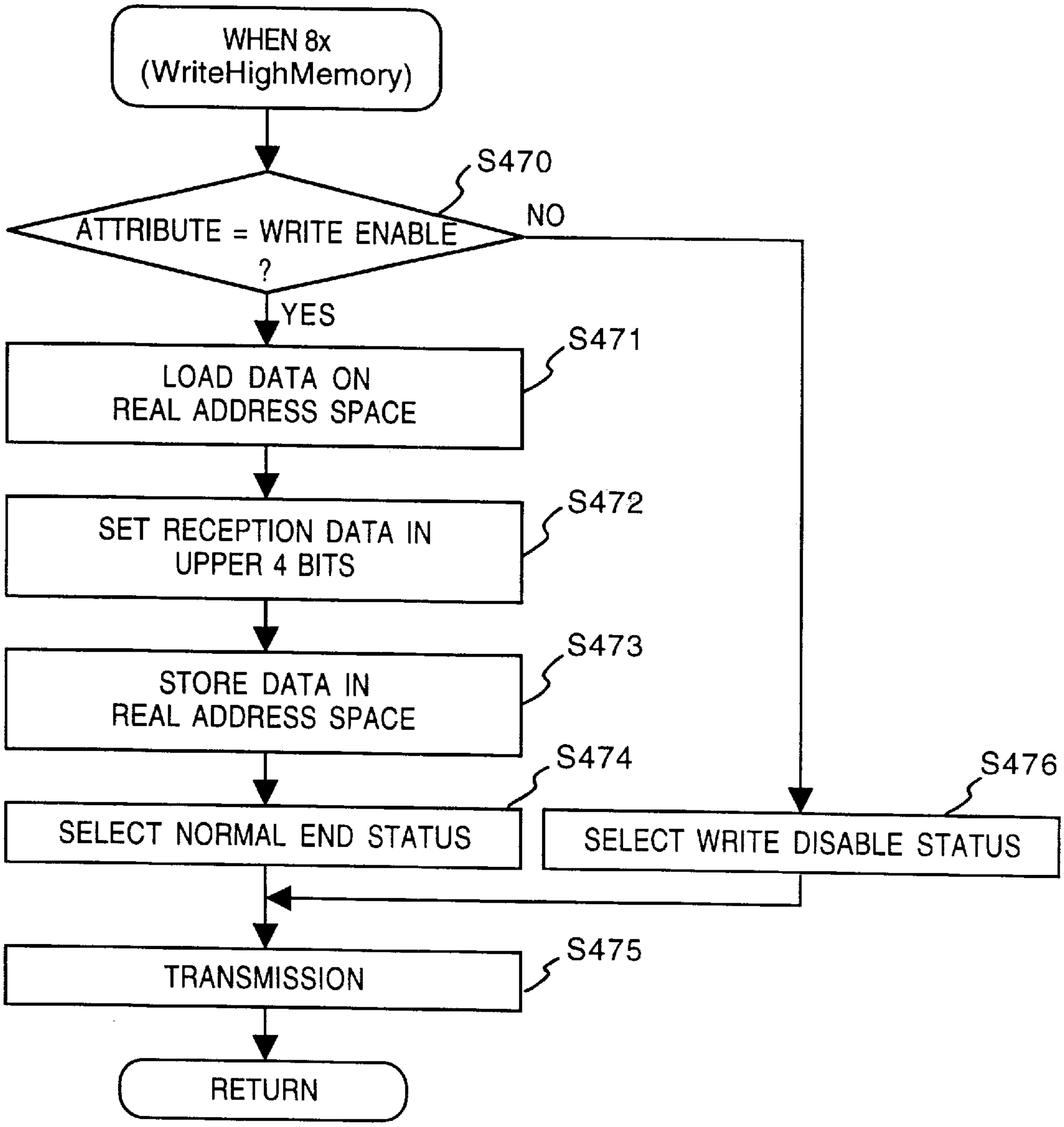
FIG. 77 is a flow chart showing the SC reception processing in the serial communication processing of the embodiment shown in FIG. 1.

If it is determined in step S434 that the upper 4 bits are (8x)h, the processing shown in FIG. 77 is executed. In this case, the received command is the "Write High Memory" command for instructing that upper data is written in the memory (RAM 162) in the FLCD 3. For this reason, it is checked in step S470 if the real address space of the designated memory is in a write enable state. Since this command must be executed after the data write address is set by the Set HH/MH/ML/LL Address commands (to be described later), the checking operation in step S470 is attained by checking the status bit, indicating the write enable or disable state, in the attribute table designated by attribute table designation information in the address space 1001 shown in FIG. 69, which was received upon setting the address.

If the designated real address space is in the write enable state, the flow advances to step S471, and data on the set real address space is temporarily loaded. The received data is set in the upper 4 bits in step S472, and the loaded data is stored in the set real address space in step S473. Thereafter, a normal end status is selected in step S474, and the flow advances to step S475. The selected status is transmitted to the FLCD interface 2 in step S475. This processing ends, and the flow returns to the previous routine.

On the other hand, if it is determined in step S470 as the checking result of the attribute that the designated real address space is not in the write enable state, the flow advances to step S476, and a write disable status is selected. The flow then advances to step S475. The selected status is transmitted to the FLCD interface 2 in step S475. This processing ends, and the flow returns to the previous routine.

Figure 78:
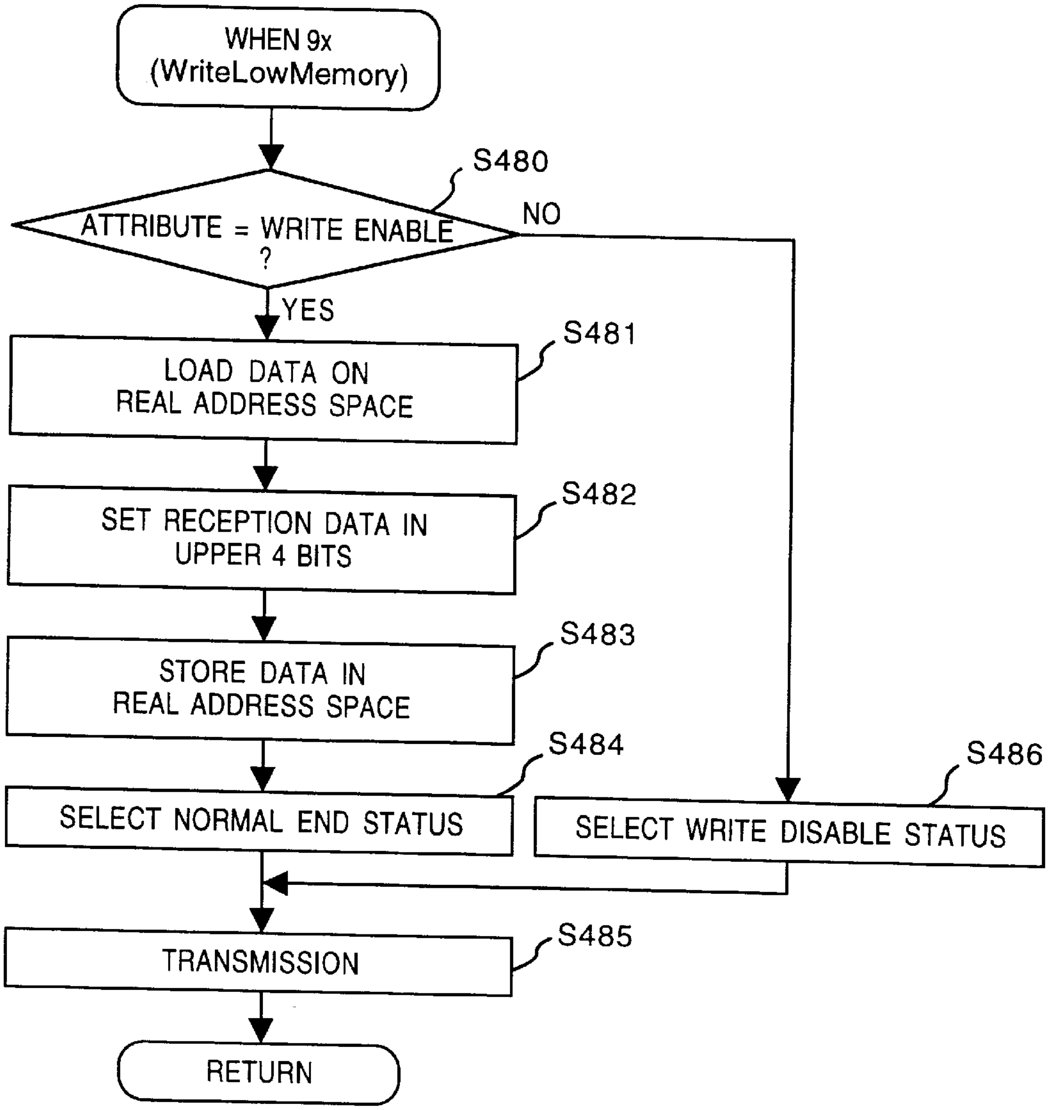
FIG. 78 is a flow chart showing the SC reception processing in the serial communication processing of the embodiment shown in FIG. 1.

If it is determined in step S434 that the upper 4 bits are (9x)h, the processing shown in FIG. 78 is executed. In this case, since the command is the "Set Low Memory" command for instructing that lower data is written in the memory (RAM 162) of the FLCD 3, it is checked in step S480 if the designated real address space is in a write enable state, as in step S470.

If the designated real address space is in the write enable state, the flow advances to step S481, and data on the set real address space is temporarily loaded. The received data is set in the lower 4 bits in step S482, and the loaded data is stored again at the set real address space position in step S483. Thereafter, a normal end status is selected in step S484, and the flow advances to step S485. In step S485, the selected status is transmitted to the FLCD interface 2. This processing ends, and the flow returns to the previous routine.

On the other hand, if it is determined in step S480 as a result of checking the attribute that the designated real address space is not in the write enable state, the flow advances to step S486 to select a write disable status, and the flow then advances to step S485. In step S485, the selected status is transmitted to the FLCD interface 2. Then, this processing ends, and the flow returns to the previous routine.

Figure 79:
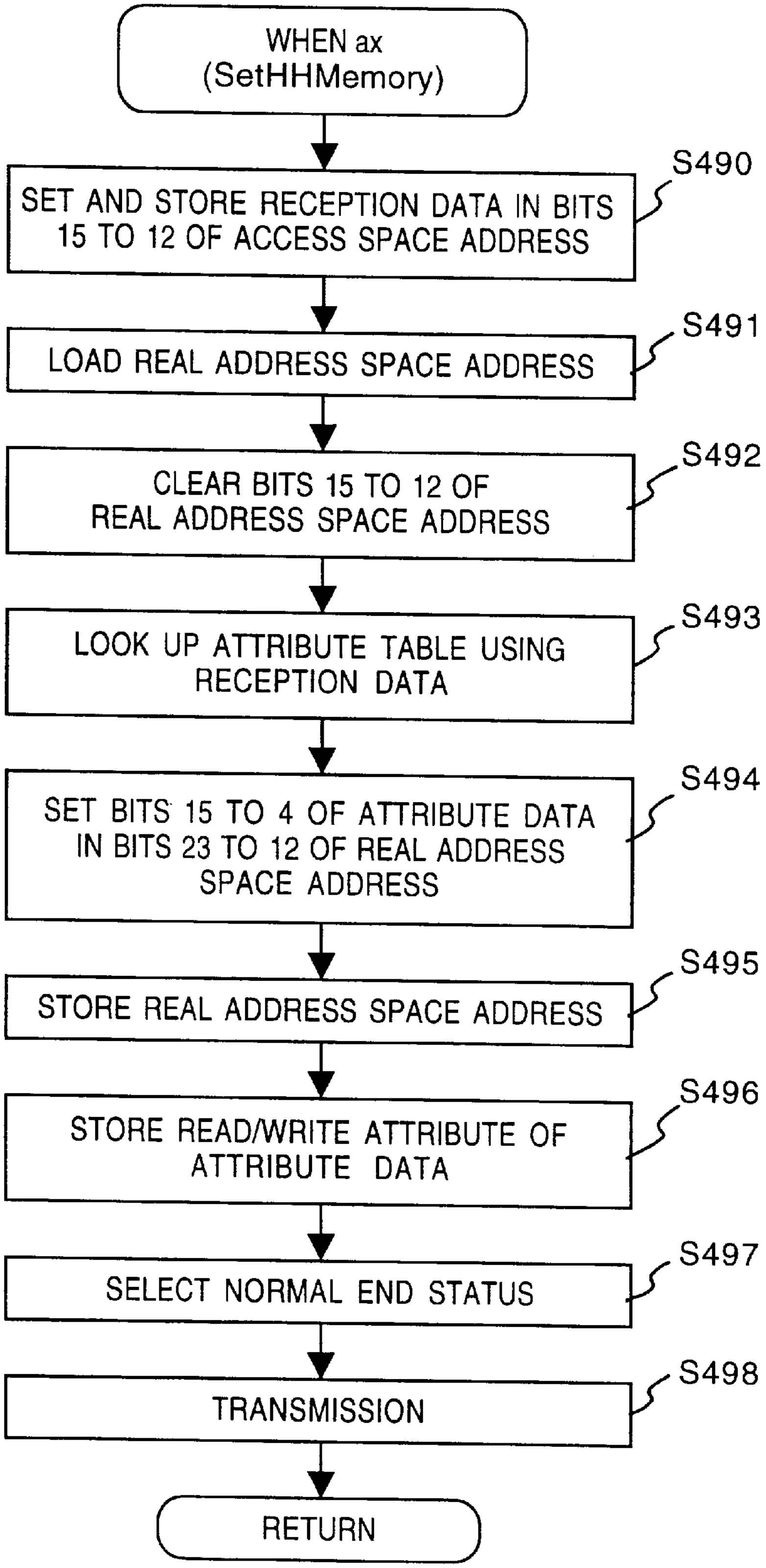
FIG. 79 is a flow chart showing the SC reception processing in the serial communication processing of the embodiment shown in FIG. 1.

If it is determined in step S434 that the upper 4 bits are (ax)h, the processing shown in FIG. 79 is executed. In this case, since the command sets the upper 4 bits (A15 to A12) of the address bits of the memory address of the FLCD 3 including the above-mentioned data write operation, 4-bit received data included in an OP code of the received command is set and stored in bits 15 to 12 of the access space address in step S490.

In this case, since the command corresponds to an attribute table instruction, the real address space is loaded in the step S491 and bits 23 to 12 of the real address space are cleared in step S492. Subsequently, in step S493, the attribute table is looked up based on the received data. In step S494, bits 15 to 4 of attribute data are stored in bits 23 to 12 of the real address space. Then, the read/write attribute of the attribute data is stored.

Thereafter, a normal end status is selected in step S497, and the flow advances to step S498. In step S498, the selected status is transmitted to the FLCD interface 2. Then, this processing ends, and the flow returns to the previous routine.

Figure 80:
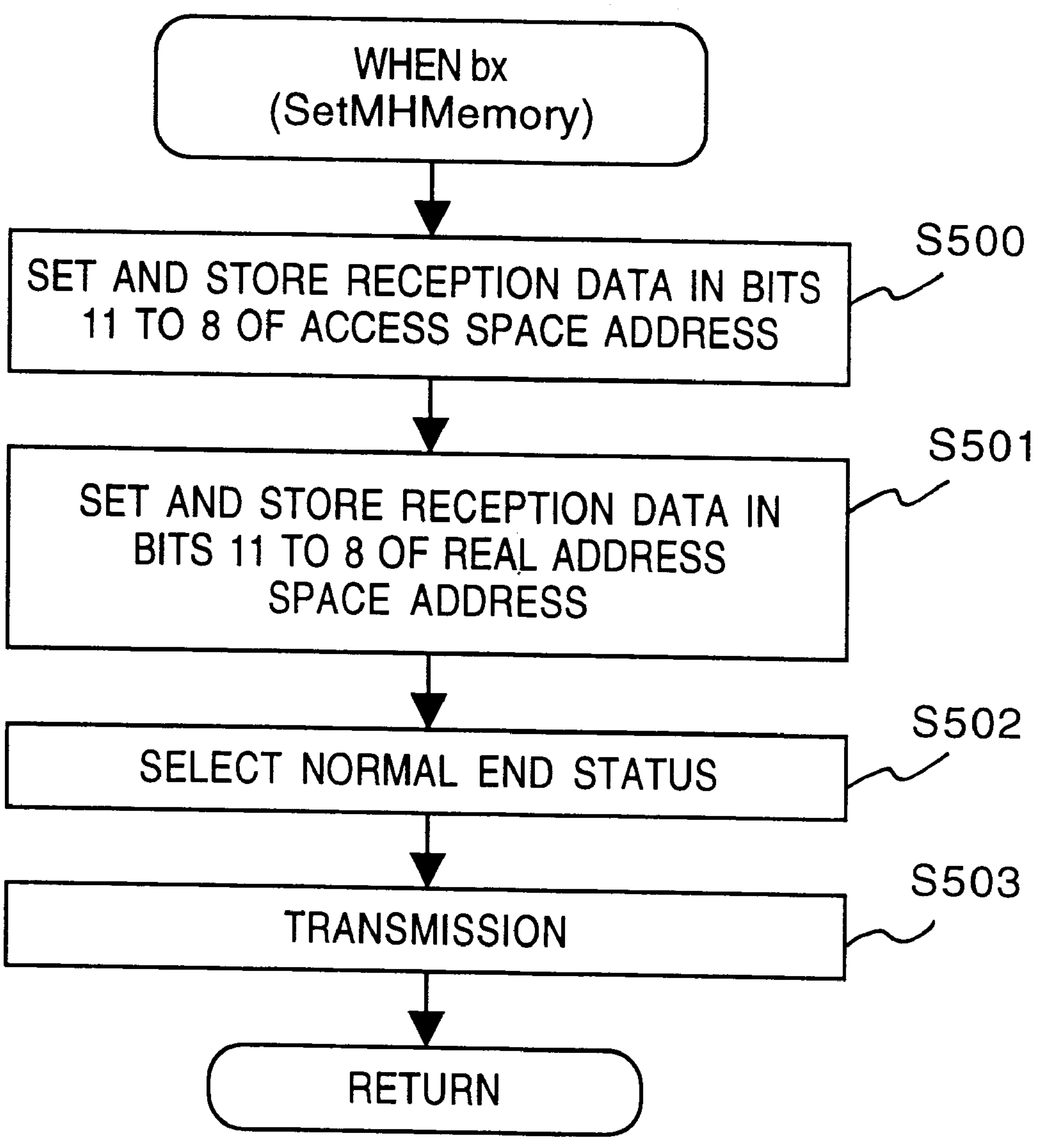
FIG. 80 is a flow chart showing the SC reception processing in the serial communication processing of the embodiment shown in FIG. 1.

If it is determined in step S434 that the upper 4 bits are (bx)h, the processing shown in FIG. 80 is executed. In this case, since the command sets the upper middle 4 bits (A11 to A8) of the address bits of the memory address of the FLCD 3 including the above-mentioned data write operation, 4-bit received data included in an OP code of the received command is set and stored in bits 11 to 8 of the access space address in step S500.

In step S501, the received data is set and stored in bits 11 to 8 of the real address space. Subsequently, in step S502, a normal end status is selected, and the flow advances to step S503. In step S503, the selected status is transmitted to the FLCD interface 2. Then, this processing ends, and the flow returns to the previous routine.

Figure 81:
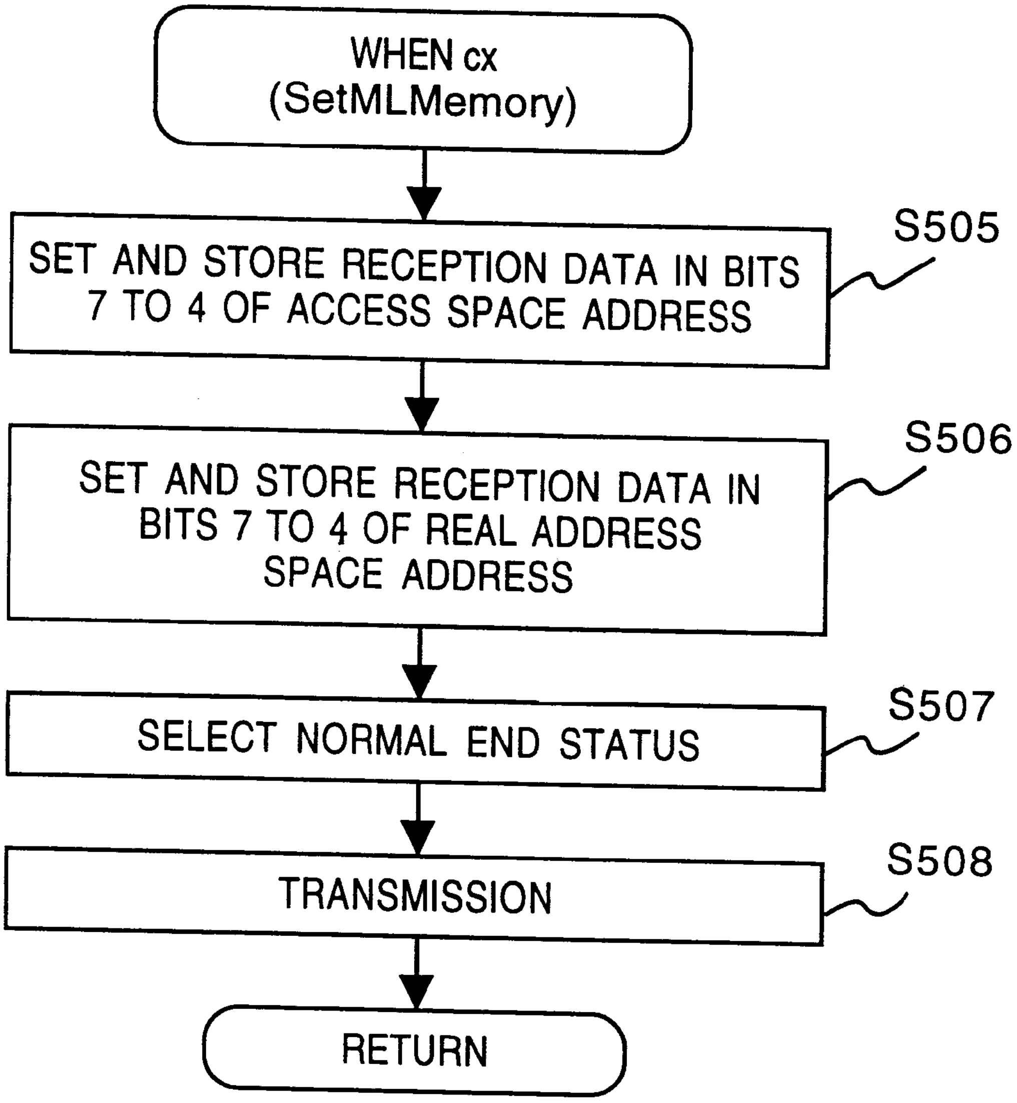
FIG. 81 is a flow chart showing the SC reception processing in the serial communication processing of the embodiment shown in FIG. 1.

If it is determined in step S434 that the upper 4 bits are (cx)h, the processing shown in FIG. 81 is executed. In this case, since the command sets the lower middle 4 bits (A7 to A4) of the address bits of the memory address of the FLCD 3 including the above-mentioned data write operation, 4-bit received data included in an OP code of the command received in step S505 is set and stored in bits 7 to 4 of the access space address in step S505.

In step S506, the received data is set and stored in bits 7 to 4 of the real address space. Subsequently, in step S507, a normal end status is selected, and the flow advances to step S508. In step S508, the selected status is transmitted to the FLCD interface 2. Then, this processing ends, and the flow returns to the previous routine.

Figure 82:
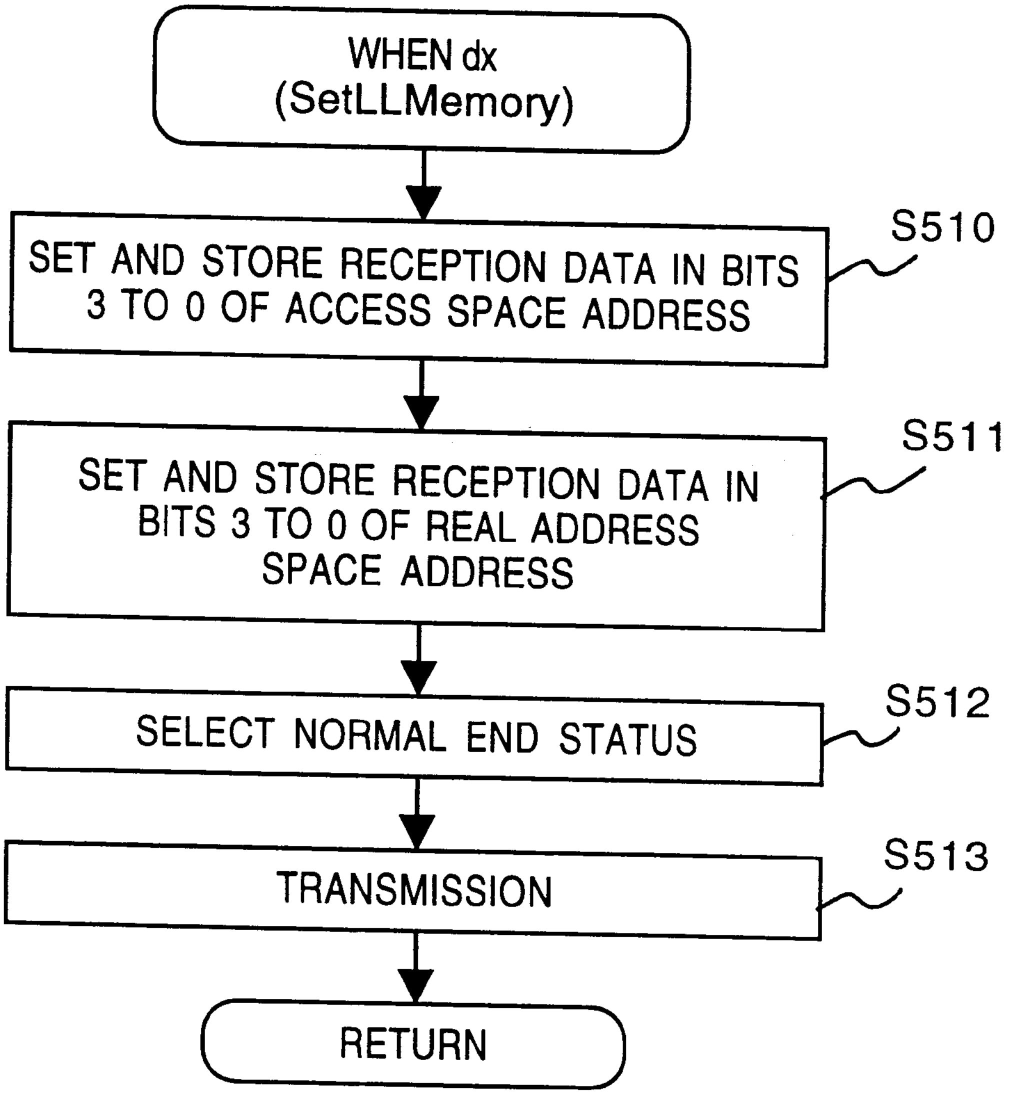
FIG. 82 is a flow chart showing the SC reception processing in the serial communication processing of the embodiment shown in FIG. 1.

If it is determined in step S434 that the upper 4 bits are (dx)h, the processing shown in FIG. 82 is executed. In this case, since the command sets the lower 4 bits (A3 to A0) of the address bits of the memory address of the FLCD 3 including the above-mentioned data write operation, 4-bit received data included in an OP code of the command received in step S510 is set and stored in bits 3 to 0 of the access space address in step S510.

In step S511, the received data is set and stored in bits 3 to 0 of the real address space. Subsequently, in step S512, a normal end status is selected, and the flow advances to step S513. In step S513, the selected status is transmitted to the FLCD interface 2. Then, this processing ends, and the flow returns to the previous routine.

With the above-mentioned address set commands, designation of the real address space by means of address mapping shown in FIG. 69 is realized, and the above-mentioned data set commands can freely access the contents of the memory of the FLCD 3 from the FLCD interface 2 side. For example, by utilizing these commands, the control program of the FLCD can be easily written, and can be very easily updated to an upper-version program.

The read processing of the memory contents in the above-mentioned maintenance mode will be explained later.

The processing upon execution of SC reception processing routine 3 in step S441 when it is determined in step S434 that the upper 4 bits are (0x)h will be described in detail below. In this case, the processing operations shown in FIGS. 83 to 95 are executed depending on the value of the lower 4 bits. The following explanation will be given in accordance with the value of the lower 4 bits.

Figure 83:
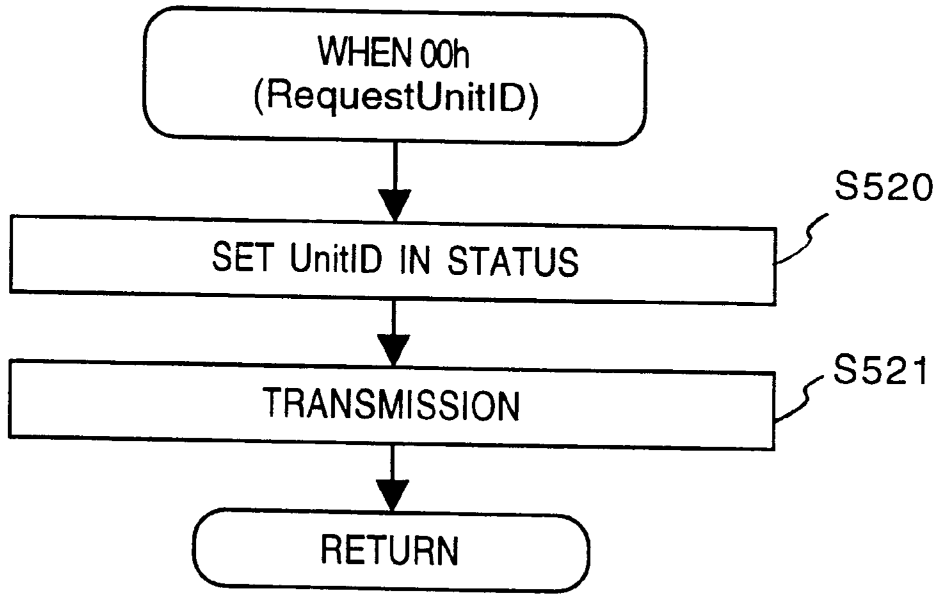
FIG. 83 is a flow chart showing the SC reception processing in the serial communication processing of the embodiment shown in FIG. 1.

If it is determined in step S440 that the lower 4 bits are 0 and a total of 8 bits is (00)h, since the received command is a unit ID request command of the FLCD 3, the processing shown in FIG. 83 is executed. In step S520, the unit ID of the FLCD 3 is set in a status. In step S521, the status is transmitted to the FLCD interface 2. Then, the processing ends, and the flow returns to the previous routine.

Figure 84:
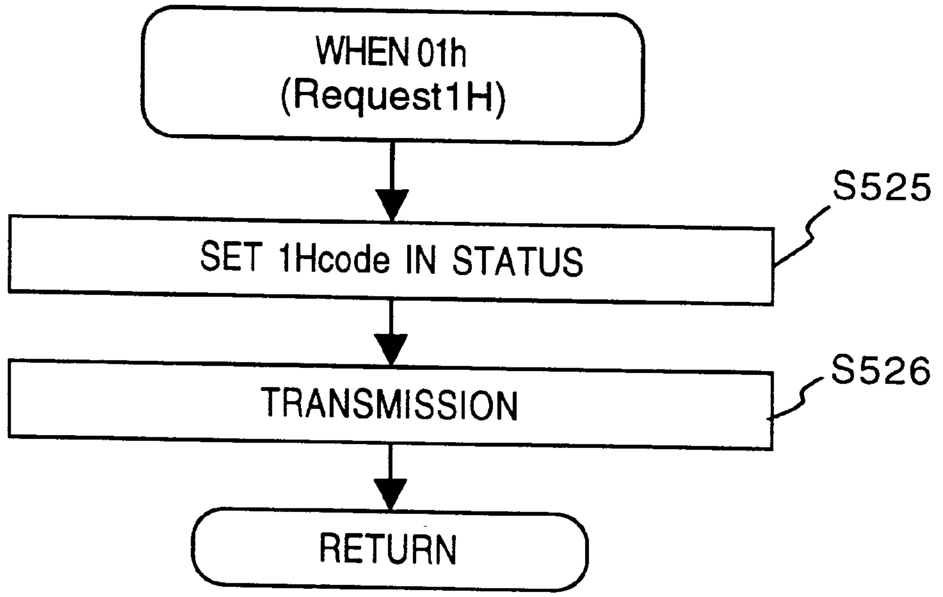
FIG. 84 is a flow chart showing the SC reception processing in the serial communication processing of the embodiment shown in FIG. 1.

If it is determined in step S440 that the lower 4 bits are 1 and a total of 8 bits is (01)h, since the received command is a unit 1H request command of the FLCD 3, the processing shown in FIG. 84 is executed. In step S525, the current 1HCode of the FLCD 3 is set in a status. In step S526, the status is transmitted to the FLCD interface 2. Then, the processing ends, and the flow returns to the previous routine.

Figure 85:
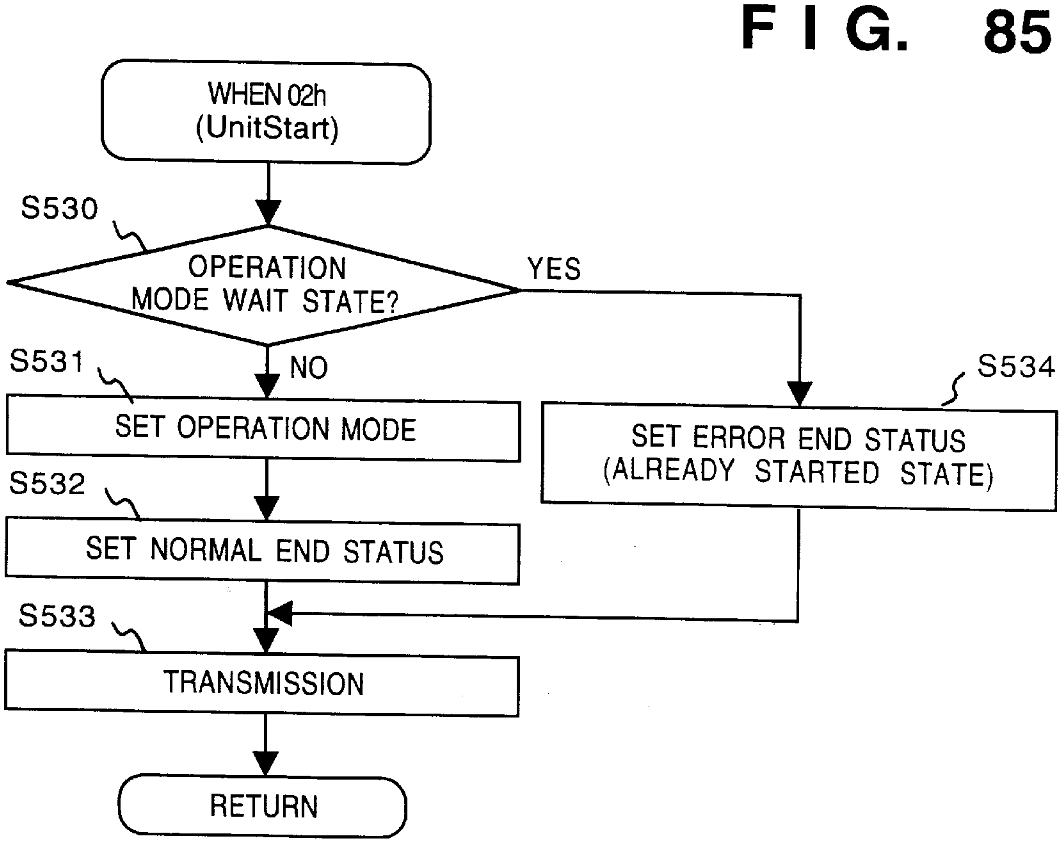
FIG. 85 is a flow chart showing the SC reception processing in the serial communication processing of the embodiment shown in FIG. 1.

If it is determined in step S440 that the lower 4 bits are 2 and a total of 8 bits is (02)h, since the received command is a command requesting the FLCD 3 to start its unit and to output a BUSY signal, the processing shown in FIG. 85 is executed. It is checked in step S530 if the current operation mode of the FLCD 3 is the wait state. If NO in step S530, the flow advances to step S531 to set the operation mode. Subsequently, in step S532, a normal end status is selected, and the flow advances to step S533. In step S533, the selected status is transmitted to the FLCD interface 2. Then, the processing ends, and the flow returns to the previous routine.

On the other hand, if it is determined in step S530 that the current operation mode is the wait state, the flow advances to step S534, and an error end status indicating the already started state is set. The flow then advances to step S533, and the set status is transmitted to the FLCD interface 2. The flow then returns to the previous routine.

Figure 86:
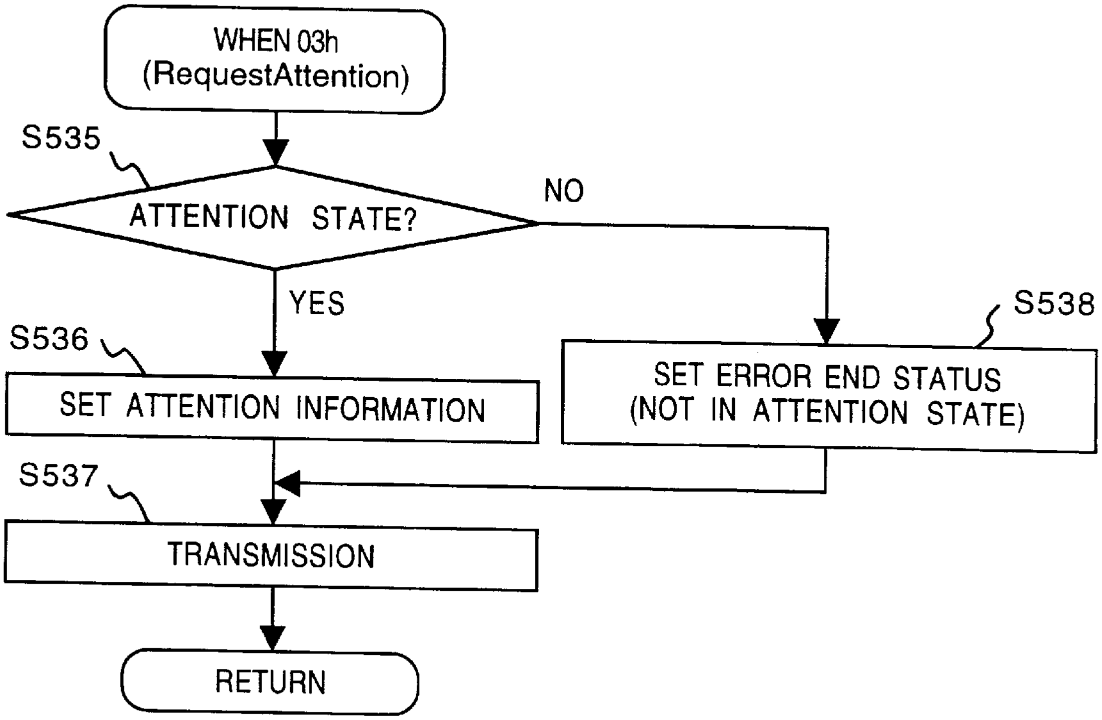
FIG. 86 is a flow chart showing the SC reception processing in the serial communication processing of the embodiment shown in FIG. 1.

If it is determined in step S440 that the lower 4 bits are 3 and a total of 8 bits is (03)h, since the received command is a command requesting attention information, the processing shown in FIG. 86 is executed. It is checked in step S535 if the FLCD 3 is in the attention state. If YES in step S535, the flow advances to step S536 to set attention information. Subsequently, in step S537, the set attention information is transmitted to the FLCD interface 2. Then, the processing ends, and the flow returns to the previous routine.

On the other hand, if it is determined in step S535 that the FLCD 3 is not in the attention state, the flow advances to step S538 to set an error end status indicating that the FLCD 3 is not in the attention state, and the set status is transmitted to the FLCD interface 2 in step S537. Thereafter, the flow returns to the previous routine.

Figure 87:
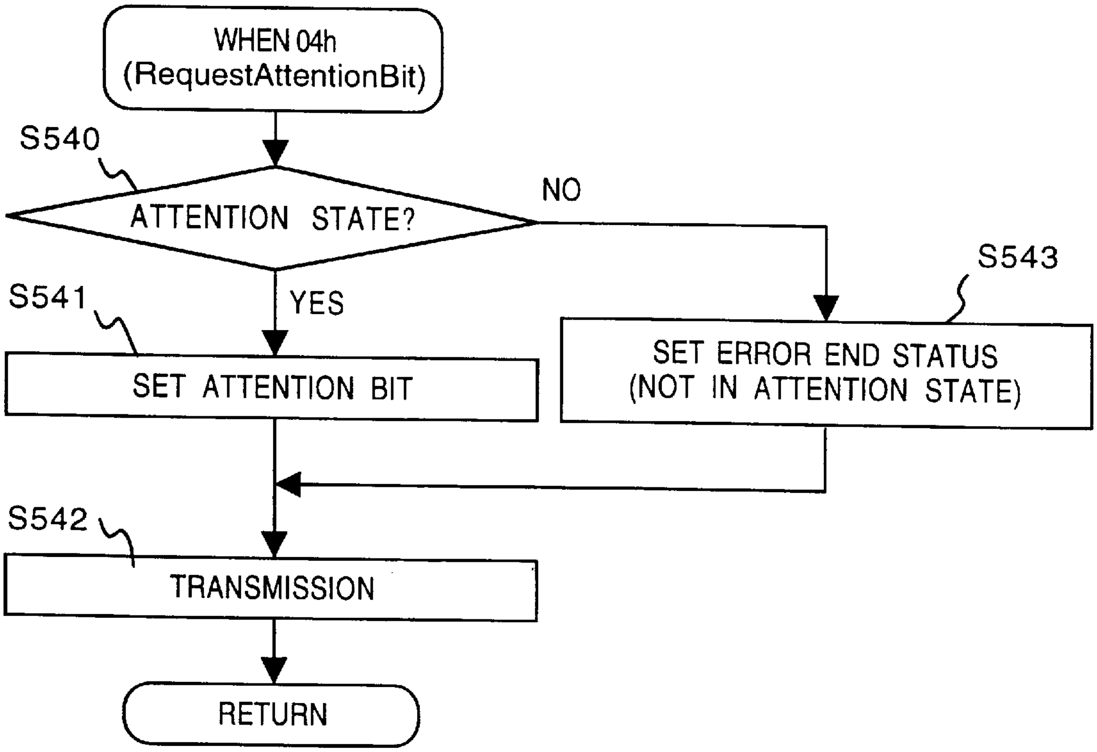
FIG. 87 is a flow chart showing the SC reception processing in the serial communication processing of the embodiment shown in FIG. 1.

If it is determined in step S440 that the lower 4 bits are 4 and a total of 8 bits is (04)h, since the received command is a command requesting an attention status bit, the processing shown in FIG. 87 is executed. It is checked in step S540 if the FLCD 3 is in the attention state. If YES in step S540, the flow advances to step S541 to set an attention status bit. Subsequently, in step S542, the set attention status bit is transmitted to the FLCD interface 2. Then, the processing ends, and the flow returns to the previous routine.

On the other hand, if it is determined in step S540 that the FLCD 3 is not in the attention state, the flow advances to step S543 to set an error end status indicating that the FLCD 3 is not in the attention state, and the set status is transmitted to the FLCD interface 2 in step S542. Thereafter, the flow returns to the previous routine.

Figure 88:
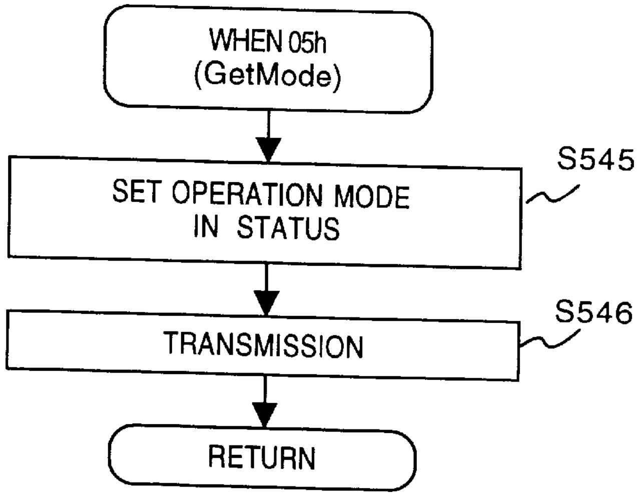
FIG. 88 is a flow chart showing the SC reception processing in the serial communication processing of the embodiment shown in FIG. 1.

If it is determined in step S440 that the lower 4 bits are 5 and a total of 8 bits is (05)h, since the received command is a command requesting the display mode (normal display mode, static mode, or sleep mode) of the FLCD 3, the processing shown in FIG. 88 is executed. In step S545, the current display mode of the FLCD 3 is set in a status. In step S546, the status is transmitted to the FLCD Interface 2. Then, the processing ends, and the flow returns to the previous routine.

Figure 89:
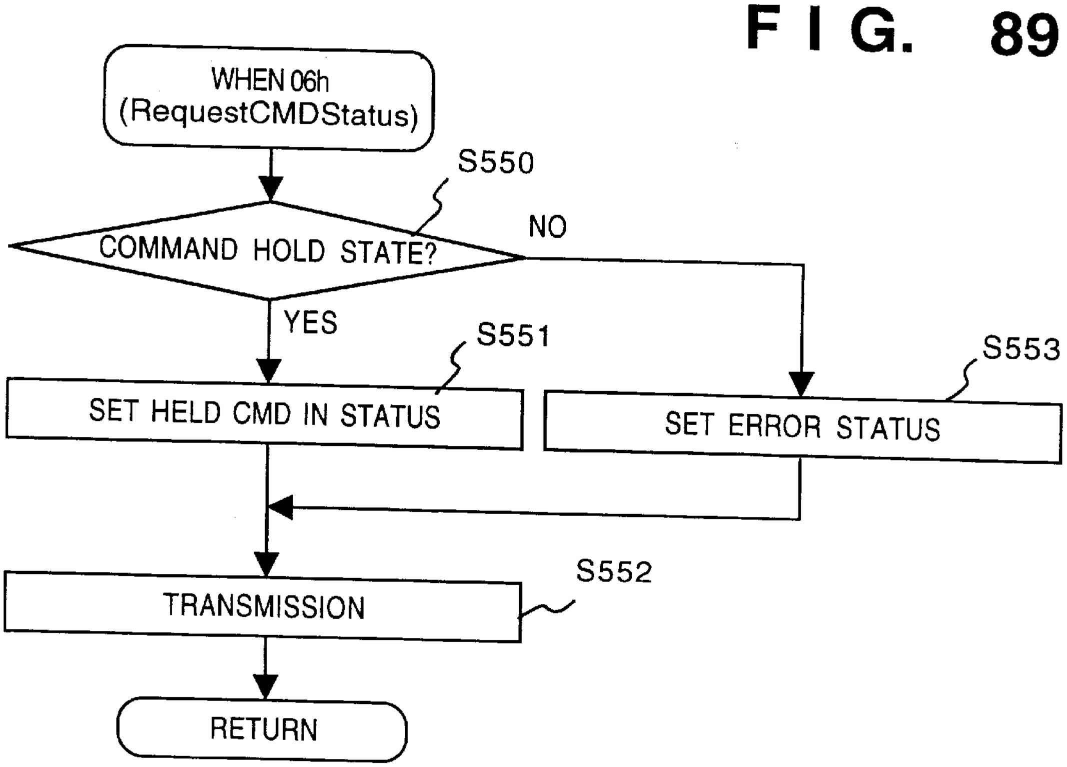
FIG. 89 is a flow chart showing the SC reception processing in the serial communication processing of the embodiment shown in FIG. 1.

If it is determined in step S440 that the lower 4 bits are 6 and a total of 8 bits is (06)h, since the received command is a command requesting a status pertaining commands, the processing shown in FIG. 89 is executed. It is checked in step S550 if the FLCD 3 is in the command hold state. If YES In step S550, the flow advances to step S551 to set the held command in a status. Subsequently, in step S552, the set status is transmitted to the FLCD Interface 2. Then, the processing ends, and the flow returns to the previous routine.

On the other hand, if NO In step S550, the flow advances to step S553 to set an error status, and the flow advances to step S552. In step S552, the set error status is transmitted to the FLCD interface 2, and the flow then returns to the previous routine.

If it is determined in step S440 that the lower 4 bits are 8 and a total of 8 bits is (08)h, and if it is determined in step S440 that the lower 4 bits are 8 and a total of 8 bits is (09)h, the received commands are commands for reading out the contents of the upper and lower 4 bits of the memory of the FLCD 3 by the FLCD interface 2 side. This command is one for debugging as in the above-mentioned case wherein the upper 4 bits are 8 to d.

Figure 90:
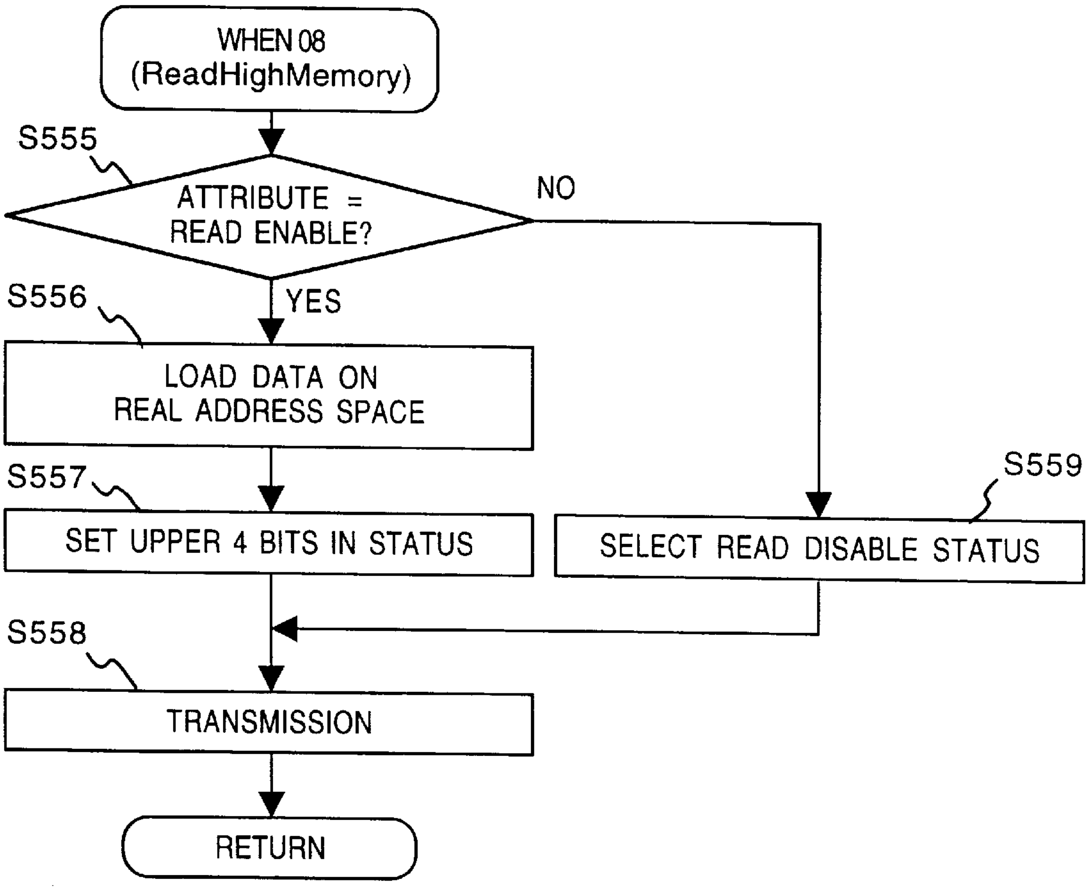
FIG. 90 is a flow chart showing the SC reception processing in the serial communication processing of the embodiment shown in FIG. 1.

If it is determined in step S440 that the lower 4 bits are 8 and a total of 8 bits is (08)h, since the received command is a command for reading the contents of the upper 4 bits of the memory of the FLCD 3, the processing shown in FIG. 90 is executed. It is checked in step S555 if the designated real address space of the memory is set in the read enable state. Since this command must be executed after the data write address is set by the Set HH/MH/ML/LL Address commands (to be described later), the checking operation in step S555 is attained by checking the status bit, indicating the write enable or disable state, in the attribute table designated by attribute table designation information in the address space 1001 shown in FIG. 69, which was received upon setting the address.

If the designated real address space is in the read enable state, the flow advances to step S556, and data on the set real address space is loaded. In step S557, the upper 4 bits are set in a status. Subsequently, in step S558, the set status is transmitted to the FLCD interface 2. Then, the processing ends, and the flow returns to the previous routine.

On the other hand, if it is determined in step S555 as a result of checking the attribute that the designated real address space is not in the read enable state, the flow advances to step S559 to select a read disable status. In step S558, the selected status is transmitted to the FLCD interface 2. Then, the processing ends, and the flow returns to the previous routine.

Figure 91:
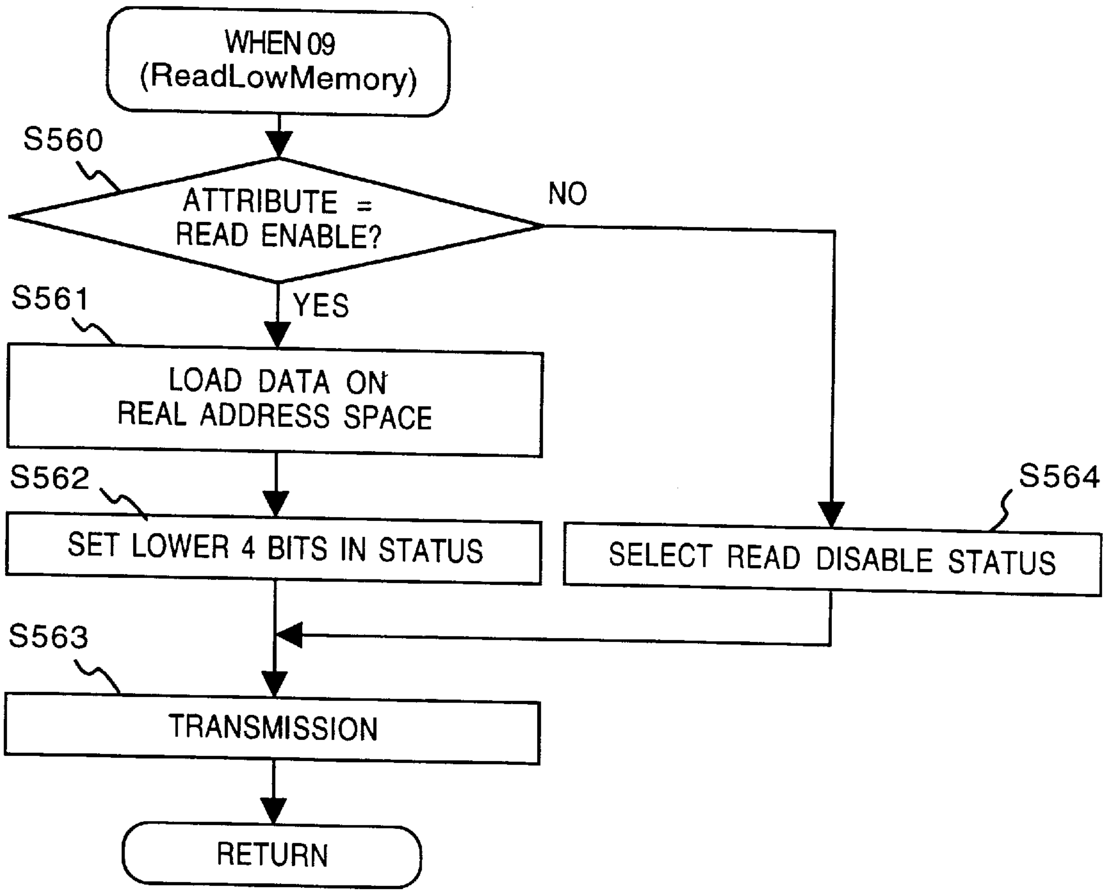
FIG. 91 is a flow chart showing the SC reception processing in the serial communication processing of the embodiment shown in FIG. 1.

If it is determined in step S440 that the lower 4 bits are 8 and a total of 8 bits is (09)h, since the received command is a command for reading the contents of the lower 4 bits of the memory of the FLCD 3, the processing shown in FIG. 91 is executed. It is checked in step S560 if the designated real address space of the memory is set in the read enable state. Since this command must be executed after the data write address is set by the Set HH/MH/ML/LL Address commands (to be described later), the checking operation in step S560 is attained by checking the status bit, indicating the write enable or disable state, in the attribute table designated by attribute table designation information in the address space 1001 shown in FIG. 69, which was received upon setting the address.

If the designated real address space is in the read enable state, the flow advances to step S561, and data on the set real address space is loaded. In step S562, the lower 4 bits are set in a status. Subsequently, in step S563, the set status is transmitted to the FLCD interface 2. Then, the processing ends, and the flow returns to the previous routine.

On the other hand, if it is determined in step S560 as a result of checking the attribute that the designated real address space is not in the read enable state, the flow advances to step S564 to select a read disable status. In step S563, the selected status is transmitted to the FLCD interface 2. Then, the processing ends, and the flow returns to the previous routine.

Figure 92:
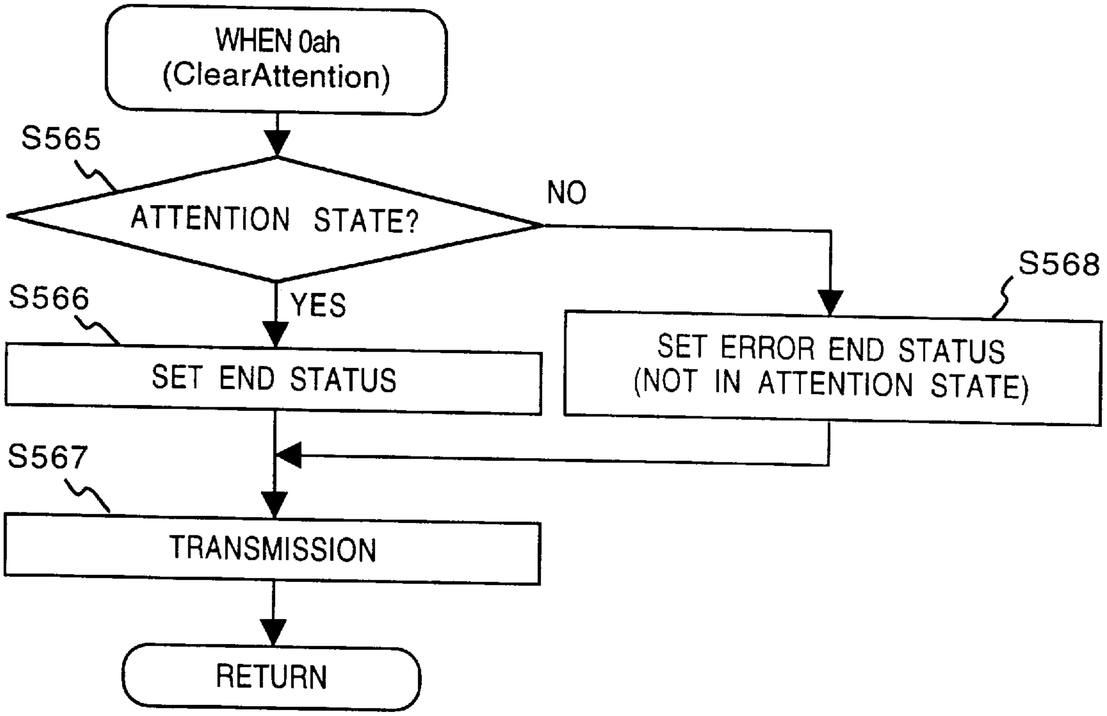
FIG. 92 is a flow chart showing the SC reception processing in the serial communication processing of the embodiment shown in FIG. 1.

If it is determined in step S440 that the lower 4 bits are a and a total of 8 bits is (0a)h, since the received command is a command for clearing the attention state, the processing shown in FIG. 92 is executed. It is checked in step S565 if the FLCD 3 is in the attention state. If YES in step S565, the flow advances to step S566. In step S566, the attention state is cleared, and an attention end status is set. Subsequently, in step S567, the set attention end status is transmitted to the FLCD interface 2. Then, the processing ends, and the flow returns to the previous routine.

On the other hand, if it is determined in step S565 that the FLCD 3 is not in the attention state, the flow advances to step S568 to set an error end status indicating that the FLCD 3 is not in the attention state, and the set status is transmitted to the FLCD interface 2 in step S567. Then, the flow returns to the previous routine.

Figure 93:
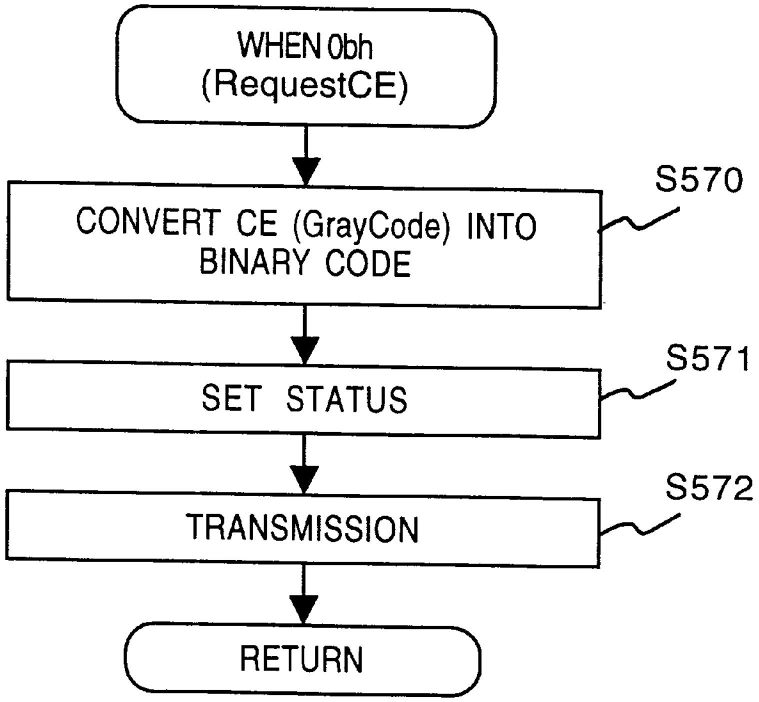
FIG. 93 is a flow chart showing the SC reception processing in the serial communication processing of the embodiment shown in FIG. 1.

If it is determined in step S440 that the lower 4 bits are b and a total of 8 bits is (0b)h, since the received command is an FLCD contrast enhancement transmission request command, the processing shown in FIG. 93 is executed. In step S570, CE (GrayCode) of the FLCD 3 is converted into a binary code. This conversion processing has been described in detail above. In step S571, the contrast enhancement value converted into binary information is set in a status. Subsequently, in step S572, the set status is transmitted to the FLCD interface 2. Then, the processing ends, and the flow returns to the previous routine.

Figure 94:
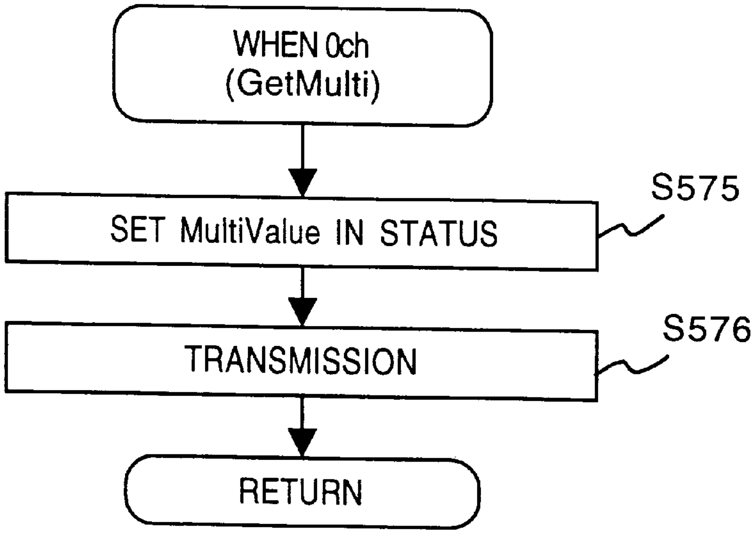
FIG. 94 is a flow chart showing the SC reception processing in the serial communication processing of the embodiment shown in FIG. 1.

If it is determined in step S440 that the lower 4 bits are c and a total of 8 bits is (0c)h, since the received command is an acquisition request command of the multi-driving mode (scan mode) of the FLCD, the processing shown in FIG. 94 is executed. In step S575, MultiValue indicating the scan mode of the FLCD 3 is set in a status. Subsequently, in step S576, the set status is transmitted to the FLCD interface 2. Then, the processing ends, and the flow returns to the previous routine.

Figure 95:
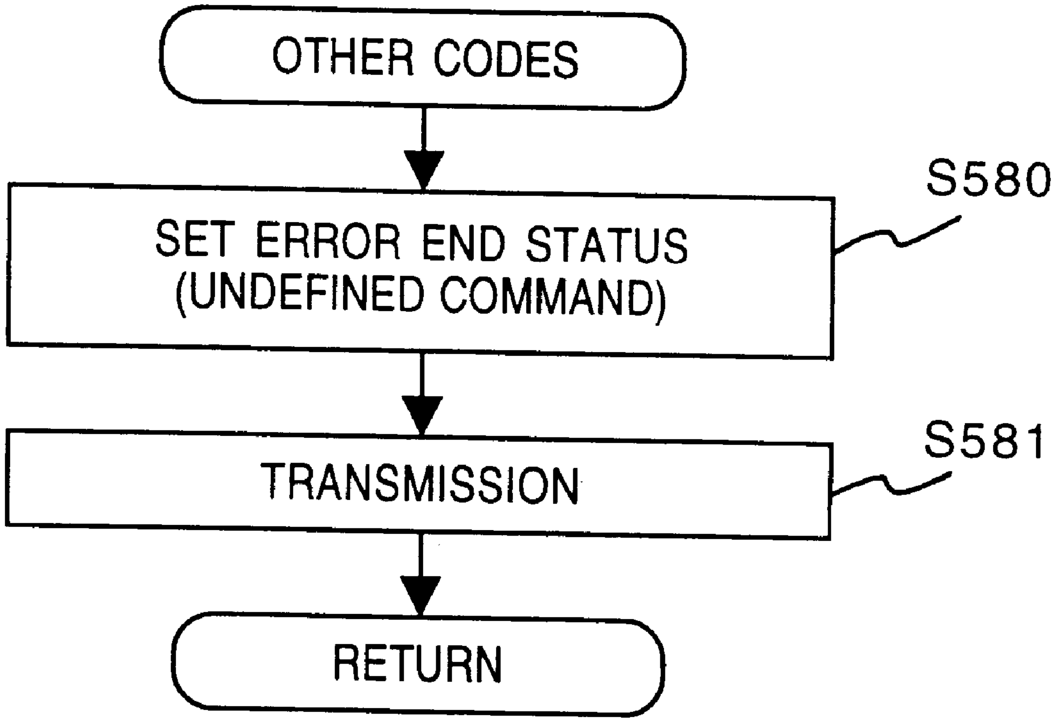
FIG. 95 is a flow chart showing the SC reception processing in the serial communication processing of the embodiment shown in FIG. 1.

If it is determined in step S440 that the lower 4 bits are other than the above-mentioned codes (e.g., 7h, 0dh, 0e, 0fh), the processing shown in FIG. 95 is executed. In step S580, an error end status indicating an undefined command is set. Subsequently, in step S581, the set error end status is transmitted to the FLCD interface 2. Then, the processing ends, and the flow returns to the previous routine.

Figure 96:
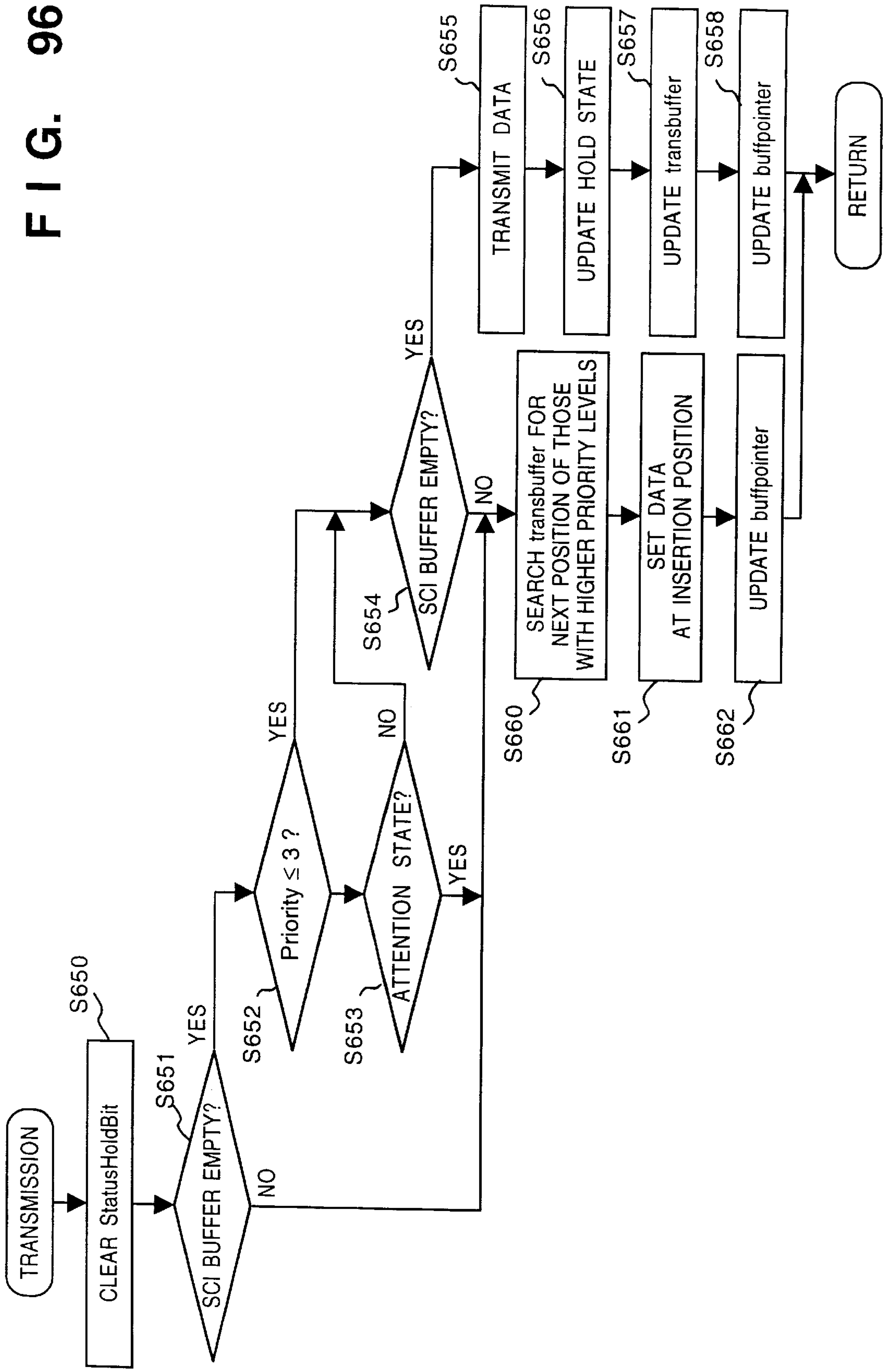
FIG. 96 is a flow chart showing the transmission processing to the FLCD interface in the embodiment shown in FIG. 1.

The transmission processing to the FLCD interface 2 in the above description will be described in detail below with reference to FIG. 96.

It is checked in step S651 if an SCI buffer serving as a hardware buffer for transmission is empty. If NO in step S651, the flow advances to step S660 to search the transmission buffer for the next position of those with higher priority levels shown in FIG. 68. In step S661, data is set at the insertion position. In step S662, the buffer pointer (buffpointer) of the SCI buffer is updated, and the flow returns to the previous routine.

On the other hand, if the SCI buffer is empty, the flow advances to step S652 to check if transmission information has priority equal to or lower than level 3 of the priority order shown in FIG. 68. If NO in step S652, the flow advances to step S653 to check if the FLCD is in the attention state. If YES in step S653, the flow advances to step S660; otherwise, the flow advances to step S654.

On the other hand, if transmission information has priority equal to or lower than level 3, the flow advances to step S654. In step S654, it is checked if the SCI buffer is empty. If NO in step S654, the flow advances to step S660.

On the other hand, if YES in step S654, the flow advances to step S655, and the system controller 160 transmits data whose transmission is designated by the buffer pointer (buffpointer) of the SCI buffer to the FLCD interface 2. Subsequently, the processing for updating the current hold state (i.e., the processing for clearing the hold state) is executed in step S656, and the transmission buffer is updated in step S657. In step S658, the buffer pointer (buffpointer) of the SCI buffer is updated, and the flow returns to the previous routine.

Figure 97:
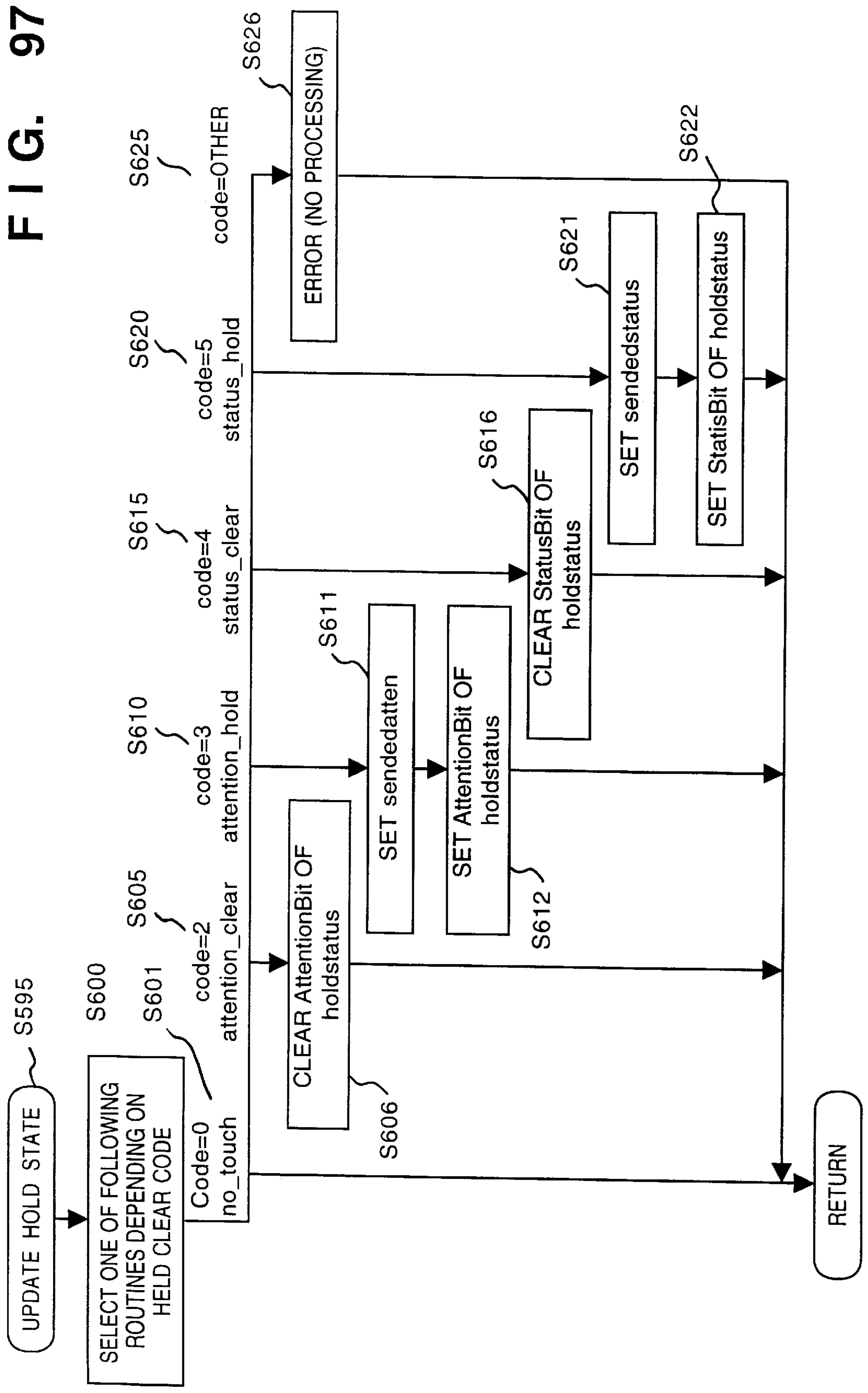
FIG. 97 is a flow chart showing in detail the hold state updating processing of the embodiment shown in FIG. 1.

The hold state updating processing in step S656 in the above-mentioned processing will be described in detail below with reference to the flow chart in FIG. 97.

In step S600, one of the following routines is selected in accordance with the held clear code to execute processing of the selected routine. That is, if the clear code is 0, since it is determined in step S601 that no processing is required, the flow directly returns to the previous routine.

On the other hand, if the clear code is 2, since it indicates clearing of the attention bit, the flow advances from step S605 to step S606, and the attention bit of holdstat indicating the hold state of the transmitted status/attention is cleared. Then, the processing ends, and the flow returns to the previous routine.

If the clear code is 3, since it indicates holding of an attention, the flow advances from step S610 to step S611, and the transmitted attention image is set in sendedatten indicating the transmitted attention image. Subsequently, in step S612, the attention bit of holdstat indicating the hold state of the transmitted status/attention is set. Then, this processing ends, and the flow returns to the previous routine.

Furthermore, if the clear code is 4, since it indicates clearing of a status, the flow advances from step S615 to step S616, and the status bit of holdstat indicating the hold state of the transmitted status/attention is cleared. Then, this processing ends, and the flow returns to the previous routine.

If the clear code is 5, since it indicates holding of a status, the flow advances from step S620 to step S621, and the transmitted status image is set in sendedstatus indicating the transmitted status image. Subsequently, in step S622, the status bit of holdstat indicating the hold state of the transmitted status/attention is set. Then, this processing ends, and the flow returns to the previous routine.

Furthermore, if the clear code has a value other than the above-mentioned value, since it is an error, the flow advances from step S625 to step S626, and the flow returns to the previous routine without any processing as an error.

As described above, according to this embodiment, in the information processing system (or apparatus), since a display (FLCD) using a ferroelectric liquid crystal cell, which can have a very low profile as compared to a CRT as a means for realizing a visual expression function of information, has characteristics for storing the displayed contents, the FLCD has an intelligence function of, e.g., communicating with the host side to confirm each other's states, and can automatically adjust itself to an optimal state independently of the host side state, so as not to disturb the displayed contents upon power-ON and power-OFF of the system. In addition, the FLCD can be naturally used as compared to a conventional display apparatus, and the user can easily recognize the state of the display apparatus side since the indication mode of the LED is changed in correspondence with the state of the display apparatus. For this reason, the user can take an appropriate measure.

Since the display speed of the FLCD delicately changes depending on its temperature (the speed becomes higher if the temperature becomes higher), the data transfer period is changed accordingly, thus improving displayed image quality.

Furthermore, since communications other than transfer of display image data to the FLCD are attained using serial communications, a high data transfer speed of display image data to the FLCD can be assured, and the displayed image quality can be prevented from being impaired.

In this embodiment, two interfaces, i.e., the bus 310 exclusively used for transferring image data, and the serial communication line 311 used for exchanging commands and attentions are arranged between the FLCD interface 2 and the FLCD 3. However, in practice, since these interfaces are stored in a single cable, and the FLCD interface 2 and the FLCD 3 are connected via the single cable, the user feels as if data were exchanged via a single interface, thus avoiding confusion upon connection of wiring lines. Even when this cable is disconnected, the user can easily recognize this state. Also, even when supply of display data from the host side to the display apparatus side is stopped, the displayed contents can be prevented from being disturbed.

According to this embodiment, since the contents of the ROM 161 and the RAM 162 of the FLCD 3 can be accessed in practice by the FLCD interface 2 side, every situations can be coped with. Furthermore, in this case, in place of sending the entire address of a memory to be accessed, the attribute table is used to greatly reduce the address transmission amount without influencing transmission of image display information. For this reason, such address data can be sufficiently sent via the serial communications.

Also, the read and write enable areas can be easily and reliably designated by the attribute table, and the memory space can be easily set.

Furthermore, this accessible memory space has no limitation, and the FLCD interface 2 (host 1) side can recognize the control sequence of the display apparatus in detail. For example, when this memory access function is used in the manufacturing process, the control state of the display apparatus can be analyzed precisely, and every states can be fetched.

Furthermore, since at least one word in the attribute table can be rewritten by the host side, the entire memory can be freely accessed, and debugging of the display apparatus can be efficiently performed. Furthermore, since information indicating whether or not the address is normally set is supplied from the FLCD 3 to the FLCD interface 2 prior to an access, the FLCD interface 2 can be prevented from reading out data at a wrong address position due to an address setting error.

Note that the present invention may be applied to either a system constituted by a plurality of equipments, or an apparatus consisting of a single equipment. Also, the present invention may be applied to a case wherein the invention is attained by supplying a program to the system or apparatus, as a matter of course.

The objects of the present invention are also achieved by supplying a storage medium, which records a program code of a software program that can realize the functions of the above-mentioned embodiments to the system or apparatus, and reading out and executing the program code stored in the storage medium by a computer (or a CPU, MPU, or the like) of the system or apparatus.

In this case, the program code itself read out from the storage medium realizes the functions of the above-mentioned embodiments, and the storage medium which stores the program code constitutes the present invention.

As the storage medium for supplying the program code, for example, a floppy disk, hard disk, optical disk, magneto-optical disk, CD-ROM, CD-R, magnetic tape, nonvolatile memory card, ROM, and the like may be used.

The functions of the above-mentioned embodiment may be realized not only by executing the readout program code by the computer but also by some or all of actual processing operations executed by an OS running on the computer on the basis of an instruction of the program code.

Furthermore, the functions of the above-mentioned embodiment may be realized by some or all of actual processing operations executed by a CPU or the like arranged in a function extension board or a function extension unit, which is inserted in or connected to the computer and receives the program code read out from the storage medium.

<Advantage of the present invention >

As described above, according to the present invention, the connection/disconnection state of the connection cable can be easily recognized, and an appropriate measure can be taken.

Furthermore, even when the display has a storage function of the displayed contents, the display state on the display screen can be prevented from being disturbed by the remaining displayed contents. When the connection cable is not normally connected, the display control is stopped to prevent unnecessary information from remaining on the display screen. Furthermore, when the connection cable is disconnected, initialization processing is executed to prevent an operation error as in a case wherein other abnormalities have occurred.

As many apparently widely different embodiments of the present invention can be made without departing from the spirit and scope thereof, it is to be understood that the invention is not limited to the specific embodiments thereof except as defined in the appended claims.

What is claimed is:

1. A display apparatus which includes communication means for executing a communication with a host computer via an interface cable, comprising:

a display including a display screen for displaying image data transferred in synchronism with display timing from the host computer via the interface cable;

a connector connectable to the interface cable that communicates with the host computer;

detection means for detecting whether or not said connector is connected to the host computer via the interface cable;

recognition means for recognizing a connection/disconnection state of the interface cable on the basis of a detection result of said detection means; and information means for informing a recognition result of said recognition means.

2. The apparatus according to claim 1, further comprising indication means for indicating a mode, wherein said information means informs the recognition result of the connection/disconnection state of the interface cable by changing the indication mode of said indication means, which is arranged in addition to said display screen.

3. The apparatus according to claim 2, wherein said indication means comprises a light-emitting diode, and said information means informs the recognition result of the connection/disconnection state of the interface cable by turning off said light-emitting diode upon detection of the disconnection of the interface cable.

4. The apparatus according to claim 2, wherein said display has a function of holding a display state of an image.

5. The apparatus according to claim 4, wherein said display comprises a ferroelectric liquid crystal display.

6. The apparatus according to claim 5, wherein said display comprises a backlight, displays information using light emitted by said backlight and transmitted through said ferroelectric liquid crystal display, and can operate at least in a display operation mode in which information is displayed by turning on said backlight and in a power saving operation mode in which said backlight is turned off, and said indication means is controlled to blink.

7. The apparatus according to claim 1, further comprising means for not updating an image displayed on said display screen when said recognition means detects the disconnection of the interface cable.

8. The apparatus according to claim 1, further comprising initialization means for performing initialization processing when said recognition means detects the disconnection of the interface cable.

9. A display method for a display apparatus which comprises a connector and communication means for executing a communication with a host computer via an interface cable connected to the connector, with the display apparatus including a display having a display screen for displaying image data transferred in synchronism with display timing from the host computer via the interface cable, said method comprising the steps of:

detecting whether or not the connector is connected to the host computer via the interface cable;

recognizing a connection/disconnection state of the interface cable to the connector; and informing a recognition result.

10. The method according to claim 9, wherein the informing step includes the step of informing the recognition result of the connection/disconnection state of the interface cable by changing an indication mode of an indication means arranged in addition to the display screen.

11. The method according to claim 10, further comprising the step of providing the indication means with a light-emitting diode, and wherein the informing step includes the step of informing the recognition result of the connection/disconnection state of the interface cable by turning off the light-emitting diode.

12. The method according to claim 11, further comprising the step of providing the display with a ferroelectric liquid crystal display which comprises a backlight and has a function of holding a display state of an image, and can operate at least in a display operation mode in which information is displayed by turning on the backlight and in a power saving operation mode in which the backlight is turned off, and wherein the indication means is controlled to blink.

13. The method according to claim 9, further comprising the step of not updating an image displayed on the display screen when the disconnection of the interface cable is recognized.

14. A computer program product comprises a computer usable medium having computer readable program code embodied on said medium for executing and integrating in a display apparatus having a connector for connecting with a host computer and for receiving images to be displayed that are transferred in synchronism with display timing from the host computer via an interface cable, said computer program product comprising:

detection procedure code means for detecting whether or not the connector is connected to the host computer via the interface cable;

recognition procedure code means for recognizing a connection/disconnection state of the interface cable to the connector which connects the interface cable in communication with the host computer; and informing step procedure code means for informing a recognition result.

15. The product according to claim 14, further comprising code means for not updating an image displayed on the display screen when the disconnection of the interface cable is recognized.

16. Information processing system having a host computer and a display apparatus, with said host computer comprising:

a first connector for connecting an interface cable that performs a communication with said display apparatus; and display supply means for supplying display data to said display apparatus via said interface cable, and said display apparatus comprising:

a second connector for connecting said interface cable that performs the communication with said host computer;

a display including a display screen for displaying image data transferred in synchronism with display timing from the second connector;

detection means for detecting whether or not said second connector is connected to said host computer via said interface cable;

recognition means for recognizing a connection/disconnection state of said interface cable on the basis of a detection result of said detection means; and information means for informing a recognition result of said recognition means.

17. An information processing system according to claim 16, further comprising indication means for indicating a mode, wherein said information means informs the recognition result of the connection/disconnection state of said interface cable by changing the indication mode of said indication means, which is arranged in addition to the display screen.

18. An information processing system according to claim 17, wherein said indication means comprises a light-emitting diode, and said information means informs the recognition result of the connection/disconnection state of said interface cable by turning off said light-emitting diode upon detection of the disconnection of said interface cable.

19. An information processing system according to claim 17, wherein said display has a function of holding a display state of an image.

20. An information processing system according to claim 19, wherein said display comprises a ferroelectric liquid crystal display.

21. An information processing system according to claim 20, wherein said display comprises a backlight, displays information using light emitted by said backlight and transmitted through said ferroelectric liquid crystal display, and can operate at least in a display operation mode in which information is displayed by turning on said backlight and in a power saving operation mode in which said backlight is turned off, and said indication means is controlled to blink.

22. An information processing system according to claim 16, further comprising means for not updating an image displayed on said display screen when said recognition means detects the disconnection of said interface cable.

23. An information processing system according to claim 16, further comprising initialization means for performing initialization processing when said recognition means detects the disconnection of said interface cable.

* * * * *

UNITED STATES PATENT AND TRADEMARK OFFICE
CERTIFICATE OF CORRECTION

PATENT NO. : 6,067,645

DATED : May 23, 2000

INVENTOR(S): TAKASHI YAMAMOTO, ET AL.

It is certified that error appears in the above-identified patent and that said Letters Patent is hereby corrected as shown below:

COLUMN 1:

Line 32, "suffers a" should read --suffers from a--.

COLUMN 2:

Line 43, "bloek" should read --block--.

COLUMN 19:

Line 1, "processing example," should read --processing according to the current condition is performed, for example,--.

Line 3, "3 may" should read --example, the display performance of the FLCD 3 may--.

COLUMN 49:

Line 47, "tuning" should read --turning--.

UNITED STATES PATENT AND TRADEMARK OFFICE

CERTIFICATE OF CORRECTION

PATENT NO. : 6,067,645

DATED : May 23, 2000

INVENTOR(S): TAKASHI YAMAMOTO, ET AL.

It is certified that error appears in the above-identified patent and that said Letters Patent is hereby corrected as shown below:

COLUMN 56:

Line 33, "8, to" should read --8 to--.

Signed and Sealed this

Twenty-second Day of May, 2001

Attest:

Nicholas P. Godici

NICHOLAS P. GODICI

*Attesting Officer*

*Acting Director of the United States Patent and Trademark Office*